(12) United States Patent
Kimura

(10) Patent No.: US 10,281,788 B2
(45) Date of Patent: May 7, 2019

(54) LIQUID CRYSTAL DISPLAY DEVICE

(71) Applicant: Semiconductor Energy Laboratory Co., Ltd., Atsugi-shi, Kanagawa-ken (JP)

(72) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/851,799

(22) Filed: Dec. 22, 2017

(65) Prior Publication Data

US 2018/0210251 A1    Jul. 26, 2018

Related U.S. Application Data

(60) Continuation of application No. 15/151,583, filed on May 11, 2016, now abandoned, which is a
(Continued)

(30) Foreign Application Priority Data

May 17, 2007   (JP) ................... 2007-132172

(51) Int. Cl.
*G02F 1/136* (2006.01)
*G02F 1/1343* (2006.01)
(Continued)

(52) U.S. Cl.
CPC ........ *G02F 1/1368* (2013.01); *G02F 1/13624* (2013.01); *G02F 1/136213* (2013.01);
(Continued)

(58) Field of Classification Search
CPC ...... G02F 1/1333; G02F 1/136; G02F 1/1362; G02F 1/1368; G02F 1/136286;
(Continued)

(56) References Cited

U.S. PATENT DOCUMENTS 5,151,689 A   9/1992 Kabuto et al.
5,204,659 A   4/1993 Sarma
(Continued)

FOREIGN PATENT DOCUMENTS

CN   001866087 A   11/2006
EP   0589478 A    3/1994
(Continued)

OTHER PUBLICATIONS

Chen.Po-Lun et al., "69.3: Invited Paper: Advanced MVA for High Quality LCD-TVs", SID Digest '06 : SID International Symposium Digest of Technical Papers, May 1, 2006, vol. 37, pp. 1946-1949.
(Continued)

*Primary Examiner* — Thoi V Duong
(74) *Attorney, Agent, or Firm* — Fish & Richardson P.C.

(57) ABSTRACT

It is an object to provide a liquid crystal display device which has excellent viewing angle characteristics and higher quality. The present invention has a pixel including a first switch, a second switch, a third switch, a first resistor, a second resistor, a first liquid crystal element, and a second liquid crystal element. A pixel electrode of the first liquid crystal element is electrically connected to a signal line through the first switch. The pixel electrode of the first liquid crystal element is electrically connected to a pixel electrode of the second liquid crystal element through the second switch and the first resistor. The pixel electrode of the second liquid crystal element is electrically connected to a Cs line through the third switch and the second resistor. A common electrode of the first liquid crystal element is electrically connected to a common electrode of the second liquid crystal element.

8 Claims, 84 Drawing Sheets

Related U.S. Application Data continuation of application No. 14/263,012, filed on Apr. 28, 2014, now Pat. No. 9,341,908, which is a division of application No. 13/793,427, filed on Mar. 11, 2013, now Pat. No. 8,711,314, which is a continuation of application No. 13/399,147, filed on Feb. 17, 2012, now Pat. No. 8,395,718, which is a continuation of application No. 13/174,842, filed on Jul. 1, 2011, now Pat. No. 8,120,721, which is a division of application No. 12/118,982, filed on May 12, 2008, now Pat. No. 7,978,277.

(51) Int. Cl.
| | |
|---|---|
| *G02F 1/1368* | (2006.01) |
| *G02F 1/1362* | (2006.01) |
| *G09G 3/34* | (2006.01) |
| *G09G 3/36* | (2006.01) |
| *H01L 29/786* | (2006.01) |
| *H01L 33/00* | (2010.01) |
| *H01L 27/12* | (2006.01) |
| *H01L 29/22* | (2006.01) |
| *H01L 29/24* | (2006.01) |
| *H01L 29/423* | (2006.01) |
| *G09G 3/20* | (2006.01) |

(52) U.S. Cl.
CPC ........... *G09G 3/342* (2013.01); *G09G 3/3648* (2013.01); *H01L 27/124* (2013.01); *H01L 27/1225* (2013.01); *H01L 29/22* (2013.01); *H01L 29/24* (2013.01); *H01L 29/42356* (2013.01); *H01L 29/7869* (2013.01); *H01L 29/78651* (2013.01); *H01L 29/78696* (2013.01); *H01L 33/0041* (2013.01); *G02F 2201/121* (2013.01); *G02F 2201/123* (2013.01); *G09G 3/2074* (2013.01); *G09G 3/3614* (2013.01); *G09G 3/3677* (2013.01); *G09G 2300/0426* (2013.01); *G09G 2300/0452* (2013.01); *G09G 2300/0486* (2013.01); *G09G 2300/0814* (2013.01); *G09G 2300/0885* (2013.01); *G09G 2310/0235* (2013.01); *G09G 2320/0276* (2013.01); *G09G 2320/066* (2013.01); *G09G 2320/068* (2013.01); *G09G 2320/0626* (2013.01); *G09G 2320/106* (2013.01); *G09G 2330/021* (2013.01); *G09G 2340/0435* (2013.01); *G09G 2360/145* (2013.01); *H01L 2924/0002* (2013.01)

(58) Field of Classification Search
CPC ........... G02F 1/13624; G02F 1/134309; G02F 1/136213; G02F 1/13306; G02F 1/134336; G02F 1/1343; G02F 2201/123; G02F 2001/134345; G02F 2202/10; H01L 27/124; H01L 27/1214; H01L 27/3262; H01L 27/3276; H01L 27/3265; H01L 29/7869; H01L 29/78696; H01L 29/42384; H01L 29/786; H01L 29/41733; H01L 29/4908; H01L 29/78645; H01L 21/02565; H01L 21/02554; G09G 3/3677; G09G 3/3648; G09G 3/2074; G09G 2300/0426; G09G 2300/0809

See application file for complete search history.

(56) References Cited

U.S. PATENT DOCUMENTS

| | | |
|---|---|---|
| 5,412,493 A | 5/1995 | Kunii et al. |
| 5,448,258 A | 9/1995 | Edwards |
| 5,731,856 A | 3/1998 | Kim et al. |
| 5,744,864 A | 4/1998 | Cillessen et al. |
| 6,184,947 B1 | 2/2001 | Ozaki et al. |
| 6,294,274 B1 | 9/2001 | Kawazoe et al. |
| 6,486,930 B1 | 11/2002 | Kwon |
| 6,525,710 B1 | 2/2003 | Kwon |
| 6,563,174 B2 | 5/2003 | Kawasaki et al. |
| 6,727,522 B1 | 4/2004 | Kawasaki et al. |
| 6,936,845 B2 | 8/2005 | Kim et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,261 B2 | 11/2006 | Chiang et al. |
| 7,173,676 B2 | 2/2007 | Jeon et al. |
| 7,211,825 B2 | 5/2007 | Shih et al. |
| 7,282,782 B2 | 10/2007 | Hoffman et al. |
| 7,286,192 B2 | 10/2007 | Lin et al. |
| 7,297,977 B2 | 11/2007 | Hoffman et al. |
| 7,323,356 B2 | 1/2008 | Hosono et al. |
| 7,324,170 B2 | 1/2008 | Baek |
| 7,385,224 B2 | 6/2008 | Ishii et al. |
| 7,402,506 B2 | 7/2008 | Levy et al. |
| 7,411,209 B2 | 8/2008 | Endo et al. |
| 7,427,972 B2 | 9/2008 | Kim et al. |
| 7,429,981 B2 | 9/2008 | Shimoshikiryoh |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,499,133 B2 | 3/2009 | Hsu et al. |
| 7,501,293 B2 | 3/2009 | Ito et al. |
| 7,535,532 B2 | 5/2009 | Hsu et al. |
| 7,567,312 B2 | 7/2009 | Lin et al. |
| 7,576,720 B2 | 8/2009 | Lin et al. |
| 7,586,574 B2 | 9/2009 | Taguchi |
| 7,633,472 B2 | 12/2009 | Edwards |
| 7,674,650 B2 | 3/2010 | Akimoto et al. |
| 7,688,393 B2 | 3/2010 | Ueda et al. |
| 7,719,623 B2 | 5/2010 | Hsieh et al. |
| 7,719,653 B2 | 5/2010 | Taguchi |
| 7,732,819 B2 | 6/2010 | Akimoto et al. |
| 7,764,329 B2 | 7/2010 | Lee |
| 7,773,169 B2 | 8/2010 | Song |
| 7,782,346 B2 | 8/2010 | Akiyama |
| 7,791,072 B2 | 9/2010 | Kumomi et al. |
| 7,834,949 B2 | 11/2010 | Tasaka et al. |
| 7,852,302 B2 | 12/2010 | Chiang et al. |
| 7,876,410 B2 | 1/2011 | Hsu et al. |
| 7,898,626 B2 | 3/2011 | Hsu et al. |
| 7,903,221 B2 | 3/2011 | Taguchi |
| 7,907,131 B2 | 3/2011 | Su et al. |
| 7,936,431 B2 | 5/2011 | Baek |
| 7,944,534 B2 | 5/2011 | Tasaka et al. |
| 7,952,651 B2 | 5/2011 | Kimura |
| 8,094,281 B2 | 1/2012 | Taguchi |
| 8,102,493 B2 | 1/2012 | Li et al. |
| 8,154,495 B2 | 4/2012 | Hsu |
| 8,159,480 B2 | 4/2012 | Tajiri |
| 8,237,166 B2 | 8/2012 | Kumomi et al. |
| 8,310,424 B2 | 11/2012 | Irie et al. |
| 8,395,718 B2 | 3/2013 | Kimura |
| 8,654,069 B2 | 2/2014 | Mamba et al. |
| 8,723,773 B2 | 5/2014 | Tajiri |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0030460 A1 | 2/2005 | Kim et al. |
| 2005/0122441 A1 | 6/2005 | Shimoshikiryoh |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0060849 A1 | 3/2006 | Kim et al. |
| 2006/0091793 A1 | 5/2006 | Baude et al. |

(56) References Cited

U.S. PATENT DOCUMENTS

| | | |
|---|---|---|
| 2006/0103800 A1 | 5/2006 | Li et al. |
| 2006/0108529 A1 | 5/2006 | Saito et al. |
| 2006/0108584 A1 | 5/2006 | Song |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0164352 A1 | 7/2006 | Yoo et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0268186 A1 | 11/2006 | Kamada et al. |
| 2006/0274008 A1* | 12/2006 | Lin ............ G09G 3/3659 345/92 |
| 2006/0284171 A1 | 12/2006 | Levy et al. |
| 2006/0284172 A1 | 12/2006 | Ishii |
| 2006/0290827 A1 | 12/2006 | Kihara et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0064164 A1 | 3/2007 | Tasaka et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0036931 A1 | 2/2008 | Chan et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0278424 A1 | 11/2008 | Kim et al. |
| 2008/0296568 A1 | 12/2008 | Ryu et al. |
| 2008/0297676 A1 | 12/2008 | Kimura |
| 2009/0002586 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0063336 A1 | 3/2011 | Shih et al. |
| 2011/0170029 A1 | 7/2011 | Kimura |
| 2011/0187979 A1 | 8/2011 | Baek |
| 2012/0057117 A1 | 3/2012 | Li et al. |
| 2012/0229721 A1 | 9/2012 | Kimura |

FOREIGN PATENT DOCUMENTS

| | | |
|---|---|---|
| EP | 0597536 A | 5/1994 |
| EP | 1058232 A | 12/2000 |
| EP | 1058233 A | 12/2000 |
| EP | 1061498 A | 12/2000 |
| EP | 1737044 A | 12/2006 |
| EP | 1795948 A | 6/2007 |
| EP | 1818903 A | 8/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-309924 A | 12/1988 |
| JP | 02-042420 A | 2/1990 |
| JP | 03-053218 A | 3/1991 |
| JP | 05-251705 A | 9/1993 |
| JP | 05-265045 A | 10/1993 |
| JP | 06-214214 A | 8/1994 |
| JP | 06-265940 A | 9/1994 |
| JP | 07-013191 A | 1/1995 |
| JP | 08-264794 A | 10/1996 |
| JP | 09-073064 A | 3/1997 |
| JP | 11-505377 | 5/1999 |
| JP | 2000-044236 A | 2/2000 |
| JP | 2000-150900 A | 5/2000 |
| JP | 2001-027751 A | 1/2001 |
| JP | 2002-076356 A | 3/2002 |
| JP | 2002-289859 A | 10/2002 |
| JP | 2003-005214 A | 1/2003 |
| JP | 2003-084298 A | 3/2003 |
| JP | 2003-086000 A | 3/2003 |
| JP | 2003-086808 A | 3/2003 |
| JP | 2004-103957 A | 4/2004 |
| JP | 2004-213011 A | 7/2004 |
| JP | 2004-273614 A | 9/2004 |
| JP | 2004-273732 A | 9/2004 |
| JP | 2005-189804 A | 7/2005 |
| JP | 2006-500617 | 1/2006 |
| JP | 2006-091890 A | 4/2006 |
| JP | 2006-126842 A | 5/2006 |
| JP | 2006-133577 A | 5/2006 |
| JP | 2006-154755 A | 6/2006 |
| JP | 2006-165528 A | 6/2006 |
| JP | 2006-201344 A | 8/2006 |
| JP | 2006-209135 A | 8/2006 |
| JP | 2006-276582 A | 10/2006 |
| JP | 2006-330634 A | 12/2006 |
| JP | 2006-343733 A | 12/2006 |
| JP | 2007-096055 A | 4/2007 |
| JP | 2007-156429 A | 6/2007 |
| JP | 2007-264443 A | 10/2007 |
| JP | 2007-293158 A | 11/2007 |
| JP | 2008-040292 A | 2/2008 |
| JP | 2008-052244 A | 3/2008 |
| JP | 2008-076958 A | 4/2008 |
| JP | 2006/035887 | 5/2008 |
| JP | 2008-129607 A | 6/2008 |
| JP | 2008-241829 A | 10/2008 |
| WO | WO-2004/027748 | 4/2004 |
| WO | WO-2004/114391 | 12/2004 |
| WO | WO-2006/049245 | 5/2006 |

OTHER PUBLICATIONS

Hibino.Y et al., "Development of High Quality 65-In. LCD-TV", AM-LCD '05 Digest of Technical Papers, Jul. 6, 2005, pp. 103-106.

Kim.S, "66.1: Invited Paper: The World's Largest (82-In.) TFT-LCD", SID Digest '05 : SID International Symposium Digest of Technical Papers, May 24, 2005, vol. 36, pp. 1842-1847.

(56) References Cited

OTHER PUBLICATIONS

Kim.Y et al., "Data and Gate-Line Sharing Pixel Structure and Driving Method for Low Cost Poly-Si TFT-LCD", AM-FPD '06 Digest of Technical Papers, Jul. 5, 2006, pp. 123-126.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kitzerow.H et al., "Observation of Blue Phases in Chiral Networks", Liquid Crystals, 1993, vol. 14, No. 3, pp. 911-916.

Nakamura.M, "Synthesis of Homologous Compound with New Long-Period Structure", NIRIM Newsletter, Mar. 1, 1995, vol. 150, pp. 1-4.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Fortunato.E et al., "Wide-Bandgap High-Mobility ZnO Thin-Film Transistors Produced at Room Tempurature", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4-ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol 85, No. 11, pp. 1993-1995.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kurokawa.Y et al., "UHF RFCPUS on Flexible and Glass Substrates for Secure RFID Systems", Journal of Solid-State Circuits, 2008, vol. 43, No. 1, pp. 292-299.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1 pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

(56) References Cited

OTHER PUBLICATIONS

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Kikuchi.H et al., "62.2: Invited Paper:Fast Electro-Optical Switching in Polymer-Stabilized Liquid Crystalline Blue Phases for Display Application", SID DIgest '07 : SID International Symposium Digest of Technical Papers, 2007, vol. 38, pp. 1737-1740.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Kikuchi.H et al., "Polymer-Stabilized Liquid Crystal Blue Phases", Nature Materials, Sep. 2, 2002, vol. 1, pp. 64-68.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Clark.S et al., "First Principles Methods Using CASTEP", Zeitschrift fur Kristallographie, 2005, vol. 220, pp. 567-570.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Lee.H et al., "Current Status of, Challenges to, and Perspective View of AM-OLED", IDW '06 : Proceedings of the 13th International Display Workshops, Dec. 7, 2006, pp. 663-666.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.

\* cited by examiner 3901  3902

3911  3912

3921  3922

3931  3932

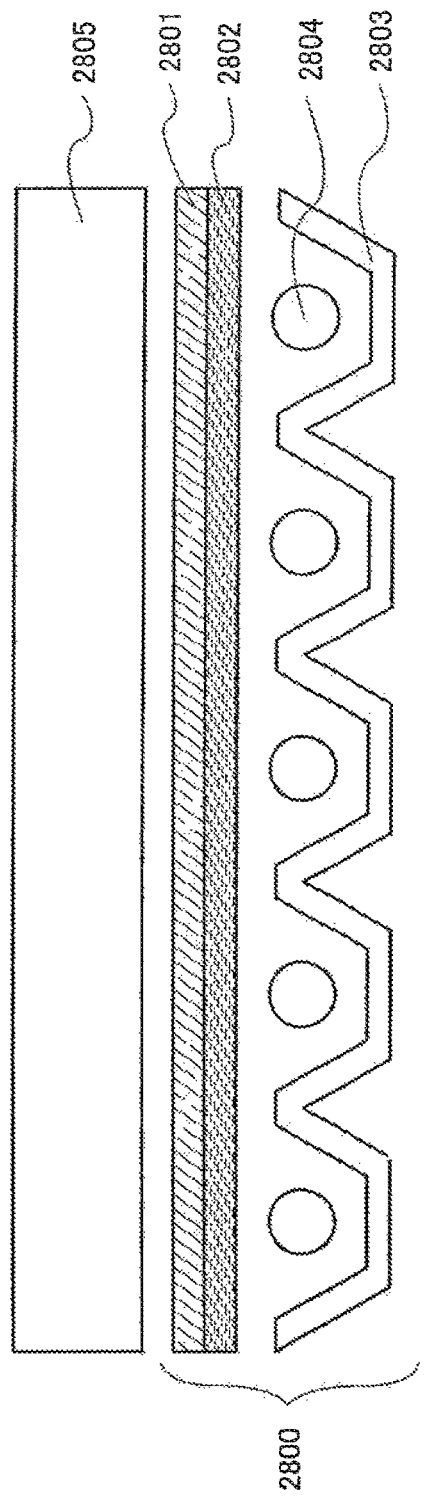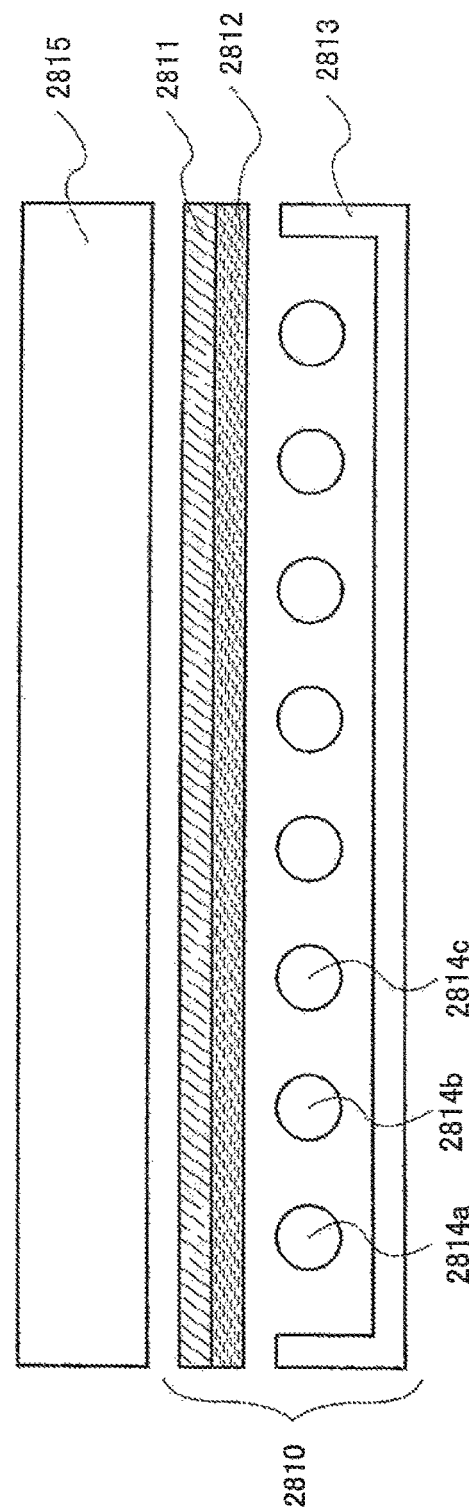

LIQUID CRYSTAL DISPLAY DEVICE

CROSS-REFERENCE TO RELATED APPLICATIONS

This application is a continuation of U.S. application Ser. No. 15/151,583, filed May 11, 2016, now allowed, which is a continuation of U.S. application Ser. No. 14/263,012, filed Apr. 28, 2014, now U.S. Pat. No. 9,341,908, which is a divisional of U.S. application Ser. No. 13/793,427, filed Mar. 11, 2013, now U.S. Pat. No. 8,711,314, which is a continuation of U.S. application Ser. No. 13/399,147, filed Feb. 17, 2012, now U.S. Pat. No. 8,395,718, which is a continuation of U.S. application Ser. No. 13/174,842, filed Jul. 1, 2011, now U.S. Pat. No. 8,120,721, which is a divisional of U.S. application Ser. No. 12/118,982, filed May 12, 2008, now U.S. Pat. No. 7,978,277, which claims the benefit of a foreign priority application filed in Japan as Serial No. 2007-132172 on May 17, 2007, all of which are incorporated by reference.

BACKGROUND OF THE INVENTION

1. Field of the Invention

The present invention relates to an object, a method, or a method to produce an object. The present invention particularly relates to a display device or a semiconductor device, and further relates to an electronic device including the display device in a display portion.

2. Description of the Related Art

Liquid crystal display devices are used for many kinds of electronic devices such as a mobile telephone, a television receiver, or the like, and many researches are done for further improving the quality.

While advantage of a liquid crystal display device is small size, light weight, and low power consumption compared to a CRT (cathode-ray tube), the problem of the liquid crystal display device is the narrow viewing angle. In recent years, many researches about a multi domain method, that is, an alignment division method are made for improving characteristics of viewing angle. For example, an MVA (multi-domain vertical alignment) mode which is combination of a VA (vertical alignment) mode and a multi-domain mode, a PVA (patterned vertical alignment) mode, and the like can be given.

In addition, researches are made in which one pixel is divided into a plurality of subpixels and the alignment state of liquid crystal in each subpixel is made different so as to improve the viewing angle characteristics (Reference 1: Japanese Published 6 Patent Application No. 2006-276582).

SUMMARY OF THE INVENTION

However, viewing angle characteristics are not enough, and further improvement is required as a display device. In view of this situation, it is an object of the present invention to provide a higher quality display device having excellent viewing angle characteristics.

FIG. 84 is an equivalent circuit diagram of one pixel included in a liquid crystal display device described in Reference 1. The pixel illustrated in FIG. 84 includes a TFT 30, a liquid crystal capacitance $L_1$, a liquid crystal capacitance $L_2$, a storage capacitor $C_1$, and a storage capacitor $C_2$, and is connected to a scan line 3a and a data line (signal line) 6a.

Although liquid crystal has a voltage holding property, the holding rate is not 100%, and there is concern about a leak by charge passing to liquid crystal. When the leak occurs in the pixel shown in FIG. 84, a constant potential state is lost by the law of conservation of charge at a node 11 which is closed by the storage capacitor $C_1$, the storage capacitor $C_2$, and the liquid crystal capacitance $L_2$, and the potential of the node 3. 11 becomes far different from the initial state which is before the leak occurs. Therefore, the transmittance of the liquid crystal capacitance $L_2$ changes from the transmittance which is determined by the image signal written in the data line 6a, that is, the potential based on the gray scale. As a result, desired gray scale can not be obtained, or the image quality is degraded. Thus, the display quality is gradually degraded in course of time, so that the life of products is shortened. Specifically, a display device of a normally black mode can not display black color, which leads to low contrast.

In view of the above mentioned problems, it is an object of the present invention to realize wide viewing angle display. Alternatively, it is another object to provide a display device which is excellent in contrast. Alternatively, it is another object to provide a display device higher display quality. Alternatively, it is another object to provide a display device which is less likely to be influenced by noise and can 16 perform clear display. Alternatively, it is another object to provide a display device in which display degradation is less likely to be caused. Alternatively, it is another object to provide a display device which has the long life time.

One aspect of the present invention is a liquid crystal display device including a pixel which has a first switch and a second switch controlled by a first scan line, a third switch controlled by the first scan line and a second scan line, a first resistor, a second resistor, a first liquid crystal element, and a second liquid crystal element. Each of the first liquid crystal element and the second liquid crystal element includes at least a pixel electrode, a common electrode, and a liquid crystal controlled by the pixel electrode and the common electrode, the pixel electrode of the first liquid crystal element is electrically connected to a first wiring through the first switch. The pixel electrode of the first liquid crystal element is electrically connected to the pixel electrode of the second liquid crystal element through the second switch and the first 6 resistor. The pixel electrode of the second liquid crystal element is electrically connected to a second wiring through the third switch and the second resistor. The common electrode of the first liquid crystal element is electrically connected to the common electrode of the second liquid crystal element.

Another aspect of the present invention is a liquid crystal display device including a pixel which has a first switch and a second switch controlled by a first scan line, a third switch controlled by the first scan line and a second scan line, a first resistor, a second resistor, a first liquid crystal element, a second liquid crystal element, a first storage capacitor, and a second storage capacitor. Each of the first liquid crystal element and the second liquid crystal element includes at least a pixel electrode, a common electrode, and a liquid crystal controlled by the pixel electrode and the common electrode. The pixel electrode of the first liquid crystal element is electrically connected to a first wiring through the first switch. The pixel electrode of the first liquid crystal element is electrically connected to the pixel electrode of the second liquid crystal element through the second switch and the first resistor. The pixel electrode of the second liquid crystal element is electrically connected to the second wiring through the third switch and the second resistor. The pixel electrode of the first liquid crystal element is electrically connected to the second wiring through the first storage capacitor. The pixel electrode of the second liquid crystal element is electrically connected to the second wiring through the second storage capacitor. The common electrode of the first liquid crystal element is electrically connected to the common electrode of the second liquid crystal element.

Another aspect of the present invention is a liquid crystal display device including a pixel which has a first switch controlled by a third scan line, a second switch controlled by a first scan line, a third switch controlled by the first scan line and a second scan line, a first resistor, a second resistor, a first liquid crystal element, and second liquid crystal element. Each of the first liquid crystal element and the second liquid crystal element includes at least a pixel electrode, a common electrode, and a liquid crystal controlled by the pixel electrode and the common electrode. The pixel electrode of the first liquid crystal element is electrically connected to a first wiring through the first switch. The pixel electrode of the first liquid crystal element is electrically connected to the pixel electrode of the second liquid crystal element through the second switch and the first resistor. The pixel electrode of the second liquid crystal element is electrically connected to a second wiring through the third switch and the second resistor. The common electrode of the first liquid crystal element is electrically connected to the common electrode of the second liquid crystal element.

Another aspect of the present invention is a liquid crystal display device including a pixel which has a first switch controlled by a third scan line, a second switch controlled by a first scan line, a third switch controlled by the first scan line and a second scan line, a first resistor, a second resistor, a first liquid crystal element, a second liquid crystal element, a first storage capacitor, and a second storage capacitor. Each of the first liquid crystal element and the second liquid crystal element includes at least a pixel electrode, a common electrode, and a liquid crystal controlled by the pixel electrode and the common electrode. The pixel electrode of the first liquid crystal element is electrically connected to a first wiring through the first switch. The pixel electrode of the first liquid crystal element is electrically connected to the pixel electrode of the second liquid crystal element through the second switch and the first resistor. The pixel electrode of the second liquid crystal element is electrically connected to a second wiring through the third switch and the second resistor. The pixel electrode of the first liquid crystal element is electrically connected to the second wiring through the first storage capacitor. The pixel electrode of the second liquid crystal element is electrically connected to the second wiring through the second storage capacitor. The common electrode of the first liquid crystal element is electrically connected to the common electrode of the second liquid crystal element.

Another aspect of the present invention is a liquid crystal display device in which resistance of the second resistor is higher than that of the first resistor in the foregoing structure.

Another aspect of the present invention is a liquid crystal display device including a pixel which has a switch controlled by a first scan line, a first transistor, a second transistor, a first liquid crystal element, a second liquid crystal element, a first storage capacitor, and a second storage capacitor. A gate electrode of the first transistor is electrically connected to the first scan line. The second transistor includes a third transistor of which gate electrode is electrically connected to the first scan line and a fourth transistor of which gate electrode is electrically connected to the second scan line, and the third transistor and the fourth transistor are connected in series. Each of the first liquid crystal element and the second liquid crystal element includes at least a pixel electrode, a common electrode, and a liquid crystal controlled by the pixel electrode and the common electrode. The pixel electrode of the first liquid crystal element is electrically connected to a first wiring through the switch. The pixel electrode of the first liquid crystal element is electrically connected to the pixel electrode of the second liquid crystal element through the first transistor. The pixel electrode of the second liquid crystal element is electrically connected to a second wiring through the second transistor. The pixel electrode of the first liquid crystal element is electrically connected to the second wiring through the first storage capacitor. The pixel electrode of the second liquid crystal element is electrically connected to the second wiring through the second storage capacitor. The common electrode of the first liquid crystal element is electrically connected to the common electrode of the second liquid crystal element.

Another aspect of the present invention is a liquid crystal display device including a pixel which has a first transistor, a second transistor, a third transistor, a first liquid crystal element, a second liquid crystal element, a first storage capacitor, and a second storage capacitor. A gate electrode of the first transistor and a gate electrode of the third transistor are electrically connected to a first scan line. The second transistor includes a fourth transistor of which gate electrode is electrically connected to the first scan line and a fifth transistor of which gate electrode is electrically connected to the second scan line, and the fourth transistor and the fifth transistor are connected in series. Each of the first liquid crystal element and the second liquid crystal element includes at least a pixel electrode, a common electrode, and a liquid crystal controlled by the pixel electrode and the common electrode. The pixel electrode of the first liquid crystal element is electrically connected to a first wiring through the third transistor. The pixel electrode of the first liquid crystal element is electrically connected to the pixel electrode of the second liquid crystal element through the first transistor. The pixel electrode of the second liquid crystal element is electrically connected to a second wiring through the second transistor. The pixel electrode of the first liquid crystal element is electrically connected to the second wiring through the first storage capacitor. The pixel electrode of the second liquid crystal element is electrically connected to the second wiring through the second storage capacitor. The common electrode of the first liquid crystal element is electrically connected to the common electrode of the second liquid crystal element.

Another aspect of the present invention is the liquid crystal display device, in which, when W represents the channel width of a transistor and L represents the channel length of a transistor, W/L of the third transistor is smaller than W/L of the first transistor or the second transistor in the foregoing structure.

Another aspect of the present invention is in the liquid crystal display device, in which, when W represents the channel width of a transistor and L represents channel length of a transistor, W/L of the second transistor is larger than W/L of the first transistor in the foregoing structure.

Note that as the display device of the present invention, an active matrix display device such as a liquid crystal display device, a light-emitting device provided with a light-emitting element typified by an organic light-emitting element (OLED) in each pixel, a DMD (digital micromirror device), a PDP (plasma display panel), or an FED (field emission display) is included in its category. In addition, a passive matrix display device is included in its category.

Note that various types of switches can be used as a switch. An electrical switch, a mechanical switch, and the like are given as examples. That is, any element can be used as long as it can control a current flow, without limiting to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used as a switch. Alternatively, a logic circuit combining such elements can be used as a switch.

An example of a mechanical switch is a switch formed using MEMS (micro electro mechanical system) technology, such as a digital micromirror device (DMD). Such a switch includes an electrode which can be moved mechanically, and operates by controlling connection and non-connection based on movement of the electrode.

In the case of using a transistor as a switch, polarity (a conductivity type) of the transistor is not particularly limited because it operates just as a switch. However, a transistor of polarity with smaller off-current is preferably used when off-current is to be suppressed. Examples of a transistor with smaller off-current are a transistor provided with an LDD region, a transistor with a multi-gate structure, and the like. In addition, it is preferable that an N-channel transistor be used when a potential of a source terminal is closer to a potential of a low-potential-side power supply (e.g., Vss, GND, or 0 V), while a P-channel transistor be used when the potential of the source terminal is closer to a potential of a high-potential-side power supply (e.g., Vdd). This is because the absolute value of gate-source voltage can be increased when the potential of the source terminal is closer to a potential of a low-potential-side power supply in an N-channel transistor and when the potential of the source terminal is closer to a potential of a high-potential-side power supply in a P-channel transistor, so that the transistor can be easily operated as a switch. In addition, this is also because the transistor does not often perform a source follower operation, so that reduction in output voltage does not often occur.

Note that a CMOS switch may be used as a switch by using both N-channel and P-channel transistors. When a CMOS switch is used, the switch can more precisely operate as a switch because current can flow when either the P-channel transistor or the N-channel transistor is turned on. For example, voltage can be appropriately output regardless of whether voltage of an input signal to the switch is high or low. In addition, since a voltage amplitude value of a signal for turning on or off the switch can be made smaller, power consumption can be reduced.

Note that when a transistor is used as a switch, the switch includes an input terminal (one of a source terminal and a drain terminal), an output terminal (the other of the source terminal and the drain terminal), and a terminal for controlling conduction (a gate terminal). On the other hand, when a diode is used as a switch, the switch does not have a terminal for controlling conduction in some cases. Therefore, when a diode is used as a switch, the number of wirings for controlling terminals can be further reduced compared to the case of using a transistor as a switch.

Note that when it is explicitly described that "A and B are connected", the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Accordingly, another element may be interposed between elements having a connection relation shown in drawings and texts, without limiting to a predetermined connection relation, for example, the connection relation shown in the drawings and the texts.

For example, in the case where A and B are electrically connected, one or more elements which enable electric connection between A and B (e.g., a switch, a transistor, a capacitor, an inductor, a resistor, and/or a diode) may be provided between A and B. In addition, in the case where A and B are functionally connected, one or more circuits which enable functional connection between A and B (e.g., a logic circuit such as an inverter, a NAND circuit, or a NOR circuit, a signal converter circuit such as a DA converter circuit, an AD converter circuit, or a gamma correction circuit, a potential level converter circuit such as a power supply circuit (e.g., a dc-dc converter, a step-up dc-dc converter, or a step-down dc-dc converter) or a level shifter circuit for changing a potential level of a signal, a voltage source, a current source, a switching circuit, or an amplifier circuit such as a circuit which can increase signal amplitude, the amount of current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be directly connected without interposing another element or another circuit therebetween.

Note that when it is explicitly described that "A and B are directly connected", the case where A and B are directly connected (i.e., the case where A and B are connected without interposing another element or another circuit theerebetween) and the case where A and B are electrically connected (i.e., the case where A and B are connected by interposing another element or another circuit therebetween) are included therein.

Note that when it is explicitly described that "A and B are electrically connected", the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included therein. That is, when it is explicitly described that "A and B are electrically connected", the description is the same as the case where it is explicitly only described that "A and B are connected".

Note that a display element, a display device which is a device having a display element, a light-emitting element, and a light-emitting device which is a device having a light-emitting element can use various types and can include various elements. For example, a display medium, whose contrast, luminance, reflectivity, transmittivity, or the like changes by an electromagnetic action, such as an EL element (e.g., an EL element including organic and inorganic materials, an organic EL element, or an inorganic EL element), an electron emitter, a liquid crystal element, electronic ink, an electrophoresis element, a grating light valve (GLV), a plasma display panel (PDP), a digital micromirror device (DMD), a piezoelectric ceramic display, or a carbon nanotube can be used as a display element, a display device, a light-emitting element, or a light-emitting device. Note that display devices using an EL element include an EL display; display devices using an electron emitter include a field emission display (FED), an SED-type flat panel display (SED: surface-conduction electron-emitter display), and the like; display devices using a liquid crystal element include a liquid crystal display (e.g., a transmissive liquid crystal display, a transflective liquid crystal display, a reflective liquid crystal display, a direct-view liquid crystal display, or a projection liquid crystal display); and display devices using electronic ink or an electrophoresis element include electronic paper.

Note that an EL element is an element having an anode, a cathode, and an EL layer interposed between the anode and the cathode. Note that as an EL layer, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed of an organic material, a layer formed of an inorganic material, a layer formed of an organic material and an inorganic material, a layer including a high-molecular material, a layer including a low molecular material, a layer including a low-molecular material and a high-molecular material, or the like can be used. Note that the present invention is not limited to this, and various EL elements can be used as an EL element.

Note that an electron emitter is an element in which electrons are extracted by high electric field concentration on a pointed cathode. For example, as an electron emitter, a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a surface conduction emitter SCD type, a thin film type in which a metal, an insulator, a semiconductor, and a metal are stacked, a HEED type, an EL type, a porous silicon type, a surface-conduction (SED) type, or the like can be used. However, the present invention is not limited to this, and various elements can be used as an electron emitter.

Note that a liquid crystal element is an element which controls transmission or non-transmission of light by optical modulation action of a liquid crystal and includes a pair of electrodes and a liquid crystal. Note that optical modulation action of a liquid crystal is controlled by an electric filed applied to the liquid crystal (including a horizontal electric field, a vertical electric field, and an oblique electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and the like. Note that the present invention is not limited to this, and various liquid crystal elements and driving methods can be used as a liquid crystal element and a driving method thereof.

Note that electronic paper corresponds to a device which displays an image by molecules which utilize optical anisotropy, dye molecular orientation, or the like; a device which displays an image by particles which utilize electrophoresis, particle movement, particle rotation, phase change, or the like; a device which displays an image by moving one end of a film; a device which displays an image by using coloring properties or phase change of molecules; a device which displays an image by using optical absorption by molecules; and a device which displays an image by using self-light emission by bonding electrons and holes. For example, the following can be used for electronic paper: microcapsule electrophoresis, horizontal electrophoresis, vertical electrophoresis, a spherical twisting ball, a magnetic twisting ball, a columnar twisting ball, a charged toner, electro liquid powder, magnetic electrophoresis, a magnetic thermosensitive type, an electrowetting type, a light-scattering (transparent-opaque change) type, a cholesteric liquid crystal and a photoconductive layer, a cholesteric liquid crystal device, a bistable nematic liquid crystal, a ferroelectric liquid crystal, a liquid crystal dispersed type with a dichroic dye, a movable film, coloring and decoloring properties of a leuco dye, a photochromic material, an electrochromic material, an electrodeposition material, flexible organic EL, and the like. Note that the present invention is not limited to this, and a variety of electronic paper can be used as electronic paper. Here, when microcapsule electrophoresis is used, defects of electrophoresis, which are aggregation and precipitation of phoresis particles, can be solved. Blectro liquid powder has advantages such as high-speed response, high reflectivity, wide viewing angle, low power consumption, and memory properties.

Note that a plasma display has a structure in which a substrate having a surface provided with an electrode and a substrate having a surface provided with an electrode and a minute groove in which a phosphor layer is formed face each other at a narrow interval and a rare gas is sealed therein. Note that display can be performed by applying voltage between the electrodes to generate an ultraviolet ray so that a phosphor emits light. Note that the plasma display may be a DC-type PDP or an AC-type PDP. For the plasma display, AWS (address while sustain) driving, ADS (address display separated) driving in which a subframe is divided into a reset period, an address period, and a sustain period, CLEAR (low energy address and reduction of false contour sequence) driving. ALIS (alternate lighting of surfaces) method, TERES (technology of reciprocal sustainer) driving, or the like can be used. Note that the present invention is not limited to this, and various plasma displays can be used as a plasma display panel.

Note that electroluminescence, a cold cathode fluorescent lamp, a hot cathode fluorescent lamp, an LED, a laser light source, a mercury lamp, or the like can be used as a light source of a display device in which a light source is necessary, such as a liquid crystal display (a transmissive liquid crystal display, a transflective liquid crystal display, a reflective liquid crystal display, a direct-view liquid crystal display, or a projection liquid crystal display), a display device using a grating light valve (GLV), or a display device using a digital micromirror device (DMD). Note that the present invention is not limited to this, and various light sources can be used as a light source.

Note that various types of transistors can be used as a transistor, without limiting to a certain type. For example, a thin film transistor (TFT) including a non-single crystal semiconductor film typified by amorphous silicon, polycrystalline silicon, microcrystalline (also referred to as semi-amorphous) silicon, or the like can be used. In the case of using the TFT, there are various advantages. For example, since the TFT can be formed at temperature lower than that of the case of using single-crystal silicon, manufacturing cost can be reduced or a manufacturing apparatus can be made larger. Since the manufacturing apparatus is made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Accordingly, transmission of light in a display element can be controlled by using the transistor formed using the light-transmitting substrate. Alternatively, part of a film which forms the transistor can transmit light because the film thickness of the transistor is thin. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction 16 circuit, or a DA converter circuit) can be formed over the same substrate as a pixel portion.

Note that when a catalyst (e.g., nickel) is used in the case of forming microcrystalline silicon, crystallinity can be further improved and a transistor having excellent electric characteristics can be formed. At this time, crystallinity can be improved by just performing heat treatment without performing laser light irradiation. Accordingly, a gate driver circuit (e.g., a scan line driver circuit) and part of a source driver circuit (e.g., an analog switch) can be formed over the same substrate. In addition, in the case of not performing laser light irradiation for crystallization, crystallinity unevenness of silicon can be suppressed. Therefore, a clear image can be displayed.

Note that polycrystalline silicon and microcrystalline silicon can be formed without using a catalyst (e.g., nickel).

Note that it is preferable that crystallinity of silicon be improved to polycrystal, microcrystal, or the like in the whole panel; however, the present invention is not limited to this. Crystallinity of silicon may be improved only in part of the panel. Selective increase in crystallinity can be achieved by selective laser irradiation or the like. For example, only a peripheral driver circuit region excluding pixels may be irradiated with laser light. Alternatively, only a region of a gate driver circuit, a source driver circuit, or the like may be irradiated with laser light. Further alternatively, only part of a source driver circuit (e.g., an analog switch) may be irradiated with laser light. Accordingly, crystallinity of silicon can be improved only in a region in which a circuit needs to be operated at high speed. Since a pixel region is not particularly needed to be operated at high speed, even if crystallinity is not improved, the pixel circuit can be operated without problems. Since a region, crystallinity of which is improved, is small, manufacturing steps can be decreased, throughput can be increased, and manufacturing cost can be reduced. Since the number of necessary manufacturing apparatus is small, manufacturing cost can be reduced.

A transistor can be formed by using a semiconductor substrate, an SOI substrate, or the like. Thus, a transistor with few variations in characteristics, sizes, shapes, or the like, with high current supply capacity, and with a small size can be formed. When such a transistor is used, power consumption of a circuit can be reduced or a circuit can be highly integrated.

A transistor including a compound semiconductor or an oxide semiconductor such as ZnO, a-InGaZnO, SiGe, GaAs, IZO, ITO, or SnO, a thin film transistor obtained by thinning such a compound semiconductor or an oxide semiconductor, or the like can be used. Thus, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor formed by using an inkjet method or a printing method, or the like can be used. Accordingly, a transistor can be formed at room temperatme, can be formed at a low vacuum, or can be formed using a large substrate. In addition, since the transistor can be formed without using a mask (a reticle), a layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

A transistor including an organic semiconductor or a carbon nanotube, or the like can be used. Accordingly, such a transistor can be formed using a substrate which can be bent. Therefore, such a device can resist a shock.

Further, transistors with various structures can be used. For example, a MOS transistor, a junction transistor, a bipolar transistor, or the like can be used as a transistor. When a MOS transistor is used, the size of the transistor can be reduced. Thus, a large number of transistors can be mounted. When a bipolar transistor is used, large current can flow. Thus, a circuit can be operated at high speed.

Note that a MOS transistor, a bipolar transistor, and the like may be formed over one substrate. Thus, reduction in power consumption, reduction in size, high speed operation, and the like can be realized.

Furthermore, various transistors can be used.

Note that a transistor can be formed using various types of substrates without limiting to a certain type. For example, a single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate over which a transistor is formed. Alternatively, a skin (e.g., epidermis or corium) or hypodermal tissue of an animal such as a human being can be used as a substrate. Further alternatively, the transistor may be formed using one substrate, and then, the transistor may be transferred to another substrate, and the transistor may be provided over another substrate. A single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transfeired. Alternatively, a skin (e.g., epidermis or corium) or hypodermal tissue of an animal such as a human being can be used as a substrate. Further alternatively, the transistor may be formed using one substrate and the substrate may be thinned by polishing. A single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human being can be used as a substrate to be polished. When such a substrate is used, a transistor with excellent properties or a transistor with low power consumption can be formed, a device with high durability, high heat resistance can be provided, or reduction in weight or thickness can be achieved.

Note that a structure of a transistor can be various modes without limiting to a certain structure. For example, a multi-gate structure having two or more gate electrodes may be used. When the multi-gate structure is used, a structure where a plurality of transistors are connected in series is provided because channel regions are connected in series. With the multi-gate structure, off-current can be reduced or the withstand voltage of the transistor can be increased to improve reliability. Alternatively, with the multi-gate structure, drain-source current does not fluctuate very much even if drain-source voltage fluctuates when the transistor operates in a saturation region, so that a flat slope of voltage-current characteristics can be obtained. When the flat slope of the voltage-current characteristics is utilized, an ideal current source circuit or an active load having an extremely high resistance value can be realized. Accordingly, a differential circuit or a current mirror circuit having excellent properties can be realized. In addition, a structure where gate electrodes are formed above and below a channel may be used. When the structure where gate electrodes are formed above and below the channel is used, a channel region is increased, so that the amount of current flowing therethrough can be increased or a depletion layer can be easily formed to decrease subthreshold swing. When the gate electrodes are formed above and below the channel, a structure where a plurality of transistors are connected in parallel is provided.

Alternatively, a structure where a gate electrode is formed above a channel region, a structure where a gate electrode is formed below a channel region, a staggered structure, an inversely staggered structure, a structure where a channel region is divided 6 into a plurality of regions, or a structure where channel regions are connected in parallel or in series can be used. Further alternatively, a source electrode or a drain electrode may overlap with a channel region (or part of it). When the structure where the source electrode or the drain electrode may overlap with the channel region (or part of it) is used, the case can be prevented in which electric charges are accumulated in part of the channel region, which would result in an unstable operation. Further alternatively, an LDD region may be provided. When the LDD region is provided, off-current can be reduced or the withstand voltage of the transistor can be increased to improve reliability. Further, when the LDD region is provided, drain-source current does not fluctuate very much even if drain-source voltage fluctuates when the transistor operates in the saturation region, so that a flat slope of voltage-current characteristics can be obtained.

Note that various types of transistors can be used as a transistor and the transistor can be formed using various types of substrates. Accordingly, all the circuits that are necessary to realize a predetermined function may be formed using the same substrate. For example, all the circuits that are necessary to realize the predetermined function may be formed using a glass substrate, a plastic substrate, a single-crystal substrate, an SOI substrate, or any other substrate. When all the circuits that are necessary to realize the predetermined function are formed using the same substrate, cost can be reduced by reduction in the number of component parts or reliability can be improved by reduction in the number of connections to circuit components. Alternatively, part of the circuits which are necessary to realize the predetermined function may be formed using one substrate and another part of the circuits which are necessary to realize the predetermined function may be formed using another substrate. That is, not all the circuits that are necessary to realize the predetermined function are required to be formed using the same substrate. For example, part of the circuits which are necessary to realize the predetermined function may be formed by transistors using a glass substrate and another part of the circuits which are necessary to realize the predetermined function may be formed over a single-crystal substrate, so that an IC chip formed by a transistor over the single-crystal substrate may be connected to the glass substrate by COG (chip on glass) and the IC chip may be provided over the glass substrate. Alternatively, the IC chip may be connected to the glass substrate by TAB (tape automated bonding) or a printed wiring board. When part of the circuits are formed using the same substrate in this manner, cost can be reduced by reduction in the number of component parts or reliability can be improved by reduction in the number of connections to circuit components. Further alternatively, when circuits with high driving voltage and high driving frequency, which consume large power, are formed over a single-crystal semiconductor substrate instead of forming such circuits using the same substrate and an IC chip formed by the circuit is used, increase in power consumption can be prevented.

Note that one pixel corresponds to one element whose brightness can be controlled. Therefore, for example, one pixel corresponds to one color element and brightness is expressed with the one color element. Accordingly, in the case of a color display device having color elements of R (red), G (green), and B (blue), a minimum unit of an image is formed of three pixels of an R pixel, a G pixel, and a B pixel. Note that the color elements are not limited to three colors, and color elements of more than three colors may be used or a color other than RGB may be used. For example, RGBW (W corresponds to white) may be used by adding white. Alternatively, one or more colors of yellow, cyan, magenta emerald green, vermilion, and the like may be added to RGB. Further alternatively, a color similar to at least one of R, G, and B may be added to RGB. For example, R, G, B1, and B2 may be used. Although both B1 and B2 are blue, they have slightly different frequency. Similarly, R1, R2, G, and B may be used. When such color elements are used, display which is closer to the real object can be performed and power consumption can be reduced. As another example, in the case of controlling brightness of one color element by using a plurality of regions, one region may correspond to one pixel. Therefore, for example, in the case of performing area ratio gray scale display or the case of including a subpixel, a plurality of regions which control brightness are provided in each color element and gray scales are expressed with the whole regions. In this case, one region which controls brightness may correspond to one pixel. Thus, in that case, one color element includes a plurality of pixels. Alternatively, even when the plurality of regions which control brightness are provided in one color element, these regions may be collected as one pixel. Thus, in that case, one color element includes one pixel. In that case, one color element includes one pixel. Further alternatively, in the case where brightness is controlled in a plurality of regions in each color element, regions which contribute to display have different area dimensions depending on pixels in some cases. Further alternatively, in the plurality of regions which control brightness in each color element, signals supplied to each of the plurality of regions may be slightly varied to widen viewing angle characteristics. That is, potentials of pixel electrodes included in the plurality of regions provided in each color element may be different from each other. Accordingly, voltage applied to liquid crystal molecules are varied depending on the pixel electrodes. Therefore, the viewing angle can be widened.

Note that explicit description "one pixel (for three colors)" corresponds to the case where three pixels of R, G, and B are considered as one pixel. Meanwhile, explicit description "one pixel (for one color)" corresponds to the case where the plurality of regions are provided in each color element and collectively considered as one pixel.

Note that in this document (the specification, the claim, the drawing, and the like), pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Thus, for example, in the case of performing full color display with three color elements (e.g., RGB), the following cases are included therein: the case where the pixels are arranged in stripes and the case where dots of the three color elements are arranged in a delta patter. In addition, the case is also included therein in which dots of the three color elements are provided in Bayer arrangement. Note that the color elements are not limited to three colors, and color elements of more than three colors may be used. For example, RGBW (W corresponds to white), RGB plus one or more of yellow, cyan, and magenta, or the like may be used. Further, the sizes of display regions may be different between respective dots of color elements. Thus, power consumption can be reduced or the life of a display element can be prolonged.

Note that an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Further, since the size of the element is small, the aperture ratio can be improved, so that power consumption can 16 be reduced or high luminance can be achieved.

Note that as a method other than an active matrix method, a passive matrix method in which an active element (a non-linear element) is not used can also be used. Since an active element (a non-linear element) is not used, manufacturing steps is few, so that manufacturing cost can be reduced or the yield can be improved. Further, since an active element (a non-linear element) is not used, the aperture ratio can be improved, so that power consumption can be reduced or high luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Therefore, in this document (the specification, the claim, the drawing, and the like), a region functioning as a source and a drain may not be called the source or the drain. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be called a drain region.

Note that a transistor may be an element having at least three terminals of a base, an emitter, and a collector. In this case, one of the emitter and the collector may be similarly referred to as a first terminal and the other terminal may be referred to as a second terminal.

Note that a gate corresponds to all or part of a gate electrode and a gate wiring (also referred to as a gate line, a gate signal line, a scan line, a scan signal line, or the like). A gate electrode corresponds to a conductive film which overlaps with a semiconductor which forms a channel region with a gate insulating film interposed therebetween. Note that part of the gate electrode overlaps with an LDD (lightly doped drain) region or the source region (or the drain region) with the gate insulating film interposed therebetween in some cases. A gate wiring corresponds to a wiring for connecting a gate electrode of each transistor to each other, a wiring for connecting a gate electrode of each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be referred to as either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be referred to as either a gate electrode or a gate wiring.

Note that a portion (a region, a conductive film, a wiring, or the like) which is formed using the same material as a gate electrode, forms the same island as the gate electrode, and is connected to the gate electrode may also be referred to as a gate electrode. Similarly, a portion (a region, a conductive film, a wiring, or the like) which is formed using the same material as a gate wiring, forms the same island as the gate wiring, and is connected to the gate wiring may also be referred to as a gate wiring. In a strict detect, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive film, a wiring, or the like) may also be referred to as either a gate electrode or a gate wiring.

Note that in a multi-gate transistor, for example, a gate electrode is often connected to another gate electrode by using a conductive film which is formed using the same material as the gate electrode. Since such a portion (a region, a conductive film, a wiring, or the like) is a portion (a region, a conductive film, a wiring, or the like) for connecting the gate electrode to another gate electrode, it may be referred to as a gate wiring, and it may also be referred to as a gate electrode because a multi-gate transistor can be considered as one transistor. That is, a portion (a region, a conductive film, a wiring, or the like) which is formed using the same material as a gate electrode or a gate wiring, forms the same island as the gate electrode or the gate wiring, and is connected to the gate electrode or the gate wiring may be referred to as either a gate electrode or a gate wiring. In addition, for example, part of a conductive film which connects the gate electrode and the gate wiring and is formed using a material which is different from that of the gate electrode or the gate wiring may also be referred to as either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

Note that when a wiring is referred to as a gate wiring, a gate line, a gate signal line, a scan line, a scan signal line, there is the case in which a gate of a transistor is not connected to a wiring. In this case, the gate wiring, the gate line, the gate signal line, the scan line, or the scan signal line corresponds to a wiring formed in the same layer as the gate of the transistor, a wiring formed using the same material of the gate of the transistor, or a wiring formed at the same time as the gate of the transistor in some cases. As examples, there are a wiring for a storage capacitor, a power supply line, a reference potential supply line, and the like.

Note that a source corresponds to all or part of a source region, a source electrode, and a source wiring (also referred to as a source line, a source signal line, a data line, a data signal line, or the like). A source region corresponds to a semiconductor region including a large amount of p-type impurities (e.g., boron or gallium) or n-type impurities (e.g., phosphorus or arsenic). Therefore, a region including a small amount of p-type impurities or n-type impurities, namely, an LDD (lightly doped drain) region is not included in the source region. A source electrode is part of a conductive layer which is formed using a material different from that of a source region and is electrically connected to the source region. However, there is the case where a source electrode and a source region are collectively referred to as a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be referred to as either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be referred to as either a source electrode or a source wiring.

Note that a portion (a region, a conductive film, a wiring, or the like) which is formed using the same material as a source electrode, forms the same island as the source electrode, and is connected to the source electrode, or a portion (a region, a conductive film, a wiring, or the like) which connects a source electrode and another source electrode may also be referred to as a source electrode. Further, a portion which overlaps with a source region may be referred to as a source electrode. Similarly, a portion (a region, a conductive film, a wiring, or the like) which is formed using the same material as a source wiring, forms the same island as the source wiring, and is connected to the source wiring may also be referred to as a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed using the same material as a source electrode or a source wiring, forms the same island as the source electrode or the source wiring, and is connected to the source electrode or the source wiring because of specifications or the like in manufacturing. Thus, such a portion (a region, a conductive film, a wiring, or the like) may also be referred to as either a source electrode or a source wiring.

For example, part of a conductive film which connects a source electrode and a source wiring and is formed using a material which is different from that of the source electrode or the source wiring may be referred to as either a source electrode or a source wiring.

Note that a source terminal corresponds to part of a source region, a source electrode, or a portion (a region, a conductive film, a wiring, or the like) which is electrically connected to the source electrode.

Note that when a wiring is referred to as a source wiring, a source line, a source signal line, a data line, a data signal line, there is the case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed using the same material of the source (the drain) of the transistor, or a wiring formed at the same time as the source (the drain) of the transistor in some cases. As examples, there are a wiring for a storage capacitor, a power supply line, a reference potential supply line, and the like.

Note that the same can be said for a drain.

Note that a semiconductor device corresponds to a device having a circuit including a semiconductor element (e.g., a transistor, a diode, or a thyristor). The semiconductor device may also include all devices that can function by utilizing semiconductor characteristics. In addition, the semiconductor device corresponds to a device having a semiconductor material.

Note that a display element corresponds to an optical modulation element, a liquid crystal element, a light-emitting element, an EL element (an organic EL element, an inorganic EL element, or an EL element including organic and inorganic materials), an electron emitter, an electrophoresis element, a discharging element, a light-reflective element, a light diffraction element, a digital micromirror device (DMD), or the like. Note that the present invention is not limited to this.

Note that a display device corresponds to a device having a display element. The display device may include a plurality of pixels each having a display element. Note that that the display device may also include a peripheral driver circuit for driving the plurality of pixels. The peripheral driver circuit for driving the plurality of pixels may be formed over the same substrate as the plurality of pixels. The display device may also include a peripheral driver circuit provided over a substrate by wire bonding or bump bonding, namely, an IC chip connected by chip on glass (COG) or an IC chip connected by TAB or the like. Further, the display device may also include a flexible printed circuit (FPC) to which an IC chip, a resistor, a capacitor, an inductor, a transistor, or the like is attached. Note also that the display device includes a printed wiring board (PWB) which is connected through a flexible printed circuit (FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a lighting device corresponds to a device having a backlight unit, a light guide plate, a prism sheet, a diffusion sheet, a reflective sheet, or a light source (e.g., an LED, a cold cathode fluorescent lamp, or a hot cathode fluorescent lamp), a cooling device, or the like.

Note that a light-emitting device corresponds to a device having a light-emitting element and the like. In the case of including a light-emitting element as a display element, the light-emitting device is one of specific examples of a display device.

Note that a reflective device corresponds to a device having a light-reflective element, a light diffraction element, a light-reflective electrode, or the like.

Note that a liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device corresponds to a device having a semiconductor element, an electric circuit, or an electronic circuit. For example, a transistor which controls input of a signal from a source signal line to a pixel (also referred to as a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also referred to as a gate driver, a gate line driver circuit, or the like), a circuit which supplies a signal to a source signal line (also referred to as a source driver, a source line driver circuit, or the like) are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Note that when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that "a layer B is formed on (or over) a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Similarly, when it is explicitly described that "B is formed above A", it does not necessarily mean that B is formed in direct contact with A, and another object may be interposed therebetween. Thus, for example, when it is described that "a layer B is formed above a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Note that when it is explicitly described that "B is formed in direct contact with A", it includes not the case where another object is interposed between A and B but the case where B is formed in direct contact with A.

Note that the same can be said when it is described that B is formed below or under A.

Note that when an object is explicitly described in a singular form, the object is preferably singular. Note that the present invention is not limited to this, and the object can be plural. Similarly, when an object is explicitly described in a plural form, the object is preferably plural. Note that the present invention is not limited to this, and the object can be singular.

By the present invention, a wide viewing angle display can be realized. Alternatively, a display device which is excellent in contrast can be obtained. Alternatively, a display device higher display quality can be obtained. Alternatively, a display device which is less likely to be influenced by noise and can perform clear display can be provided. Alternatively, a display device in which display degradation is less likely to be caused can be provided. Alternatively, a display device which has the long life time can be provided.

BRIEF DESCRIPTION OF THE DRAWINGS

In the accompanying drawings:

FIGS. 41A and 41B are diagrams showing examples of a peripheral component of a display device of the present invention;

DETAILED DESCRIPTION OF THE INVENTION

Figure 1:
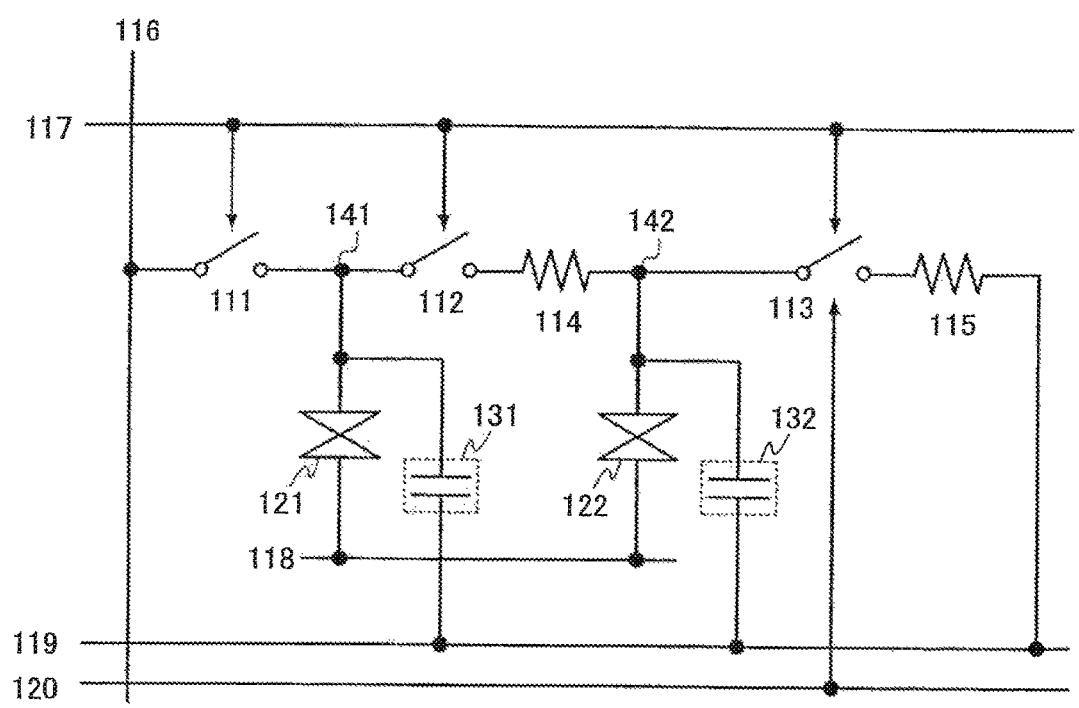
FIG. 1 is a diagram showing an example of a pixel structure of the present invention.

Hereinafter one mode of the present invention is described. The present invention can be carried out in many different modes. It is easily understood by those 6 skilled in the art that modes and details herein disclosed can be modified in various ways without departing from the purpose and the scope of the present invention. Accordingly, the present invention should not be interpreted as being limited to the embodiment modes and embodiments. Note that, in a structure of the present invention which will be explained below, like reference numerals may be used for like portions throughout the drawings and the description is omitted.

Embodiment Mode 1

A basic configuration of a pixel of the present invention is described with reference to FIG. 1. A pixel shown in FIG. 1 includes a first switch 111, a second switch 112, a third switch 113, a first resistor 114, a second resistor 115, a first liquid crystal element 121, a second liquid crystal element 122, a first storage capacitor 131, and a second storage capacitor 132. In addition, the pixel is connected to a signal line 116, a first scan line 117, a second scan line 120, and a Cs line 119. Note that each of the first liquid crystal element 121 and the second liquid crystal element 122 includes at least a pixel electrode, a common electrode 118, and liquid crystal controlled by the pixel electrode and the common electrode 118.

In FIG. 1, the pixel electrode of the first liquid crystal element 121 is connected to the signal line 116 through the first switch 111. In addition, the pixel electrode of the first liquid crystal element 121 is connected to the pixel electrode of the second liquid crystal element 122 through the second switch 112 and the first resistor 114. When a connection portion of the first resistor 114 and the pixel electrode of the second liquid crystal element 122 is a node 142, the node 142 is connected to the Cs line 119 through the third switch 113 and the second resistor 115. In addition, a connection portion of the second switch 112 and a wiring which connects the first pixel electrode of liquid crystal element 121 to the first switch 111 is a node 141.

Note that on/off of the first switch 111 and the second switch 112 is controlled by a signal input to the first scan line 117, and on/off of the third switch 113 is controlled by both signals input to the first scan line 117 and the second scan line 120. Although the case where each switch is controlled by using scan line is described here, control method of the switch is not limited to this.

An image signal corresponding to a video signal, in other words, a potential based on the gray scale of the pixel is input to the signal line 116.

Figure 77:
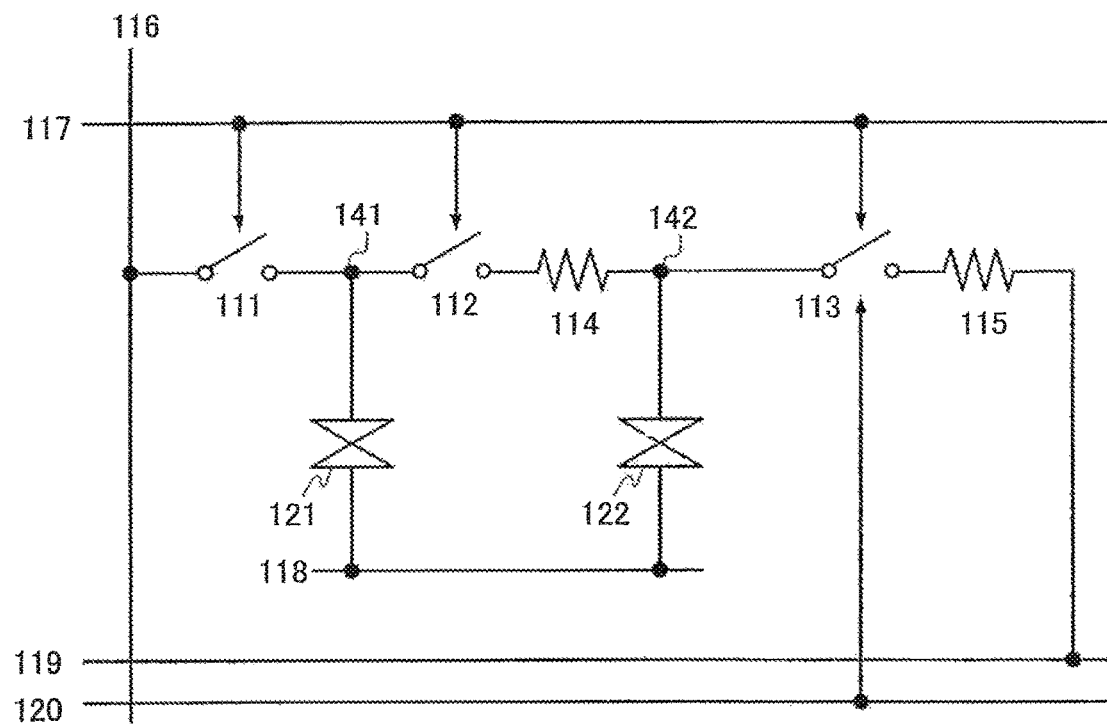
FIG. 77 is a diagram showing an example of a pixel structure of the present invention.

Although the liquid crystal element shows voltage holding property, the holding rate is not 100%. Therefore, the first storage capacitor 131 and the second storage capacitor 132 are provided corresponding to the first liquid crystal element 121 and the second liquid crystal element 122, respectively, in each of the pixels shown in FIG. 1 in order to store the held voltage. Specifically, the pixel electrode of the first liquid crystal element 121 is connected to the Cs line 119 through the first storage capacitor 131, and the pixel electrode of the second liquid crystal element 122 is connected to the Cs line 119 through the second storage capacitor 132. Note that since the voltage holding property of the liquid crystal element depends on a liquid crystal material, impurities mixed in the liquid crystal material, the size of a pixel, and the like, storage capacitor need not be provided in the case where the voltage holding property of the liquid crystal element is high as shown in FIG. 77. For example, when contribution to display of the second liquid crystal element 122 is less than that of the first liquid crystal element 121, the second storage capacitor 132 which is provided to the second liquid crystal element 122 with less contribution for display is may be omitted.

Figure 78:
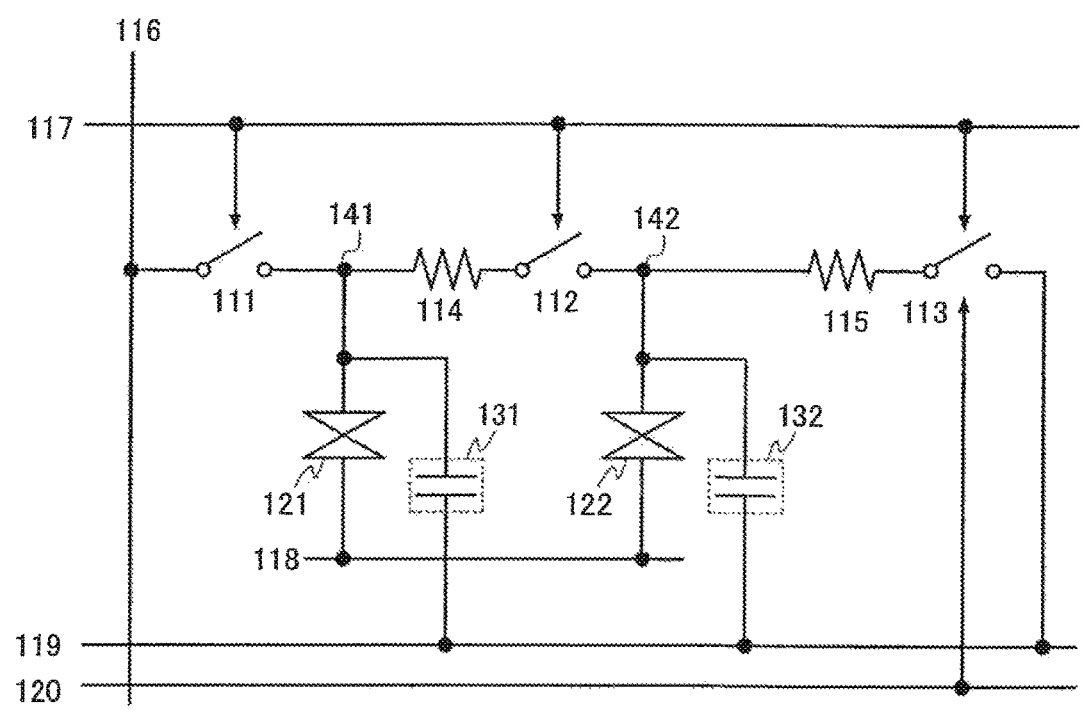
FIG. 78 is a diagram showing an example of a pixel structure of the present invention.

In addition, in FIG. 1, the node 141 is connected to the node 142 through the second switch 112 and the first resistor 114 in this order. Alternatively, the node 141 may be connected to the node 142 through the first resistor 114 and the second switch 112 in this order. Further, the node 142 may be connected to the Cs line 119 through the second resistor 115 and the third switch 113 in this order. Of course, as shown in FIG. 78, in the second switch 112 and the first resistor 114, and the third switch 113 and the second resistor 115, positions in connection between the switch and the resistor may be reversed.

Figure 79:
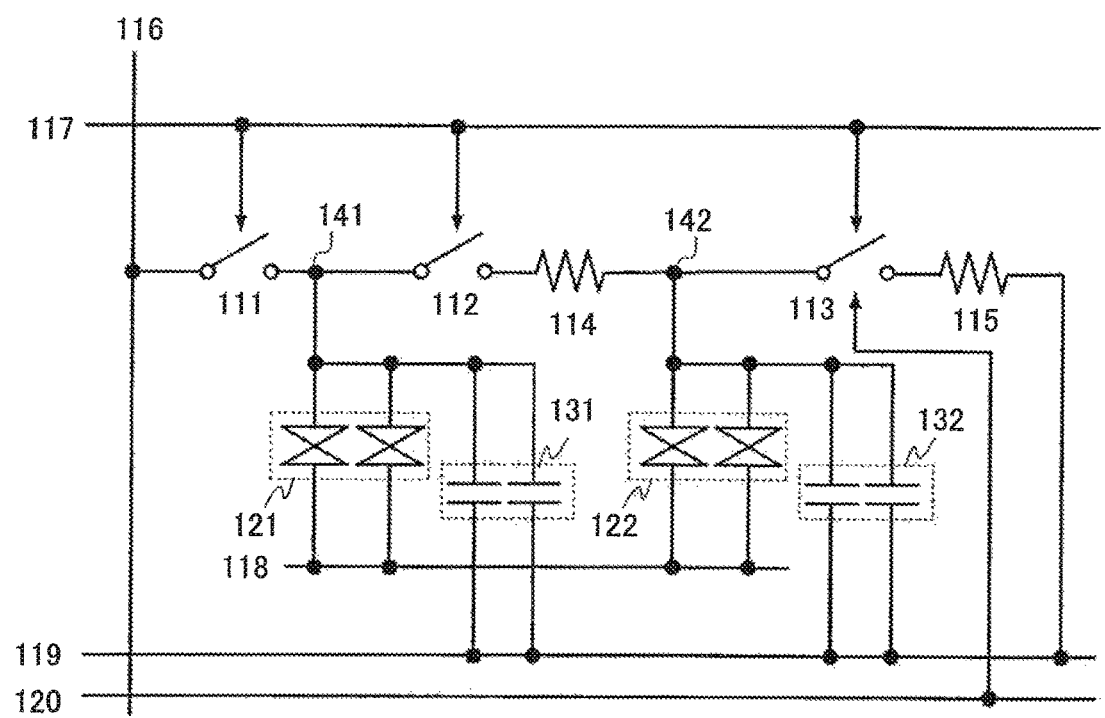
FIG. 79 is a diagram showing an example of a pixel structure of the present invention.

In addition, each of the first liquid crystal element 121 and the second liquid crystal element 122 may be formed of a plurality of liquid crystal elements. Similarly, each of the first storage capacitor 131 and the second storage capacitor 132 may be formed of a plurality of storage capacitors. For example, FIG. 79 shows the case where each of the first liquid crystal element 121 and the second liquid crystal element 122 is formed of two liquid crystal elements and where each of the first storage capacitor 131 and the second storage capacitor 132 is formed of two storage capacitors.

An operation of the pixel in FIG. 1 is described. As described above, on/off of the first switch 111 and the second switch 112 is controlled by inputting a signal to the first scan line 117. Here, the case where the first switch 111 and the second switch 112 are turned on by inputting a High level signal (hereinafter, referred to as an H level) to the first scan line 117 is described. In addition, as for the third switch 113 which is controlled by both signals input to the first scan line 117 and the second scan line 120, the case where the third switch 113 is turned on only when an H level is input to both first scan line 117 and second scan line 120 is described. Thus, in this case, these switches are turned off when a Low level signal (hereinafter, referred to as an L level) is input to the first scan line 117, and further, the third switch 113 is turned off even when an H level is input to the first scan line 117 and an L level is input to the second scan line 120.

A period in which the potential based on the gray scale of the pixel is input to the pixel, in other words, writing period is divided into the first half and the latter half by using switches such as the first switch 111, the second switch 112, and the third switch 113. The first switch 111 and the second switch 112 except for the third switch 113 are turned on in the first half and the third switch 113 in addition to the first switch 111 and the second switch 112 is turned on in the latter half. In this manner, the signal line 116 and the Cs line 119 are electrically disconnected in the first half, and the signal line 116 and the Cs line 119 are electrically connected in the latter half whereby a video signal can be written into a pixel quickly.

First, in the first half of the writing period, an H level is input to the first scan line 117, and an L level is input to the second scan line 120, and then, the first switch 111 and the switch 112 are turned on. The potential which is based on gray scale of a pixel and is input from the signal line 116 is supplied to each pixel electrode of the first liquid crystal element 121 and a first electrode of the first storage capacitor 131 through the first switch 111. Further, the potential is supplied to the pixel electrode of the second liquid crystal element 122 and a first electrode of the second storage capacitor 132 through the second switch 112 and the first resistor 114. At that time the third switch 113 is turned off, so that the potential can be supplied to each pixel electrode of the first liquid crystal element 121 and the second liquid crystal element 122 quickly.

After that, in the latter half of the writing period, an H level is also input to the second scan line 120, and the third switch 113 in addition to the first switch 111 and the second switch 112 is turned on. In this manner, the signal line 116 and the Cs line 119 are electrically connected. Therefore, the potential which is supplied to each pixel electrode of the first liquid crystal element 121 and the second liquid crystal element 122 in the first half of the writing period can be adjusted to the appropriate potential based on the gray scale of the pixel.

Note that the potential which is supplied to the pixel electrode of the second liquid crystal element 122 and the first electrode of the second storage capacitor 132 is the same as the potential at the node 142, and the potential is determined by the potential difference between the node 141 and the Cs line 119 and the resistance of the first resistor 114 and the second resistor 115. That is, potential which is based on gray scale of a pixel and is input from the signal line 116 is divided by the first resistor 114 and the second resistor 115, and the potential after resistance division is supplied to the pixel electrode of the second liquid crystal element 122. Note that when potential which is based on gray scale of a pixel and is input from the signal line 116 is $V_{sig}$, the resistance of the first resistor 114 is $R_1$, the resistance of the second resistor 115 is $R_2$, and the potential which is supplied to the Cs line 11i9 is $V_{cs}$, the potential of the node 141 is $V_{sig}$, and the potential of the node 142 in the latter half of the writing period is $V_{cs}+(V_{sig}-V_{cs})\times R_2/(R_1+R_2)$.

Note that the potential difference between the potential which is based on the gray scale and is input from the signal line 116 and the potential of the Cs line 119 is held in the first storage capacitor 131, and the potential difference between the potential after resistance division and the potential of the Cs line 119 is held in the second storage capacitor 132.

Next, an L level is input to the first scan line 117. Then, the first switch 111, the second switch 112, and the third switch 113 are turned off and the signal line 116, the first liquid crystal element 121, and the second liquid crystal element 122 are electrically disconnected from each other. However, the potential difference between the potential which is based on the gray scale and is input from the signal line 116 and the potential of the Cs line 119 is held in the first storage capacitor 131, and the potential difference between the potential after resistance division and the potential of the Cs line 119 is kept in the second storage capacitor 132. Therefore, the pixel electrode of the first liquid crystal element 121 can hold potential which is based on gray scale of a pixel and is input from the signal line 116, and the pixel electrode of second liquid crystal element 122 can hold the potential after resistance division. Note that an L level may be supplied to the second scan line 120 in addition to the first scan line 117 without being limited to the first scan line 117. In any case, the first switch 111, the second switch 112, and the third switch 113 may be turned off.

In this manner, the gray scale of the pixel can be expressed using the potential difference, that is, the voltage held in the first liquid crystal element 121 and the second liquid crystal element 122. Since the value of voltage applied is different between the first liquid crystal element 121 and the second liquid crystal element 122, liquid crystal which is included in each liquid crystal element shows different orientations. Therefore, viewing angle characteristics can be improved.

Note that since the gray scale that the pixel expresses is determined by the orientation of the liquid crystal included in each of the first liquid crystal element 121 and the second liquid crystal element 122 in the pixel, the potential which corresponds to the gray scale of the pixel and which is supplied from the signal line 116 is necessary to be determined in view of these points.

In addition, the signal line 116 and the Cs line 119 are electrically disconnected in the first half of the writing period, and the signal line 116 and the Cs line 119 are electrically connected in the latter half so that the potential of each pixel electrode of the first liquid crystal element 121 and the second liquid crystal element 122 can be adjusted to the potential based on the gray scale of the pixel quickly. Thus, a video signal can be written into a pixel quickly.

Figure 2:
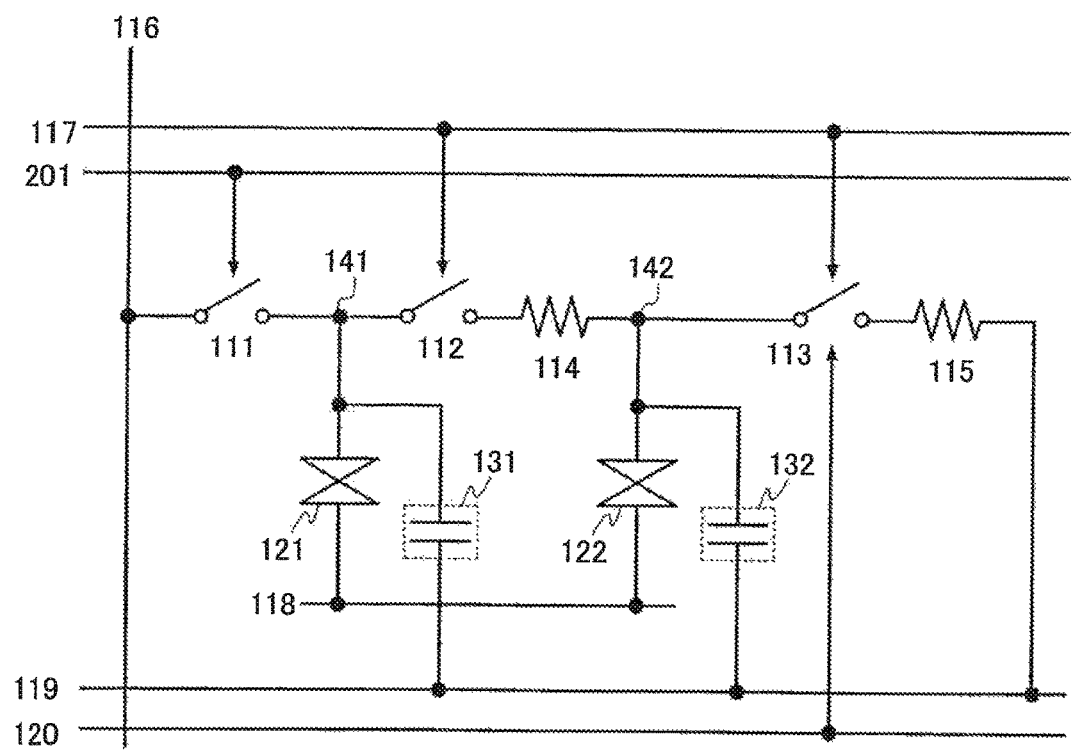
FIG. 2 is a diagram showing an example of a pixel structure of the present invention.

In addition, the first switch 111, the second switch 112, and the third switch 113 may be controlled by using different scan lines as shown in FIG. 2. FIG. 2 shows the case where the first switch 111 is controlled by a third scan line 201, the case where the second switch 112 is controlled by the first scan line 117, and the case where the third switch 113 is controlled by the first scan line 117 and the second scan line 120. Note that the pixel shown in FIG. 2 can be operated in a similar manner to the pixel shown in FIG. 1.

However, in the case of such a pixel structure, the voltage applied to the second liquid crystal element 122 is lower than the voltage applied to the first liquid crystal element 121. Therefore, when the resistance of the second resistor 115 is much lower than that of the first resistor 114, the voltage that is applied to the second liquid crystal element 122 is lower than the threshold voltage of liquid crystal, and the liquid crystal included in the second liquid crystal element 122 is not driven in some cases. Thus, the resistance $R_2$ of the second resistor 115 is preferably higher than the resistance $R_1$ of the first resistor 114 ($R_2 > R_1$). Of course, the relation of the resistances is not limited to this as long as the liquid crystals of the first liquid crystal element 121 and the second liquid crystal element 122 are driven and the gray scale can be expressed using both of the liquid crystals. Note that the threshold voltage of the liquid crystal indicates a critical value of the voltage which is necessary to drive the liquid crystal.

In addition, in FIG. 1, if the resistances of the first resistor 114 and the second resistor 115 are high and the potential which is input from the signal line 116 can be kept at each of the node 141 and the node 142 after the first switch 111 is turned off without the second switch 112 and the third switch 113, it is not particularly necessary to provide these switches. For example, when the resistance of the first resistor 114 is high, the second switch 112 provided between the node 141 and the node 142 may be omitted, and when the resistance of the second resistor 115 is high, the third switch 113 provided between the node 142 and the Cs line 119 may be omitted. Of course, when both of the resistances are high, the second switch 112 and the third switch 113 can be omitted.

Figure 3:
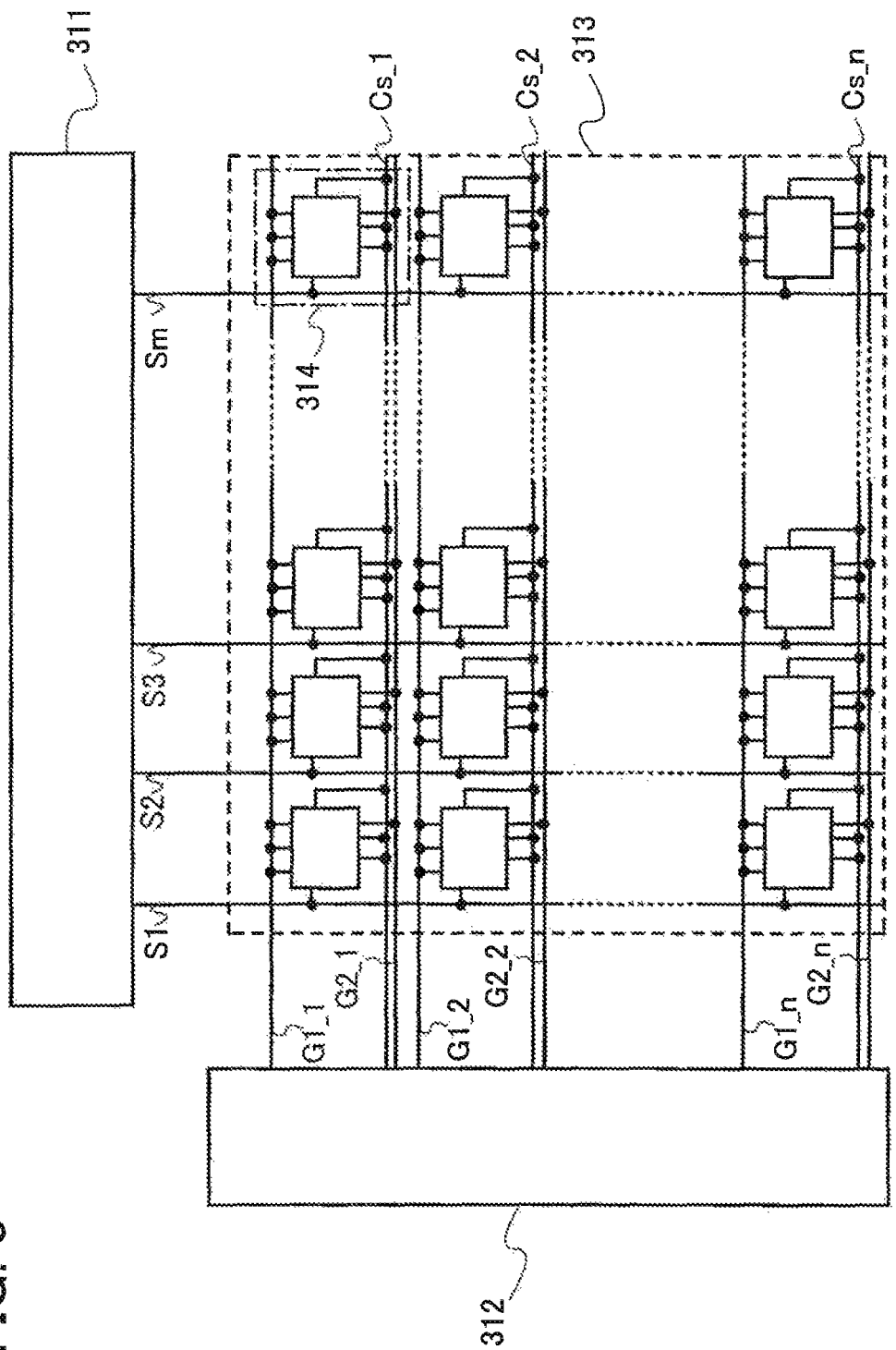
FIG. 3 is a diagram illustrating an example of a display device which includes a pixel of the present invention.

Next, a display device having the above-mentioned pixel shown in FIG. 1 is described with reference to FIG. 3.

A display device includes a signal line driver circuit 311, a scan line driver circuit 312, and a pixel portion 313. The pixel portion 313 includes a plurality of signal lines S1 to Sm which are extended from the signal line driver circuit 311 in a column direction, first scan lines G1_1 to G1_$n$, second scan lines G2_1 to G2_$n$, and Cs lines Cs_1 to Cs_n which are extended from the scan line driver circuit 312 in a row direction, and a plurality of pixels 314 which are provided in matrix corresponding to the signal lines S1 to Sm. Then, each pixel 314 is connected to the signal line Sj (one of the signal lines S1 to Sm), the first scan line G1_$i$ (one of the scan lines G1 to Gn), the second scan lines G2_$i$ (one of the scan lines G2 to G2$n$), and the Cs line Cs_$i$ (one of the Cs lines Cs_to Cs_n).

Note that the signal line Sj, the first scan line G1_$i$, the second scan line G2_$i$, and the Cs line Cs_$i$ corresponds to the signal line 116, the first scan line 117, the second scan line 120, and the Cs line 119 of FIG. 1, respectively. The common electrode 118 in FIG. 1 is connected to the plurality of pixels 314 commonly or electrically, and the same potential is supplied. Note that when the Cs line 119 and the common electrode 118 may have the same potential, the Cs line 119 and the common electrode 118 may be electrically connected using a conductive fine particle, wiring, or the like outside the pixel portion 313.

The row of a pixel which is to be operated by inputting a signal into the first scan line G1_$i$ from the scan line driver circuit 312 is selected sequentially, the potential based on the gray scale of each pixel is supplied to each pixel that belongs to a selected row from the signal line driver circuit 311 through the signal lines S1 to Sm.

Figure 17:
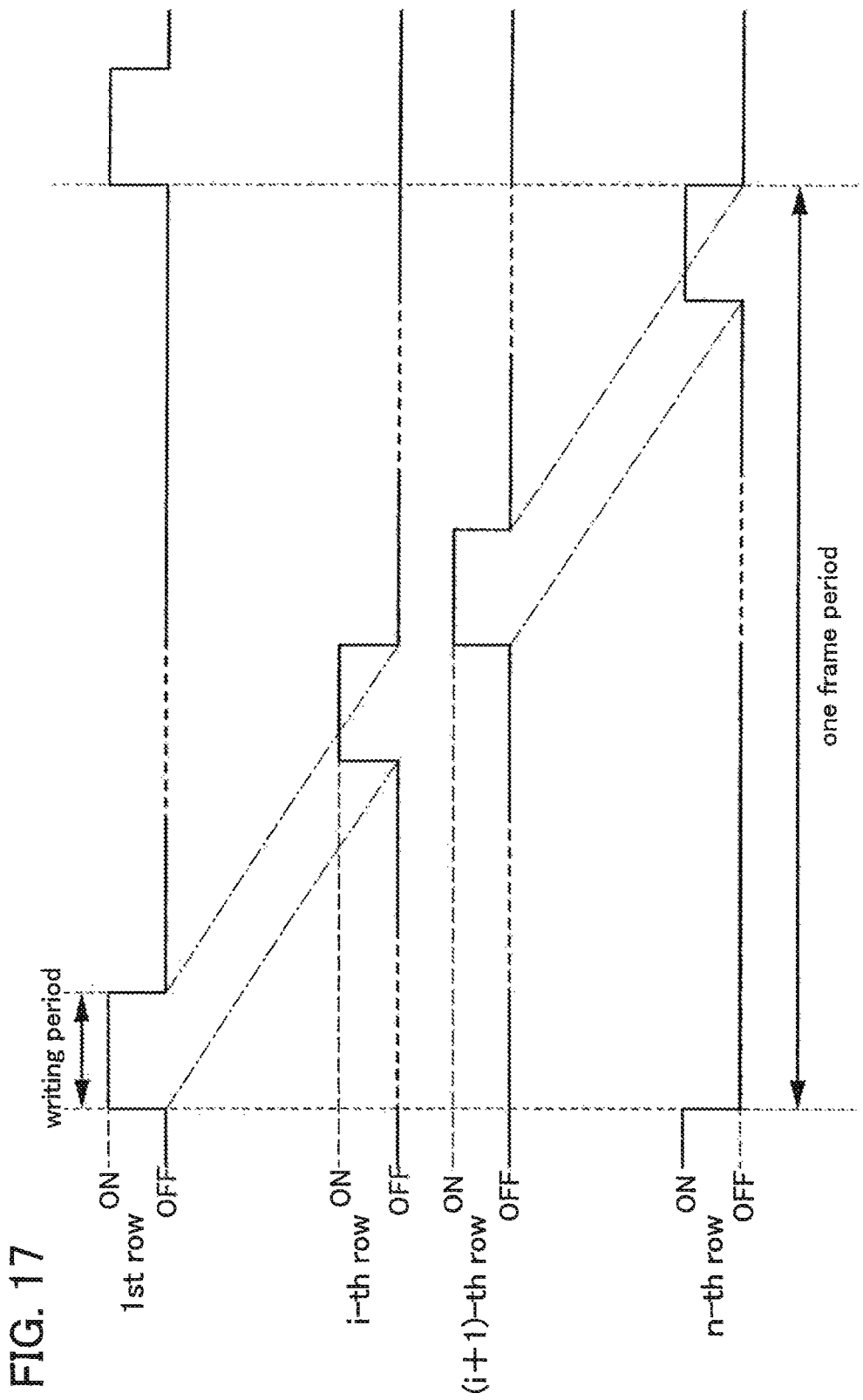
FIG. 17 is a diagram illustrating an operation method of a display device shown in FIG. 3.

As shown in FIG. 17, for example, when, i-th row is selected and the writing period is completed, a signal is written to pixels which belong to i+1-th row. Note that FIG. 17 selectively shows an operation of the first switch 111 shown in FIG. 1 which can illustrate a wiring period in each row precisely. Then, a pixel which is completed the writing period in i-th row express the gray scale by the voltage held in the first liquid crystal element and the second liquid crystal element in the period.

Note that a signal of an H level is input only to the first scan line G1_$i$ in the first half of the writing period, and, a signal of an H level is input to second scan line G2_$i$ in the latter half. Thus, the pixel can express the gray scale by the potential supplied from the signal line Sj in the writing period as described above.

Note that it is desirable to use inversion driving which is driven by inverting the polarity of the voltage to be applied to the pixel electrode with respect to the potential of the common electrode (common potential) in the liquid crystal element every certain period, in order to suppress liquid crystal material degradation or to decrease display unevenness such as flickers. In this specification, it is written that when the potential of the pixel electrode is higher than that of the common electrode, the voltage of positive polarity is applied to the liquid crystal element, and when the potential of the common electrode is higher than that of the pixel electrode, the voltage of negative polarity is applied to the liquid crystal element. In addition, it is written that a video signal which is input from the signal line when the voltage of positive polarity is applied to the liquid crystal element is a signal of positive polarity, and a video signal which is input from the signal line when the voltage of negative polarity is applied to the liquid crystal element is a signal of negative polarity. Note that inversion driving includes, for an example, frame inversion driving, source line inversion driving, gate line inversion driving, dot inversion driving, and the like.

Frame inversion driving is a driving method in which the polarity of the voltage applied to the liquid crystal element is inverted every one frame period. Note that one frame period corresponds to a period to display an image for one pixel, and there is no particular limitation on one frame period, but one frame period is at least preferably 1/60 second or shorter so that a person does not sense flickers.

It is preferable that a period is shortened, and the frequency is increased further to reduce motion blur. It is desirable that the period is 1/120 second or shorter (the frequency is 120 Hz or higher). It is more preferable that the period is 1/180 second or shorter (the frequency is 180 Hz or higher). When a frame frequency is increased in this manner, and when the increased frequency does not match the frame frequency of original image data, image data is necessary to be interpolated. In this case, an image data is interpolated by using a motion vector, so that display at a high frame frequency can be realized. Motion of an image is displayed smoothly, and display with little afterimage can be performed in the above described manner.

In addition, source line inversion driving is a driving method in which the polarity of the voltage applied to the liquid crystal elements which belong to pixels connected to the same signal line is inverted with respect to the liquid crystal elements which belong to pixels connected to the adjacent signal line, and further, frame inversion is performed to each pixel. On the other hand, gate line inversion driving is a driving method in which the polarity of the voltage applied to the liquid crystal elements which belong to pixels connected to the same scan line is inverted with respect to the liquid crystal elements which belong to pixels connected to the adjacent scan line, and further, frame inversion is performed to each pixel. In addition, dot inversion driving is a driving method in which the polarity of the voltage applied to the liquid crystal element is inverted between the adjacent pixels, and is a driving method in which source line inversion driving and gate line inversion driving are combined.

In the meantime, when the frame inversion driving, the source line inversion driving, the gate line inversion driving, the dot inversion driving, or the like is employed, the width of the potential which is necessary for a video signal written in a signal line is twice as large as the width when the inversion driving is not performed. Therefore, in the case of the frame inversion driving and the gate line inversion driving, common inversion driving in which the potential of a common electrode is inverted is sometimes employed in order to solve the problem.

Common inversion driving is a driving method in which the potential of a common electrode is changed in synchronization with inversion of the polarity applied to the liquid crystal element, and the width of the potential which is necessary for a video signal written in a signal line can be decreased by performing common inversion driving. In this case, it is preferable that the common electrode 118 and the Cs line 119 (the Cs line Cs_1 to Cs_n in FIG. 3) are electrically connected. The same signal is input to the common electrode 118 and the Cs line 119, so that display is performed more adequately.

For example, when source line inversion driving is performed, positive and negative video signals in which the potential of the common electrode is as a center, in other words, video signals of positive polarity and negative polarity are supplied alternatively through the signal line in such a manner that the image signal is changed between positive polarity and negative polarity per frame period. Note that in such case, a video signal is a signal which can be positive and negative with respect to the potential supplied to the Cs line.

Figure 4:
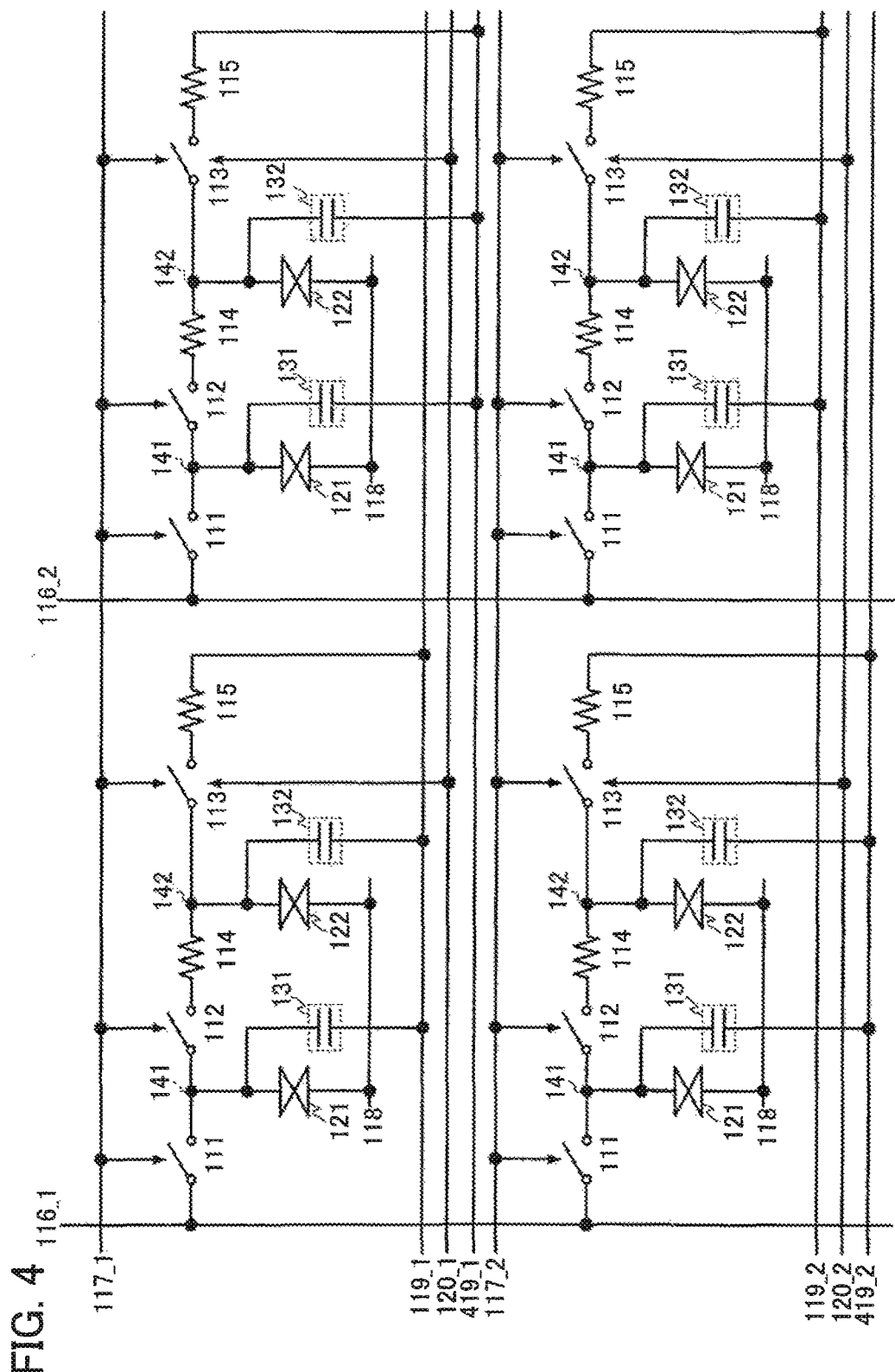
FIG. 4 is a diagram illustrating a structural example of a pixel included in a display device of the present invention.
Figure 80:
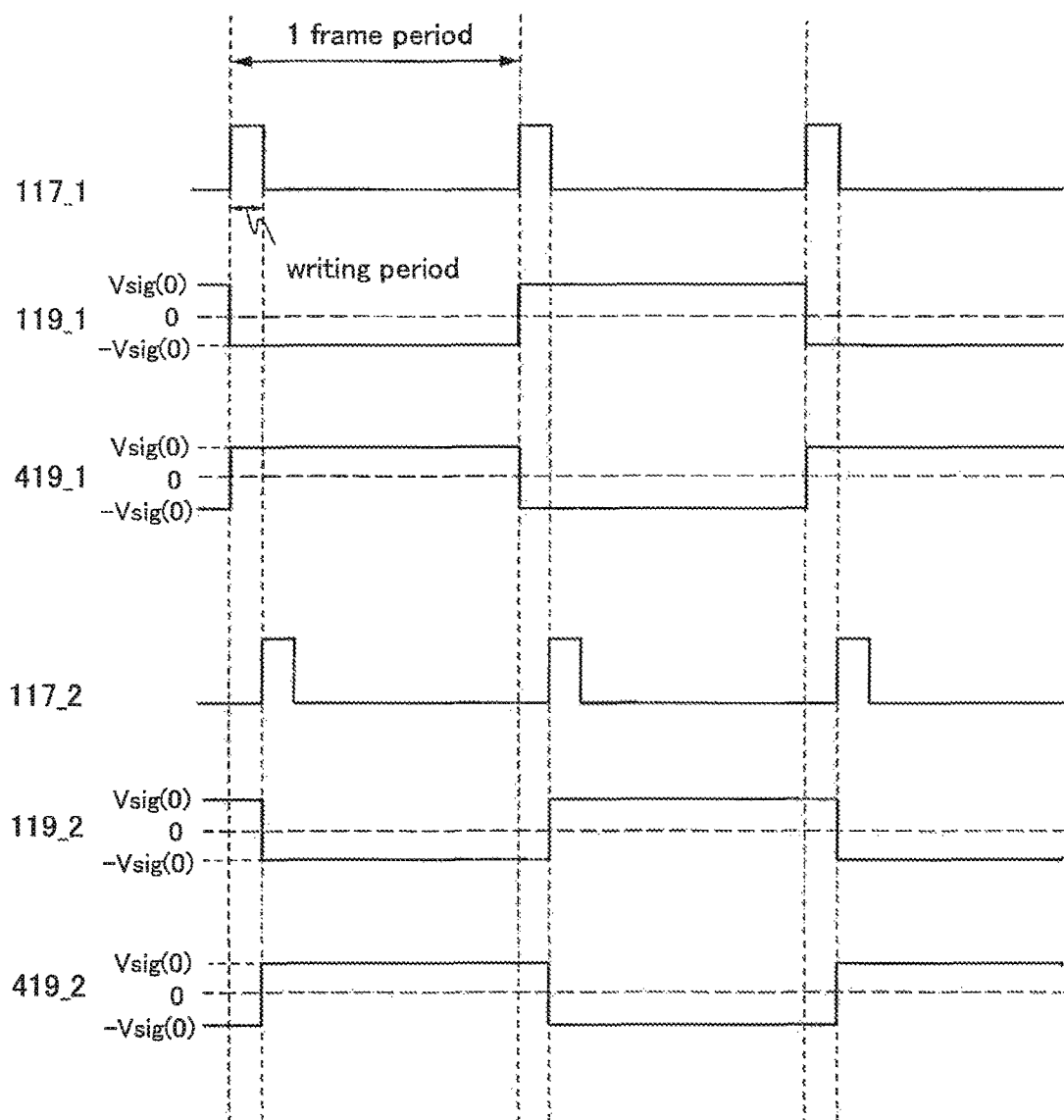
FIG. 80 is a diagram showing an exemplary driving method of a display device of the present invention.

Next FIG. 4 shows one structural example of a pixel in which dot inversion driving can be realized. FIG. 4 shows four pixels each of which has a structure shown in FIG. 1. In the diagram, signal lines 116_1 and 116_2 correspond to the signal line 116 in FIG. 1; first scan lines 117_1 and 117_2 correspond to the first scan line 117; the second scan lines 120_1 and 120_2 correspond to the second scan line 120; and Cs lines 119_1, 119_2, 419_1, and 419_2 correspond to the Cs line 119. Signals having different polarities are input to the signal lines 116_1 and 116_2. In accordance with the polarity, potentials which are different from those of the adjacent pixels are supplied using Cs lines which are different from those of the adjacent pixels even the pixels belong to the same row, that is, by using the Cs lines 119_1 and 419_1, or 119_2 and 419_2 as shown in FIG. 80. Dot inversion driving may be performed by a driving method as shown in FIG. 80.

Note that when a signal for displaying block color when a normally black mode is used, and for displaying white color when a normally white mode is used is $|V_{sig}(0)|$, and the potential of a common electrode is $V_{com}$, a potential which is higher than or equal to $V_{com}$ and lower than or equal to $V_{sig}(0)+V_{com}$ may be supplied to the Cs line in the case where a signal of positive polarity is supplied to the pixel from the signal line. On the other hand, a potential which is higher than or equal to $-V_{sig}(0)+V_{com}$ and lower than or equal to $V_{com}$ may be supplied to the Cs line in the case where a signal of negative polarity is supplied to the pixel.

Note that it is preferable that a potential which is higher than or equal to $V_{com}+\alpha$ and lower than or equal to $V_{sig}(0)+V_{com}$ be supplied to the Cs line in the case where a signal of positive polarity is supplied to the pixel, and the potential which is higher than or equal to $-V_{sig}(0)+V_{com}$ and lower than or equal to $V_{com}-\alpha$ be supplied to the Cs line in the case where a signal of negative polarity is supplied to the pixel. Here, $\alpha$ is $V_{sig}/2$. More preferably, a potential of $V_{sig}(0)+V_{com}$ may be supplied in the case where a signal of positive polarity is supplied to the pixel, and a potential of $-V_{sig}(0)+V_{com}$ may be supplied in the case where a signal of negative polarity is supplied to the pixel.

As described above, the potential of the Cs line is set at $V_{sig}(0)+V_{com}$ in the case where a signal of positive polarity is supplied to the pixel, and is set at $-V_{sig}(0)+V_{com}$ in the case where a signal of negative polarity is supplied to the pixel, whereby the voltage applied to the second liquid crystal element 122 can be increased, and the second liquid crystal element 122 can be easily controlled.

Note that when the potential of the Cs line is set higher than $V_{sig}(0)+V_{com}$ in the case where a signal of positive polarity is supplied to the pixel, a voltage that is higher than $V_{sig}(0)$ is always applied to the liquid crystal; therefore, black color cannot be displayed in a normally black mode and white color cannot be displayed in a normally white mode. In addition, when the potential which is lower than $-V_{sig}(0)+V_{com}$ is supplied to the Cs line in the case where a signal of negative polarity is supplied to the pixel, black color cannot be displayed in a normally black mode and white color cannot be displayed in a normally white mode, similar to the case of the signal of positive polarity.

Note that FIG. 80 shows a case where the potential of $V_{com}$ is 0 V, the potential of the Cs line in the case where a signal of positive polarity is supplied to the pixel is $V_{sig}(0)$, and the potential of the Cs line in the case where a signal of negative polarity is supplied to the pixel is $-V_{sig}(0)$.

Note that the method of inversion driving is not limited to the above described methods.

In addition, a wiring which is connected to each pixel is shared between pixels, whereby the number of the wiring can be reduced. In this case, various wiring can be shared between pixels as long as it operates normally. For example, a wiring can be shared with the pixel of the next row, and an example is described.

Figure 5:
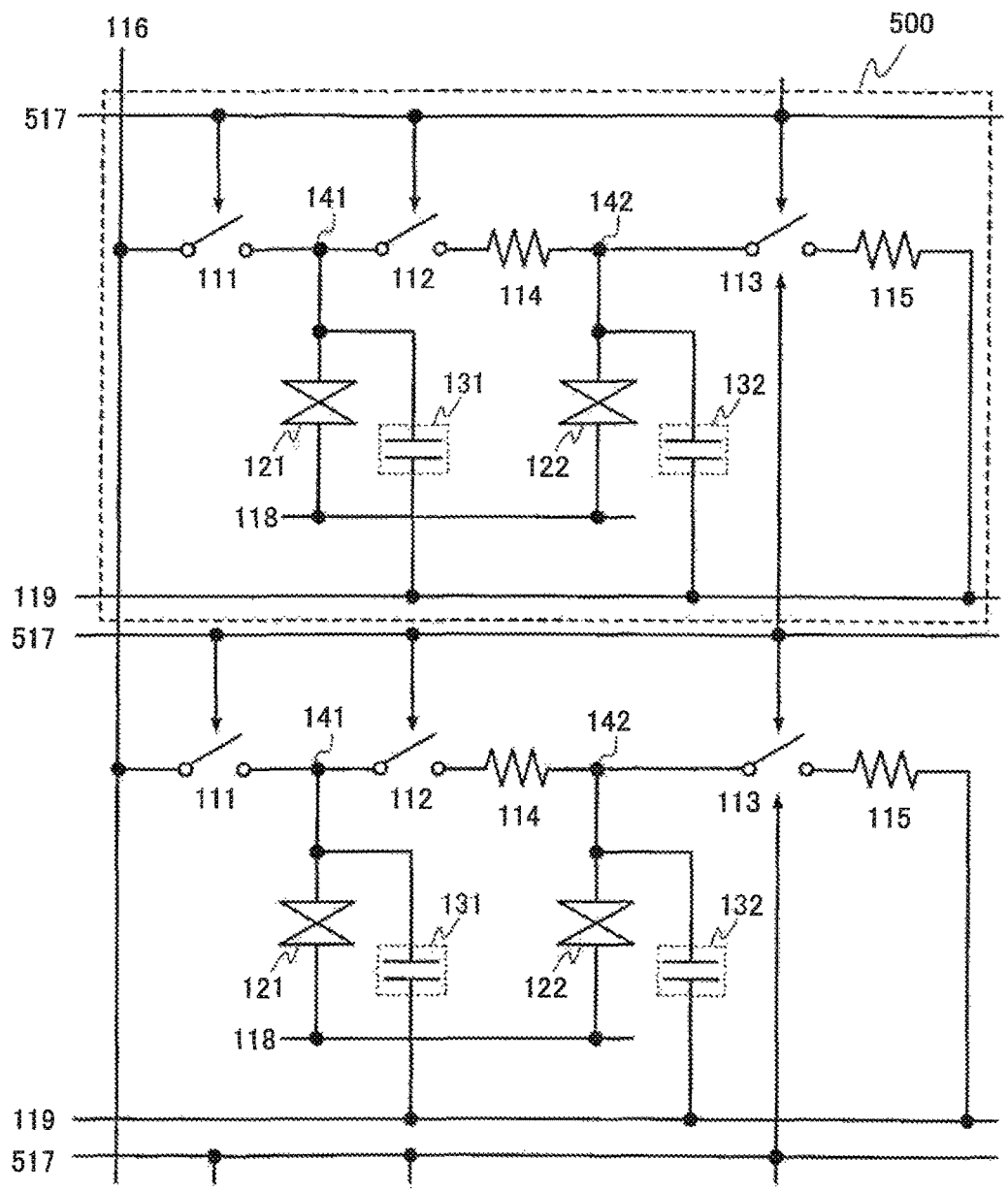
FIG. 5 is a diagram showing an example of a pixel structure of the present invention.

A pixel 500 shown in FIG. 5 includes the first switch 111, the second switch 112, the third switch 113, the first resistor 114, the second resistor 115, the first liquid crystal element 121, the second liquid crystal element 122, the first storage capacitor 131, and the second storage capacitor 132 similar to FIG. 1. Note that the pixel 500 is connected to the signal line 116, a first scan line 517, the Cs line 119, and the first scan line 517 of the next row.

The first scan line 517 of the next row is used as one of scan lines which control the third switch 113 in the pixel shown in FIG. 5, whereas the second scan line 120 is used in FIG. 1. As described above by sharing wiring with next row, the number of the wirings can be reduced to improve the aperture ratio.

Figure 18:
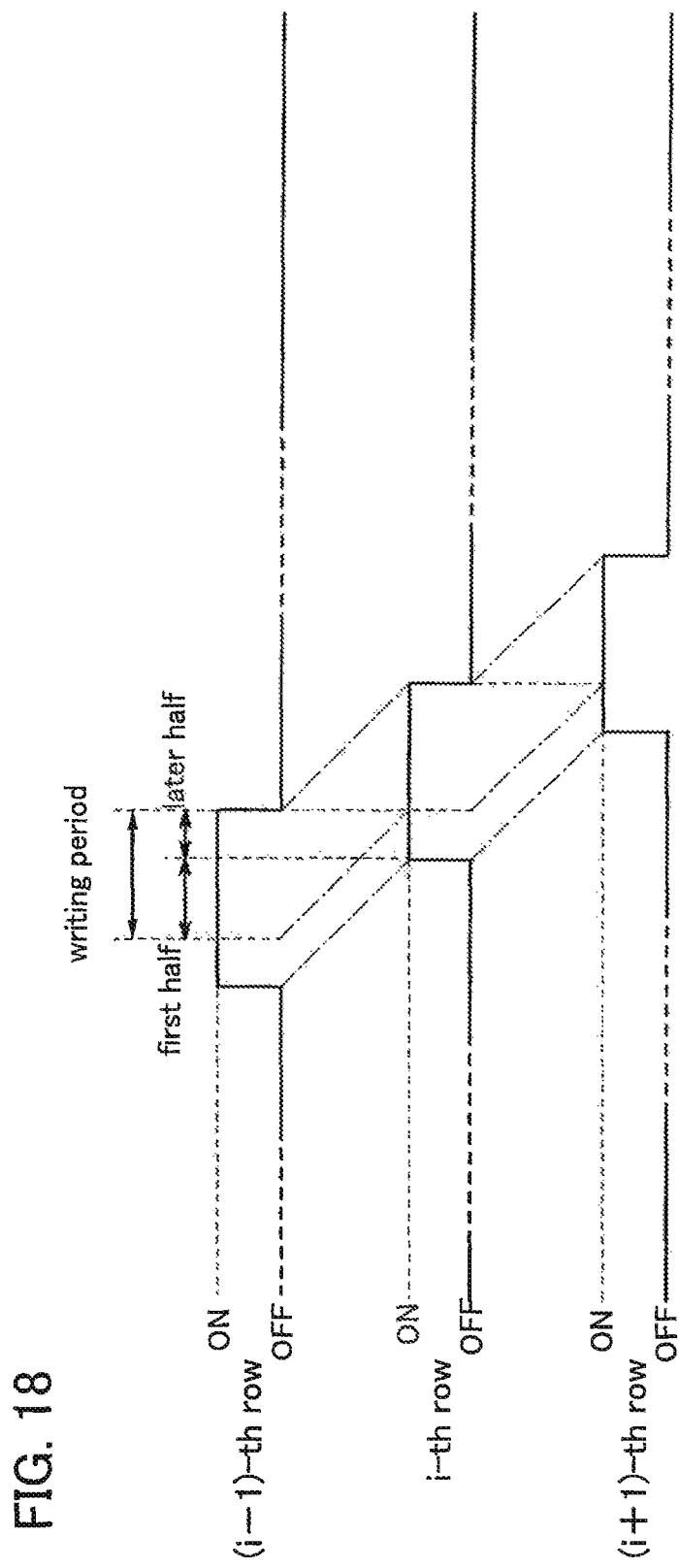
FIG. 18 is a diagram illustrating an operation of a pixel shown in FIG. 5.

Note that when the third switch 113 is turned on, the first switch 111 and the second switch 112 in a pixel of the next row are turned on before writing is completed in the pixel shown in FIG. 5. That is, a pixel of the next row is selected in a latter half of the writing period in the pixel 500 as shown in FIG. 18. Note that FIG. 18 shows the writing period in i−1-th row, i-th row, i+1-th row and selectively illustrates an operation of the first switch 111 which can illustrate a wiring period precisely similar to FIG. 17.

As described above, the voltage which is applied to the first liquid crystal element 121 and the second liquid crystal element 122 included in the pixel of the next row changes from the voltage based on the gray scale of the pixel because the pixel of the next row is selected in the latter half of the writing period. However, since a video signal is written to the pixel of the next row after the pixel 500, a period when the third switch 113 is turned on, in other words, the latter half of the writing period is set so that the display is not influenced, whereby changing the voltage does not cause a problem in particular. Needless to say, in a pixel structure of FIG. 2, in other words, in the case where a scan line which controls the first switch 111 is provided separately from the first scan line 517, such a thing does not occur.

Note that in the foregoing case, various forms of switches can be used for the first switch 111, the second switch 112, and the third switch 113, and an electric switch or a mechanical switch can be applied to the switches. That is, any element can be used as long as it can control a current flow, without limitation to a particular element. For example, the switch may be a transistor, a diode, or a logic circuit with combines them.

Figure 6:
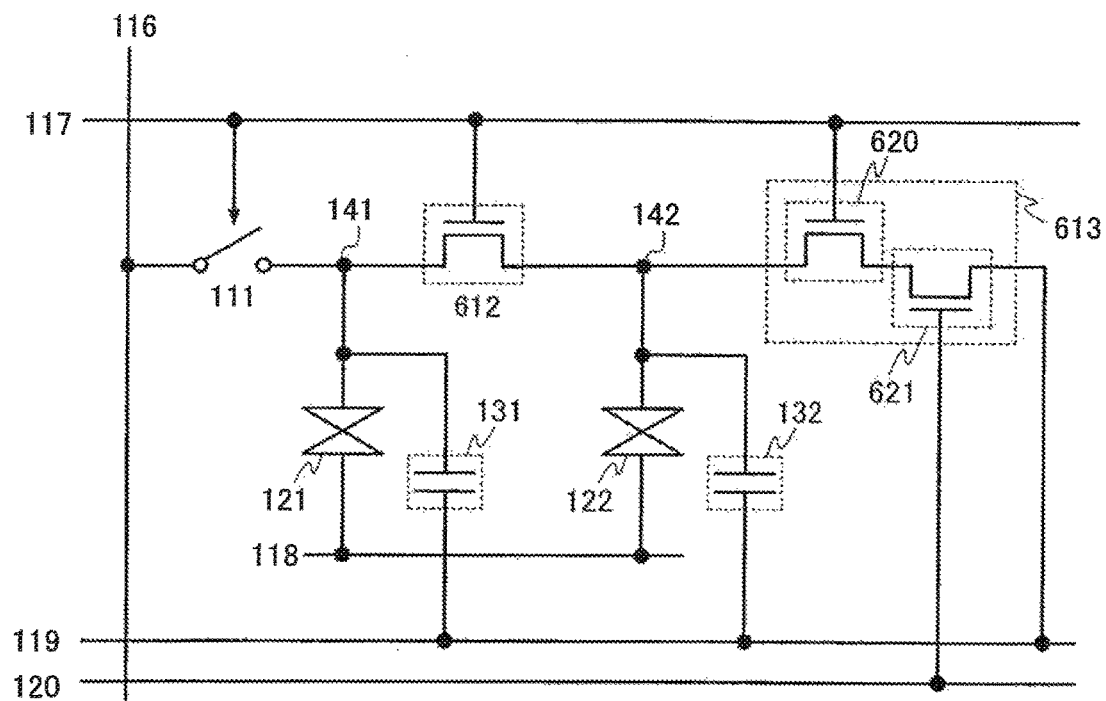
FIG. 6 is a diagram showing an example of a pixel structure of the present invention.

As shown in FIG. 6, a structure in which a second transistor 612 and a third transistor 613 are used for the second switch 112 and the third switch 113 of FIG. 1 respectively, and further, the first resistor 114 and the second resistor 115 of FIG. 1 are realized by using on-resistance of these transistors may be employed to omit these resistances. Note that the third transistor 613 is necessary to be controlled by signals input to the first scan line 117 and the second scan line 120. Therefore, the third transistor 613 is configured by two transistors 620 and 621 of which the gate electrode is connected to the first scan line 117 and the second scan line 120, respectively.

Figure 81:
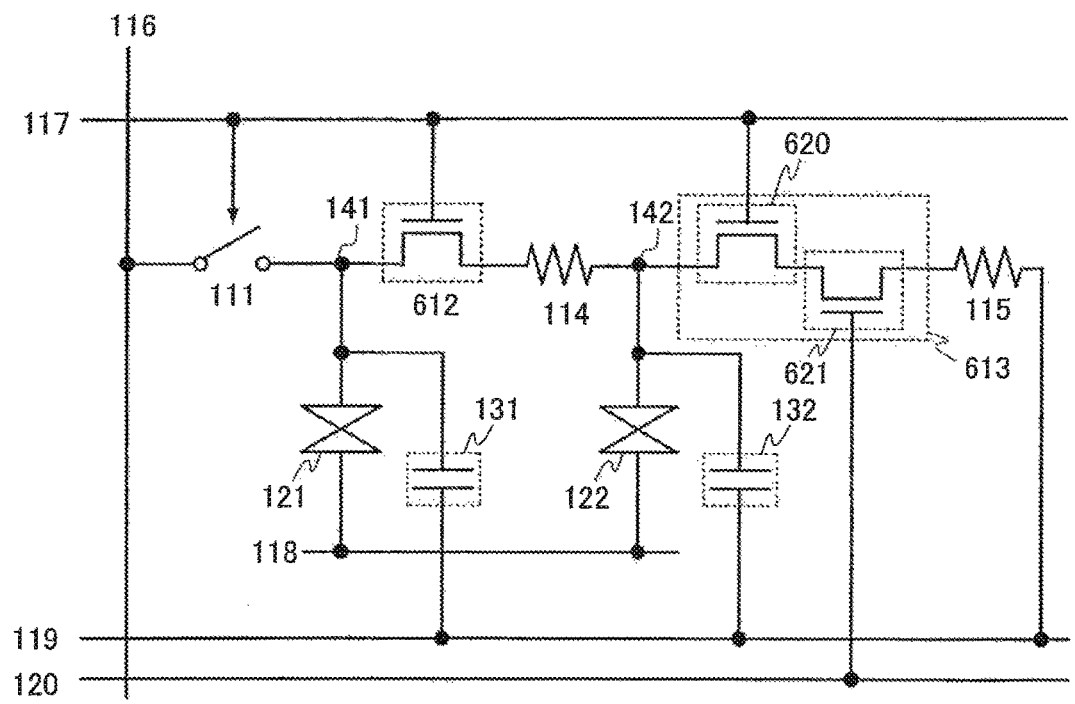
FIG. 81 is a diagram showing an example of a pixel structure of the present invention.

Note that as described above, since the resistance $R_2$ of the second resistor 115 is preferably higher than the resistance $R_1$ of the first resistor 114 ($R_2 > R_1$) in FIG. 1, the on-resistance of the third transistor 613 is preferably higher than the on-resistance of the second transistor 612 also in the structure of FIG. 6. Therefore, when the channel width and the channel length of the second transistor 612 are $W_2$ and $L_2$, respectively, and the channel width and the channel length of the third transistor 613 are $W_3$ and $L_3$, respectively, transistors which satisfy the relation, $W_2/L_2 > W_3/L_3$, are preferably used. Here, when channel widths W of the serially-connected transistors 620 and 621 are equal, the value of channel length L of the third transistor 613 corresponds to a total channel length of each transistor. However, the present invention is not limited to this relation. Needless to say the present invention is not limited to this pixel structure, and as shown in FIG. 81 for example, a structure in which the second transistor 612 and the third transistor 613 are used for the second switch 112 and the third switch 113 of FIG. 1 respectively, and resistors are not omitted may be employed.

Figure 83:
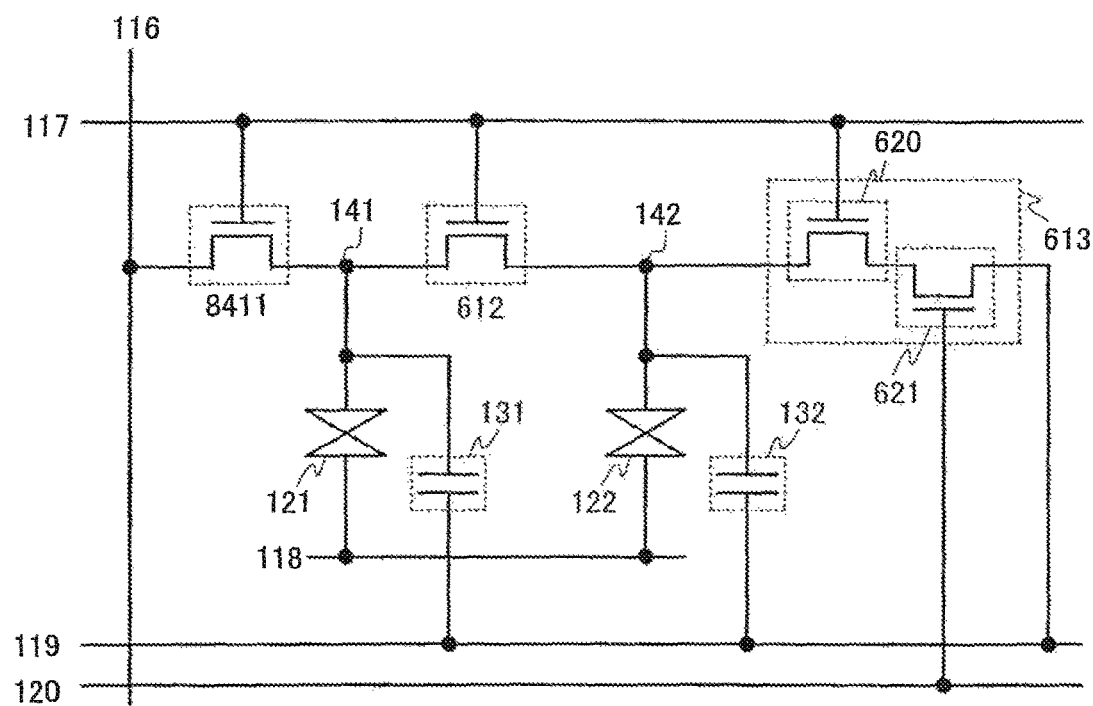
FIG. 83 is a diagram showing an example of a pixel structure of the present invention.
Figure 84:
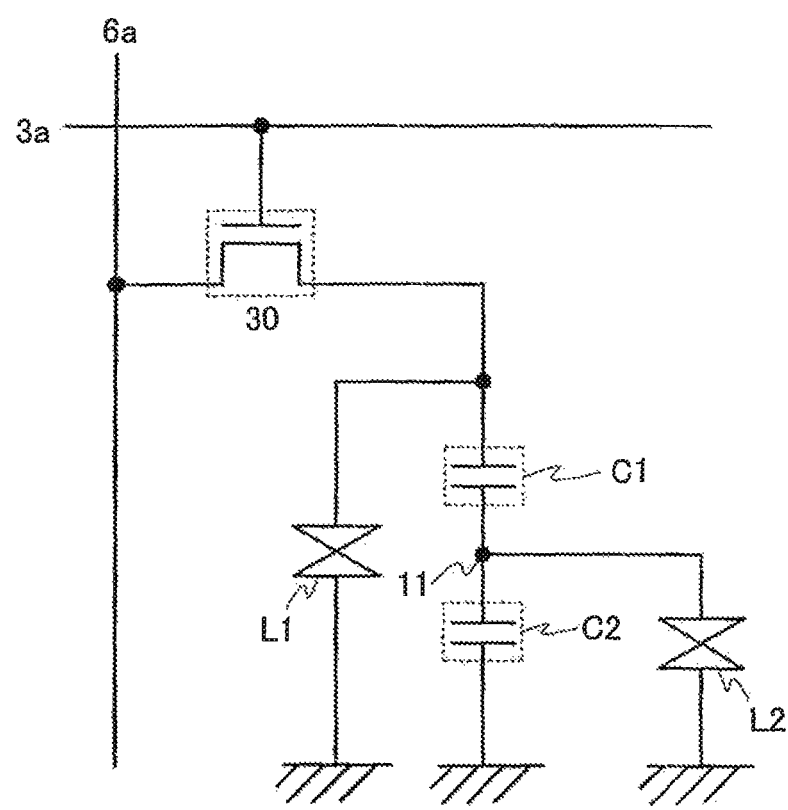
FIG. 84 is a diagram illustrating a conventional technique.

In addition, when a transistor (here, referred to as a first transistor) is used for the first switch 111 in FIG. 1, the on-resistance of the first transistor is preferably lower. When the channel width and the channel length of the first transistor are $W_1$ and $L_1$, respectively, $W_1/L_1$ is preferably larger FIG. 83 shows the case where the first transistor 8411 is used for the first switch 111 in the structure of FIG. 6. Note that transistors which satisfy the relation, $W_1/L_1 > W_2/L_2 > W_3/L_3$, when the first transistor 8411 is compared to the second transistor 612 and the third transistor 613, are preferably used. However, the present invention is not limited to this.

Figure 7:
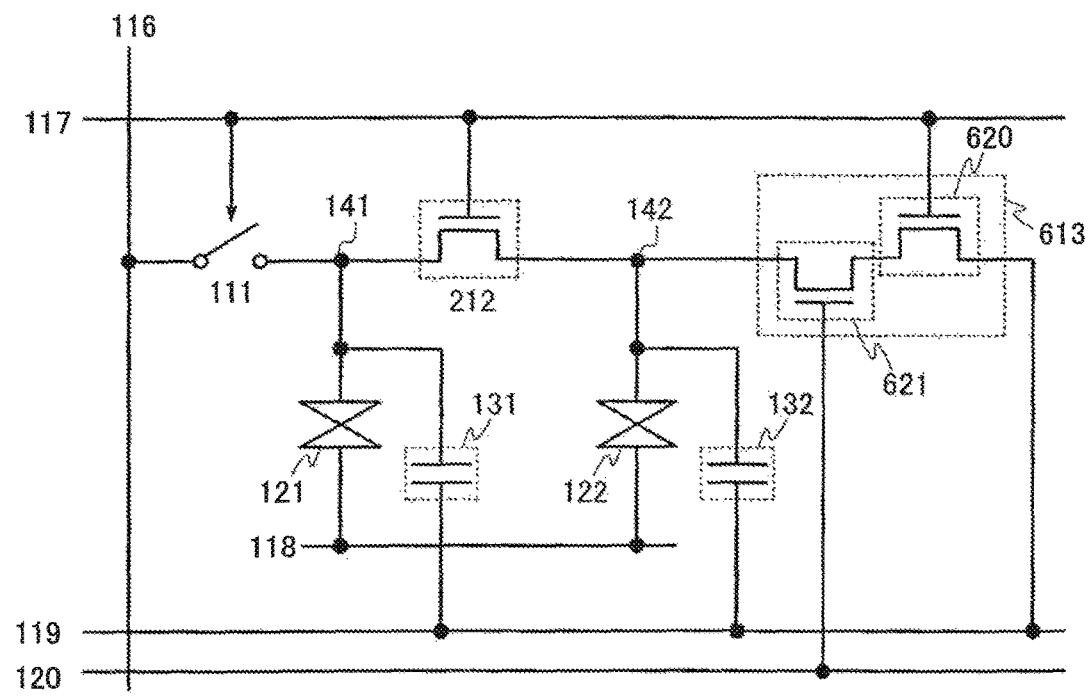
FIG. 7 is a diagram showing an example of a pixel structure of the present invention.

In addition, as for relation of connection of the transistors 620 and 621 which configures the third transistor 613, the node 142 may be provided so as to be connected to the Cs line 119 through the transistor 620 and the transistor 621 in this order as shown in FIG. 6, and the node 142 may be provided so as to be connected to the Cs line 119 through the transistor 621 and the transistor 620 in this order as shown in FIG. 7. In a pixel structure shown in FIG. 7, the transistor which is connected to the node 142 among transistors which configures the third transistor 613 is off, whereby the gate capacitance of the transistor can be smaller than the case that the gate capacitance of transistor is on. Therefore, the potential can be supplied to each pixel electrode of the first liquid crystal element 121 and the second liquid crystal element 122 quickly in the first half of the writing period compared to FIG. 6.

Figure 8:
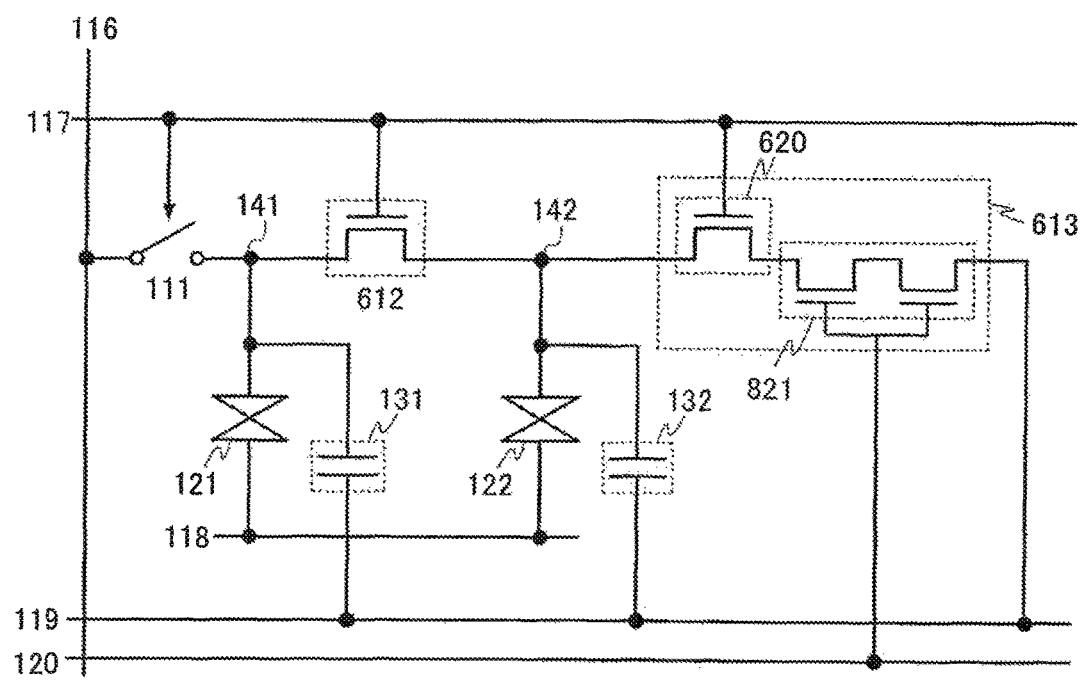
FIG. 8 is a diagram showing an example of a pixel structure of the present invention.

In addition, a multi-gate transistor 821 in which two transistors are connected in series may be used for a transistor 621 which configures the third transistor 613 of FIG. 6 in order to make the on-resistance of the third transistor 613 larger as shown in FIG. 8. Note that although FIG. 8 illustrates the case where two transistors are connected in series, the number of serially connected transistors is not limited in particular.

Note that when the channel widths W of two transistors which is connected in series are equal, the channel length L of the transistor 821 is the total channel length of the two transistors. Therefore, W/L easily becomes smaller, and the on-resistance can be increased. Thus, the on-resistance of the transistor 821 can be easily made higher by using the multi-gate transistor. Thus, the on-resistance of the third transistor 613 can be easily made higher than that of the second transistor 212.

Figure 9:
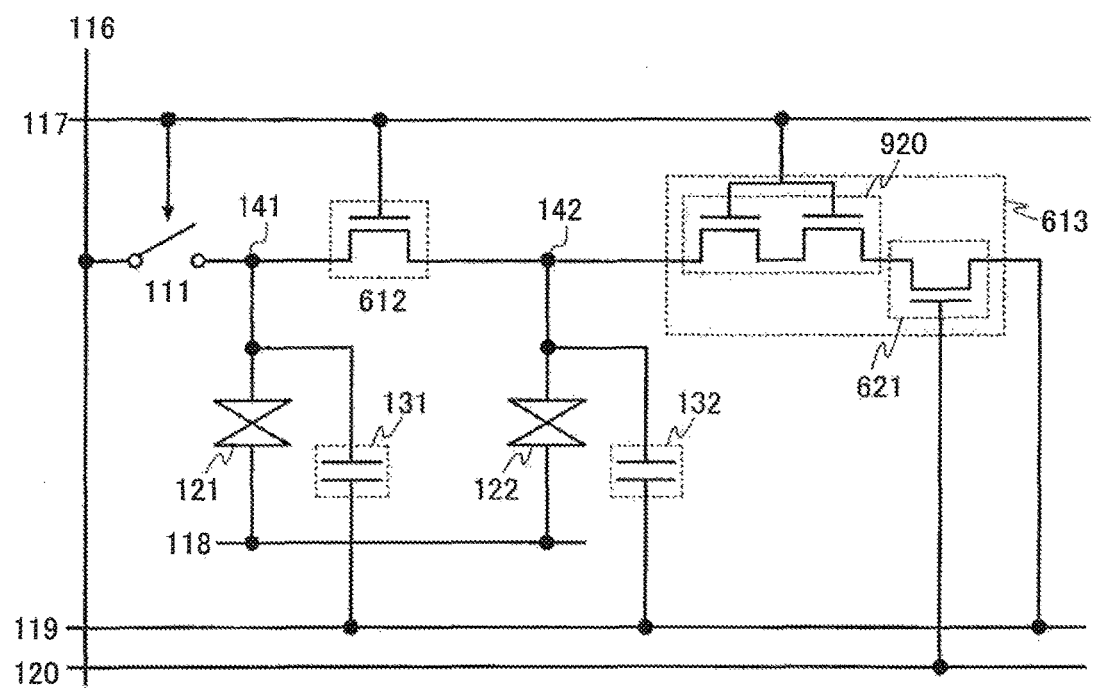
FIG. 9 is a diagram showing an example of a pixel structure of the present invention.

In addition, a multi-gate transistor 920 may be used for the transistor 620 in FIG. 6 as shown in FIG. 9 without limiting to the transistor 621.

Figure 10:
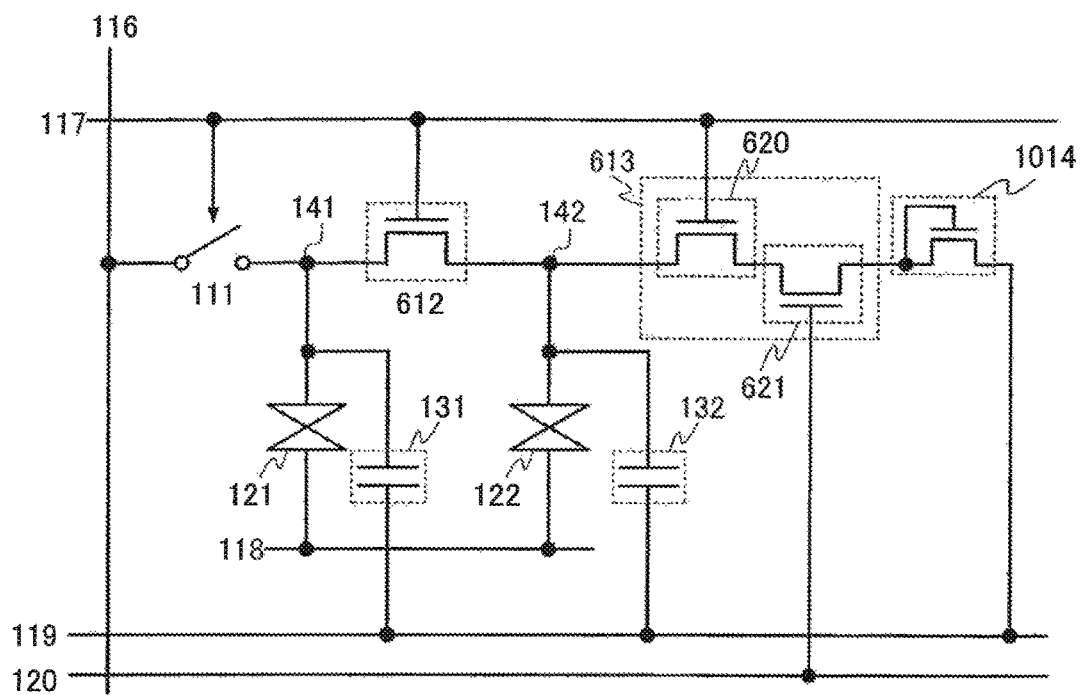
FIG. 10 is a diagram showing an example of a pixel structure of the present invention.

In addition, when the voltage applied to the second liquid crystal element 122 is lower than the threshold voltage of the liquid crystal included in the second liquid crystal element 122, for example in the case the on-resistance of the third transistor 613 is much lower than that of the second transistor 612, a diode-connected transistor 1014 which is serially connected to third transistor 613 may be provided as a resistor as shown in FIG. 10.

By the diode-connected transistor 1014, the voltage which is at least equal to or higher than the threshold voltage of the transistor 1014 can be held in the second storage capacitor 132. Therefore, by using the diode-connected transistor 1014, the voltage applied to the second liquid crystal element 122 can be increased, and the liquid crystal included in the second liquid crystal element 122 can be driven more surely. Since diodes have non-linearity, the resistance becomes larger in a region where the voltage is low;

accordingly, diodes are particularly effective in such a case. It is needless to say that a resistor can also be used. Here, the drawings are illustrated on the assumption that the potential which is based on the gray scale and is input from the signal line 116 is positive, and an example in which an n-channel transistor is used for the transistor 1014 and a drain electrode of the transistor 1014 is connected to the third transistor 613 is shown. Of course, a p-channel transistor can be used for the transistor 1014. However, a source electrode is connected to the third transistor 613 in this case.

Figure 11:
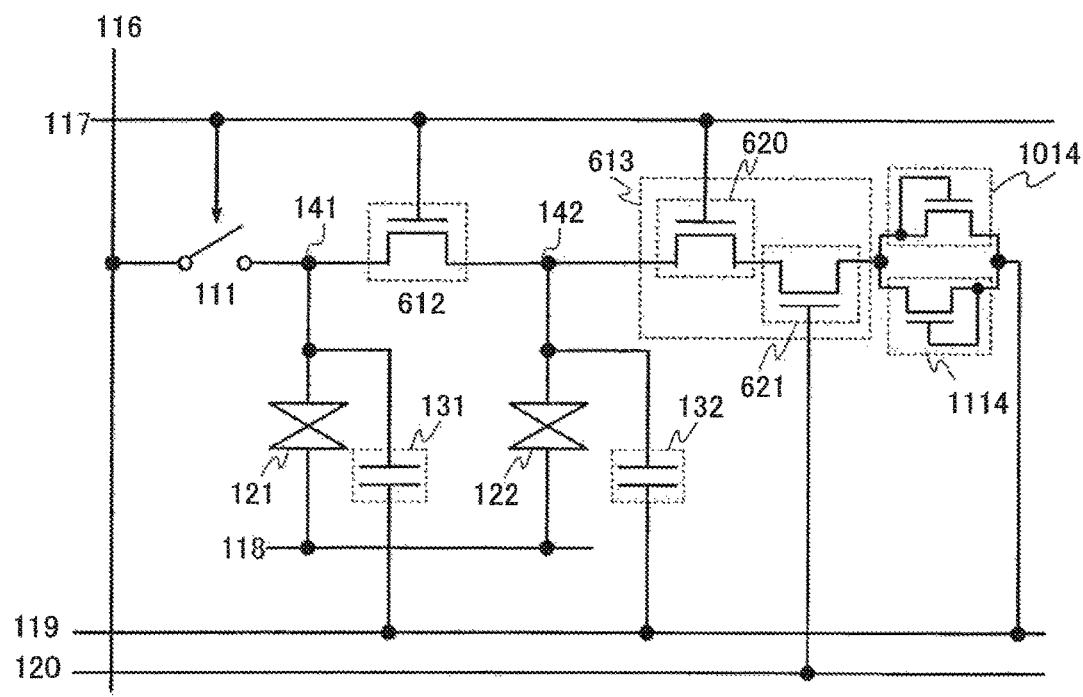
FIG. 11 is a diagram showing an example of a pixel structure of the present invention.

Note that when the source line inversion driving, the dot inversion driving or the like is performed as described above, positive and negative image signals with the potential of the common electrode as a center, in other words, image signals of positive polarity and negative polarity are supplied alternatively through a signal line in such a manner that the image signal is changed between positive polarity and negative polarity per frame period. In such case, an image signal is a signal which can be positive and negative with respect to the potential supplied to the Cs line. Therefore, the potential of the Cs line 119 may be changed between the time an image signal of positive polarity is input and the time an image signal of negative polarity is input. In other words, the potential of the Cs line 119 when a signal of negative polarity is input may be lower than that when a signal of positive polarity is input. Thus, the voltage can be supplied in each pixel electrode adequately. Note that the pixel shown in FIG. 10 may employ a structure shown in FIG. 11 in order to deal with both a positive image signal and a negative image signal. FIG. 11 shows a structure of a pixel in which a diode-connected transistor 1114 which is connected to the diode-connected transistor 1014 in FIG. 10 in parallel is further provided. Note that when these transistors are transistors having the same conductivity type, the transistor 1014 and the transistor 1114 are connected so that directions of the current flow are different from each other. By this structure, even if relation between the potential of Cs line 119 and the potential supplied from the signal line 116 is reversed, the voltage which is at least equal to or higher than the threshold voltage of the transistor 1014 or the transistor 1114 can be held in the second storage capacitor 132. Therefore, the voltage applied to the second liquid crystal element 122 can be increased, and the liquid crystal included in the second liquid crystal element 122 can be driven more surely. Note that the pixel structure shown in FIG. 11 may be used even when such a driving method is not used.

Figure 82:
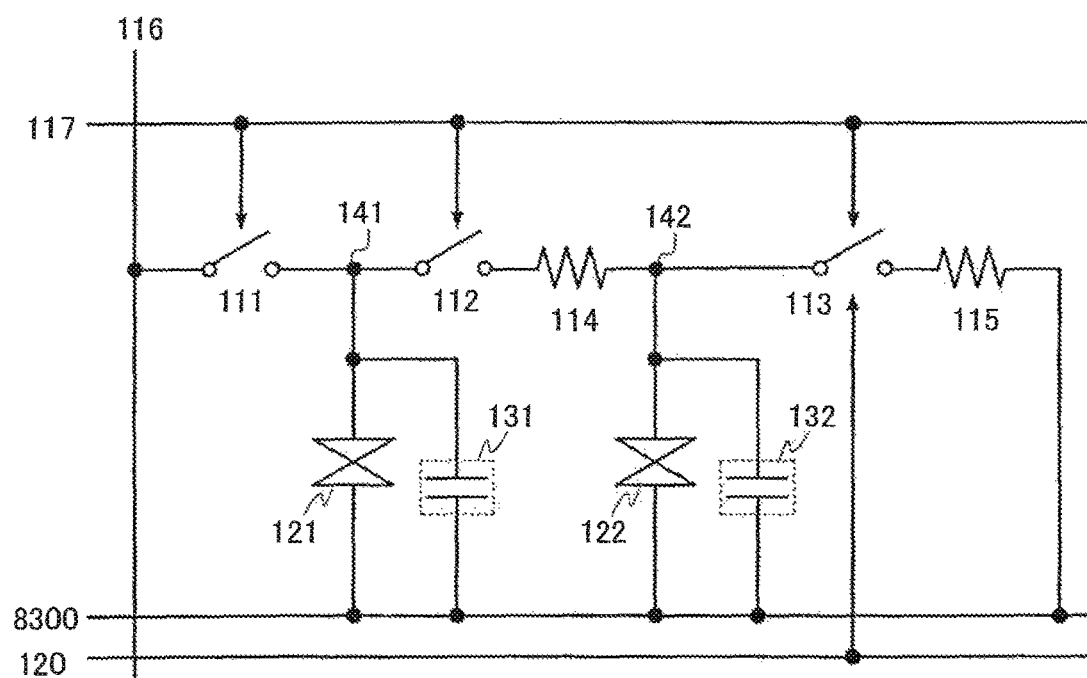
FIG. 82 is a diagram showing an example of a pixel structure of the present invention.

In addition, different potentials may be supplied to the common electrode 118 and the Cs line 119, or the same potential may be supplied thereto in this specification. In addition, as shown in FIG. 82, the Cs line 119 may be combined with the common electrode 118. Note that FIG. 82 shows a case where a wiring 8300 is used as a combination of the common electrode 118 and Cs line 119 of FIG. 1.

Figure 12:
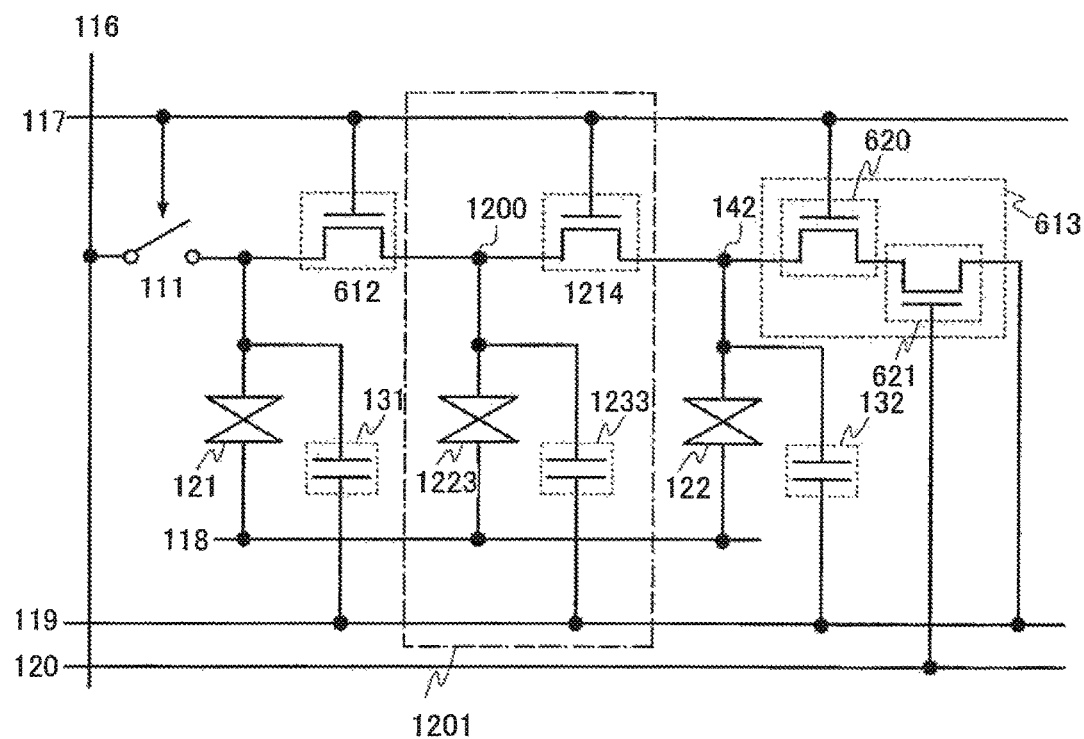
FIG. 12 is a diagram showing an example of a pixel structure of the present invention.

FIGS. 1 to 11 show the case where two liquid crystal elements are provided in one pixel; however the number of the liquid crystal elements included in a pixel is not limited in particular. FIG. 12 shows the case where three liquid crystal elements are provided in one pixel. A pixel shown in FIG. 12 includes a transistor 1214, a liquid crystal element 1223 and a storage capacitor 1233 in addition to the pixel structure shown in FIG. 6. In FIG. 12, a pixel electrode of the liquid crystal element 1223 is connected to the signal line 116 through the second transistor 612 and the first switch 111. When a connection portion of the pixel electrode of the liquid crystal element 1223 and the second transistor 612 is a node 1200, the node 1200 is connected to the node 142 through the transistor 1214. Note that a gate electrode of the transistor 1214 is connected to the first scan line 117 similar to the second transistor 612 and the third transistor 613. In addition, the node 1200 is connected to the Cs line 119 through the third storage capacitor 1233. In this manner, a unit 1201 which includes the transistor 1214, the liquid crystal element 1223, and the storage capacitor 1233 is provided between the second transistor 612 and the node 142 in FIG. 12. Note that when the number of the liquid crystal elements included in a pixel is increased, for example, the number of units 1201 may be increased. Of course, the present invention is not limited to this.

Figure 13:
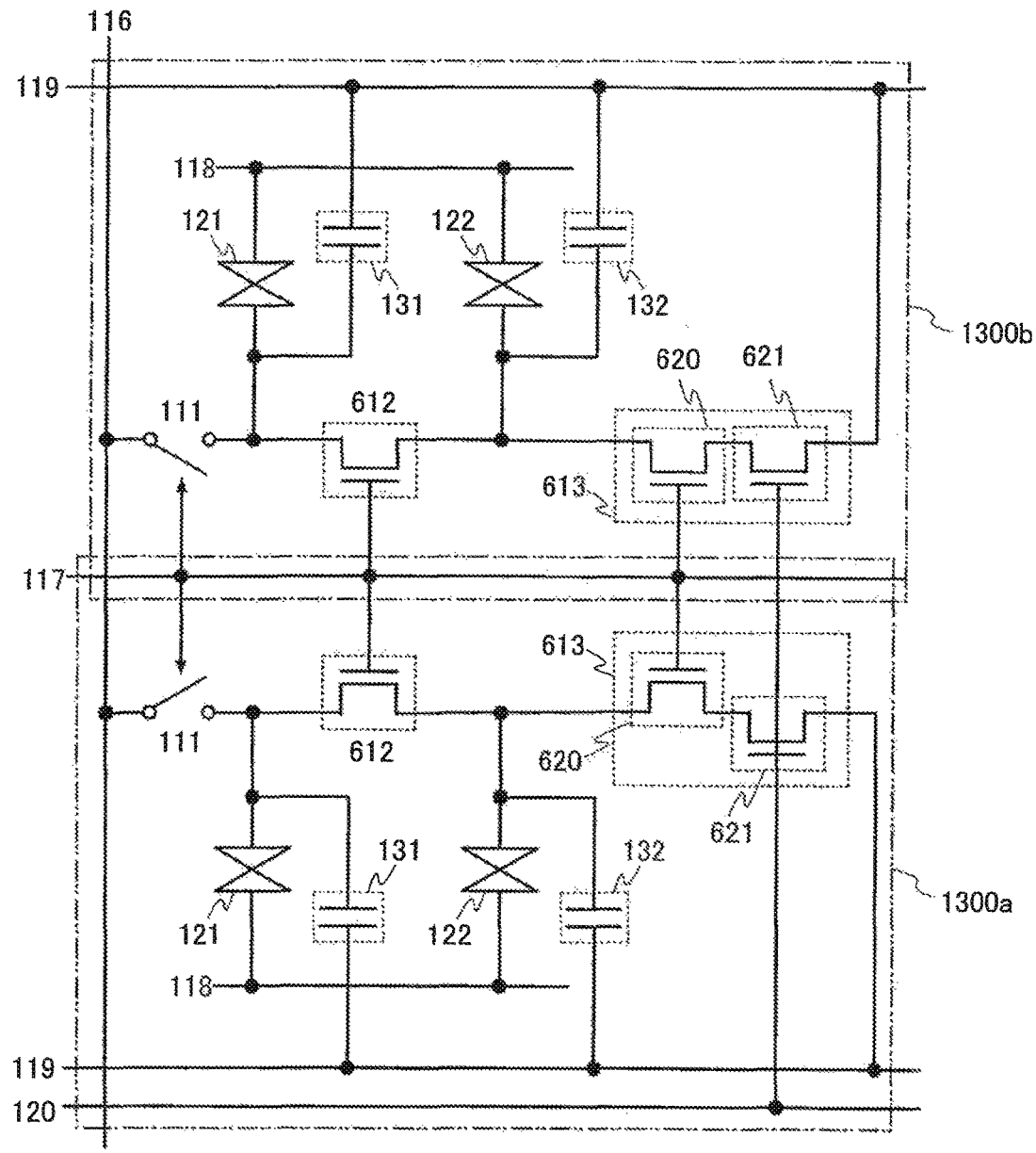
FIG. 13 is a diagram showing an example of a pixel structure of the present invention.

In addition, a plurality of pixel structures which are mentioned above may be provided in one pixel. FIG. 13 shows one structural example of such a pixel. A pixel shown in FIG. 13 includes two sub-pixels 1300*a* and 1300*b*, and gray scale of one pixel is expressed using these sub-pixels. In FIG. 13, the pixel structure shown in FIG. 6 is employed for each of the sub-pixels. Note that the signal line 116, the first scan line 117, and the second scan line 120 which are connected to the sub-pixels 1300*a* and 1300*b* are shared by the sub-pixels. The different potentials can be supplied to each Cs line 119 which is connected to sub-pixels 1300*a* and 1300*b*, so that different voltages can be applied to the liquid crystal elements which belong to different sub-pixels. In this way, the viewing angle characteristics can be further improved using a difference of the orientation of the liquid crystal in the sub-pixels.

Figure 14:
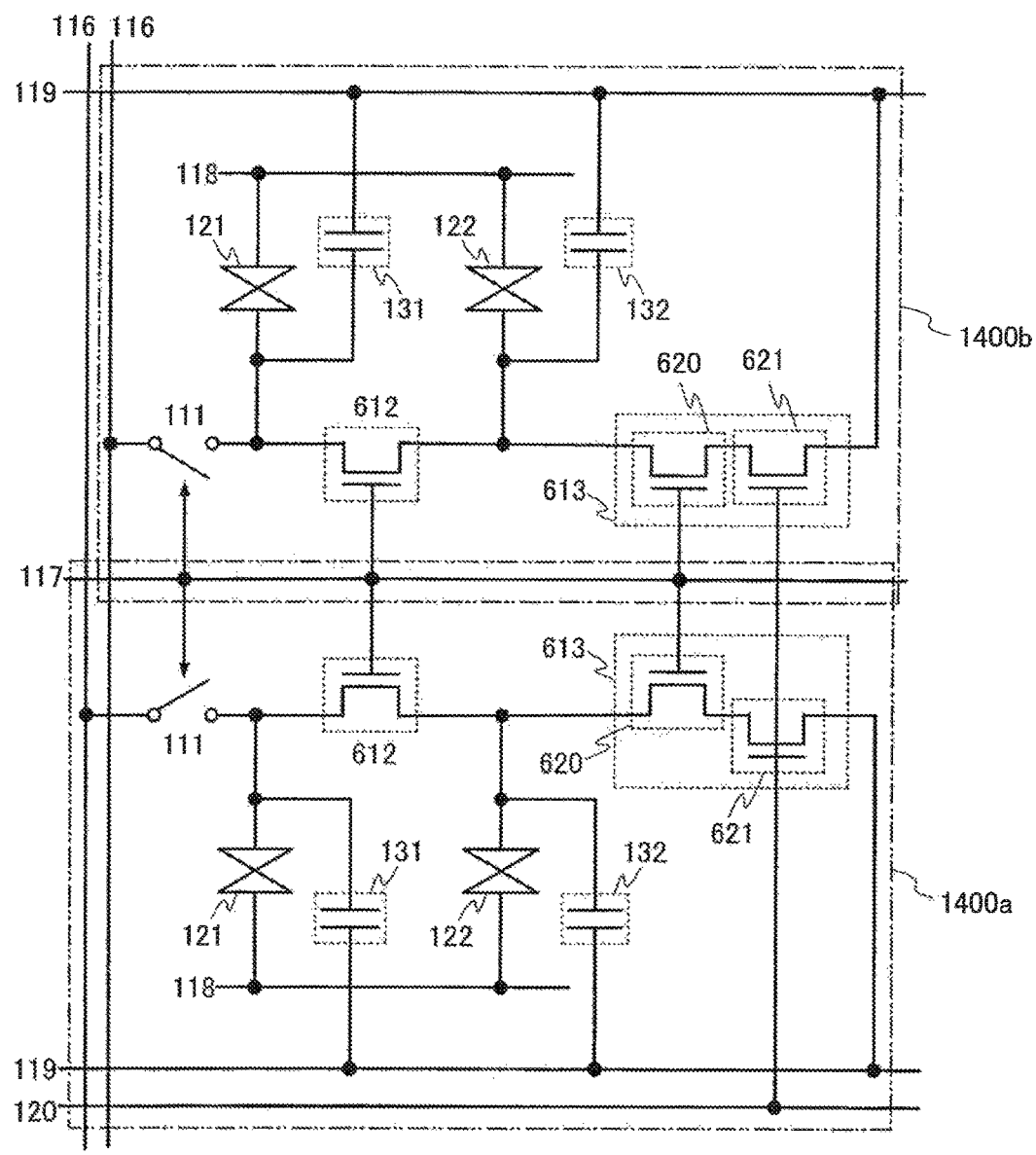
FIG. 14 is a diagram showing an example of a pixel structure of the present invention.
Figure 15:
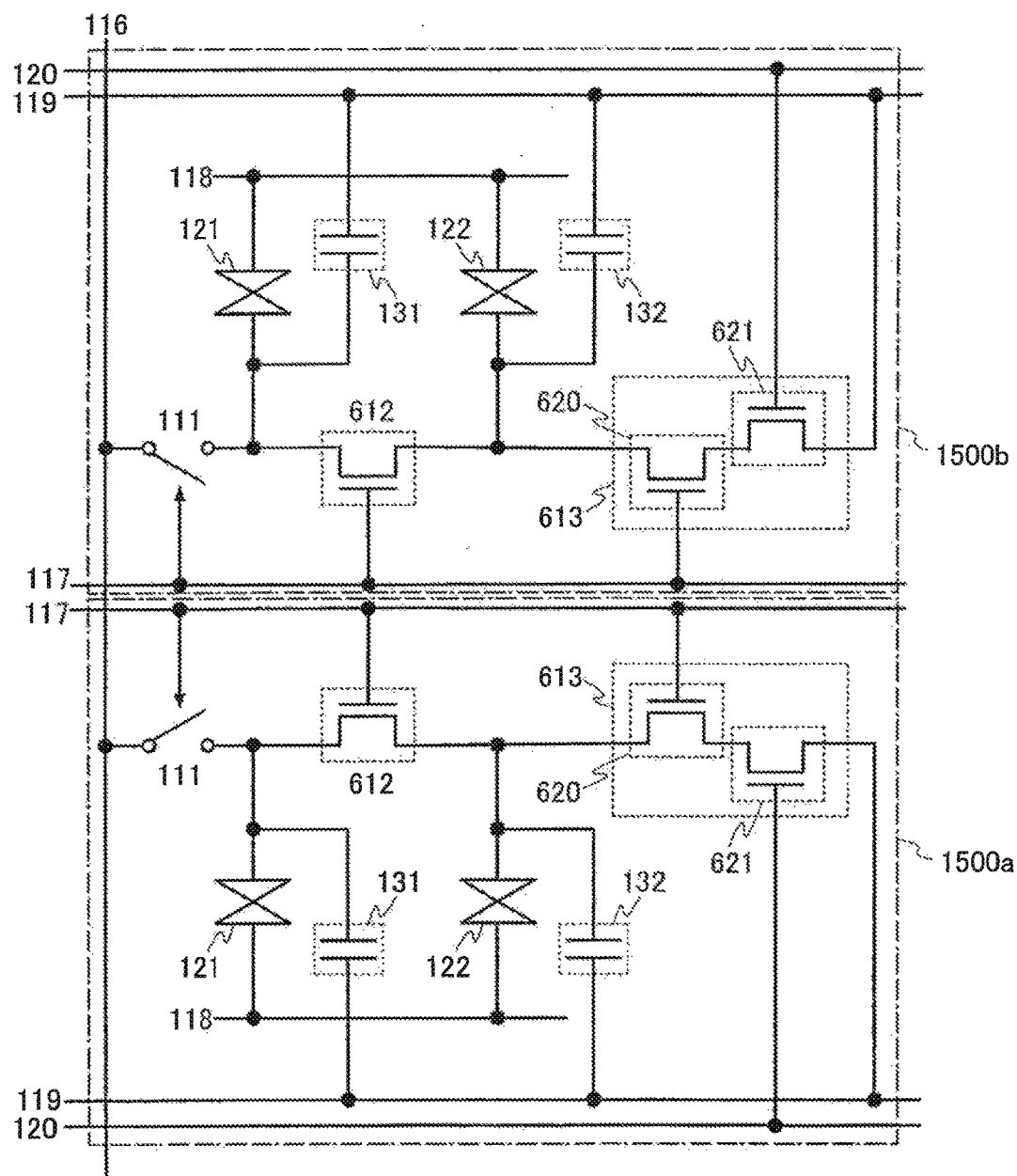
FIG. 15 is a diagram showing an example of a pixel structure of the present invention.

In addition, the case where the signal line 116, the first scan line 117, and the second scan line 120 are utilized as a common wiring in the sub-pixels as shown in FIG. 13 has been described; however, only the first scan line 117 and the second scan line 120 may be shared by sub-pixels 1400*a* and 1400*b* as shown in FIG. 14. In addition, only the signal line 116 may be shared by sub-pixels 1500*a* and 1500*b* as shown in FIG. 15, and the gray scale of one pixel may be expressed using these sub-pixels. Note that the wiring which is shared by the sub-pixels is not limited to the above line, and the Cs line 119 may be used, or two or more wirings may be shared as shown in FIGS. 13 and 14.

The shared wiring is not necessarily a wiring which has similar function among sub-pixels. For example, as shown in FIG. 16, a scan line which is different from the first scan line 117 among scan lines which controls the transistor 613 included in one sub-pixel 1600*a*, that is, the first scan line 117 included in the other sub-pixel 1600*b* which is located on the next portion, can be used.

Figure 16:
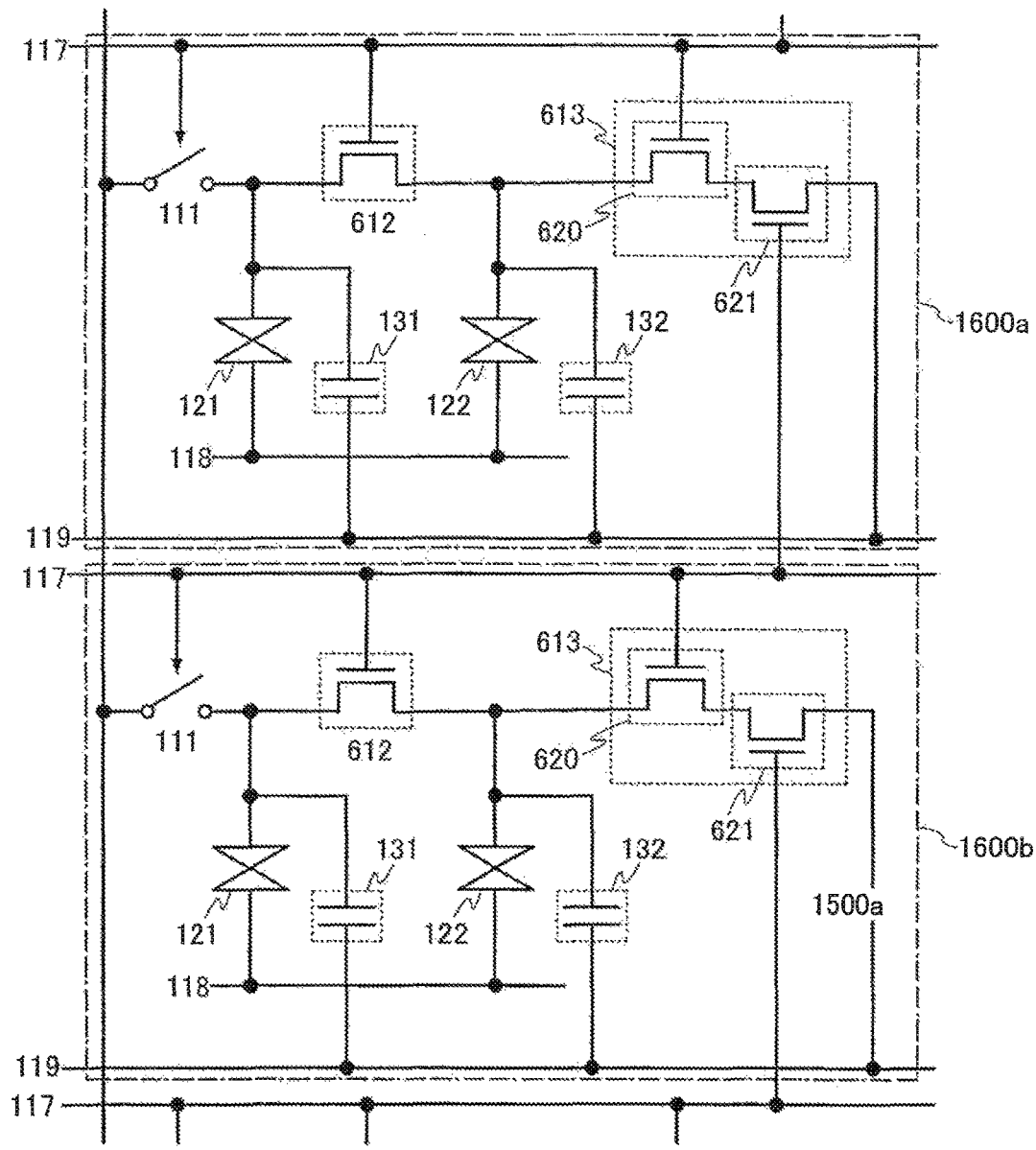
FIG. 16 is a diagram showing an example of a pixel structure of the present invention.

Note that in the pixel shown in FIG. 16, the first switch 111 and the transistor 612 included in a pixel of the next row is turned on before the writing for the pixel which includes the sub-pixel 1600*a* and the sub-pixel 1600*b* is completed. Therefore, the voltage which is applied to the first liquid crystal element 121 and the second liquid crystal element 122 included in the pixel of the next row changes from the voltage based on the gray scale of the pixel. However, similar to the pixel structure of FIG. 6, since a video signal is written to the pixel of the next row after the pixel which includes the sub-pixel 1600*a* and sub-pixel 1600*b*, a period when the transistor 613 is turn on, in other words the latter half of the writing period is set so that the display is not influenced, whereby changing the voltage does not cause a problem in particular.

In addition, FIGS. 13 to 16 show the case where one pixel includes sub-pixels having the same structure; however, the structures may be different among sub-pixels. In addition, the case where the first switch 111, the transistor 612 and the transistor 613 are controlled by using the same scan line is described mainly; alternatively, different scan lines may be used for controlling switches as shown in FIG. 2.

In the above-described manner, the viewing angle characteristics can be improved by the present invention. Further, the present invention can be driven without reduction in contrast; therefore, a liquid crystal display device which has higher display quality can be provided.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a part thereof) described in a drawing in another embodiment mode. Further, even more drawings can be formed by combining each part with part of another embodiment mode in the drawings of this embodiment mode.

Note that this embodiment mode shows an example of an embodied case of the contents (or a part thereof) described in other embodiment modes, an example of slight transformation thereof, an example of partial modification thereof, an example of improvement thereof; an example of detailed description thereof; an application example thereof, an example of related part thereof; or the like. Therefore, the contents described in other embodiment modes can be freely applied to, combined with, or replaced with this embodiment mode.

Embodiment Mode 2

In this embodiment mode, an example of the pixel structure which is different from that of Embodiment Mode 1 is described. A pixel shown in FIG. 19 includes the first switch 111, a second switch 1712, the third switch 113, the first resistor 114, the second resistor 115, the first liquid crystal element 121, the second liquid crystal element 122, the first storage capacitor 131, and the second storage capacitor 132. In addition, the pixel is connected to the signal line 116, the first scan line 117, the second scan line 120, and the Cs line 119.

Note that on/off of the first switch 111 is controlled by a signal input to the first scan line 117, and on/off of the second switch 1712 and the third switch 113 is controlled by both signals input to the first scan line 117 and the second scan line 120. As described above, the pixel structure shown in FIG. 19 is different from the pixel structure shown in FIG. 1 in that the second switch 1712 is controlled by both signals of the first scan line 117 and the second scan line 120. Reference numerals denoting the same components as those in FIG. 1 are used in common throughout the drawings, and the description is omitted.

Figure 19:
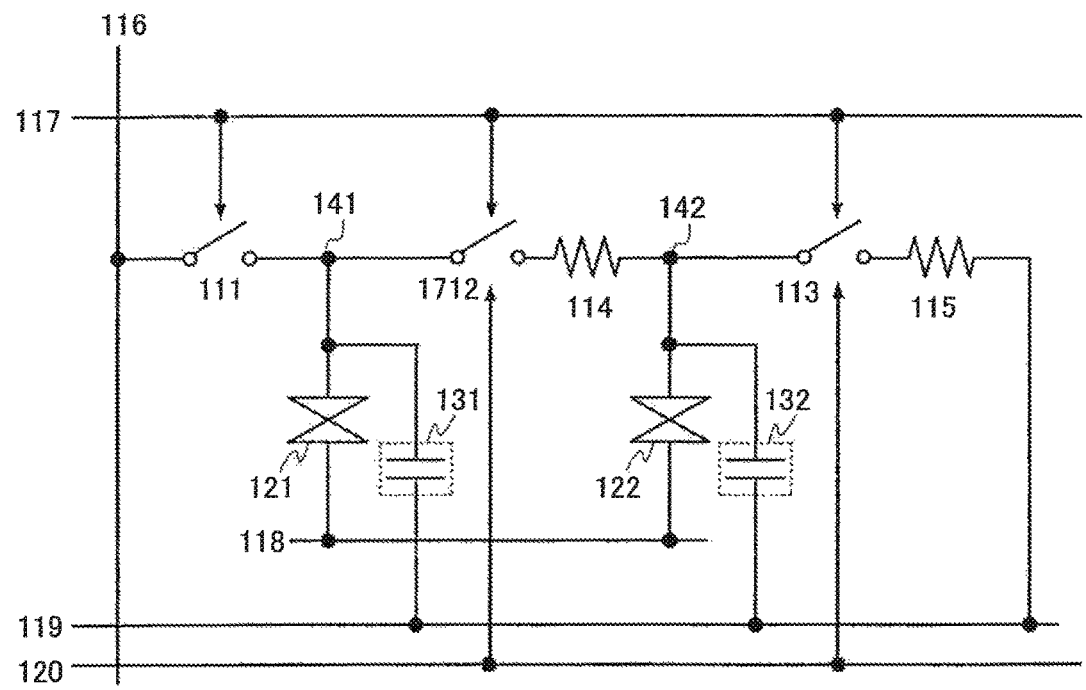
FIG. 19 is a diagram showing an example of a pixel structure of the present invention.

In a pixel shown in FIG. 19, a writing period is divided into the first half and the latter half by using the first switch 111, the second switch 1712, and the third switch 113 in the similar manner to the pixel shown in FIG. 1

Note that the case is described where the first switch 111 is turned on when an H level is input to the first scan line 117, and the second switch 1712 and the third switch 113 are turned on only when an H level is input to both of the first scan line 117 and the second scan line 120.

First, in the first half of the writing period, an H level is input to the first scan line 117, and an L level is input to the second scan line 120, and then, the first switch 111 is turned on. At that time the second switch 1712 and the third switch 113 are turned off, so that the potential can be supplied to the pixel electrode of the first liquid crystal element 121 quickly.

After that, in the latter half of the writing period, an H level is also input to the second scan line 120, and then, the second switch 1712 and the third switch 113 as well as the first switch 111 can be turned on. In this manner, the signal line 116 and the Cs line 119 which are electrically disconnected are electrically connected. Therefore, the potential which is supplied to the pixel electrode of the first liquid crystal element 121 in the first half of the writing period can be adjusted to the appropriate potential based on the gray scale of the pixel quickly. In addition, the potential based on the gray scale of the pixel is supplied to the pixel electrode of the second liquid crystal element 122.

In this manner, the gray scale of the pixel can be expressed using the potential difference, that is, the voltage, held in the first liquid crystal element 121 and the second liquid crystal element 122. Since the value of voltage applied is different between the first liquid crystal element 121 and the second liquid crystal element 122, liquid crystal which is included in each liquid crystal element shows different orientations. Therefore, viewing angle characteristics can be improved. In addition, a video signal can be written into the pixel quickly.

Note that the gray scale that the pixel expresses is determined by the orientation of the liquid crystal which is included in each of the first liquid crystal element 121 and the second liquid crystal element 122 in the pixel, whereby the potential supplied from the signal line 116 should be determined in consideration of these factors.

In addition various forms of switches can be used for the first switch 111, the second switch 1712, and the third switch 113, and an electric switch or a mechanical switch can be applied to the switches. That is, any element can be used as long as it can control a current flow, without limitation to a particular element. For example, the switch may be a transistor, a diode, or a logic circuit with combines them.

Figure 20:
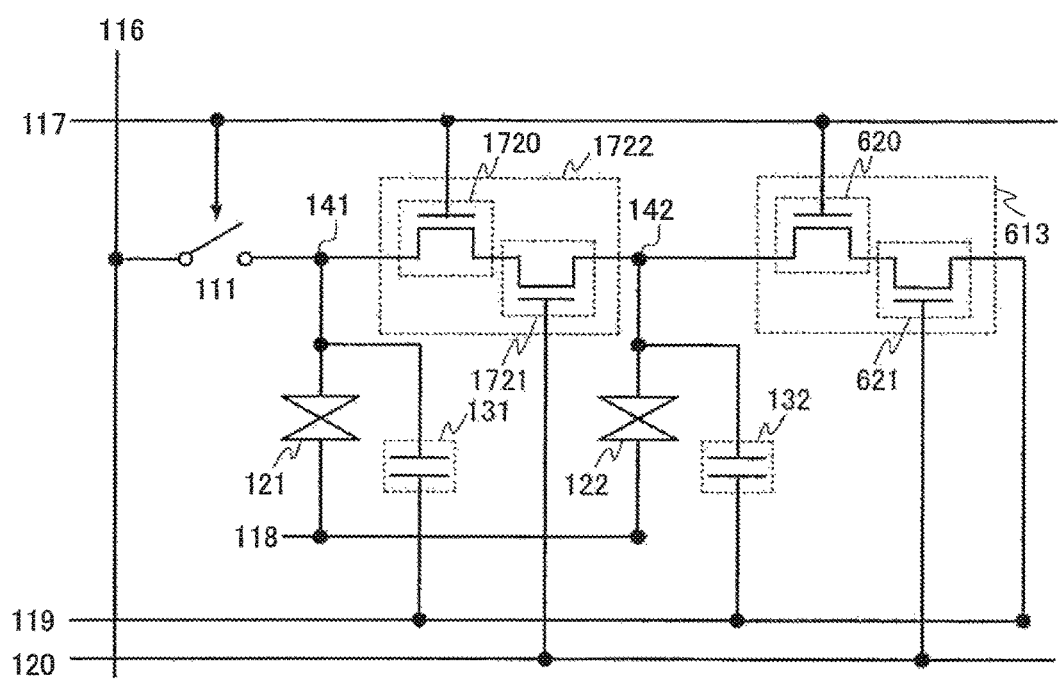
FIG. 20 a diagram showing an example of a pixel structure of the present invention.

Therefore, similar to FIG. 6, a structure in which a second transistor 1722 and a third transistor 613 are used for the second switch 1712 and the third switch 113 of FIG. 19, respectively, as shown in FIG. 20, and further, the first resistor 114 and the second resistor 115 of FIG. 19 may be realized by using on-resistance of these transistors may be employed to omit these resistances. Note that the second transistor 1722 and the third transistor 613 are needed to be controlled by both signals input to the first scan line 117 and the second scan line 120. Therefore, each of the second transistor 1722 and the third transistor 613 is configured by two transistors of which gate electrode is connected to the first scan line 117 and the second scan line, respectively.

Figure 21:
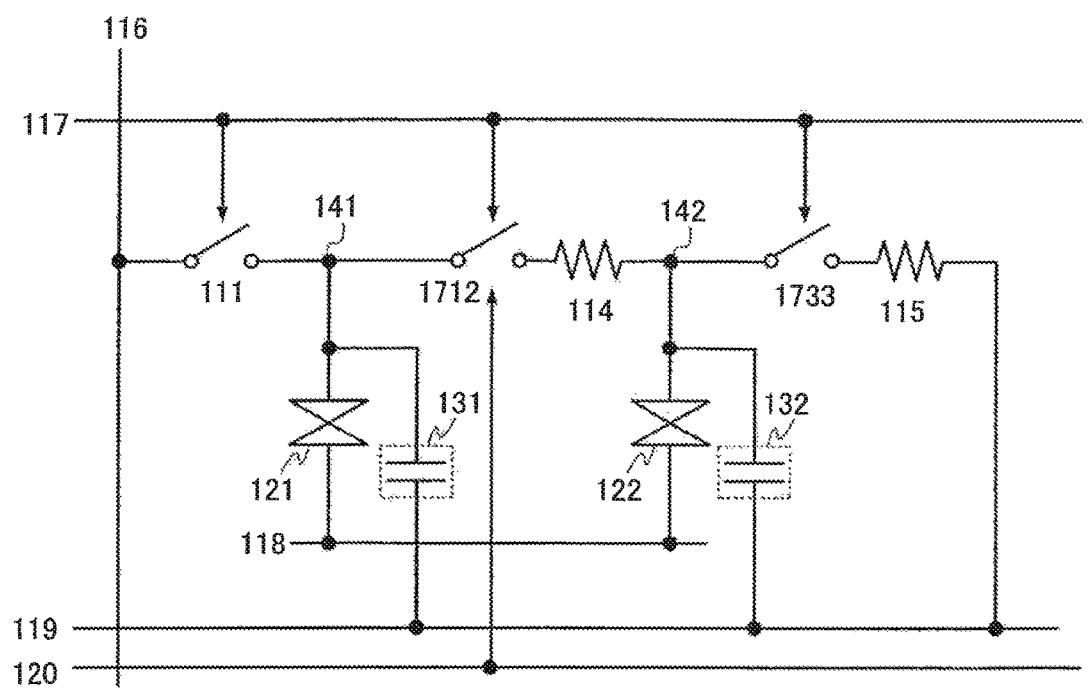
FIG. 21 is a diagram showing an example of a pixel structure of the present invention.

In addition, in order to electrically disconnect the signal line 116 and the Cs line 119 in the first half of the writing period, only the third switch 113 are used in FIG. 1 in Embodiment Mode 1, and the second switch 1712 and the third switch 113 is used in FIG. 19; however, the structure is not limited to these structure. For example, only the second switch 1712 may be used as shown in FIG. 21. In this case, on/off of the first switch 111 and the third switch 1733 are controlled by a signal input to the first scan line 117, and on/off of the second switch 1712 is controlled by both signals input to the first scan line 117 and the second scan line 120.

Figure 22:
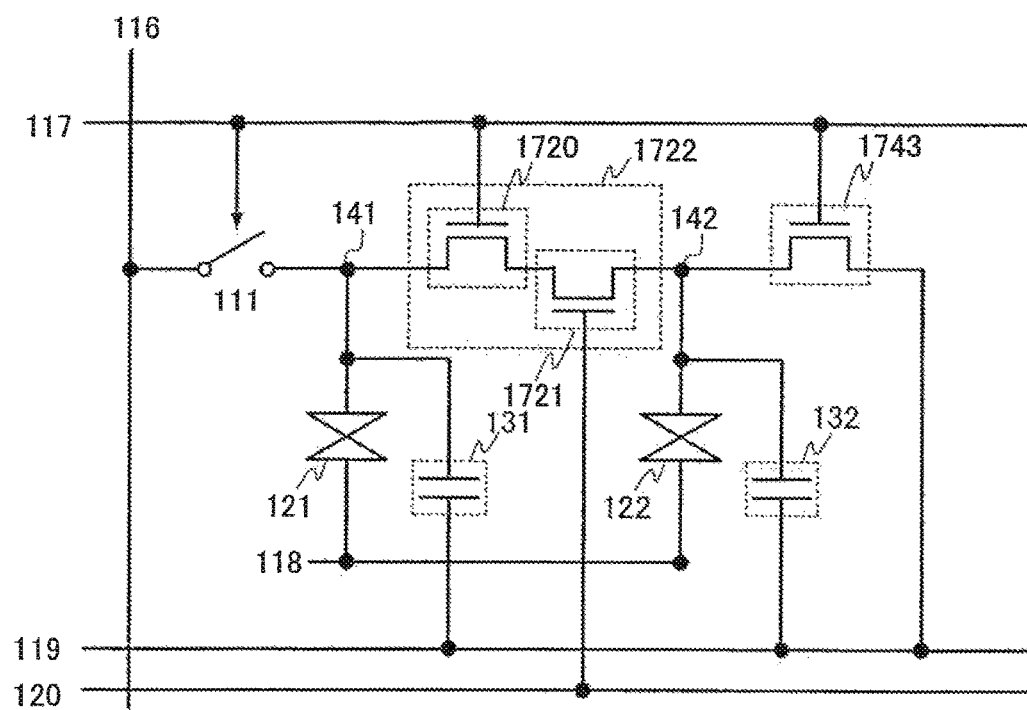
FIG. 22 is a diagram showing an example of a pixel structure of the present invention.

In addition, the second transistor 1722 and a third transistor 1743 are used for the second switch 1712 and the third switch 1733 in FIG. 21, respectively, as shown in FIG. 22, and further, the first resistor 114 and the second resistor 115 in FIG. 21 may be realized by using on-resistance of these transistors to omit these resistances.

Figure 23:
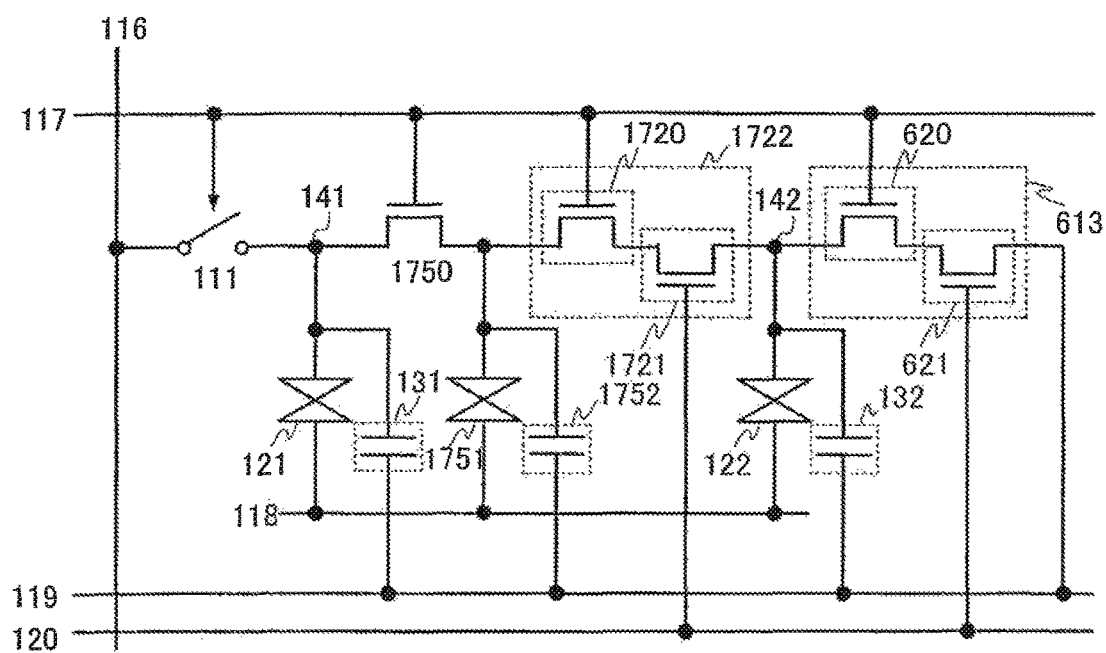
FIG. 23 is a diagram showing an example of a pixel structure of the present invention.

In addition, the number of liquid crystal elements included in one pixel is not limited in particular as described in Embodiment Mode 1. For example, a unit which includes a transistor 1750, a liquid crystal element 1751, and a storage capacitor 1752 may be further provided between the node 141 and the transistor 1722 in FIG. 20 as shown in FIG. 23. Note that in the first half of the writing period, a switch for electrically disconnecting the signal line 116 and the Cs line 119 is not limited to the transistor 1722 and the transistor 613, and the signal line 116 and the Cs line 119 are electrically disconnected by using a transistor included in the unit.

In the above-described manner, the viewing angle characteristics can be improved by the present invention. Further, the present invention can be driven without reduction in contrast; therefore, a liquid crystal display device which has higher display quality can be provided.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a part thereof) described in a drawing in another embodiment mode. Further, even more drawings can be formed by combining each part with part of another embodiment mode in the drawings of this embodiment mode.

Note that this embodiment mode shows an example of an embodied case of the contents (or a part thereof) described in other embodiment modes, an example of slight transformation thereof; an example of partial modification thereof, an example of improvement thereof; an example of detailed description thereof, an application example thereof; an example of related part thereof; or the like. Therefore, the contents described in other embodiment modes can be freely applied to, combined with, or replaced with this embodiment mode.

Embodiment Mode 3

Figure 24:
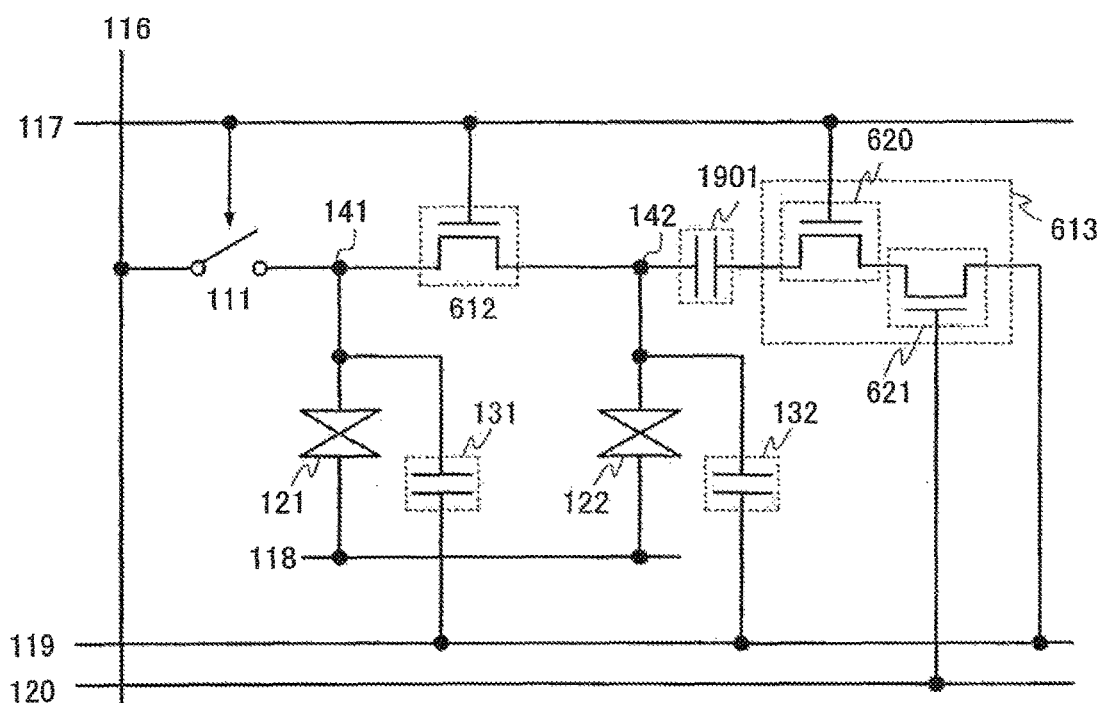
FIG. 24 is a diagram showing an example of a pixel structure of the present invention.

In this embodiment mode, an example of the pixel structure which is different from that of Embodiment Mode 1. A pixel shown in FIG. 24 includes the switch 111, the transistor 612, the transistor 613, the first liquid crystal element 121, the second liquid crystal element 122, the first storage capacitor 131, the second storage capacitor 132, and a third storage capacitor 1901. Note that the pixel shown in FIG. 24 is connected to the signal line 116, the first scan line 117, the second scan line 120, and the Cs line 119, and has a structure in which the third storage capacitor 1901 is provided between the node 142 and one electrode of the transistor 620 which is one transistor that configures the transistor 613 in the pixel shown in FIG. 6 in Embodiment Mode 1. Note that reference numerals denoting the same components as those in FIG. 6 are used in common throughout the drawings, and the description is omitted.

The pixel shown in FIG. 24 can be operated in a similar manner to the pixel shown in FIG. 6. Note that by providing the third storage capacitor 1901, it takes time to obtain the potential which corresponds to the gray scale that should be supplied to the pixel electrode of the second liquid crystal element 122. Therefore, response speed of the liquid crystal included in the second liquid crystal element 122 to which lower voltage is applied compared to the first liquid crystal element 121 is intentionally made slower, whereby viewing angle characteristics can be improved. In this case also, the gray scale that the pixel expresses is determined by the orientation of the liquid crystal which is included in each of the first liquid crystal element 121 and the second liquid crystal element 122 in the pixel, whereby the potential supplied from the signal line 116 is determined in consideration of these factors.

Figure 25:
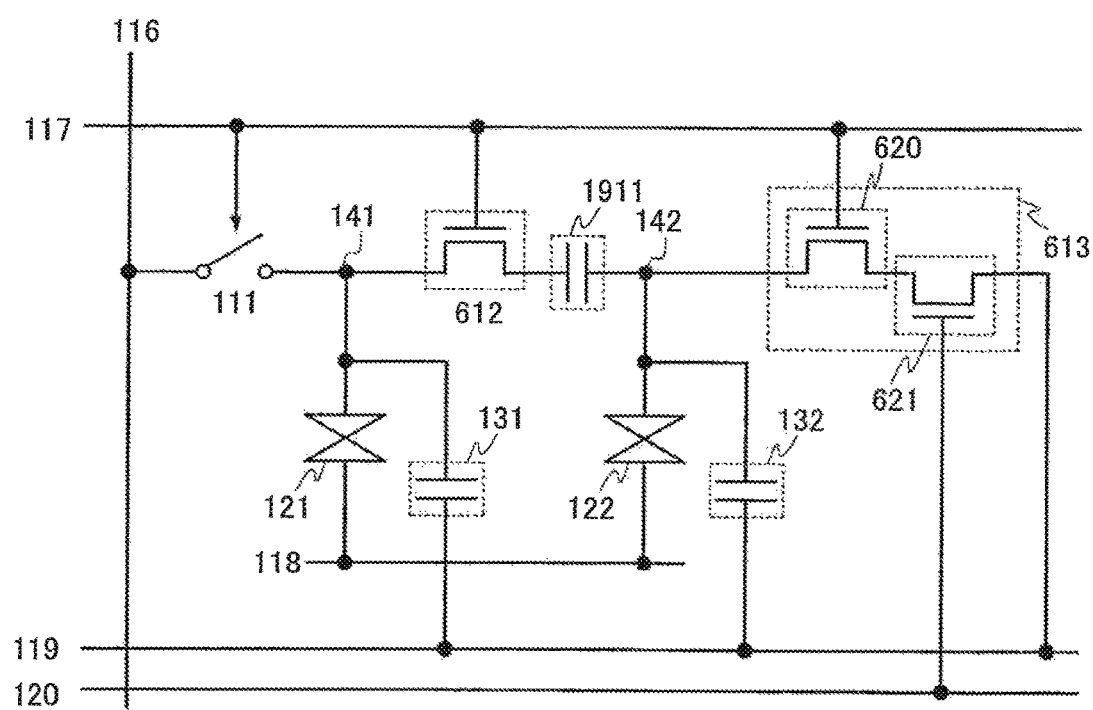
FIG. 25 is a diagram showing an example of a pixel structure of the present invention.

In addition, the third storage capacitor 1911 may be provided between the transistor 612 and the node 142 as shown in FIG. 25. The pixel shown in FIG. 25 can be operated in a similar manner to the pixel shown in FIG. 6. It takes time to obtain the potential which corresponds to the gray scale that should be supplied to the pixel electrode of the second liquid crystal element 122, similar to the pixel shown in FIG. 24. Viewing angle characteristics can be further improved by using this. In this case, the potential supplied from the signal line 116 needed to be determined by taking into account the factor that the voltage applied to the second liquid crystal element 122 is determined by capacitance division with the third storage capacitor 1911.

Also in the above mentioned pixel structure, the gray scale that the pixel expresses is determined by the orientation of the liquid crystal which is included in each of the first liquid crystal element 121 and the second liquid crystal element 122 in the pixel in a similar manner to Embodiment Mode 1, whereby the viewing angle characteristics can be improved. Further, the present invention can be driven without reduction in contrast; therefore, a liquid crystal display device which has higher display quality can be provided.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a part thereof) described in a drawing in another embodiment mode. Further, even more drawings can be formed by combining each part with part of another embodiment mode in the drawings of this embodiment mode.

Note that this embodiment mode shows an example of an embodied case of the contents (or a part thereof) described in other embodiment modes, an example of slight transformation thereof, an example of partial modification thereof an example of improvement thereof, an example of detailed description thereof; an application example thereof an example of related part thereof, or the like. Therefore, the contents described in other embodiment modes can be freely applied to, combined with, or replaced with this embodiment mode.

Embodiment Mode 4

Figure 26:
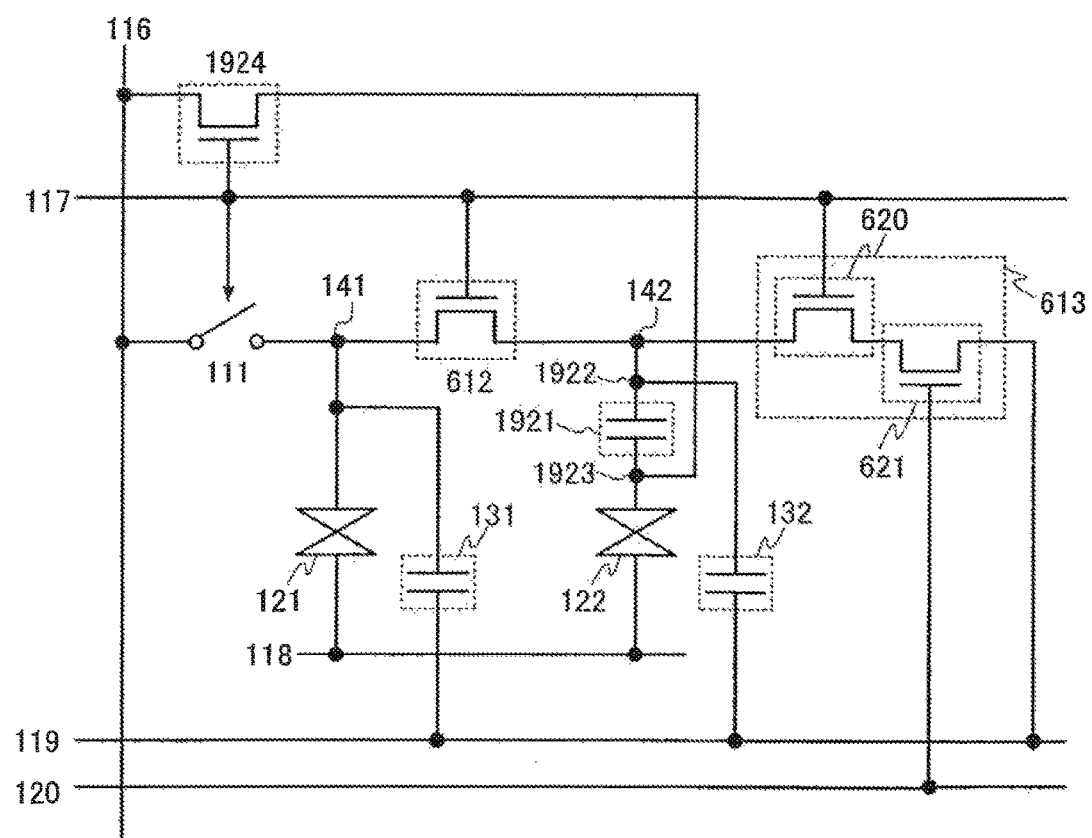
FIG. 26 is a diagram showing an example of a pixel structure of the present invention.

In this embodiment mode, an example of the pixel structure which is different from those of Embodiment Modes 1 to 3 is described. The pixel shown in FIG. 26 includes the switch 111, the transistor 612, the transistor 613, a transistor 1924, the first liquid crystal element 121, the second liquid crystal element 122, the first storage capacitor 131, the second storage capacitor 132, and a third storage capacitor 1921. Note that the pixel shown in FIG. 26 is connected to the signal line 116, the first scan line 117, the second scan line 120, and the Cs line 119, and has a structure where the transistor 1924 and the third storage capacitor 1921 are further provided in the pixel shown in FIG. 6 in Embodiment Mode 1. Reference numerals denoting the same components as those in FIG. 6 are used in common throughout the drawings, and the description is omitted.

When a connection portion of the node 142 and the first electrode of the second storage capacitor 132 is a node 1922, the third storage capacitor 1921 is provided between the node 1922 and the pixel electrode of the second liquid crystal element 122. In addition, when a connection portion of the third storage capacitor 1921 and the pixel electrode of the second liquid crystal element 122 is a node 1923, the transistor 1924 is provided between the node 1923 and the signal line 116. In other words, the node 1923 is connected to the signal line 116 through the transistor 1924. On/off of the transistor 1924 is controlled by a signal input to the first scan line 117 as in the case of the switch 111, the transistor 612, and the transistor 620.

The pixel shown in FIG. 26 can be operated in a similar manner to the pixel shown in FIG. 6. Note that the potential is supplied to the pixel electrodes of the first liquid crystal element 121 and the second liquid crystal element 122 from the signal line 116 through the switch 111 and the transistor 1924, respectively, at the same time. Therefore, the potential of the pixel electrode of each liquid crystal element can be adjusted to the appropriate potential based on the gray scale of the pixel quickly. Thus, it is effective in the case of high speed operation. In addition, also in the pixel shown in FIG. 26, the gray scale that the pixel expresses is determined by the orientation of the liquid crystal which is included in each of the first liquid crystal element 121 and the second liquid crystal element 122 in the pixel, whereby the viewing angle characteristics can be improved. Note that it is preferable that the on-resistance of the transistor 1924 be higher than that of the switch 111.

Thus, viewing angle characteristics can be improved by the present invention. Further, the present invention can be driven without reduction in contrast; therefore, a liquid crystal display device which has higher display quality can be provided.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a part thereof) described in a drawing in another embodiment mode. Further, even more drawings can be formed by combining each part with part of another embodiment mode in the drawings of this embodiment mode.

Note that this embodiment mode shows an example of an embodied case of the contents (or a part thereof) described in other embodiment modes, an example of slight transformation thereof an example of partial modification thereof; an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 5

Figure 27:
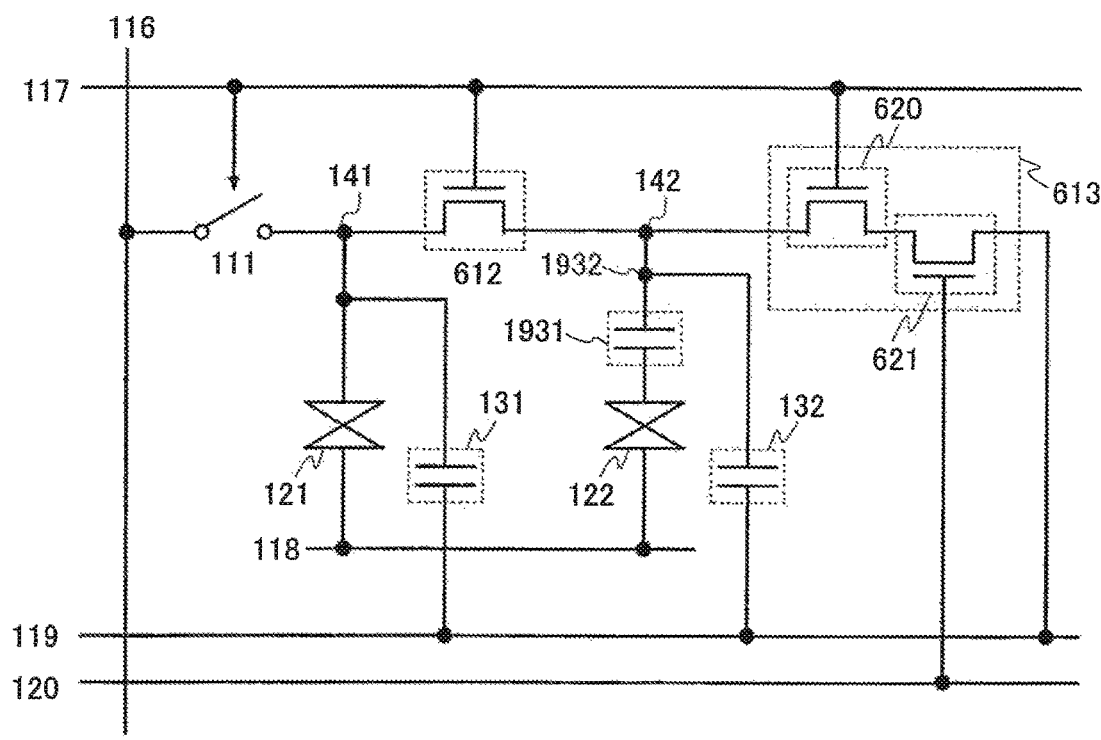
FIG. 27 is a diagram showing an example of a pixel structure of the present invention.

In this embodiment mode, an example of the pixel structure which is different from those of Embodiment Modes 1 to 4 is described. The pixel shown in FIG. 27 includes the switch 111, the transistor 612, the transistor 613, the first liquid crystal element 121, the second liquid crystal element 122, the first storage capacitor 131, the second storage capacitor 132, and a third storage capacitor 1931. Note that the pixel 6 shown in FIG. 27 is connected to the signal line 116, the first scan line 117, the second scan line 120, and the Cs line 119, and has a structure where the third storage capacitor 1931 is further provided in the pixel shown in FIG. 6 in Embodiment Mode 1. Reference numerals denoting the same components as those in FIG. 6 are used in common throughout the drawings, and the description is omitted.

When a connection portion of the node 142 and the first electrode of the second storage capacitor 132 is a node 1932, the third storage capacitor 1931 is provided between the node 1932 and the pixel electrode of the second liquid crystal element 122.

The pixel shown in FIG. 27 can be operated in a similar manner to the pixel shown in FIG. 6. Note that by providing the third storage capacitor 1931, it takes time to obtain the potential which corresponds to the gray scale that should be supplied to the pixel electrode of the second liquid crystal element 122. Viewing angle characteristics can be further improved by using this. In addition, since the voltage applied to the second liquid crystal element 122 is determined by capacitance division with the third storage capacitor 1931, providing the third storage capacitor 1931 is effective when low voltage designed to be applied to the second liquid crystal element 122.

Also in the pixel of this embodiment mode, the gray scale that the pixel expresses is determined by the orientation of the liquid crystal which is included in each of the first liquid crystal element 121 and the second liquid crystal element 122 in the pixel, whereby the viewing angle characteristics can be improved.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a pert thereof) described in a drawing in another embodiment mode. Further, even more drawings can be formed by combining each part with part of another embodiment mode in the drawings of this embodiment mode.

Note that this embodiment mode shows an example of an embodied case of the contents (or a part thereof) described in other embodiment modes, an example of slight transformation thereof, an example of partial modification thereof, an example of improvement thereof, an example of detailed description thereof, an application example thereof an example of related part thereof, or the like. Therefore, the contents described in other embodiment modes can be freely applied to, combined with, or replaced with this embodiment mode.

Embodiment Mode 6

In this embodiment mode, a pixel structure of a display device is described. In particular, a pixel structure of a liquid crystal display device is described.

A pixel structure in the case where each liquid crystal mode and a transistor are combined is described with reference to cross-sectional views of a pixel.

Note that as the transistor, a thin film transistor (a TFT) or the like including a non-single crystalline semiconductor layer typified by amorphous silicon, polycrystalline silicon, micro crystalline (also referred to as semi-amorphous) silicon, or the like can be used. As a structure of the transistor, a top-gate structure, a bottom-gate structure, or the like can be used. Note that a channel-etched transistor, a channel-protective transistor, or the like can be used as a bottom-gate transistor.

Figure 28:
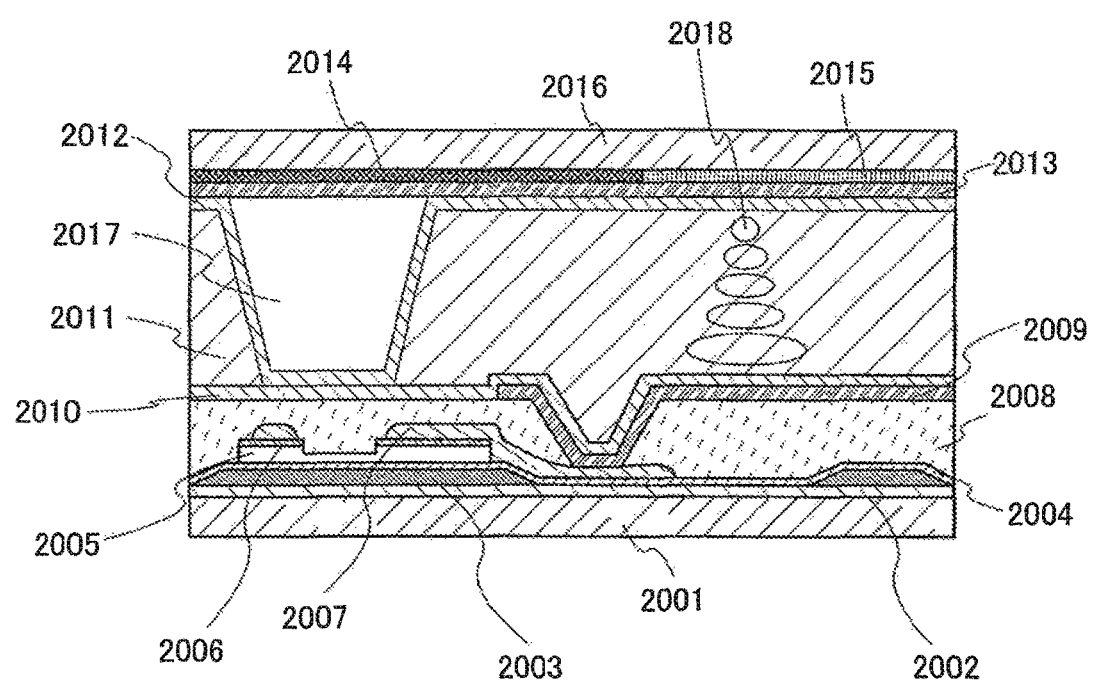
FIG. 28 is a diagram showing an exemplary structure of a display device of the present invention.

FIG. 28 is an example of a cross-sectional view of a pixel in the case where a TN mode and a transistor are combined. Features of the pixel structure shown in FIG. 28 are described.

Liquid crystal molecules 2018 shown in FIG. 28 are long and narrow molecules each having a major axis and a minor axis. In FIG. 28, a direction of each of the liquid crystal molecules 2018 is expressed by the length thereof. That is, the direction of the major axis of the liquid crystal molecule 2018, which is expressed as long, is parallel to the page (a cross-sectional direction shown in FIG. 28), and as the liquid crystal molecule 2018 is expressed to be shorter, the direction of the major axis becomes closer to a normal direction of the page. That is, among the liquid crystal molecules 2018 shown in FIG. 28, the direction of the major axis of the liquid crystal molecule 2018 which is close to the first substrate 2001 and the direction of the major axis of the liquid crystal molecule 2018 which is close to the second substrate 2016 are different from each other by 90 degrees, and the directions of the major axes of the liquid crystal molecules 2018 located therebetween are arranged so as to link the above two directions smoothly. That is, the liquid crystal molecules 2018 shown in FIG. 28 are aligned to be twisted by 90 degrees between the first substrate 2001 and the second substrate 2016.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion displaying images, which is called a liquid crystal panel. The liquid crystal panel is manufactured as follows: two processed substrates are attached to each other with a gap of several µm therebetween, and a liquid crystal material is injected into a space between the two substrates. That is, the liquid crystal is interposed between the first substrate and the second substrate. In FIG. 28, liquid crystal 2011 is interposed between the first substrate 2001 and the second substrate 2016. A transistor and a pixel electrode are formed over the first substrate. A light-shielding film 2014, a color filter 2015, a fourth conductive layer 2013, a spacer 2017, and a second alignment film 2012 are formed over the second substrate 2016.

When the light-shielding film 2014 is formed, a display device with little light leakage at the time of black display can be obtained. The light-shielding film 2014 is 6 not necessarily provided over the second substrate 2016. When the light-shielding film 2014 is not formed, the number of steps can be reduced, so that manufacturing cost can be reduced and yield can be improved.

The color filter 2015 is not necessarily provided over the second substrate 2016. When the color filter 2015 is not formed, the number of steps can be reduced similarly to when the light-shielding film is not formed, so that manufacturing cost can be reduced and yield can be improved. Note that even when the color filter 2015 is not formed, a display device which can perform color display can be obtained by field sequential driving.

Spherical spacers may be dispersed over the second substrate 2016 instead of forming the spacer 2017. When the spherical spacers are dispersed, the number of steps is reduced, so that manufacturing cost can be reduced. In addition, yield can be improved. Alternatively, when the spacer 2017 is formed, a distance between the two substrates can be uniform easily because a position of the spacer is not varied, so that a display device with little display unevenness can be obtained.

A process to be performed to the first substrate 2001 is described.

First, a first insulating film 2002 is formed over the first substrate 2001 by a sputtering method, a printing method, a coating method, or the like. The first insulating film 2002 has a function of preventing change in characteristics of the transistor due to an impurity from the first substrate 2001 which affects a semiconductor layer. Note that the first insulating film 2002 is not necessarily formed when a quartz substrate is used as the first substrate 2001.

Next, a first conductive layer 2003 is formed over the first insulating film 2002 by photolithography, a laser direct writing method, an inkjet method, or the like.

Next, a second insulating film 2004 is formed over the entire surface by a sputtering method, a printing method, a coating method, or the like. The second insulating film 2004 has a function of preventing change in characteristics of the transistor due to an impurity from the first substrate 2001 which affects the semiconductor layer.

Next, a first semiconductor layer 2005 and a second semiconductor layer 2006 are formed. Note that the first semiconductor layer 2005 and the second semiconductor layer 2006 are formed sequentially and shapes thereof are processed at the same time.

Next, a second conductive layer 2007 is formed by photolithography, a laser direct writing method, an inkjet method, or the like. Note that as a method for etching which is performed at the time of processing a shape of the second conductive layer 2007, dry etching is preferable. Note that either a light-transmitting material or a reflective material may be used for the second conductive layer 2007.

Next, a channel region of the transistor is formed. Here, an example of a step thereof is described. The second semiconductor layer 2006 is etched by using the second conductive layer 2007 as a mask. Alternatively, the second semiconductor layer 2006 may be etched by using a mask for processing the shape of the second conductive layer 2007. Then, the first semiconductor layer 2005 at a position where the second semiconductor layer 2006 is removed serves as the channel formation region of the transistor. When the channel region is formed in this manner, the number of masks can be reduced, so that manufacturing cost can be reduced.

Next, a third insulating film 2008 is formed and a contact hole is formed as selected in the third insulating film 2008.

Note that a contact bole may be formed also in the second insulating film 2004 at the same time as forming the contact hole in the third insulating film 2008. Note that a surface of the third insulating film 2008 is preferably as even as possible. This is because orientation of the liquid crystal molecules is affected by unevenness of a surface with which the liquid crystal is in contact, that is, the surface of the third insulating film 2008.

Next, a third conductive layer 2009 is formed by photolithography, a laser direct writing method, an inkjet method, or the like.

Next, a first alignment film 2010 is formed. Note that after the first alignment film 2010 is formed, rubbing treatment may be performed so as to control the orientation of the liquid crystal molecules.

The first substrate 2001 which is manufactured as described above and the second substrate 2016 which is provided with the light-shielding film 2014, the color filter 2015, the fourth conductive layer 2013, the spacer 2017, and the second alignment film 2012 are attached to each other with a sealant with a gap of several μm therebetween. Then, a liquid crystal material is injected into a space between the two substrates. Note that in the TN mode, the fourth conductive layer 2013 is provided for the entire surface of the second substrate 2016.

Figure 29A:
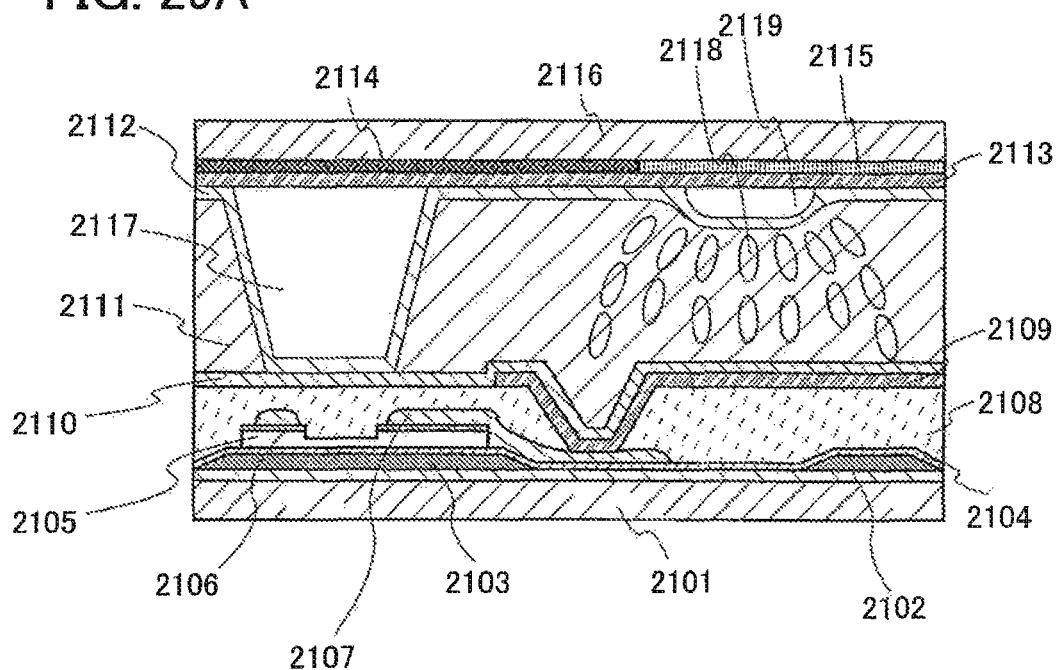
FIGS. 29A and 29B are diagrams each showing exemplary structures of a display device of the present invention.

FIG. 29A is an example of a cross-sectional view of a pixel in the case where an MVA (multi-domain vertical alignment) mode and a transistor are combined. By applying the pixel structure shown in FIG. 29A to a liquid crystal display device of the present invention, a liquid crystal display device having a wider viewing angle characteristics can be obtained.

Features of the pixel structure of the MVA-mode liquid crystal panel shown in FIG. 29A are described. Liquid crystal molecules 2118 shown in FIG. 29A are long and narrow molecules each having a major axis and a minor axis similarly to the liquid crystal molecules 2018. In FIG. 29A, a direction of each of the liquid crystal molecules 2118 is expressed by the length thereof. That is, each of the liquid crystal molecules 2118 shown in FIG. 29A is aligned such that the direction of the major axis is normal to the alignment film. Thus, the liquid crystal molecules 2118 at a position where an alignment control protrusion 2119 is formed are aligned radially with the alignment control protrusion 2119 as a center. With this state, a liquid crystal display device having wide viewing angle characteristics can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

In FIG. 29A, the two substrates between which the liquid crystal 2111 is interposed correspond to the first substrate 2101 and the second substrate 2116. A transistor and a pixel electrode are formed over the first substrate 2101. A light-shielding film 2114, a color filter 2115, a fourth conductive layer 2113, a spacer 2117, a second alignment film 2112, and an alignment control protrusion 2119 are provided for the second substrate 2116.

When the light-shielding film 2114 is formed, a display device with little light leakage at the time of black display can be obtained. The light-shielding film 2114 is not necessarily provided on the second substrate 2116. When the light-shielding film 2114 is not formed, the number of steps can be reduced, so that manufacturing cost can be reduced and yield can be improved.

The color filter 2115 is not necessarily provided on the second substrate 2116. When the color filter 2115 is not formed, similarly to the light-shielding film, the number of steps can be reduced, so that manufacturing cost can be reduced and yield can be improved. Note that even when the color filter 2115 is not formed, a display device which can perform color display can be obtained by field sequential driving.

Spherical spacers may be dispersed instead of forming the spacer 2117. When the spherical spacers are dispersed, the number of steps is reduced, so that manufacturing cost can be reduced. In addition, yield can be improved. Alternatively, when the spacer 2117 is formed, a distance between the two substrates can be uniform easily because a position of the spacer is not varied, so that a display device with little display unevenness can be obtained.

A process to be performed to the first substrate 2101 is described.

First, a first insulating film 2102 is formed over the first substrate 2101 by a sputtering method, a printing method, a coating method, or the like. The first insulating film 2102 has a function of preventing change in characteristics of the transistor due to an impurity from the first substrate 2101 which affects a semiconductor layer. Note that the first insulating film 2102 is not necessarily formed when a quartz substrate is used as the first substrate 2101.

Next, a first conductive layer 2103 is formed over the first insulating film 2102 by photolithography, a laser direct writing method, an inkjet method, or the like.

Next, a second insulating film 2104 is formed over the entire surface by a sputtering method, a printing method, a coating method, or the like. The second insulating film 2104 has a function of preventing change in characteristics of the transistor due to an impurity from the first substrate 2101 which affects the semiconductor layer.

Next, a first semiconductor layer 2105 and a second semiconductor layer 2106 are formed. Note that the first semiconductor layer 2105 and the second semiconductor layer 2106 are formed sequentially and shapes thereof are processed at the same time.

Next, a second conductive layer 2107 is formed by photolithography, a laser direct writing method, an inkjet method, or the like. Note that as a method for etching which is performed at the time of processing a shape of the second conductive layer 2107, dry etching is preferable. Note that as the second conductive layer 2107, either a light-transmitting material or a reflective material may be used.

Next, a channel region of the transistor is formed. Here, an example of a step thereof is described. The second semiconductor layer 2106 is etched by using the second conductive layer 2107 as a mask. Alternatively, the second semiconductor layer 2106 may be etched by using a mask for processing the shape of the second conductive layer 2107. Then, the first semiconductor layer 2105 at a position where the second semiconductor layer 2106 is removed serves as the channel formation region of the transistor. When the channel region is formed in this manner, the number of masks can be reduced, so that manufacturing cost can be reduced.

Next, a third insulating film 2108 is formed and a contact hole is formed as selected in the third insulating film 2108. Note that a contact hole may be formed also in the second insulating film 2104 at the same time as forming the contact hole in the third insulating film 2108.

Next, a third conductive layer 2109 is formed by photolithography, a laser direct writing method, an inkjet method, or the like.

Next, a first alignment film 2110 is formed. Note that after the first alignment film 2110 is formed, rubbing treatment may be performed so as to control the orientation of the liquid crystal molecules.

The first substrate 2101 which is manufactured as described above and the second substrate 2116 which is provided with the light-shielding film 2114, the color filter 2115, the fourth conductive layer 2113, the spacer 2117, and the second alignment film 2112 are attached to each other with a sealant with a gap of several m therebetween. Then, a liquid crystal material is injected into a space between the two substrates.

Note that in the MVA mode, the fourth conductive layer 2113 is provided for the entire surface of the second substrate 2116. Note that the alignment control protrusion 2119 is formed so as to be in contact with the fourth conductive layer 2113. The alignment control protrusion 2119 preferably has a shape with a smooth curved surface. Thus, orientation defect of the liquid crystal molecules 2118 caused by the alignment control protrusion 2119 is reduced. Further, since breaking of the alignment film provided for the alignment control protrusion 2119 can be prevented, a defect of the alignment film caused by breaking of the alignment film can be reduced.

Figure 29B:
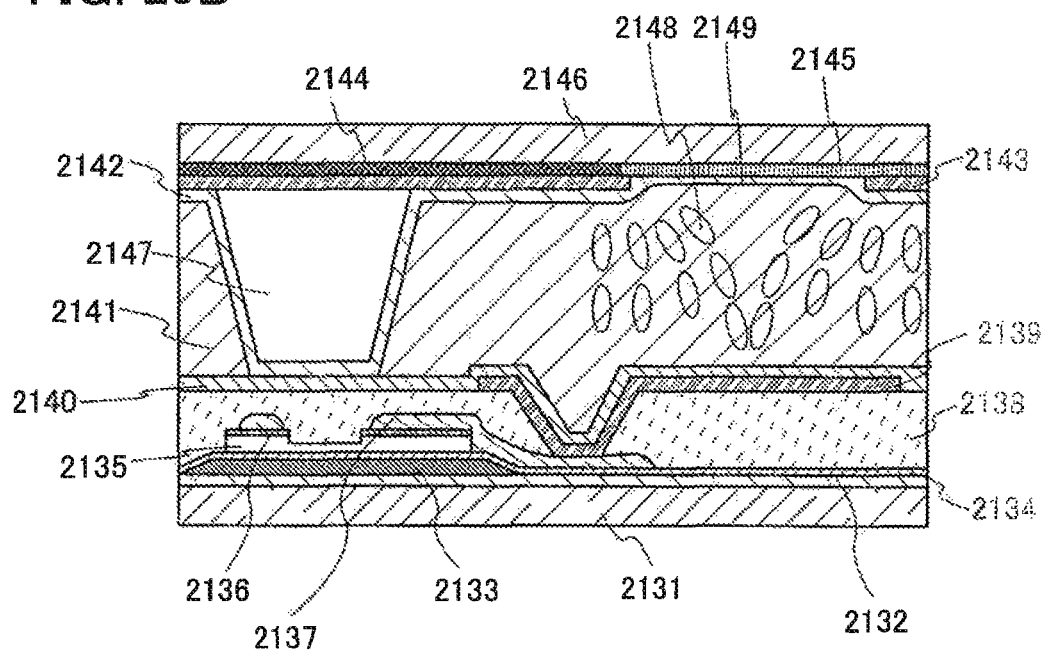

FIG. 29B is an example of a cross-sectional view of a pixel in the case where a PVA (patterned vertical alignment) mode and a transistor are combined. By applying the pixel structure shown in FIG. 29B to a liquid crystal display device of the present invention, a liquid crystal display device having a wider viewing angle characteristics, high response speed, and high contrast can be obtained.

Features of the pixel structure shown in FIG. 29B are described. In FIG. 29B, direction of each of the liquid crystal molecules 2148 is expressed by the length thereof, similarly to the liquid crystal molecules 2018 shown in FIG. 28. Thus, each of the liquid crystal molecules 2148 shown in FIG. 29B is aligned such that the direction of the major axis is normal to the alignment film. Thus, the liquid crystal molecules 2148 which exist in the periphery of the electrode notch portion 2149 which is not provided with the fourth conductive layer 2143 are aligned radially with a boundary of the electrode notch portion 2149 and the fourth conductive layer 2143 as a center. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

In FIG. 29B, the two substrates between which liquid crystal 2141 is interposed correspond to the first substrate 2131 and the second substrate 2146. A transistor and a pixel electrode are formed over the first substrate 2131. A light-shielding film 2144, a color filter 2145, a fourth conductive layer 2143, a spacer 2147, and a second alignment film 2142 are provided for the second substrate 2146.

When the light-shielding film 2144 is formed, a display device with little light leakage at the time of black display can be obtained. The light-shielding film 2144 is not necessarily provided on the second substrate 2146. When the light-shielding film 2144 is not formed, the number of steps can be reduced, so that manufacturing cost can be reduced and yield can be improved.

The color filter 2145 is not necessarily provided on the second substrate 2146. When the color filter 2145 is not formed, similarly to the light-shielding film, the number of steps can be reduced, so that manufacturing cost can be reduced and yield can be improved. Note that even when the color filter 2145 is not formed, a display device which can perform color display can be obtained by field sequential driving.

Spherical spacers may be dispersed instead of forming the spacer 2147. When the spherical spacers are dispersed, the number of steps is reduced, so that manufacturing cost can be reduced. In addition, yield can be improved. Alternatively, when the spacer 2147 is formed, a distance between the two substrates can be uniform easily because a position of the spacer is not varied, so that a display device with little display unevenness can be obtained.

A process to be performed to the first substrate 2131 is described.

First, a first insulating film 2132 is formed over the first substrate 2131 by a sputtering method, a printing method, a coating method, or the like. The first insulating film 2132 has a function of preventing change in characteristics of the transistor due to an impurity from the first substrate 2131 which affects a semiconductor layer. Note that the first insulating film 2132 is not necessarily formed when a quartz substrate is used as the first substrate 2131.

Next, a first conductive layer 2133 is formed over the first insulating film 2132 by photolithography, a laser direct writing method, an inkjet method, or the like.

Next, a second insulating film 2134 is formed over the entire surface by a sputtering method, a printing method, a coating method, or the like. The second insulating film 2134 has a function of preventing change in characteristics of the transistor due to an impurity from the first substrate 2131 which affects the semiconductor layer.

Next, a first semiconductor layer 2135 and a second semiconductor layer 2136 are formed. Note that the first semiconductor layer 2135 and the second semiconductor layer 2136 are formed sequentially and shapes thereof are processed at the same time.

Next, a second conductive layer 2137 is formed by photolithography, a laser direct writing method, an inkjet method, or the like. Note that as a method for etching which is performed at the time of processing a shape of the second conductive layer 2137, dry etching is preferable. Note that as the second conductive layer 2137, either a light-transmitting material or a reflective material may be used.

Next, a channel region of the transistor is formed. Here, an example of a step thereof is described. The second semiconductor layer 2136 is etched by using the second conductive layer 2137 as a mask. Alternatively, the second semiconductor layer 2136 may be etched by using a mask for processing the shape of the second conductive layer 2137. Then, the first semiconductor layer 2135 at a position where the second semiconductor layer 2136 is removed serves as the channel region of the transistor. When the channel region is formed in this manner, the number of masks can be reduced, so that manufacturing cost can be reduced.

Next, a third insulating film 2138 is formed and a contact hole is formed as selected in the third insulating film 2138. Note that a contact hole may be formed also in the second insulating film 2134 at the same time as forming the contact hole in the third insulating film 2138.

Next, a third conductive layer 2139 is formed by photolithography, a laser direct writing method, an inkjet method, or the like.

Next, a first alignment film 2140 is formed. Note that after the first alignment film 2140 is formed, rubbing treatment may be performed so as to control the orientation of the liquid crystal molecules.

The first substrate 2131 which is manufactured as described above and the second substrate 2146 which is provided with the light-shielding film 2144, the color filter 2145, the fourth conductive layer 2143, the spacer 2147, and the second alignment film 2142 are attached to each other with a sealant with a gap of several μm therebetween. Then, a liquid crystal material is injected into a space between the two substrates.

Note that in the PVA mode, the fourth conductive layer 2143 is patterned and is provided with the electrode notch portion 2149. Although a shape of the electrode notch portion 2149 is not particularly limited, the electrode notch portion 2149 preferably has a shape in which a plurality of rectangles having different directions are combined. Thus, a plurality of regions having different alignment can be formed, so that a liquid crystal display device having a wide viewing angle can be obtained. Note that the fourth conductive layer 2143 at the boundary between the electrode notch portion 2149 and the fourth conductive layer 2143 preferably has a shape with a smooth slope with respect to the base. Thus, an orientation defect of the liquid crystal molecules 2148 which are adjacent to the slope is reduced. Further, since breaking of the alignment film provided over the fourth conductive layer 2143 can be prevented, a defect of the alignment film caused by breaking of the alignment film can be reduced.

Figure 30A:
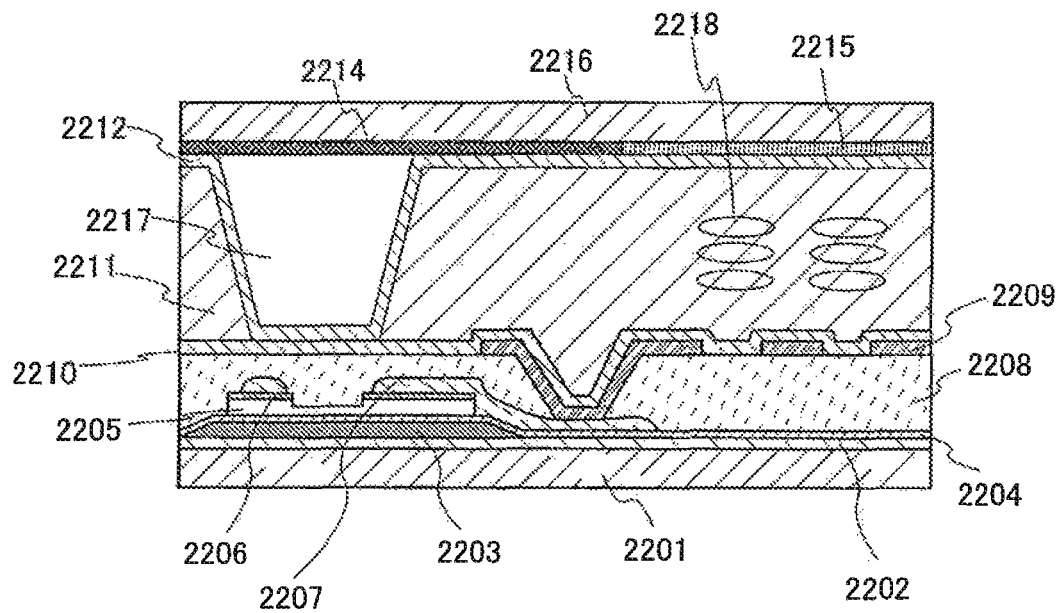
FIGS. 30A and 30B are diagrams each showing exemplary structures of a display device of the present invention.

FIG. 30A is an example of a cross-sectional view of a pixel in the case where an IPS (in-plane-switching) mode and a transistor are combined. By applying the pixel structure shown in FIG. 30A to a liquid crystal display device, a liquid crystal display device theoretically having a wider viewing angle can be obtained.

Features of the pixel structure shown in FIG. 30A are described. Liquid crystal molecules 2218 shown in FIG. 30A are long and narrow molecules each having a major axis and a minor axis, similarly to the liquid crystal molecules 2018 shown in FIG. 28. In FIG. 30A, a direction of each of the liquid crystal molecules 10318 is expressed by the length thereof. That is, each of the liquid crystal molecules 2218 shown in FIG. 30A is aligned so that the direction of the major axis thereof is always horizontal to the substrate. Although FIG. 30A shows alignment of the liquid crystal molecules 2218 with no electric field in a region where liquid crystal 2211 exists, when an electric field is applied to each of the liquid crystal molecules 2218, each of the liquid crystal molecules 2218 rotates in a horizontal plane as the direction of the major axis thereof is always horizontal to the substrate. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

In FIG. 30A, the two substrates between which the liquid crystal 2211 is interposed correspond to the first substrate 2201 and the second substrate 2216. A transistor and a pixel electrode are formed over the first substrate 2201. A light-shielding film 2214, a color filter 2215, a spacer 2217, and a second alignment film 2212 are provided for the second substrate.

When the light-shielding film 2214 is formed, a display device with little light leakage at the time of black display can be obtained. The light-shielding film 2214 is not necessarily provided on the second substrate 2216. When the light-shielding film 2214 is not formed, the number of steps is reduced, so that manufacturing cost can be reduced and yield can be improved.

The color filter 2215 is not necessarily provided on the second substrate 2216. When the color filter 2215 is not provided, similarly to the light-shielding film, the number of steps can be reduced, so that manufacturing cost can be reduced and yield can be improved. Note that even when the color filter 2215 is not formed, a display device which can perform color display can be obtained by field sequential driving.

Spherical spacers may be dispersed instead of forming the spacer 2217. When the spherical spacers are dispersed, the number of steps is reduced, so that manufacturing cost can be reduced. In addition, yield can be improved. Alternatively, when the spacer 2217 is formed, a distance between the two substrates can be uniform easily because a position of the spacer is not varied, so that a display device with little display unevenness can be obtained.

A process to be performed to the first substrate 2201 is described.

First, a first insulating film 2202 is formed over the first substrate 2201 by a sputtering method, a printing method, a coating method, or the like. The first insulating film 2202 has a function of preventing change in characteristics of the transistor due to an impurity from the first substrate 2201 which affects a semiconductor layer. Note that the first insulating film 2202 is not necessarily formed when a quartz substrate is used as the first substrate 2201.

Next, a first conductive layer 2203 is formed over the first insulating film 2202 by photolithography, a laser direct writing method, an inkjet method, or the like.

Next, a second insulating film 2204 is formed over the entire surface by a sputtering method, a printing method, a coating method, or the like. The second insulating film 2204 has a function of preventing change in characteristics of the transistor due to an impurity from the first substrate 2201 which affects the semiconductor layer.

Next, a first semiconductor layer 2205 and a second semiconductor layer 2206 are formed. Note that the first semiconductor layer 2205 and the second semiconductor layer 2206 are formed sequentially and shapes thereof are processed at the same time.

Next, a second conductive layer 2207 is formed by photolithography, a laser direct writing method, an inkjet method, or the like. Note that as a method for etching which is performed at the time of processing a shape of the second conductive layer 2207, dry etching is preferable. Note that as the second conductive layer 2207, either a light-transmitting material or a reflective material may be used.

Next, a channel region of the transistor is formed. Here, an example of a step thereof is described. The second semiconductor layer 2206 is etched by using the second conductive layer 2207 as a mask. Alternatively, the second semiconductor layer 2206 is etched by using a mask for processing the shape of the second conductive layer 2207. Then, the first semiconductor layer 2205 at a position where the second semiconductor layer 2206 is removed serves as the channel region of the transistor. When the channel region is formed in this manner, the number of masks can be reduced, so that manufacturing cost can be reduced.

Next, a third insulating film 2208 is formed and a contact hole is formed as selected in the third insulating film 2208. Note that a contact hole may be formed also in the second insulating film 2204 at the same time as forming the contact hole in the third insulating film 2208.

Next, a third conductive layer 2209 is formed by photolithography, a laser direct writing method, an inkjet method, or the like. Here, the third conductive layer 2209 has a shape in which two comb-shaped electrodes engage with each other. One of the comb-shaped electrodes is electrically connected to one of a source electrode and a drain electrode of the transistor, and the other of the comb-shaped electrodes is electrically connected to a common electrode. Thus, a horizontal electric field can be effectively applied to the liquid crystal molecules 2218.

Next, a first alignment film 2210 is formed. Note that after the first alignment film 2210 is formed, rubbing treatment may be performed so as to control the orientation of the liquid crystal molecules.

The first substrate 2201 which is manufactured as described above and the second substrate 2216 which is provided with the light-shielding film 2214, the color filter 2215, the spacer 2217, and the second alignment film 2212 are attached to each other with a sealant with a gap of several μm therebetween. Then, a liquid crystal material is injected into a space between the two substrates.

Figure 30B:
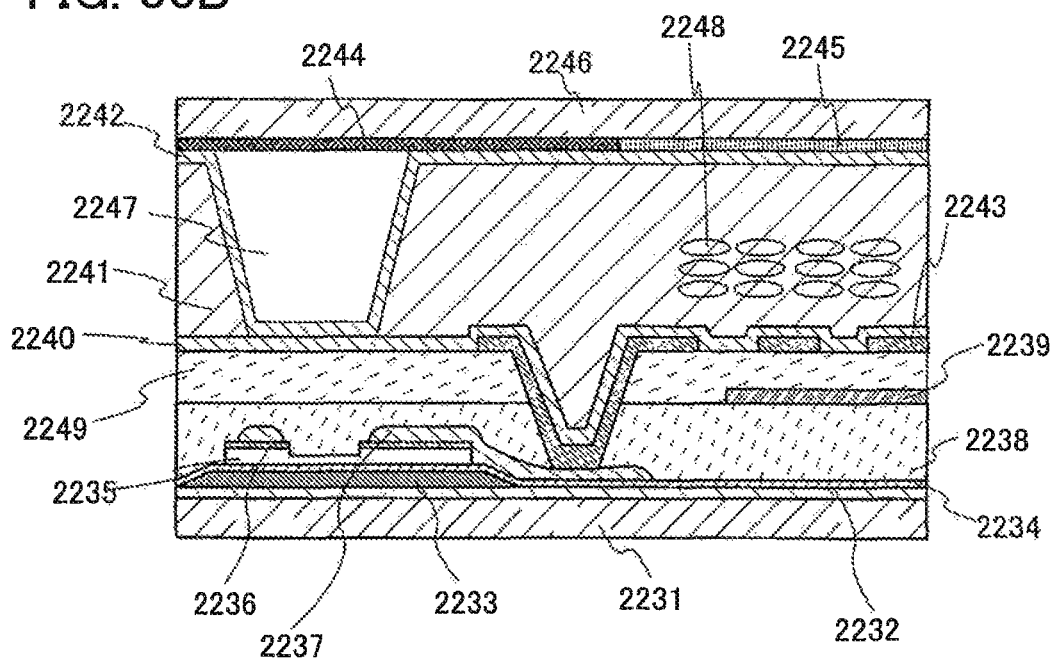

FIG. 30B is an example of a cross-sectional view of a pixel in the case where an FFS (fringe field switching) mode and a transistor are combined. By applying the pixel structure shown in FIG. 30B to a liquid crystal display device of the present invention, a liquid crystal display device having a wider viewing angle can be obtained.

Features of the pixel structure shown in FIG. 30B are described. In FIG. 30B, direction of each of the liquid crystal molecules 2248 is expressed by the length thereof in a similar way to the liquid crystal molecules 2018. That is, each of the liquid crystal molecules 2248 shown in FIG. 30B is aligned so that the direction of the major axis thereof is always horizontal to the substrate. Although FIG. 30B shows alignment of the liquid crystal molecules 2248 with no electric field in a region where liquid crystal 2241 exists, when an electric field is applied to each of the liquid crystal molecules 2248, each of the liquid crystal molecules 2248 rotates in a horizontal plane as the direction of the major axis thereof is always horizontal to the substrate. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

In FIG. 30B, the two substrates between which the liquid crystal 2241 is interposed correspond to the first substrate 2231 and the second substrate 2246. A transistor and a pixel electrode are formed over the first substrate 2241. A light-shielding film 2244, a color filter 2245, a spacer 2247, and a second alignment film 2242 are provided for the second substrate 2246.

When the light-shielding film 2244 is formed, a display device with little light leakage at the time of black display can be obtained. The light-shielding film 2244 is not necessarily provided on the second substrate 2246. When the light-shielding film 2244 is not formed, the number of steps can be reduced, so that manufacturing cost can be reduced and yield can be improved.

The color filter 2245 is not necessarily provided on the second substrate 2246. When the color filter 2245 is not formed, similarly to the light-shielding film, the number of steps can be reduced, so that manufacturing cost can be reduced and yield can be improved. Note that even when the color filter 2245 is not formed, a display device which can perform color display can be obtained by field sequential driving.

Spherical spacers may be dispersed instead of forming the spacer 2247. When the spherical spacers are dispersed, the number of steps is reduced, so that manufacturing cost can be reduced. In addition, yield can be improved. Alternatively, when the spacer 2247 is formed, a distance between the two substrates can be uniform easily because a position of the spacer is not varied, so that a display device with little display unevenness can be obtained.

A process to be performed to the first substrate 2231 is described.

First, a first insulating film 2232 is formed over the first substrate 2231 by a sputtering method, a printing method, a coating method, or the like. The first insulating film 2232 has a function of preventing change in characteristics of the transistor due to an impurity from the first substrate 2231 which affects a semiconductor layer. Note that the first insulating film 2232 is not necessarily formed when a quartz substrate is used as the first substrate 2231.

Next, a first conductive layer 2233 is formed over the first insulating film 2232 by photolithography, a laser direct writing method, an inkjet method, or the like.

Next, a second insulating film 2234 is formed over the entire surface by a sputtering method, a printing method, a coating method, or the like. The second insulating film 2234 has a function of preventing change in characteristics of the transistor due to an impurity from the first substrate 2231 which affects the semiconductor layer.

Next, a first semiconductor layer 2235 and a second semiconductor layer 2236 are formed. Note that the first semiconductor layer 2235 and the second semiconductor layer 2236 are formed sequentially and shapes thereof are processed at the same time.

Next, a second conductive layer 2237 is formed by photolithography, a laser direct writing method, an inkjet method, or the like. Note that as a method for etching which is performed at the time of processing a shape of the second conductive layer 2237, dry etching is preferable. Note that as the second conductive layer 2237, either a light-transmitting material or a reflective material may be used.

Next, a channel region of the transistor is formed. Here, an example of a step thereof is described. The second semiconductor layer 2236 is etched by using the second conductive layer 2237 as a mask. Alternatively, the second semiconductor layer 2236 may be etched by using a mask for processing the shape of the second conductive layer 2237. Then, the first semiconductor layer 2235 at a position where the second semiconductor layer 2236 is removed serves as the channel region of the transistor. When the channel region is formed in this manner, the number of masks can be reduced, so that manufacturing cost can be reduced.

Next, a third insulating film 2238 is formed and a contact hole is formed as selected in the third insulating film 2238.

Next, a third conductive layer 2239 is formed by photolithography, a laser direct writing method, an inkjet method, or the like.

Next, a fourth insulating film 2249 is formed and a contact hole is formed as selected in the fourth insulating film 2249.

Next, a fourth conductive layer 2243 is formed by photolithography, a laser direct writing method, an inkjet method, or the like. Here, the fourth conductive layer 2243 is comb-shaped.

Next, a first alignment film 2240 is formed. Note that after the first alignment film 2240 is formed, rubbing treatment may be performed so as to control the orientation of the liquid crystal molecules.

The first substrate 2231 which is manufactured as described above and the second substrate 2246 which is provided with the light-shielding film 2244, the color filter 2245, the spacer 2247, and the second alignment film 2242 are attached to each other with a sealant with a gap of several μm therebetween. Then, a liquid crystal material is injected into a space between the two substrates, so that a liquid crystal panel can be manufactured.

Here, materials which can be used for conductive layers or insulating films are described.

As the first insulating film 2002 in FIG. 28, the first insulating film 2102 in FIG. 29A, the first insulating film 2132 in FIG. 29B, the first insulating film 2202 in FIG. 30A, or the first insulating film 2232 in FIG. 30B, an insulating film such as a silicon oxide film, a silicon nitride film, or a silicon oxynitride ($SiO_xN_y$) film can be used. Alternatively, an insulating film having a stacked-layer structure in which two or more of a silicon oxide film, a silicon nitride film, a silicon oxynitride ($SiO_xN_y$) film, and the like are combined can be used.

As the first conductive layer 2003 in FIG. 28, the first conductive layer 2103 in FIG. 29A, the first conductive layer 2133 in FIG. 29B, the first conductive layer 2203 in FIG. 30A, or the first conductive layer 2233 in FIG. 30B, a conductive material such as Mo, Ti, Al, Nd, Cr, or the like can be used. Alternatively, a stacked-layer structure in which two or more of conductive materials such as Mo, Ti, Al, Nd, Cr, and the like are combined can be used.

As the second insulating film 2004 in FIG. 28, the second insulating film 2104 in FIG. 29A, the second insulating film 2134 in FIG. 29B, the second insulating film 2204 in FIG. 30A, or the second insulating film 2234 in FIG. 30B, a thermal oxide film, a silicon oxide film, a silicon nitride film, a silicon oxynitride film, or the like can be used. Alternatively, a stacked-layer structure in which two or more of a thermal oxide film, a silicon oxide film, a silicon nitride film, a silicon oxynitride film, and the like are combined can be used. Note that a silicon oxide film is preferable in a portion which is in contact with a semiconductor layer. This is because a trap level at an interface with the semiconductor layer decreases when a silicon oxide film is used. Note that a silicon nitride film is preferable in a portion which is in contact with Mo. This is because a silicon nitride film does not oxidize Mo.

As the first semiconductor layer 2005 in FIG. 28, the first semiconductor layer 2105 in FIG. 29A, the first semiconductor layer 2135 in FIG. 29B, the first semiconductor layer 2205 in FIG. 30A, or the first semiconductor layer 2235 in FIG. 30B, silicon, silicon germanium (SiGe), or the like can be used.

As the second semiconductor layer 2006 in FIG. 28, the second semiconductor layer 2106 in FIG. 29A, the second semiconductor layer 2136 in FIG. 29B, the second semiconductor layer 2206 in FIG. 30A, or the second semiconductor layer 2236 in FIG. 30B, silicon or the like including phosphorus can be used.

As a light-transmitting material of the second conductive layer 2007 and the third conductive layer 2009 in FIG. 28; the second conductive layer 2107 and the third conductive layer 2109 in FIG. 29A; the second conductive layer 2137 and the third conductive layer 2139 in FIG. 29B; the second conductive layer 2207 and the third conductive layer 2209 in FIG. 30A; or the second conductive layer 2237, the third conductive layer 2239, and a fourth conductive layer 2243 in FIG. 30B, an indium tin oxide (ITO) film formed by mixing tin oxide into indium oxide, an indium tin silicon oxide (ITSO) film formed by mixing silicon oxide into indium tin oxide (ITO), an indium zinc oxide (IZO) film formed by mixing zinc oxide into indium oxide, a zinc oxide film, a tin oxide film, or the like can be used. Note that IZO can be formed by sputtering using a target in which zinc oxide (ZnO) is mixed into ITO at 2 to 20 wt %.

As a reflective material of the second conductive layer 2007 and the third conductive layer 2009 in FIG. 28; the second conductive layer 2107 and the third conductive layer 2109 in FIG. 29A; the second conductive layer 2137 and the third conductive layer 2139 in FIG. 29B; the second conductive layer 2207 and the third conductive layer 2209 in FIG. 30A; or the second conductive layer 2237, the third conductive layer 2239, and the fourth conductive layer 2243 in FIG. 30B, Ti, Mo, Ta, Cr, W, Al, or the like can be used. Alternatively, a two-layer structure in which Al and Ti, Mo, Ta, Cr, or W are stacked, or a three-layer structure in which Al is interposed between metals such as Ti, Mo, Ta, Cr, and W may be used.

As the third insulating film 2008 in FIG. 28, the third insulating film 2108 in FIG. 29A, the third insulating film 2138 in FIG. 29B, the third conductive layer 2139 in FIG. 29B, the third insulating film 2208 in FIG. 30A, or the third insulating film 2238 and the fourth insulating film 2249 in FIG. 30B, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material including siloxane can be used. Note that siloxane is a material in which a skeleton structure is formed by a bond of silicon (Si) and oxygen (O). As a substituent, an organic group including at least hydrogen (e.g., an alkyl group or an aryl group) is used. Alternatively, a fluoro group may be used as the substituent. Further alternatively, the organic group including at least hydrogen and the fluoro group may be used as the substituent.

As the first alignment film 2010 in FIG. 28, the first alignment film 2110 in FIG. 29A, the first alignment film 2140 in FIG. 29B, the first alignment film 2210 in FIG. 30A, or the first alignment film 2240 in FIG. 30B, a film of a high molecular compound such as polyimide can be used.

Next, the pixel structure in the case where each liquid crystal mode and the transistor are combined is described with reference to a top view (a layout diagram) of the pixel.

Note that as a liquid crystal mode, a TN (twisted nematic) mode, an IPS (m-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti-ferroelectric liquid crystal) mode, or the like can be used.

As the transistor, a thin film transistor (a TFT) including a non-single crystalline semiconductor layer typified by amorphous silicon, polycrystalline silicon, microcrystalline (also referred to as semi-amorphous) silicon, or the like can be used.

Note that as a structure of the transistor, a top-gate structure, a bottom-gate structure, or the like can be used. A channel-etched transistor, a channel-protective transistor, or the like can be used as a bottom-gate transistor.

Figure 31:
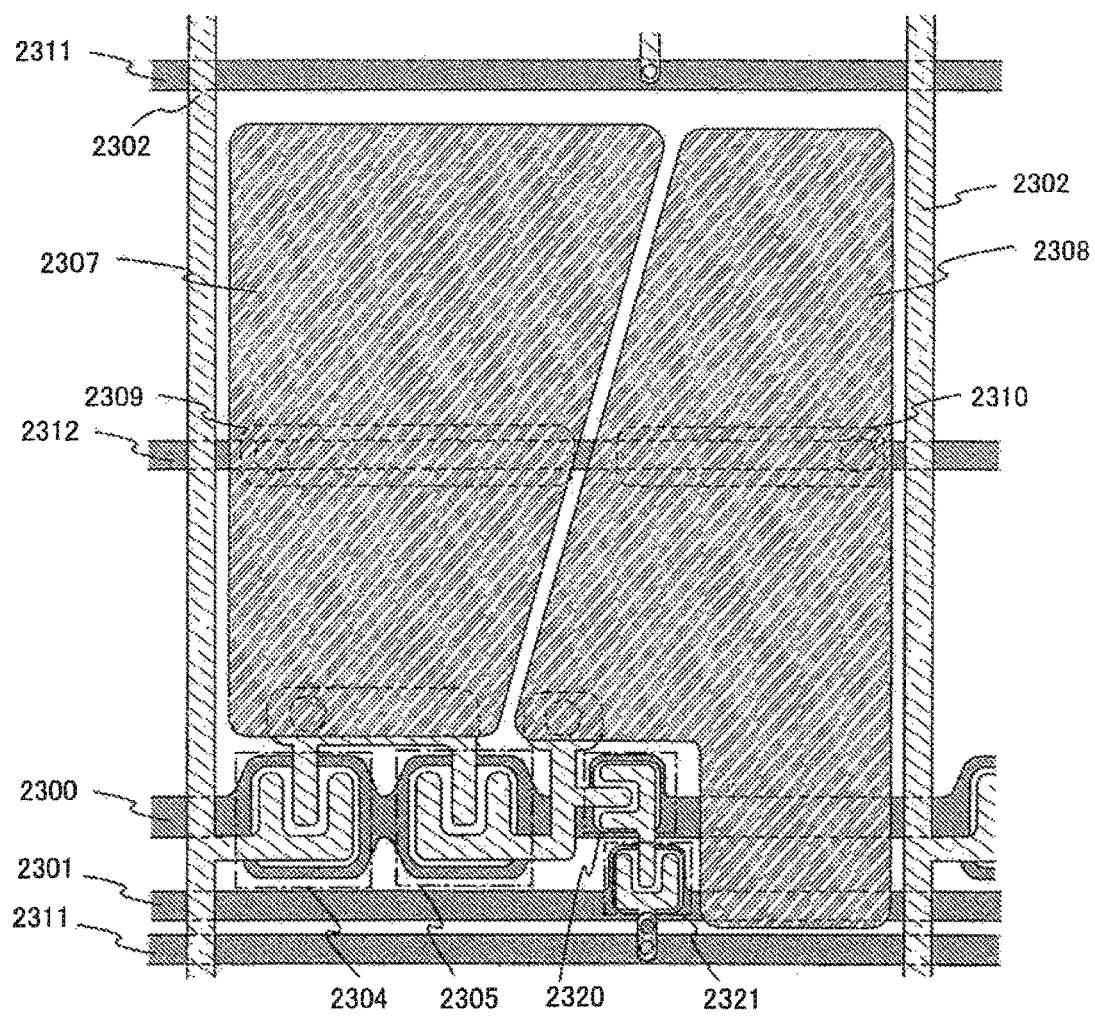
FIG. 31 is a diagram showing an exemplary layout of a pixel included in a display device of the present invention.

FIG. 31 is an example of a top view of a pixel in the case where a TN mode and a transistor are combined.

The pixel shown in FIG. 31 includes a first transistor 2304, a second transistor 2305, a third transistor including a transistor 2320 and a transistor 2321, a first liquid crystal capacitor, a second liquid crystal capacity, a first storage capacitor and a second storage capacitor and is connected to a first scanning line 2300, a second scanning line 2301, a signal line 2302 and a Cs line 2311. Note that since an equivalent circuit diagram of a pixel structure shown in FIG. 31 is the same as that shown in FIG. 83, the description of details is omitted.

In FIG. 31, a pixel electrode included in the first liquid crystal capacitor corresponds to a pixel electrode 2307 and a pixel electrode included in the second liquid crystal capacitor corresponds to a pixel electrode 2308. The first storage capacitor includes a capacitor line 2312 which is connected to a Cs line 2311 outside the pixel portion, a semiconductor layer 2309 which is connected to the pixel electrode 2307 and an insulating film which is interposed therebetween. In a similar manner to the first storage capacitor, the second storage capacitor includes the capacitor line 2312, a semiconductor layer 2310 which is connected to the pixel electrode 2308 and an insulating film which is interposed therebetween. Note that the capacitor line 2312 included in the first storage capacitor and the second storage capacitor is manufactured in the same process as the first scanning line 2300 which includes the gate electrodes included in the transistors 2304, 2305 and 2320; the second scanning line 2301 which includes the gate electrode included in the transistor 2321; the Cs line 2311; and the semiconductor layers 2309 and 2310 which includes source regions, drain regions or channel formation regions included in the transistors 2304, 2305, 2320 and 2321. As the insulating film included in the first storage capacitor and the second storage capacitor, a film which is manufactured in the same process as the gate insulating films included in the transistors 2304, 2305, 2320 and 2321 can be used.

As shown in FIG. 31, a liquid crystal display device which is superior in viewing angle characteristic can be obtained by using the two liquid crystal capacitors in which alignment states of liquid crystal molecules are different from each other. Note that a top view shown in FIG. 31 is an example, the present invention is not limited thereto.

Note that channel width can be widened by employing a structure in which one of the source electrode and the drain electrode surrounds the other of the source electrode and the drain electrode in each transistor. Such a structure is particularly effective when an amorphous semiconductor layer with lower mobility than that of a crystalline semiconductor layer is used for a semiconductor layer of a transistor included in the pixel.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode or embodiment. Further, much more drawings can be formed by combining each part in each drawing in this embodiment mode with part of another embodiment mode or embodiment.

Note that this embodiment mode shows examples of embodying, slightly transforming, partially modifying, improving, describing in detail, or applying the contents (or part of the contents) described in other embodiment modes and embodiments, an example of related part thereof, or the like. Therefore, the contents described in other embodiment modes and embodiments can be freely applied to, combined with, or replaced with this embodiment mode.

Embodiment Mode 7

In this embodiment mode, various liquid crystal modes are described with reference to cross-sectional views.

Figure 32A:
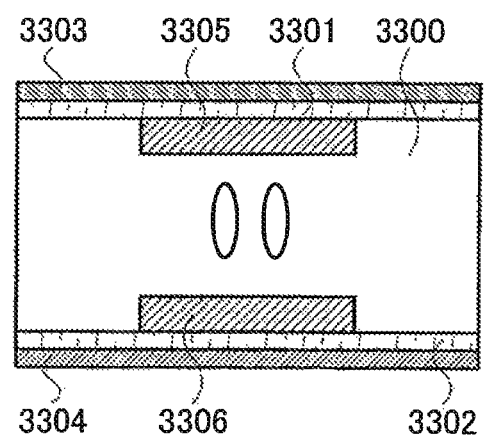
FIGS. 32A and 32B are diagrams illustrating liquid crystal modes of a display device of the present invention.
Figure 32B:
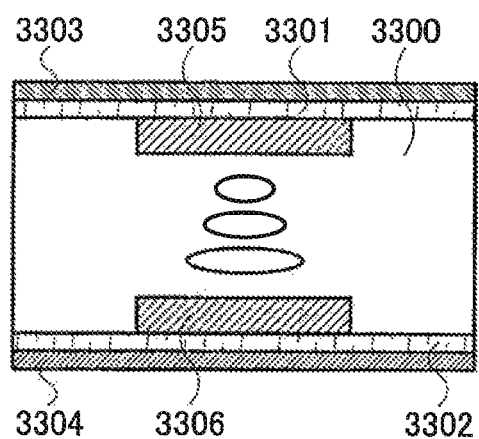

FIGS. 32A and 32B are schematic views of cross sections of a TN mode.

A liquid crystal layer 3300 is held between a first substrate 3301 and a second substrate 3302 which are provided so as to be opposite to each other. A first electrode 3305 is formed on a top surface of the first substrate 3301. A second electrode 3306 is formed on a top surface of the second substrate 3302. A first polarizing plate 3303 is provided on a surface of the first substrate 3301, which does not face the liquid crystal layer. A second polarizing plate 3304 is provided on a surface of the second substrate 3302, which does not face the liquid crystal layer. Note that the first polarizing plate 3303 and the second polarizing plate 3304 are provided so as to be in a cross nicol state.

The first polarizing plate 3303 may be provided on the top surface of the first substrate 3301. The second polarizing plate 3304 may be provided on the top surface of the second substrate 3302.

It is acceptable as long as at least one of (or both) the first electrode 3305 and the second electrode 3306 has a light-transmitting property (a transmissive or reflective liquid crystal display device). Alternatively, both the first electrode 3305 and the second electrode 3306 may have light-transmitting properties, and part of one of the electrodes may have reflectivity (a semi-transmissive liquid crystal display device).

FIG. 32A is a schematic view of a cross section in the case where voltage is applied to the first electrode 3305 and the second electrode 3306 (referred to as a vertical electric field mode). Since liquid crystal molecules are aligned longitudinally, light emitted from a backlight is not affected by birefringence of the liquid crystal molecules. In addition, since the first polarizing plate 3303 and the second polarizing plate 3304 are provided so as to be in a cross nicol state, light emitted from the backlight cannot pass through the substrate. Therefore, black display is performed.

FIG. 32B is a schematic view of a cross section in the case where voltage is not applied to the first electrode 3305 and the second electrode 3306. Since the liquid crystal molecules are aligned laterally and rotated between the first electrode 3305 and the second electrode 3306, light emitted from a backlight is affected by birefringence of the liquid crystal molecules. In addition, since the first polarizing plate 3303 and the 20 second polarizing plate 3304 are provided so as to be in a cross nicol state, light emitted from the backlight passes through the substrate. Therefore, white display is performed. This is a so-called normally white mode.

Note that by controlling voltage applied to the first electrode 3305 and the second electrode 3306, conditions of the liquid crystal molecules, that is, alignment of the liquid crystal molecules can be controlled. Therefore, since the amount of light emitted from the backlight can be controlled by the liquid crystal molecules, predetermined image display can be performed.

A liquid crystal display device having a structure shown in FIG. 32A or FIG. 32B can perform full-color display by being provided with a color filter. The color filter can be provided on a first substrate 3301 side or a second substrate 3302 side.

It is acceptable as long as a known material is used as a liquid crystal material used for a TN mode.

Figure 33A:
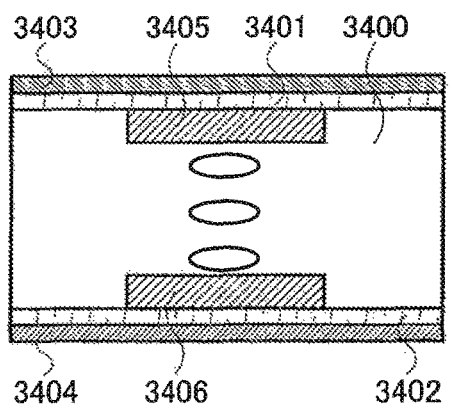
FIGS. 33A to 33D are diagrams illustrating liquid crystal modes of a display device of the present invention.
Figure 33B:
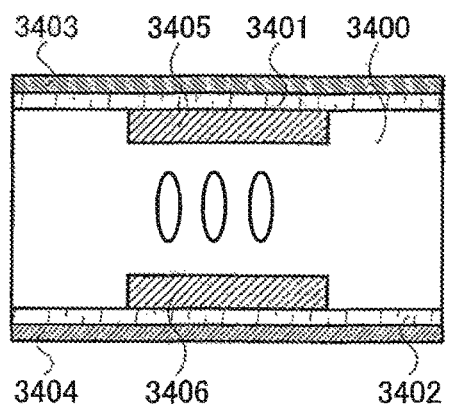

FIGS. 33A and 33B are schematic views of cross sections of a VA mode. In the VA mode, liquid crystal molecules are aligned such that they are vertical to a substrate when there is no electric field.

A liquid crystal layer 3400 is held between a first substrate 3401 and a second substrate 3402 which are provided so as to be opposite to each other. A first electrode 3405 is formed on a top surface of the first substrate 3401. A second electrode 3406 is formed on a top surface of the second substrate 3402. A first polarizing plate 3403 is provided on a surface of the first substrate 3401, which does not face the liquid crystal layer. A second polarizing plate 3404 is provided on a surface of the second substrate 3402, which does not face the liquid crystal layer. Note that the first polarizing plate 3403 and the second polarizing plate 3404 are provided so as to be in a cross nicol state.

The first polarizing plate 3403 may be provided on the top surface of the first substrate 3401. The second polarizing plate 3404 may be provided on the top surface of the second substrate 3402.

It is acceptable as long as at least one of (or both) the first electrode 3405 and the second electrode 3406 has a light-transmitting property (a transmissive or reflective liquid crystal display device). Alternatively, both the first electrode 3405 and the second electrode 3406 may have light-transmitting properties, and part of one of the electrodes may have reflectivity (a semi-transmissive liquid crystal display device).

FIG. 33A is a schematic view of a cross section in the case where voltage is applied to the first electrode 3405 and the second electrode 3406 (referred to as a vertical electric field mode). Since liquid crystal molecules are aligned laterally, light emitted from a backlight is affected by birefringence of the liquid crystal molecules. In addition, since the first polarizing plate 3403 and the second polarizing plate 3404 are provided so as to be in a cross nicol state, light emitted from the backlight passes through the substrate. Therefore, white display is performed.

FIG. 33B is a schematic view of a cross section in the case where voltage is not applied to the first electrode 3405 and the second electrode 3406. Since liquid crystal molecules are aligned longitudinally, light emitted from a backlight is not affected by birefringence of the liquid crystal molecules. In addition, since the first polarizing plate 3403 and the second polarizing plate 3404 are provided so as to be in a cross nicol state, light emitted from the backlight does not pass through the substrate. Therefore, black display is performed. This is a so-called normally black mode.

Note that by controlling voltage applied to the first electrode 3405 and the second electrode 3406, conditions of the liquid crystal molecules, that is, alignment of the liquid crystal molecules can be controlled. Therefore, since the amount of light emitted from the backlight can be controlled by the liquid crystal molecules, predetermined image display can be performed.

A liquid crystal display device having a structure shown in FIG. 33A or FIG. 33B can perform full-color display by being provided with a color filter. The color filter can be provided on a first substrate 3401 side or a second substrate 3402 side.

It is acceptable as long as a known material is used as a liquid crystal material used for a VA mode.

Figure 33C:
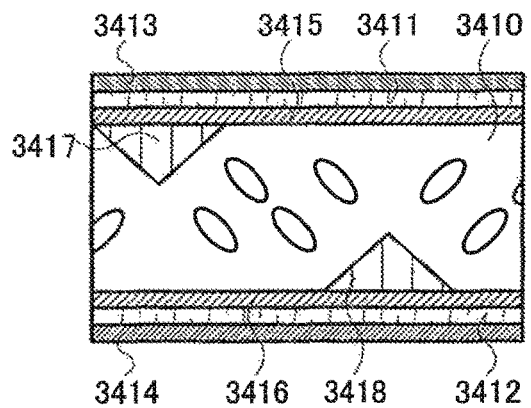
Figure 33D:
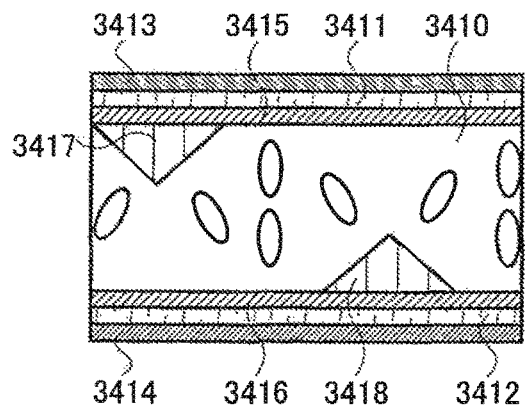

FIGS. 33C and 33D are schematic views of cross sections of an MVA mode. In the MVA mode, viewing angle dependency of each portion is compensated by each other.

A liquid crystal layer 3410 is held between a first substrate 3411 and a second substrate 3412 which are provided so as to be opposite to each other. A first electrode 3415 is formed on a top surface of the first substrate 3411. A second electrode 3416 is formed on a top surface of the second substrate 3412. A first protrusion 3417 for controlling alignment is formed on the first electrode 3415. A second protrusion 3418 for controlling alignment is formed on the second electrode 3416. A first polarizing plate 3413 is provided on a surface of the first substrate 3411, which does not face the liquid crystal layer. A second polarizing plate 3414 is provided on a surface of the second substrate 3412, which does not face the liquid crystal layer. Note that the first polarizing plate 3413 and the second polarizing plate 3414 are provided so as to be in a cross nicol state.

The first polarizing plate 3413 may be provided on the top surface of the first substrate 3411. The second polarizing plate 3414 may be provided on the top surface of the second substrate 3412.

It is acceptable as long as at least one of (or both) the first electrode 3415 and the second electrode 3416 has a light-transmitting property (a transmissive or reflective liquid crystal display device). Alternatively, both the first electrode 3415 and the second electrode 3416 may have light-transmitting properties, and part of one of the electrodes may have reflectivity (a semi-transmissive liquid crystal display device).

FIG. 33C is a schematic view of a cross section in the case where voltage is applied to the first electrode 3415 and the second electrode 3416 (referred to as a vertical electric field mode). Light emitted from a backlight is affected by birefringence of the liquid crystal molecules. In addition, since the first polarizing plate 3413 and the second polarizing plate 3414 are provided so as to be in a cross nicol state, light emitted from the backlight passes through the substrate. Therefore, white display is performed. Further, liquid crystal molecules are affected by the first protrusion 3417 and the second protrusion 3418 and thus aligned so as to tilt toward the first protrusion 3417 and the second protrusion 3418. Therefore, viewing angle characteristics can be further enhanced.

FIG. 33D is a schematic view of a cross section in the case where voltage is not applied to the first electrode 3415 and the second electrode 3416. Since liquid crystal molecules are aligned longitudinally, light emitted from a backlight is not affected by birefringence of the liquid crystal molecules. In addition, since the first polarizing plate 3413 and the second polarizing plate 3414 are provided so as to be in a cross nicol state, light emitted from the backlight does not pass through the substrate. Therefore, black display is performed. This is a so-called normally black mode.

Note that by controlling voltage applied to the first electrode 3415 and the second electrode 3416, conditions of the liquid crystal molecules, that is, alignment of the liquid crystal molecules can be controlled. Therefore, since the amount of light emitted from the backlight can be controlled by the liquid crystal molecules, predetermined image display can be performed.

A liquid crystal display device having a structure shown in FIG. 33C or FIG. 33D can perform full-color display by being provided with a color filter. The color filter can be provided on a first substrate 3411 side or a second substrate 3412 side.

It is acceptable as long as a known material is used as a liquid crystal material used for an MVA mode.

Figure 34A:
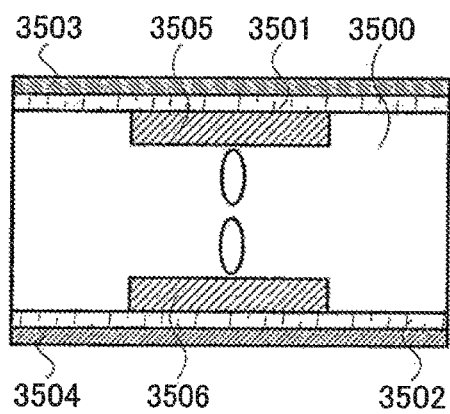
FIGS. 34A to 34D are diagrams illustrating liquid crystal modes of a display device of the present invention.
Figure 34B:
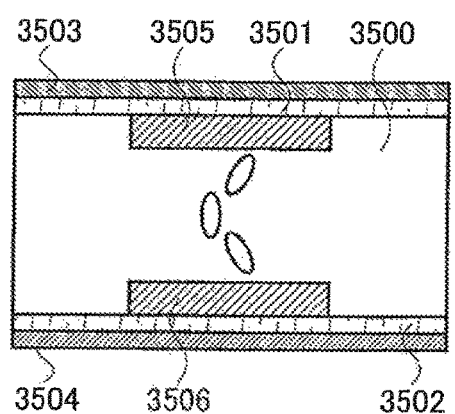

FIGS. 34A and 34B are schematic views of cross sections of an OCB mode. In the OCB mode, viewing angle dependency is low because alignment of liquid crystal molecules in a liquid crystal layer is optically compensated. This state of the liquid crystal molecules is referred to as bend alignment.

A liquid crystal layer 3500 is held between a first substrate 3501 and a second substrate 3502 which are provided so as to be opposite to each other. A first electrode 3505 is formed on a top surface of the first substrate 3501. A second electrode 3506 is formed on a top surface of the second substrate 3502. A first polarizing plate 3503 is provided on a surface of the first substrate 3501, which does not face the liquid crystal layer A second polarizing plate 3504 is provided on a surface of the second substrate 3502, which does not face the liquid crystal layer. Note that the first polarizing plate 3503 and the second polarizing plate 3504 are provided so as to be in a cross nicol state.

The first polarizing plate 3503 may be provided on the top surface of the first substrate 3501. The second polarizing plate 3504 may be provided on the top surface of the second substrate 3502.

It is acceptable as long as at least one of (or both) the first electrode 3505 and the second electrode 3506 has a light-transmitting property (a transmissive or reflective liquid crystal display device). Alternatively, both the first electrode 3505 and the second electrode 3506 may have light-transmitting properties, and part of one of the electrodes may have reflectivity (a semi-transmissive liquid crystal display device).

FIG. 34A is a schematic view of a cross section in the case where voltage is applied to the first electrode 3505 and the second electrode 3506 (referred to as a vertical electric field mode). Since liquid crystal molecules are aligned longitudinally, light emitted from a backlight is not affected by birefringence of the liquid crystal molecules. In addition, since the first polarizing plate 3503 and the second polarizing plate 3504 are provided so as to be in a cross nicol state, light emitted from the backlight does not pass through the substrate. Therefore, black display is performed.

FIG. 34B is a schematic view of a cross section in the case where voltage is not applied to the first electrode 3505 and the second electrode 3506. Since liquid crystal molecules are in a bend alignment state, light emitted from a backlight is affected by birefringence of the liquid crystal molecules. In addition, since the first polarizing plate 3503 and the second polarizing plate 3504 are provided so as to be in a cross nicol state, light emitted from the backlight passes through the substrate. Therefore, white display is performed. This is a so-called normally white mode.

Note that by controlling voltage applied to the first electrode 3505 and the second electrode 3506, conditions of the liquid crystal molecules, that is, alignment of the liquid crystal molecules can be controlled. Therefore, since the amount of light emitted from the backlight can be controlled by the liquid crystal molecules, predetermined image display can be performed.

A liquid crystal display device having a structure shown in FIG. 34A or FIG. 34B can perform full-color display by being provided with a color filter. The color filter can be provided on a first substrate 3501 side or a second substrate 3502 side.

It is acceptable as long as a known material is used as a liquid crystal material used for an OCB mode.

Figure 34C:
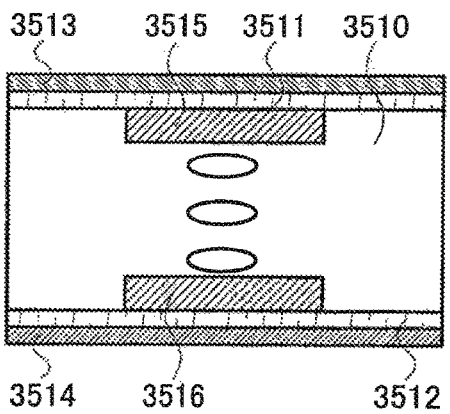
Figure 34D:
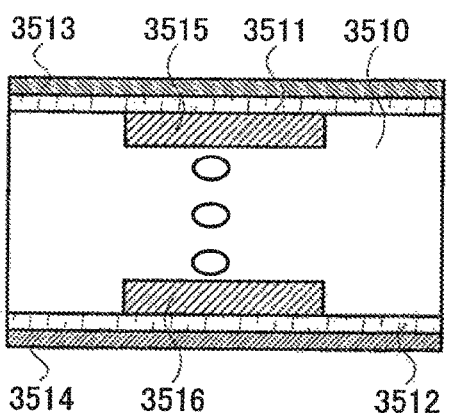

FIGS. 34C and 34D are schematic views of cross sections of an FLC mode or an AFLC mode.

A liquid crystal layer 3510 is held between a first substrate 3511 and a second substrate 3512 which are provided so as to be opposite to each other. A first electrode 3515 is formed on a top surface of the first substrate 3511. A second electrode 3516 is formed on a top surface of the second substrate 3512. A first polarizing plate 3513 is provided on a surface of the first substrate 3511, which does not face the liquid crystal layer. A second polarizing plate 3514 is provided on a surface of the second substrate 3512, which does not face the liquid crystal layer. Note that the first polarizing plate 3513 and the second polarizing plate 3514 are provided so as to be in a cross nicol state.

The first polarizing plate 3513 may be provided on the top surface of the first substrate 3511. The second polarizing plate 3514 may be provided on the top surface of the second substrate 3512.

It is acceptable as long as at least one of or both the first electrode 3515 and the second electrode 3516 have light-transmitting properties (a transmissive or reflective liquid crystal display device). Alternatively, both the first electrode 3515 and the second electrode 3516 may have light-transmitting properties, and part of one of the electrodes may have reflectivity (a semi-transmissive liquid crystal display device).

FIG. 34C is a schematic view of a cross section in the case where voltage is applied to the first electrode 3515 and the second electrode 3516 (referred to as a vertical electric field mode). Since liquid crystal molecules are aligned laterally in a direction which is deviated from a rubbing direction, light emitted from a backlight is affected by birefringence of the liquid crystal molecules. In addition, since the first polarizing plate 3513 and the second polarizing plate 3514 are provided so as to be in a cross nicol state, light emitted from the backlight passes through the substrate. Therefore, white display is performed.

FIG. 34D is a schematic view of a cross section in the case where voltage is not applied to the first electrode 3515 and the second electrode 3516. Since liquid crystal molecules are aligned laterally in a rubbing direction, light emitted from a backlight is not affected by birefringence of the liquid crystal molecules. In addition, since the first polarizing plate 3513 and the second polarizing plate 3514 are provided so as to be in a cross nicol state, light emitted from the backlight does not pass through the substrate. Therefore, black display is performed. This is a so-called normally black mode.

Note that by controlling voltage applied to the first electrode 3515 and the second electrode 3516, conditions of the liquid crystal molecules, that is, alignment of the liquid crystal molecules, can be controlled. Therefore, since the amount of light emitted from the backlight can be controlled by the liquid crystal molecules, predetermined image display can be performed.

A liquid crystal display device having a structure shown in FIG. 34C or FIG. 34D can perform full-color display by being provided with a color filter. The color filter can be provided on a first substrate 3511 side or a second substrate 3512 side.

It is acceptable as long as a known material is used as a liquid crystal material used for an FLC mode or an AFLC mode.

Figure 35A:
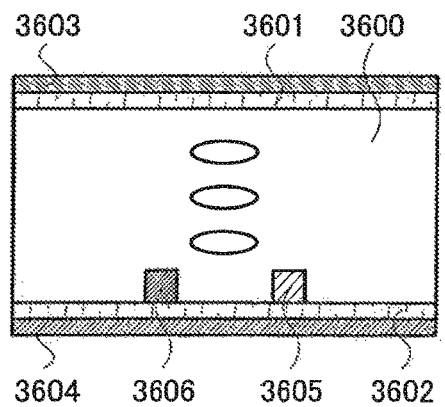
FIGS. 35A to 35D are diagrams illustrating liquid crystal modes of a display device of the present invention.
Figure 35B:
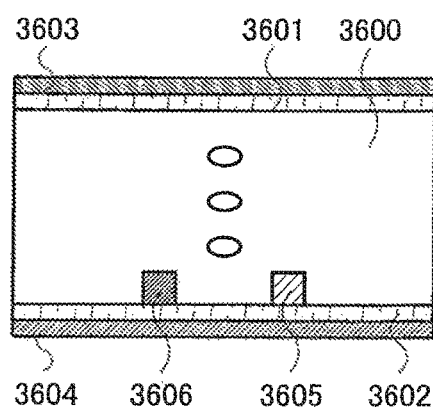

FIGS. 35A and 35B are schematic views of cross sections of an IPS mode. In the IPS mode, the liquid crystal molecules are constantly rotated in a plane parallel to a substrate, and a horizontal electric field mode in which electrodes are provided only on one substrate side is used.

A liquid crystal layer 3600 is held between a first substrate 3601 and a second substrate 3602 which are provided so as to be opposite to each other. A first electrode 3605 and a second electrode 3606 are formed on a top surface of the second substrate 3602. A first polarizing plate 3603 is provided on a surface of the first substrate 3601, which does not face the liquid crystal layer. A second polarizing plate 3604 is provided on a surface of the second substrate 3602, which does not face the liquid crystal layer. Note that the first polarizing plate 3603 and the second polarizing plate 3604 are provided so as to be in a cross nicol state.

The first polarizing plate 3603 may be provided on the top surface of the first substrate 3601. The second polarizing plate 3604 may be provided on the top surface of the second substrate 3602.

It is acceptable as long as at least one of (or both) the first electrode 3605 and the second electrode 3606 has a light-transmitting property (a transmissive or reflective liquid crystal display device). Alternatively, both the first electrode 3605 and the second electrode 3606 may have light-transmitting properties, and part of one of the electrodes may have reflectivity (a semi-transmissive liquid crystal display device).

FIG. 35A is a schematic view of a cross section in the case where voltage is applied to the first electrode 3605 and the second electrode 3606. Since liquid crystal molecules are aligned along a line of electric force which is deviated from a rubbing direction, light emitted from a backlight is affected by birefringence of the liquid crystal molecules. In addition, since the first polarizing plate 3603 and the second polarizing plate 3604 are provided so as to be in a cross nicol state, light emitted from the backlight passes through the substrate. Therefore, white display is performed.

FIG. 35B is a schematic view of a cross section in the case where voltage is not applied to the first electrode 3605 and the second electrode 3606. Since liquid crystal molecules are aligned laterally in a rubbing direction, light emitted from a backlight is not affected by birefringence of the liquid crystal molecules. In addition, since the first polarizing plate 3603 and the second polarizing plate 3604 are provided so as to be in a cross nicol state, light emitted from the backlight does not pass through the substrate. Therefore, black display is performed. This is a so-called normally black mode.

By controlling voltage applied to the first electrode 3605 and the second electrode 3606, conditions of the liquid crystal molecules, that is, alignment of the liquid crystal molecules can be controlled. Therefore, since the amount of light emitted from the backlight can be controlled by the liquid crystal molecules, predetermined image display can be performed.

A liquid crystal display device having a structure shown in FIG. 35A or FIG. 35B can perform full-color display by being provided with a color filter. The color filter can be provided on a first substrate 3601 side or a second substrate 3602 side.

It is acceptable as long as a known material is used as a liquid crystal material used for an IPS mode.

Figure 35C:
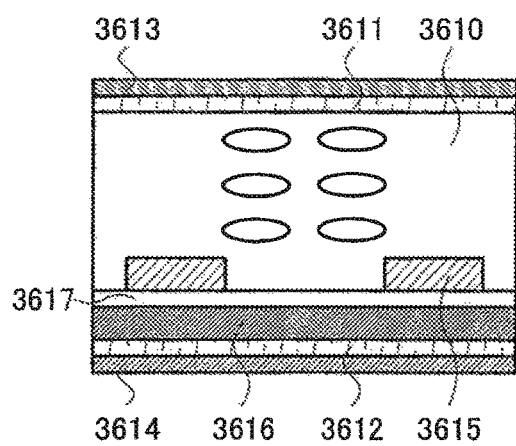
Figure 35D:
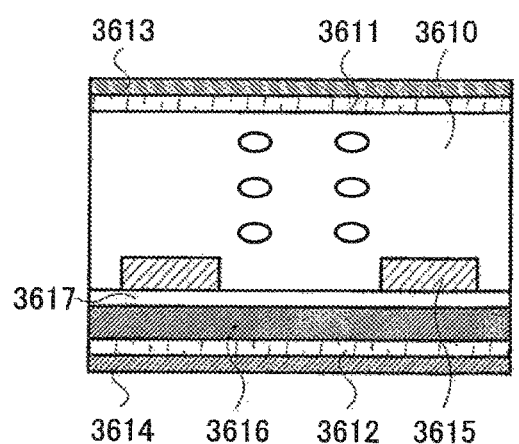

FIGS. 35C and 35D are schematic views of cross sections of an FFS mode. Also in the FFS mode, the liquid crystal molecules are constantly rotated in a plane parallel to a substrate, and a horizontal electric field method in which electrodes are provided only on one substrate side is used.

A liquid crystal layer 3610 is held between a first substrate 3611 and a second substrate 3612 which are provided so as to be opposite to each other. A second electrode 3616 is formed on a top surface of the second substrate 3612. An insulating film 3617 is formed on a top surface of the second electrode 3616. A first electrode 3615 is formed over the insulating film 3617. A first polarizing plate 3613 is provided on a surface of the first substrate 3611, which does not face the liquid crystal layer. A second polarizing plate 3614 is provided on a surface of the second substrate 3612, which does not face the liquid crystal layer. Note that the first polarizing plate 3613 and the second polarizing plate 3614 are provided so as to be in a cross nicol state.

The first polarizing plate 3613 may be provided on the top surface of the first substrate 3611. The second polarizing plate 3614 may be provided on the top surface of the second substrate 3612.

It is acceptable as long as at least one of (or both) the first electrode 3615 and the second electrode 3616 has a light-transmitting property (a transmissive or reflective liquid crystal display device). Alternatively, both the first electrode 3615 and the second electrode 3616 may have light-transmitting properties, and part of one of the electrodes may have reflectivity (a semi-transmissive liquid crystal display device).

FIG. 35C is a schematic view of a cross section in the case where voltage is applied to the first electrode 3615 and the second electrode 3616. Since liquid crystal molecules are aligned along a line of electric force which is deviated from a rubbing direction, light emitted from a backlight is affected by birefringence of the liquid crystal molecules. In addition, since the first polarizing plate 3613 and the second polarizing plate 3614 are provided so as to be in a cross nicol state, light emitted from the backlight passes through the substrate. Therefore, white display is performed.

FIG. 35D is a schematic view of a cross section in the case where voltage is not applied to the first electrode 3615 and the second electrode 3616. Since liquid crystal molecules are aligned laterally in a rubbing direction, light emitted from the backlight is not affected by birefringence of the liquid crystal molecules. In addition, since the first polarizing plate 3613 and the second polarizing plate 3614 are provided so as to be in a cross nicol state, light emitted from the backlight does not pass through the substrate. Therefore, black display is performed. This is a so-called normally black mode.

Note that by controlling voltage applied to the first electrode 3615 and the second electrode 3616, conditions of the liquid crystal molecules, that is, alignment of the liquid crystal molecules can be controlled. Therefore, since the amount of light emitted from the backlight can be controlled by the liquid crystal molecules, predetermined image display can be performed.

A liquid crystal display device having a structure shown in FIG. 35C or FIG. 35D can perform full-color display by being provided with a color filter. The color filter can be provided on a first substrate 3611 side or a second substrate 3612 side.

It is acceptable as long as a known material is used as a liquid crystal material used for an FFS mode.

Next, various liquid crystal modes are described with reference to top plan views.

Figure 36:
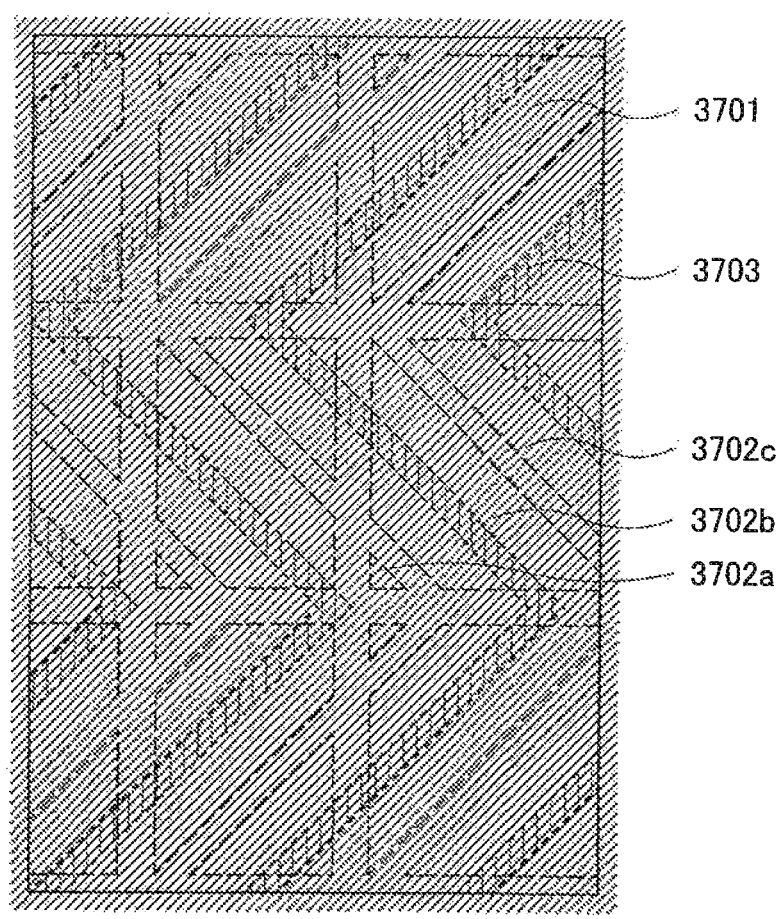
FIG. 36 is a diagram showing an exemplary structure of a display device of the present invention.

FIG. 36 is a top plan view of one of a plurality of liquid crystal capacitors included in a pixel to which an MVA mode is applied.

FIG. 36 shows a first electrode 3701, second electrodes (3702a, 3702b, and 3702c), and a protrusion 3703. The first electrode 3701 is formed over the entire surface of a counter substrate. The protrusion 3703 is formed so as to have boomerang shapes. The second electrodes (3702*a*, 3702*b*, and 3702*c*) are formed over the first electrode 3701 so as to have shapes corresponding to the protrusion 3703.

Opening portions of the second electrodes (3702*a*, 3702*b*, and 3702*c*) function like protrusions.

In the case where voltage is applied to the first electrode 3701 and the second electrodes (3702*a*, 3702*b*, and 3702*c*) (referred to as a vertical electric field mode), liquid crystal molecules are aligned so as to tilt toward the opening portions of the second electrodes (3702*a*, 3702*b*, and 3702*c*) and the protrusion 3703. Therefore, viewing angle characteristics can be enhanced. Note that since light emitted from a backlight passes through a substrate when a pair of polarizing plates is provided so as to be in a cross nicol state, white display is performed.

In the case where voltage is not applied to the first electrode 3701 and the second electrodes (3702*a*, 3702*b*, and 3702*c*), the liquid crystal molecules are aligned longitudinally. Since light emitted from the backlight does not pass through a panel when the pair of polarizing plates is provided so as to be in the cross nicol state, black display is performed. This is a so-called normally black mode.

Note that by controlling voltage applied to the first electrode 3701 and the second electrodes (3702*a*, 3702*b*, and 3702*c*), conditions of the liquid crystal molecules, that is, alignment of the liquid crystal molecules can be controlled. Therefore, since the amount of light emitted from the backlight can be controlled by the liquid crystal molecules, predetermined image display can be performed.

It is acceptable as long as a known material is used as a liquid crystal material used for an MVA mode.

FIGS. 37A to 37D are top plan views of a liquid crystal capacitor to which an IPS mode is applied. In the IPS mode, the liquid crystal molecules are constantly rotated in a plane parallel to a substrate, and a horizontal electric field mode in which electrodes are provided only on one substrate side is used.

In the IPS mode, a pair of electrodes is formed so as to have different shapes.

Figure 37A:
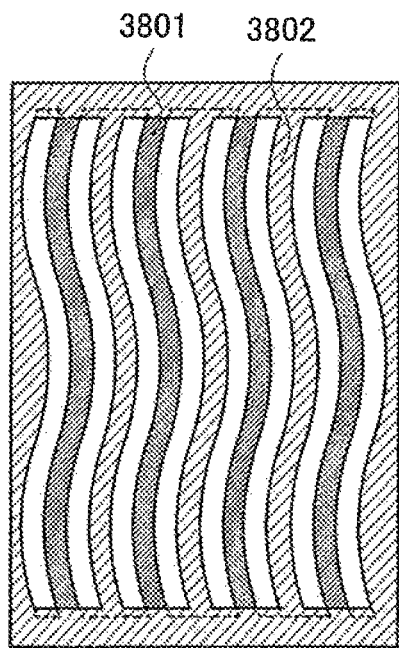
FIGS. 37A to 37D are diagrams showing exemplary structures of a display device of the present invention.

FIG. 37A shows a first electrode 3801 and a second electrode 3802. The first electrode 3801 and the second electrode 3802 have wavy shapes.

Figure 37B:
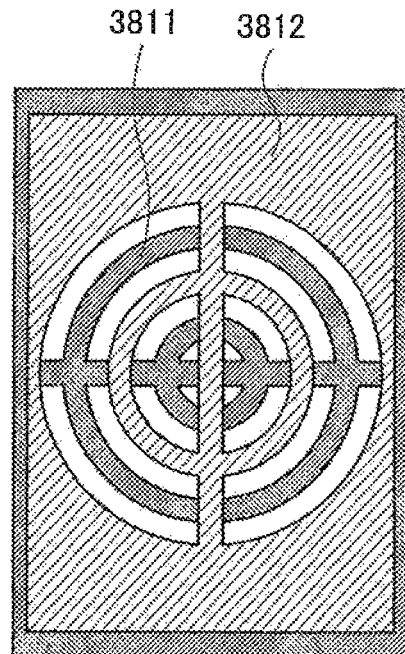

FIG. 37B shows a first electrode 3811 and a second electrode 3812. The first electrode 3811 and the second electrode 3812 have shapes having concentric openings.

Figure 37C:
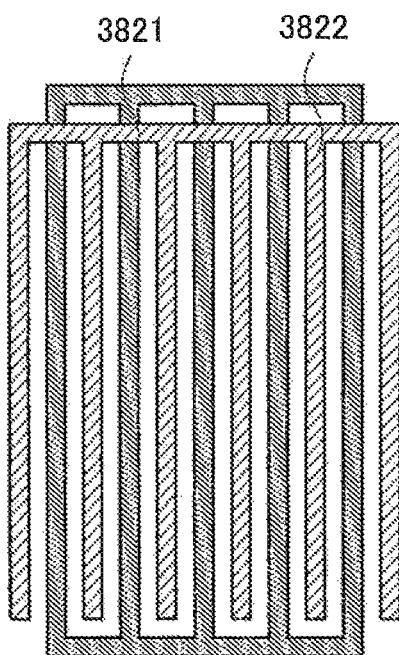

FIG. 37C shows a first electrode 3821 and a second electrode 3822. The first electrode 3821 and the second electrode 3822 have comb shapes and partially overlap with each other.

Figure 37D:
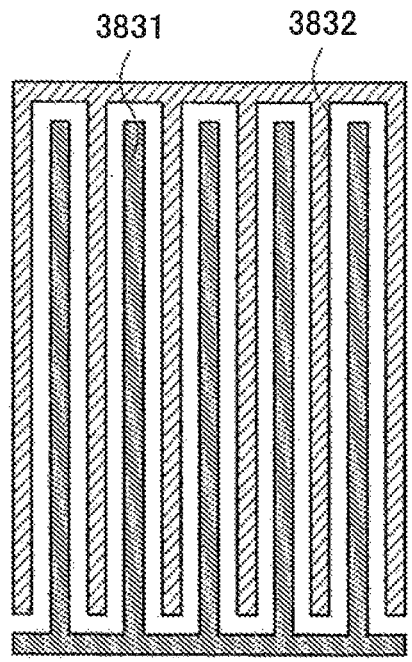

FIG. 37D shows a first electrode 3831 and a second electrode 3832. The first electrode 3831 and the second electrode 3832 have comb shapes in which electrodes engage with each other.

In the case where voltage is applied to the first electrodes (3801, 3811, 3821, and 3831) and the second electrodes (3802, 3812, 3822, and 3832), liquid crystal molecules are aligned along a line of electric force which is deviated from a rubbing direction. Since light emitted from a backlight passes through a substrate when a pair of polarizing plates is provided so as to be in a cross nicol state, white display is performed.

In the case where voltage is not applied to the first electrodes (3801, 3811, 3821, and 3831) and the second electrodes (3802, 3812, 3822, and 3832), the liquid crystal molecules are aligned laterally in the rubbing direction. Since light emitted from the backlight does not pass through the substrate when the pair of polarizing plates is provided so as to be in the cross nicol state, black display is performed. This is a so-called normally black mode.

Note that by controlling voltage applied to the first electrodes and the second electrodes, conditions of the liquid crystal molecules, that is, alignment of the liquid crystal molecules can be controlled. Therefore, since the amount of light emitted from the backlight can be controlled by the liquid crystal molecules, predetermined image display can be performed.

It is acceptable as long as a known material be used as a liquid crystal material used for an IPS mode.

FIGS. 38A to 38D are top plan views of a liquid crystal capacitor to which an FFS mode is applied. In the FFS mode, the liquid crystal molecules are constantly rotated in a plane parallel to a substrate, and a horizontal electric field method in which electrodes are provided only on one substrate side is used.

In the FFS mode, a first electrode is formed over a top surface of a second electrode so as to have various shapes.

Figure 38A:
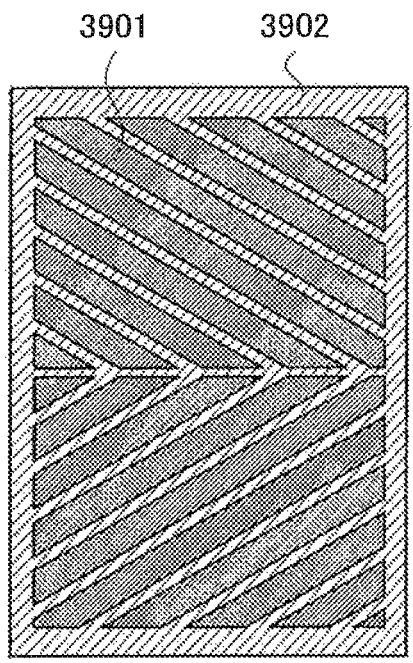
FIGS. 38A to 38D are diagrams showing exemplary structures of a display device of the present invention.

FIG. 38A shows a first electrode 3901 and a second electrode 3902. The first electrode 3901 has a bent boomerang shape. The second electrode 3902 is not necessarily pattered.

Figure 38B:
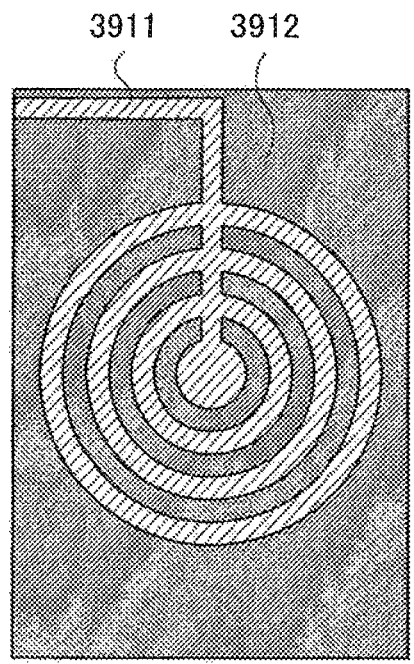

FIG. 38B shows a first electrode 3911 and a second electrode 3912. The first electrode 3911 has a concentric shape. The second electrode 3912 is not necessarily patterned.

Figure 38C:
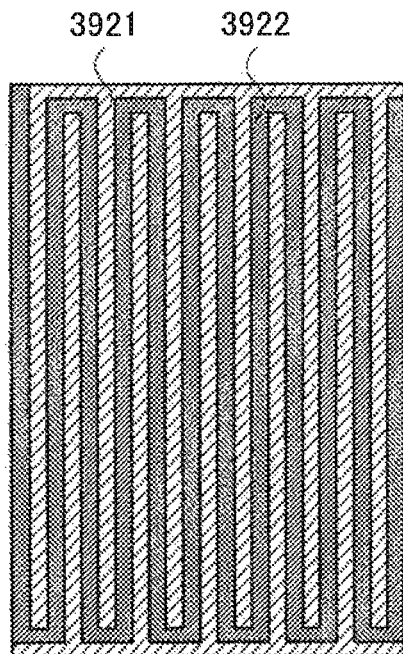

FIG. 38C shows a first electrode 3921 and a second electrode 3922. The first electrode 3921 has a comb shape in which electrodes engage with each other. The second electrode 3922 is not necessarily patterned.

Figure 38D:
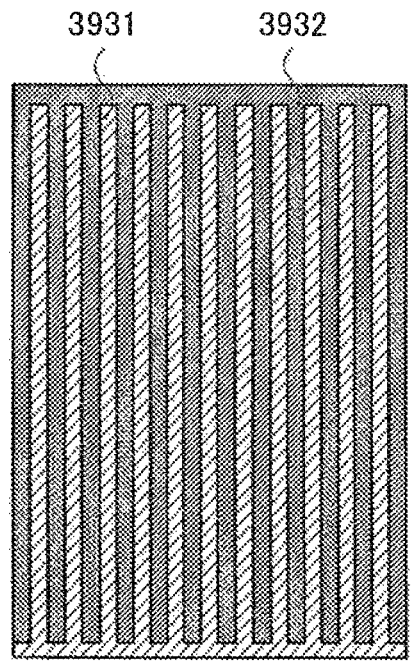

FIG. 38D shows a first electrode 3931 and a second electrode 3932. The first electrode 3931 has a comb shape. The second electrode 3932 is not necessarily.

In the case where voltage is applied to the first electrodes (3901, 3911, 3921, and 3931) and the second electrodes (3902, 3912, 3922, and 3932), liquid crystal molecules are aligned along a line of electric force which is deviated from a rubbing direction. Since light emitted from a backlight passes through a substrate when a pair of polarizing plates is provided so as to be in a cross nicol state, white display is performed.

In the case where voltage is not applied to the first electrodes (3901, 3911, 3921, and 3931) and the second electrodes (3902, 3912, 3922, and 3932), the liquid crystal molecules are aligned laterally in the rubbing direction. Since light emitted from the backlight does not pass through the substrate when the pair of polarizing plates is provided so as to be in the cross nicol state, black display is performed. This is a so-called normally black mode.

Note that by controlling voltage applied to the first electrodes and the second electrodes, conditions of the liquid crystal molecules, that is, alignment of the liquid crystal molecules can be controlled. Therefore, since the amount of light emitted from the backlight can be controlled by the liquid crystal molecules, predetermined image display can be performed.

It is acceptable as long as a known material is used as a liquid crystal material used for an FFS mode.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof; an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 8

In this embodiment mode, a peripheral portion of a liquid crystal panel is described.

Figure 39:
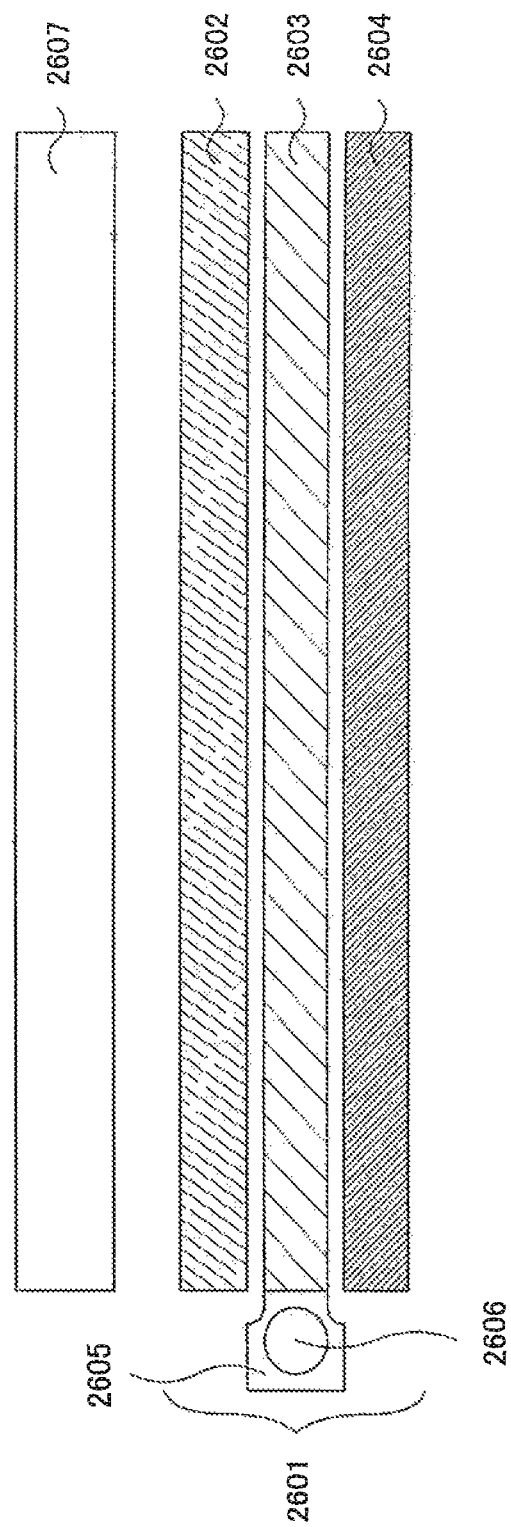
FIG. 39 is a diagram showing an example of a peripheral component of a display device of the present invention.

FIG. 39 shows an example of a liquid crystal display device including a so-called edge-light type backlight unit 2601 and a liquid crystal panel 2607. An edge-light type corresponds to a type in which a light source is provided at an end of a backlight unit and fluorescence of the light source is emitted from the entire light-emitting surface. The edge-light type backlight unit is thin and can save power.

The backlight unit 2601 includes a diffusion plate 2602, a light guide plate 2603, a reflection plate 2604, a lamp reflector 2605, and a light source 2606.

The light source 2606 has a function of emitting light as necessary. For example, as the light source 2606, a cold cathode fluorescent lamp, a hot cathode fluorescent lamp, a light-emitting diode, an inorganic EL, an organic EL, or the like is used. The lamp reflector 2605 has a function of efficiently guiding fluorescence from the light source 2606 to the light guide plate 2603. The light guide plate 2603 has a function of guiding light to the entire surface by total reflection of fluorescence from the light source 2606. The diffusion plate 2602 has a function of reducing variations in brightness. The reflection plate 2604 has a function of reflecting light which is leaked from the light guide plate 2603 to a direction which is opposite to the liquid crystal panel 2607 to be reused.

Note that a control circuit for controlling luminance of the light source 2606 is connected to the backlight unit 2601. By using this control circuit, luminance of the light source 2606 can be controlled.

FIGS. 40A to 40D are views each showing a detailed structure of the edge-light type backlight unit. Note that description of a diffusion plate, a light guide plate, a reflection plate, and the like is omitted.

Figure 40A:
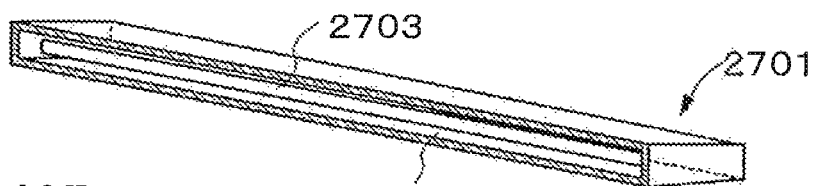
FIGS. 40A to 40D are diagrams showing examples of a peripheral component of a display device of the present invention.

A backlight unit 2701 shown in FIG. 40A has a structure in which a cold cathode fluorescent lamp 2703 is used as a light source. In addition, a lamp reflector 2702 is provided to efficiently reflect light from the cold cathode fluorescent lamp 2703. Such a structure is often used for a large display device.

Figure 40B:
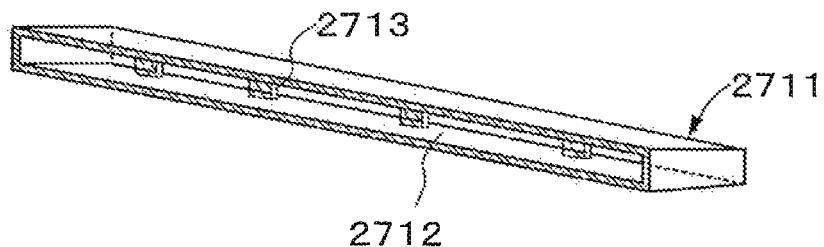

A backlight unit 2711 shown in FIG. 40B has a structure in which light-emitting diodes (LEDs) 2713 are used as light sources. For example, the light-emitting diodes (W) 2713 which emit white light are provided at a predetermined interval. In addition, a lamp reflector 2712 is provided to efficiently reflect light from the light-emitting diodes 2713.

Since emission intensity of light-emitting diodes is high, a structure using light-emitting diodes is suitable for a large display device. Since light-emitting diodes are superior in color reproducibility, an accurate image can be displayed with respect to inputted image information: Since light-emitting diodes are small, an arrangement area can be reduced. Therefore, a frame of a display device can be narrowed.

Note that in the case where light-emitting diodes are mounted on a large display device, the light-emitting diodes can be provided on a back side of the substrate. The light-emitting diodes of R, G, and B are sequentially provided at a predetermined interval.

Figure 40C:
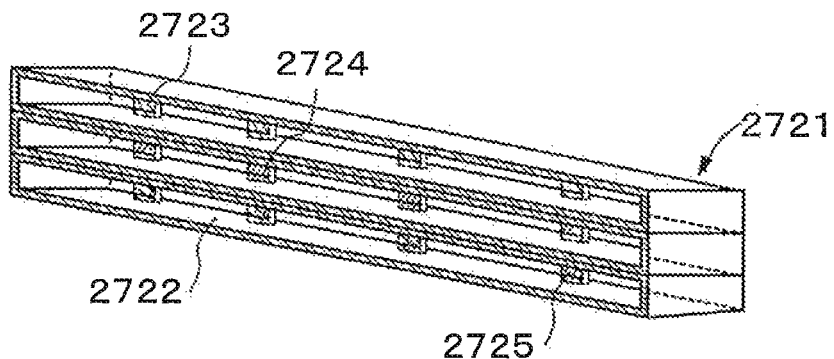

A backlight unit 2721 shown in FIG. 40C has a structure in which light-emitting diodes (LEDs) 2723, light-emitting diodes (LEDs) 2724, and light-emitting diodes (LEDs) 2725 of R, G, and B are used as light sources. The light-emitting diodes (LEDs) 2723, the light-emitting diodes (LEDs) 2724, and the light-emitting diodes (LEDs) 2725 of R, q and B are each provided at a predetermined interval. By using the light-emitting diodes (LEDs) 2723, the light-emitting diodes (LEDs) 2724, and the light-emitting diodes (LEDs) 2725 of R, G, and B, color reproducibility can be improved. In addition, a lamp reflector 2722 is provided to efficiently reflect light from the light-emitting diodes.

Since luminance of light-emitting diodes is high, a structure using light-emitting diodes of R, G, and B as light sources is suitable for a large display device. Since light-emitting diodes are superior in color reproducibility, an accurate image can be displayed with respect to inputted image information. Since light-emitting diodes are small, an arrangement area can be reduced. Therefore, a frame of a display device can be narrowed.

By sequentially making the light-emitting diodes of R, G, and B emit light in accordance with time, color display can be performed. This is a so-called field sequential mode.

Note that a light-emitting diode which emits white light can be combined with the light-emitting diodes (LEDs) 2723, the light-emitting diodes (LEDs) 2724, and the light-emitting diodes (LEDs) 2725 of R, G, and B.

Note that in the case where light-emitting diodes are mounted on a large display device, the light-emitting diodes can be provided on a back side of the substrate. The light-emitting diodes of R, G, and B are sequentially provided at a predetermined interval. By providing the light-emitting diodes in this manner, color reproducibility can be improved.

Figure 40D:
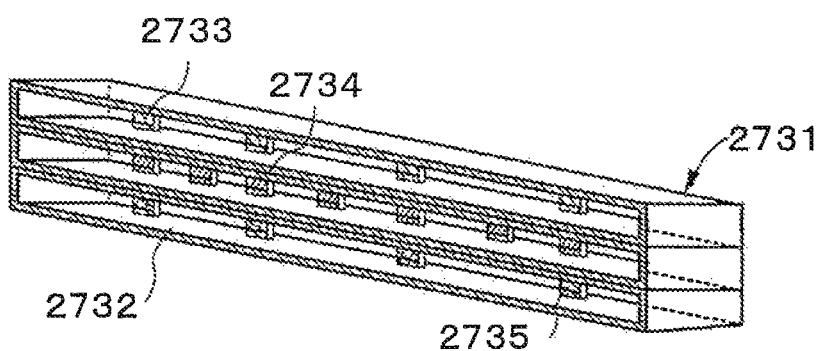

A backlight unit 2731 shown in FIG. 40D has a structure in which light-emitting diodes (LEDs) 2733, light-emitting diodes (LEDs) 2734, and light-emitting diodes (LEDs) 2735 of R, G, and B are used as light sources. For example, among the light-emitting diodes (LEDs) 2733, the light-emitting diodes (LEDs) 2734, and the light-emitting diodes (LEDs) 2735 of R, G, and B, a plurality of the light-emitting diodes (LEDs) 2734 of a color with low emission intensity (e.g., green) are provided in FIG. 40D. With such a structure, color reproducibility can be improved. In addition, a lamp reflector 2732 is provided to efficiently reflect light from the light-emitting diodes.

Since emission intensity of light-emitting diodes is high, a structure using light-emitting diodes of R, G, and B as light sources is suitable for a large display device. Since light-emitting diodes are superior in color reproducibility, an accurate image can be displayed with respect to inputted image information. Since light-emitting diodes are small, an arrangement area can be reduced. Therefore, a frame of a display device can be narrowed.

By sequentially making the light-emitting diodes of R, G, and B emit light in accordance with time, color display can be performed.

Note that a light-emitting diode which emits white light can be combined with the light-emitting diodes (LEDs) 2733, the light-emitting diodes (LEDs) 2734, and the light-emitting diodes (LEDs) 2735 of R, G, and B.

Note that in the case where light-emitting diodes are mounted on a large display device, the light-emitting diodes can be provided on a back side of the substrate. The light-emitting diodes of R, G, and B are sequentially provided at a predetermined interval. By providing the light-emitting diodes in this manner, color reproducibility can be improved.

FIG. 41A shows an example of a liquid crystal display device including a so-called direct-type backlight unit 2800 and a liquid crystal panel 2805. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 2800 includes a diffusion plate 2801, a light-shielding plate 2802, a lamp reflector 2803, and a light source 2804.

The light source 2804 has a function of emitting light as necessary. For example, as the light source 2804, a cold cathode fluorescent lamp, a hot cathode fluorescent lamp, a light-emitting diode, an inorganic EL element, an organic EL element, or the like is used. The lamp reflector 2803 has a function of efficiently guiding fluorescence from the light source 2804 to the diffusion plate 2801 and the light-shielding plate 2802. The light-shielding plate 2802 has a function of reducing variations in luminance by shielding much light as light becomes more intense in accordance with provision of the light source 2804. The diffusion plate 2801 also has a function of reducing variations in luminance.

A control circuit for controlling luminance of the light source 2804 is connected to the backlight unit 2800. By using this control circuit, luminance of the light source 2804 can be controlled.

FIG. 41B shows an example of a liquid crystal display device including a so-called direct-type backlight unit 2810 and a liquid crystal panel 2815.

A backlight unit 2810 includes a diffusion plate 2811; a light-shielding plate 2812; a lamp reflector 2813; and a light source (R) 2814*a*, a light source (G) 2814*b*, and a light source (B) 2814*c* of R, G, and B.

Each of the light source (R) 2814*a*, the light source (G) 2814*b*, and the light source (B) 2814*c* of R, G, and B has a function of emitting light as necessary. For example, as each of the light source (R) 2814*a*, the light source (G) 2814*b*, and the light source (B) 2814*c*, a cold cathode fluorescent lamp, a hot cathode fluorescent lamp, a light-emitting diode, an inorganic EL element, an organic EL element, or the like is used. The lamp reflector 2813 has a function of efficiently guiding fluorescence from the light sources 2814*a* to 2814*c* to the diffusion plate 2811 and the light-shielding plate 2812. The light-shielding plate 2812 has a function of reducing variations in brightness or luminance by shielding much light as light becomes more intense in accordance with provision of the light sources 2814*a* to 2814*c*. The diffusion plate 2811 also has a function of reducing variations in brightness or luminance.

A control circuit for controlling luminance of the light source (R) 2814*a*, the light source (G) 2814*b*, and the light source (B) 2814*c* of R, G, and B is connected to the backlight unit 2810. By using this control circuit, luminance of the light source (R) 2814*a*, the light source (G) 2814*b*, and the light source (B) 2814*c* of R, G, and B can be controlled.

Figure 42:
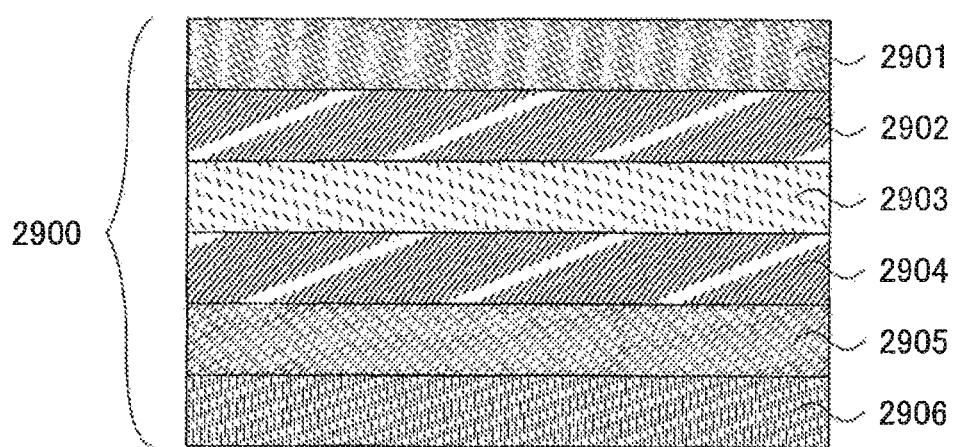
FIG. 42 is a diagram showing an example of a peripheral component of a display device of the present invention.

FIG. 42 shows an example of a structure of a polarizing plate (also referred to as a polarizing film).

A polarizing film 2900 includes a protective film 2901, a substrate film 2902, a PVA polarizing film 2903, a substrate film 2904, an adhesive layer 2905, and a mold release film 2906.

The PVA polarizing film 2903 has a function of generating light in only a certain vibration direction (linear polarized light). Specifically, the PVA polarizing film 2903 includes molecules, which function as a polarizer in which lengthwise electron density and widthwise electron density are greatly different from each other. The PVA polarizing film 2903 can generate linear polarized light by uniforming directions of the molecules in which lengthwise electron density and widthwise electron density are greatly different from each other.

For example, a high molecular film of poly vinyl alcohol is doped with an iodine compound and a PVA film is pulled in a certain direction, so that a film in which iodine molecules are aligned in a certain direction can be obtained as the PVA polarizing film 2903. Then, light which is parallel to a major axis of the iodine molecule is absorbed by the iodine molecule. Note that a dichroic dye may be used instead of iodine for high durability use and high heat resistance use. Note that it is preferable that the dye be used for a liquid crystal display device which needs to have durability and heat resistance, such as an in-car LCD or an LCD for a projector.

When the PVA polarizing film 2903 is sandwiched by films to be base materials (the substrate film 2902 and the substrate film 2904) from both sides, reliability can be improved. Note that the PVA polarizing film 2903 may be sandwiched by triacetylcellulose (TAC) films with high light-transmitting properties and high durability. Note that each of the substrate films and the TAC films function as protective layers of polarizer included in the PVA polarizing film 2903.

The adhesive layer 2905 which is to be attached to a glass substrate of the liquid crystal panel is attached to one of the substrate films (the substrate film 2904). Note that the adhesive layer 2905 is formed by applying an adhesive to one of the substrate films (the substrate film 2904). The mold release film 2906 (a separate film) is provided to the adhesive layer 2905.

The protective film 2901 is provided to the other of the substrates films (the substrate film 2902).

A hard coating scattering layer (an anti-glare layer) may be provided on a surface of the polarizing film 2900. Since the surface of the hard coating scattering layer has minute unevenness formed by AG treatment and has an anti-glare function which scatters external light, reflection of external light in the liquid crystal panel can be prevented. Surface reflection can also be prevented.

Note that a treatment in which plurality of optical thin film layers having different refractive indexes are layered (also referred to as anti-reflection treatment or AR treatment) may be performed on the surface of the polarizing film 2900. The plurality of layered optical thin film layers having different refractive indexes can reduce reflectivity on the surface by an interference effect of light.

Figure 43A:
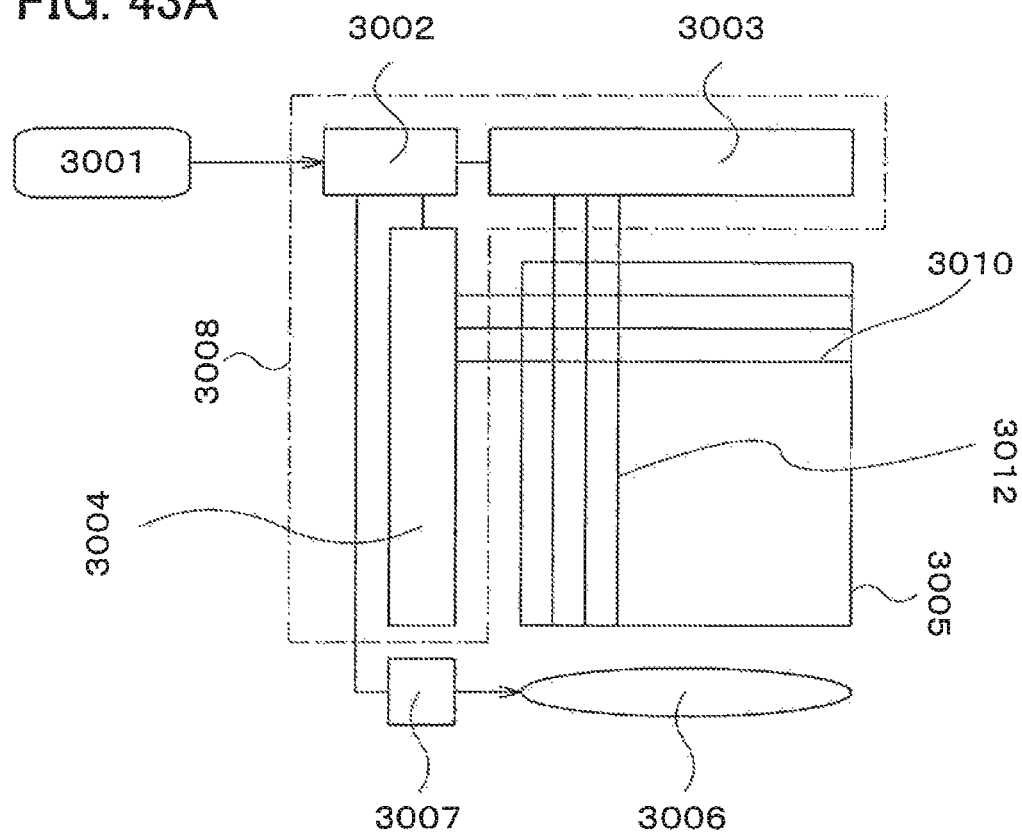
FIGS. 43A to 43C are diagrams showing an exemplary structure of a panel circuit of a display device of the present invention.
Figure 43B:
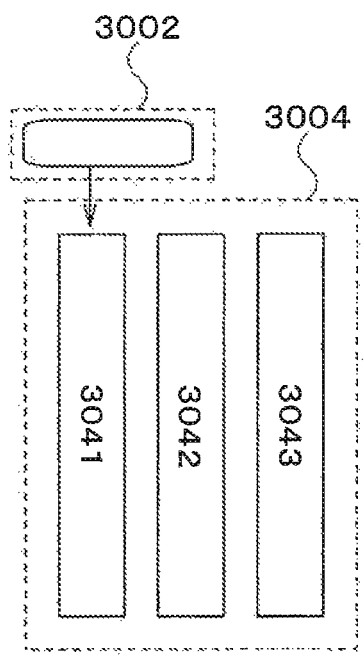
Figure 43C:
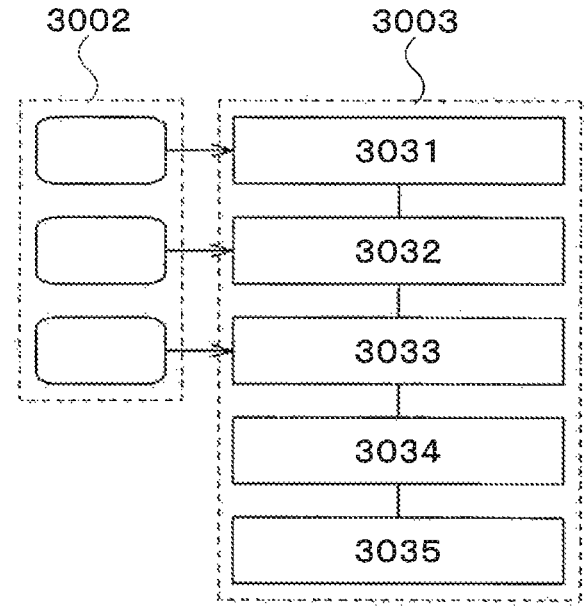

FIGS. 43A to 43C each show an example of a system block of the liquid crystal display device.

As shown in FIG. 43A, in a pixel portion 3005, signal lines 3012 which are extended from a signal line driver circuit 3003 are provided. In addition, in the pixel portion 3005, scan lines 3010 which are extended from a scan line driver circuit 3004 are also provided. In addition, a plurality of pixels are arranged in matrix in cross regions of the signal lines 3012 and the scan lines 3010. Note that each of the plurality of pixels includes a switching element. Here, detailed description of the pixel portion 3005 is omitted since it is described in the above-mentioned embodiment mode.

In FIG. 43A, a driver circuit portion 3008 includes a control circuit 3002, the signal line driver circuit 3003, and the scan line driver circuit 3004. An image signal is input to the control circuit 3002. The signal line driver circuit 3003 and the scan line driver circuit 3004 are controlled by the control circuit 3002 in accordance with this control signal 3001. That is, the control circuit 3002 inputs a control signal to each of the signal line driver circuit 3003 and the scan line driver circuit 3004. Then, in accordance with this control signal, the signal line driver circuit 20403 inputs a video signal to each of the signal lines 3012 and the scan line driver circuit 3004 inputs a scan signal to each of the scan lines 3010. Then, the switching element included in the pixel is selected in accordance with the scan signal and the video signal is input to a pixel electrode of the pixel.

Note that the control circuit 3002 also controls a power source 3007 in accordance with the control signal 3001. The power source 3007 includes a unit for supplying power to a lighting unit 3006. As the lighting unit 3006, an edge-light type backlight unit or a direct-type backlight unit can be used. Note that a front light may be used as the lighting unit 3006. A front light corresponds to a plate-like lighting unit including a luminous body and a light conducting body, which is attached to the front surface side of a pixel portion and illuminates the whole area. By using such a lighting unit, the pixel portion can be uniformly illuminated at low power consumption.

As shown in FIG. 43B, the scan line driver circuit 3004 includes a shift register 3041, a level shifter 3042, and a circuit functioning as a buffer 3043. A signal such as a gate start pulse (GSP) or a gate clock signal (GCK) is input from the control circuit 3002 to the shift register 3041.

As shown in FIG. 43C, the signal line driver circuit 3003 includes a shift register 3031, a first latch 3032, a second latch 3033, a level shifter 3034, and a circuit functioning as a buffer 3035. The circuit functioning as the buffer 3035 corresponds to a circuit which has a function of amplifying a weak signal and includes an operational amplifier or the like. A signal such as a source start pulse (SSP) or a source clock signal (SCK) is input to the level shifter 3034 and data (DATA) such as a video signal is input to the first latch 3032. A latch (LAT) signal can be temporally held in the second latch 3033 and are simultaneously input to the pixel portion 3005 by a latch (LAT) signal. This is referred to as line sequential driving. Therefore, when a pixel is used in which not line sequential driving but dot sequential driving is performed, the second latch can be omitted.

Note that in this embodiment mode, a known liquid crystal panel can be used for the liquid crystal panel. For example, a structure in which a liquid crystal layer is sealed between two substrates can be used as the liquid crystal panel. A transistor, a capacitor, a pixel electrode, an alignment film, or the like is formed over one of the substrates. A polarizing plate, a retardation plate, or a prism sheet may be provided over the surface opposite to a top surface of the one of the substrates. A color filter, a black matrix, a counter electrode, an alignment film, or the like is provided over the other of the substrates. A polarizing plate or a retardation plate may be provided over the surface opposite to a top surface of the other of the substrates. The color filter and the black matrix may be formed over the top surface of the one of the substrates. Note that three-dimensional display can be performed by providing a slit (a grid) over the top surface side of the one of the substrates or the surface opposite to the top surface side of the one of the substrates.

Each of the polarizing plate, the retardation plate, and the prism sheet can be provided between the two substrates. Alternatively, each of the polarizing plate, the retardation plate, and the prism sheet can be integrated with one of the two substrates.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode or embodiment. Further, even more drawings can be formed by combining each part with part of another embodiment mode or embodiment in the drawings of this embodiment mode.

This embodiment mode shows an example of an embodied case of the contents (or may be part of the contents) described in other embodiment modes and embodiments, an example of slight transformation thereof; an example of partial modification thereof, an example of improvement thereof an example of detailed description thereof, an application example thereof, an example of related part thereof, or the like. Therefore, the contents described in other embodiment modes and embodiments can be freely applied to, combined with, or replaced with this embodiment mode.

Embodiment Mode 9

In this embodiment mode, a method for driving a display device is described. In particular, a method for driving a liquid crystal display device is described.

A liquid crystal display panel which can be used for a liquid crystal display device described in this embodiment mode has a structure in which a liquid crystal material is interposed between two substrates. Each of the two substrates is provided with an electrode for controlling an electric field applied to the liquid crystal material. A liquid crystal material corresponds to a material optical and electrical properties of which are changed by an electric field externally applied. Accordingly, a liquid crystal panel corresponds to a device in which desired optical and electrical properties can be obtained by controlling voltage applied to the liquid crystal material with use of the electrode included in each of the two substrates. In addition, many electrodes are arranged in a planar manner so that each of the electrodes corresponds to a pixel, and voltages applied to the pixels are individually controlled; therefore, a liquid crystal display panel which can display a high-definition image can be obtained.

Here, response time of the liquid crystal material due to change in an electric field depends on a space (a cell gap)

between the two substrates and a type or the like of the liquid crystal material, and is generally several milliseconds to several ten milliseconds. When the amount of change in the electric field is small, the response time of the liquid crystal material is further lengthened. This characteristic causes defects in image display, such as an after image, a phenomenon in which traces can be seen, and decrease in contrast when the liquid crystal panel displays a moving image. In particular, when a half tone is changed into another half tone (when change in the electric field is small), a degree of the above-described defects become noticeable.

On the other hand, as a particular problem of a liquid crystal panel using an active matrix method, fluctuation in writing voltage due to constant charge driving is given. Constant charge driving in this embodiment mode is described below.

A pixel circuit using an active matrix method includes a switch which controls writing and a capacitor which holds a charge. A method for driving the pixel circuit using the active matrix method corresponds to a method in which predetermined voltage is written in a pixel circuit with a switch in an on state, and immediately after that, the switch is turned off and a charge in the pixel circuit is held (a hold state). At the time of the hold state, exchange of the charge between inside and outside of the pixel circuit is not performed (a constant charge). In general, a period when the switch is in an off state is approximately several hundreds (the number of scan lines) of times longer than a period when the switch is in an on state. Accordingly, it is likely that the switch of the pixel circuit is almost always in an off state. As described above, constant charge driving in this embodiment mode corresponds to a driving method in which a pixel circuit is in a hold state in almost all periods when a liquid crystal panel is driven.

Next, electrical properties of the liquid crystal material are described. A dielectric constant as well as optical properties of the liquid crystal material are changed when an electric field externally applied is changed. That is, when it is considered that each pixel of the liquid crystal panel is a capacitor (a liquid crystal element) interposed between two electrodes, the capacitor corresponds to a capacitor, capacitance of which is changed in accordance with applied voltage. This phenomenon is called dynamic capacitance.

When a capacitor, the capacitance of which is changed in accordance with applied voltage in this manner, is driven by the constant charge driving, the following problem occurs. When capacitance of a liquid crystal element is changed in a hold state in which a charge is not moved, applied voltage is also changed. This can be understood from the fact that the amount of charges is constant in a relational expression of (the amount of charges) (capacitance)×(applied voltage).

Figure 44A:
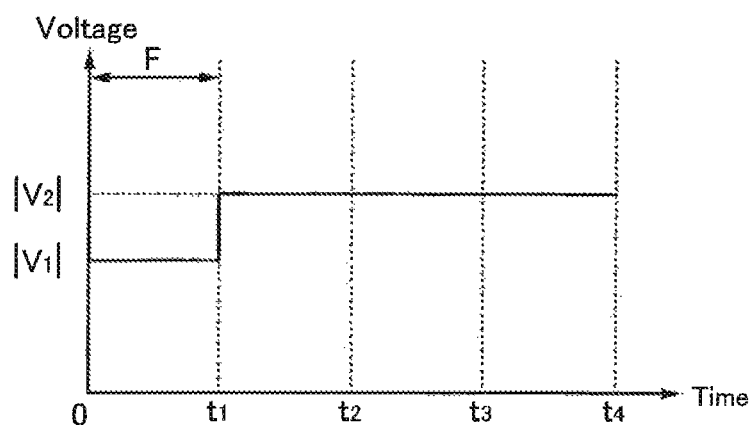
FIGS. 44A to 44C are diagrams showing an exemplary driving method of a display device of the present invention.
Figure 44B:
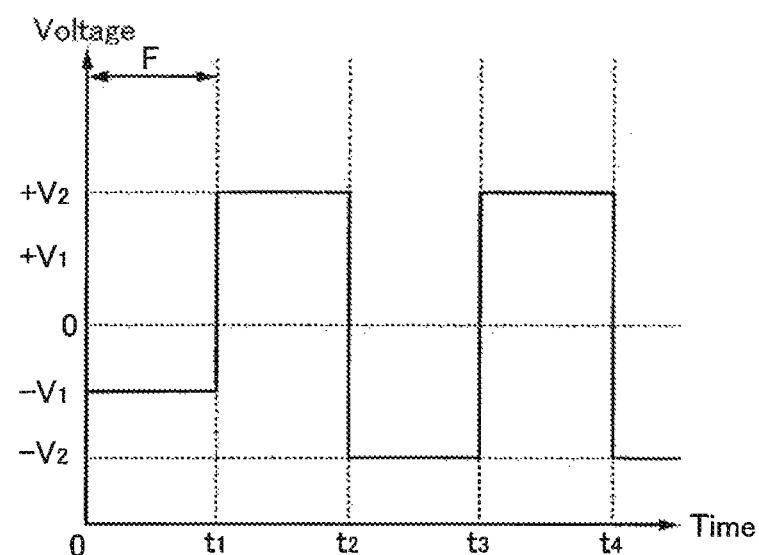
Figure 44C:
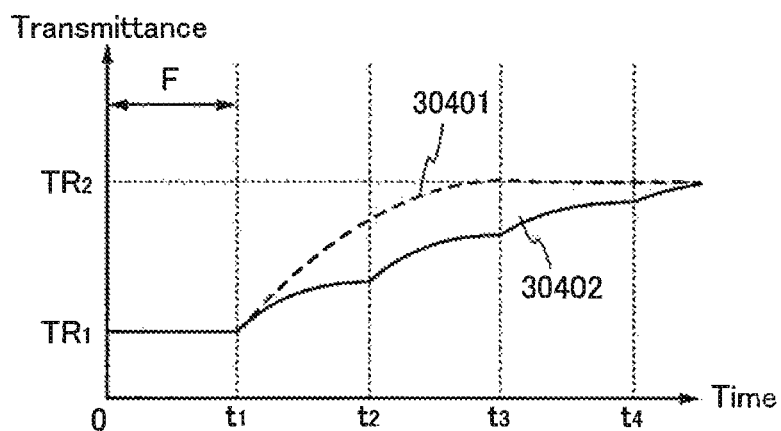

For the above-described reasons, voltage at the time of a hold state is changed from voltage at the time of writing because constant charge driving is performed in a liquid crystal panel using an active matrix method. Accordingly, change in transmittance of the liquid crystal element is different from change in transmittance of a liquid crystal element in a driving method which does not take a hold state. FIGS. 44A to 44C show this state. FIG. 44A shows an example of controlling voltage written in a pixel circuit when time is represented by a horizontal axis and an absolute value of the voltage is represented by a vertical axis. FIG. 44B shows an example of controlling voltage written in the pixel circuit when time is represented by a horizontal axis and the voltage is represented by a vertical axis. FIG. 44C shows change in transmittance of the liquid crystal element over time in the case where the voltage shown in FIG. 44A or 44B is written in the pixel circuit when time is represented by a horizontal axis and transmittance of the liquid crystal element is represented by a vertical axis. In each of FIGS. 44A to 44C, a period F indicates a period for rewriting the voltage, and time for rewriting the voltage is denoted by t1, t2, t3, t4, and the like.

Here, writing voltage corresponding to image data input to the liquid crystal display device corresponds to |V1| in rewriting at the time of 0 and corresponds to |V2| in rewriting at the time of t1, t2, t3, t4, and the like (see FIG. 44A).

Note that polarity of the writing voltage corresponding to image data input to the liquid crystal display device may be switched periodically (inversion driving: see FIG. 44B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of a flicker caused by inversion driving can be reduced because the inversion period is short. Further, the inversion period may be a period which is integral times the period of rewriting voltage. In this case, power consumption can be reduced because the inversion period is long and frequency of writing voltage can be decreased by changing the polarity.

FIG. 44C shows change in transmittance of the liquid crystal element over time when voltage as shown in FIG. 44A or 44B is applied to the liquid crystal element. Here, the voltage |V1| is applied to the liquid crystal element, and transmittance of the liquid crystal element after enough time passes corresponds to TR1. Similarly, the voltage |V2| is applied to the liquid crystal element, and transmittance of the liquid crystal element after enough time passes corresponds to TR2. When the voltage applied to the liquid crystal element is changed from |V1| to |V2| at the time of t1, transmittance of the liquid crystal element does not immediately become TR2 but slowly changes as shown by a dashed line 30401. For example, when the period of rewriting voltage is the same as a frame period (16.7 milliseconds) of an image signal of 60 Hz, time for several frames is necessary until transmittance is changed to TR2.

Note that smooth change in transmittance over time as shown in the dashed line 30401 corresponds to change in transmittance over time when the voltage |V2| is accurately applied to the liquid crystal element. In an actual liquid crystal panel, for example, in a liquid crystal panel using an active matrix method, transmittance of the liquid crystal element does not changed over time as shown by the dashed line 30401 but gradually changes over time as shown by a solid line 30402. This is because voltage at the time of a hold state is changed from voltage at the time of writing due to constant charge driving, and it is impossible to reach intended voltage only by one writing. Accordingly, the response time of transmittance of the liquid crystal element becomes further longer than original response time (the dashed line 30401) in appearance, so that defects when an image is displayed, such as an after image, a phenomenon in which traces can be seen, or decrease in contrast noticeably occur.

Figure 45A:
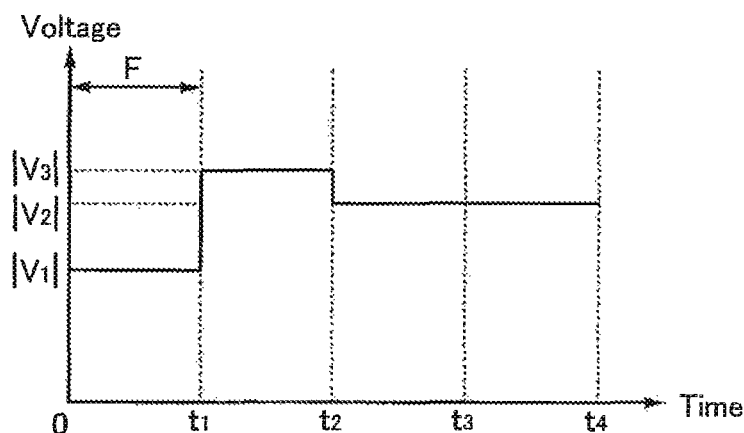
FIGS. 45A to 45C are diagrams showing an exemplary driving method of a display device of the present invention.
Figure 45B:
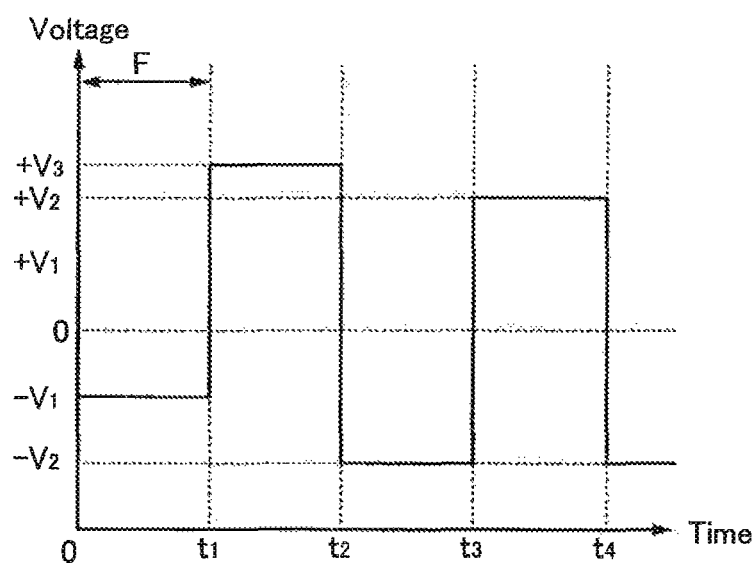
Figure 45C:
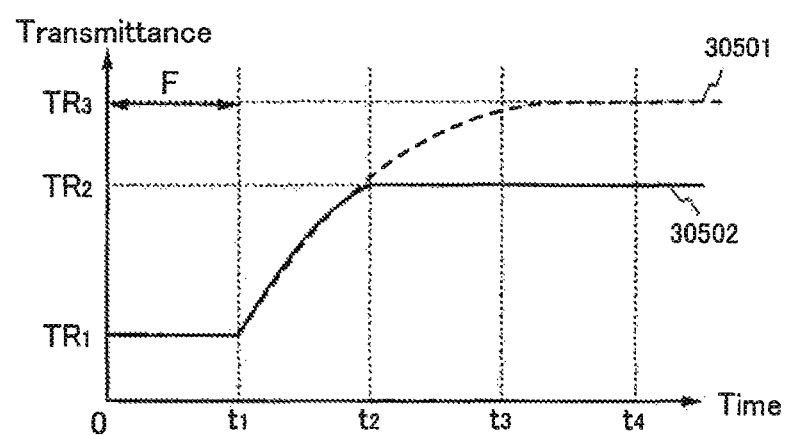

By using overdriving, it is possible to solve a phenomenon in which the response time in appearance becomes further longer because of shortage of writing by dynamic capacitance and constant charge driving as well as length of the original response time of the liquid crystal element. FIGS. 45A to 45C show this state. FIG. 45A shows an example of controlling voltage written in a pixel circuit when time is represented by a horizontal axis and an absolute value of the voltage is represented by a vertical axis. FIG. 45B shows an example of controlling voltage written in the pixel circuit when time is represented by a horizontal axis and the voltage is represented by a vertical axis. FIG. 45C shows change in transmittance of the liquid crystal element over time in the case where the voltage shown in FIG. 45A or 45B is written in the pixel circuit when time is represented by a horizontal axis and transmittance of the liquid 6 crystal element is represented by a vertical axis. In each of FIGS. 45A to 45C, a period F indicates a period for rewriting the voltage, and time for rewriting the voltage is denoted by t1, t2, t3, t4, and the like.

Here, writing voltage corresponding to image data input to the liquid crystal display device corresponds to |V1| in rewriting at the time of 0, corresponds to |V3| in rewriting at the time of t1, and corresponds to |V2| in rewriting at the time of t2, t3, t4, and the like (see FIG. 45A).

Note that polarity of the writing voltage corresponding to image data input to the liquid crystal display device may be switched periodically (inversion driving: see FIG. 45B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of a flicker caused by inversion driving can be reduced because the inversion period is short. Further, the inversion period may be a period which is integral times the period of rewriting voltage. In this case, power consumption can be reduced because the inversion period is long and frequency of writing voltage can be decreased by changing the polarity.

FIG. 45C shows change in transmittance of the liquid crystal element over time when voltage as shown in FIG. 45A or 45B is applied to the liquid crystal element. Here, the voltage |V1| is applied to the liquid crystal element and transmittance of the liquid crystal element after enough time passes corresponds to TR1. Similarly, the voltage |V2| is applied to the liquid crystal element and transmittance of the liquid crystal element after enough time passes corresponds to TR2. Similarly, the voltage |V3| is applied to the liquid crystal element and transmittance of the liquid crystal element after enough time passes corresponds to TR3. When the voltage applied to the liquid crystal element is changed from |V1| to |V3| at the time of t1, transmittance of the liquid crystal element is tried to be changed to TR3 for several frames as shown by a dashed line 30501. However, application of the voltage |V3| is terminated at the time of t2, and the voltage |V2| is applied after the time of t2. Therefore, transmittance of the liquid crystal element does not become as shown by the dashed line 30501 but becomes as shown by a solid line 30502. It is preferable that a value of the voltage |V3| be set so that transmittance is approximately TR2 at the time of t2. Here, the voltage |V3| is also referred to as overdriving voltage.

That is, the response time of the liquid crystal element can be controlled to some extent by changing |V3|, which is the overdriving voltage. This is because the response time of the liquid crystal element is changed by the strength of an electric field. Specifically, the response time of the liquid crystal element becomes shorter as the electric field is stronger, and the response time of the liquid crystal element becomes longer as the electric field is weaker.

It is preferable that |V3|, which is the overdriving voltage, be changed in accordance with the amount of change in the voltage, that is, the voltage |V1| and the voltage |V2| which provide intended transmittance TR1 and TR2. This is because appropriate response time can be always obtained by changing |V3|, which is the overdriving voltage, in accordance with change in the response time of the liquid crystal element even when the response time of the liquid crystal element is changed by the amount of change in the voltage.

It is preferable that |V3|, which is the overdriving voltage, be changed depending on a mode of the liquid crystal element, such as a TN mode, a VA mode, an IPS mode, or an OCB mode. This is because appropriate response time can be always obtained by changing |V3|, which is the overdriving voltage, in accordance with change in the response time of the liquid crystal element even when the response time of the liquid crystal element is changed depending on the mode of the liquid crystal element.

Note that the voltage rewriting period F may be the same as a frame period of an input signal. In this case, a liquid crystal display device with low manufacturing cost can be obtained since a peripheral driver circuit of the liquid crystal display device can be simplified.

Note that the voltage rewriting period F may be shorter than the frame period of the input signal. For example, the voltage rewriting period F may be one half the frame period of the input signal, or one third or less the frame period of the input signal. It is effective to combine this method with a measure against deterioration in quality of a moving image caused by hold driving of the liquid crystal display device, such as black data insertion driving, backlight blinking, backlight scanning, or intermediate image insertion driving by motion compensation. That is, since required response time of the liquid crystal element is short in the measure against deterioration in quality of a moving image caused by hold driving of the liquid crystal display device, the response time of the liquid crystal element can be relatively shortened easily by using the overdriving method described in this embodiment mode. Although the response time of the liquid crystal element can be shortened by a cell gap, a liquid crystal material, a mode of the liquid crystal element, or the like, it is technically difficult to shorten the response time of the liquid crystal element. Therefore, it is very important to use a method for shortening the response time of the liquid crystal element by a driving method, such as overdriving.

Note also that the voltage rewriting period F may be longer than the frame period of the input signal. For example, the voltage rewriting period F may be twice the frame period of the input signal, or three times or more the frame period of the input signal. It is effective to combine this method with a means (a circuit) which determines whether voltage is not rewritten for a long period or not. That is, when the voltage is not rewritten for a long period, an operation of the circuit can be stopped during a period where no voltage is rewritten without performing a rewriting operation of the voltage. Thus, a liquid crystal display device with low power consumption can be obtained.

Next, a specific method for changing the overdriving voltage |V3| in accordance with the voltage |V1| and the voltage |V2|, which provide intended transmittance TR1 and TR2, is described.

Since an overdriving circuit corresponds to a circuit for appropriately controlling the overdriving voltage |V3| in accordance with the voltage |V1| and the voltage |V2|, which provide intended transmittance TR1 and TR2, signals input to the overdriving circuit am a signal related to the voltage |V1|, which provides intended transmittance TR1, and a signal related to the voltage |V2|, which provides intended transmittance TR2; and a signal output from the overdriving circuit is a signal related to the overdriving voltage |V3|. Here, each of these signals may have an analog voltage value such as the voltage (|V1|, |V2|, or |V3|) applied to the liquid crystal element or may be a digital signal for supplying the voltage applied to the liquid crystal element. Here, the signal related to the overdriving circuit is described as a digital signal.

Figure 46A:
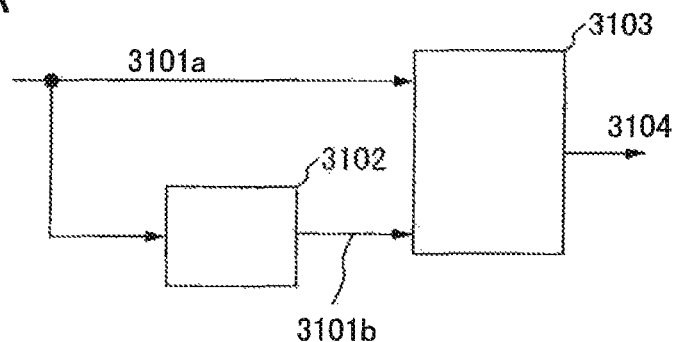
FIGS. 46A to 46E are diagrams showing an exemplary driving method of a display device of the present invention.

First, a general structure of the overdriving circuit is described with reference to FIG. 46A. Here, input image signals 3101a and 3101b are used as signals for controlling the overdriving voltage. As a result of processing these signals, an output image signal 3104 is to be output as a signal which provides the overdriving voltage.

Since the voltage |V1| and the voltage |V2|, which provide intended transmittance TR1 and TR2, are image signals in adjacent frames, it is preferable that the input image signals 3101a and 3101b be also image signals in adjacent frames. In order to obtain such signals, the input image signal 3101a is input to a delay circuit 3102 in FIG. 46A, and a signal which is consequently output can be used as the input image signal 3101b. An example of the delay circuit 3102 includes a memory. That is, the input image signal 3101a is stored in the memory in order to delay the input image signal 3101a for one frame, and at the same time, a signal stored in the previous 6 frame is extracted from the memory as the input image signal 3101b, and the input image signals 3101a and 3101b are simultaneously input to a correction circuit 3103. Thus, the image signals in adjacent frames can be handled. By inputting the image signals in adjacent frames to the correction circuit 3103, the output image signal 3104 can be obtained. Note that when a memory is used as the delay circuit 3102, a memory having capacity for storing an image signal for one frame in order to delay the input image signal 3101a for one frame (i.e., a frame memory) can be obtained. Thus, the memory can have a function as a delay circuit without causing excess and deficiency of memory capacity.

Next, the delay circuit 3102 formed mainly for reducing memory capacity is described. Since memory capacity can be reduced by using such a circuit as the delay circuit 3102, manufacturing cost can be reduced.

Figure 46B:
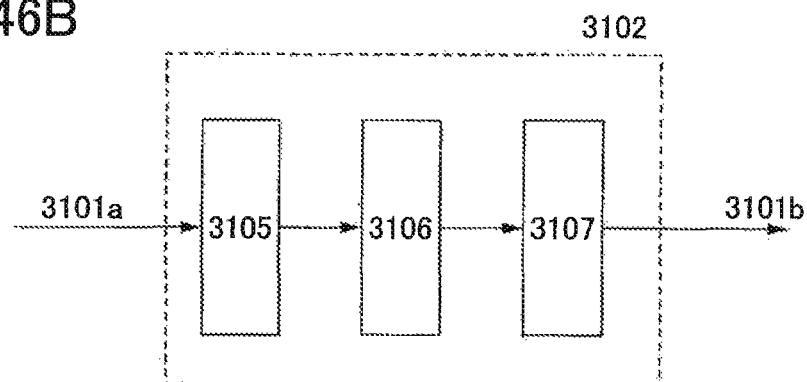

Specifically, a delay circuit as shown in FIG. 46B can be used as the delay circuit 3102 having such characteristics. The delay circuit shown in FIG. 46B includes an encoder 3105, a memory 3106, and a decoder 3107.

Operations of the delay circuit 3102 shown in FIG. 46B are as follows. First, compression processing is performed by the encoder 3105 before the input image signal 3101a is stored in the memory 3106. Thus, the size of data to be stored in the memory 3106 can be reduced. Accordingly, memory capacity can be reduced, and manufacturing cost can be reduced. Then, a compressed image signal is transferred to the decoder 3107 and extension processing is performed here. Thus, the signal which has been compressed by the encoder 3105 can be restored. Here, compression and extension processing which is performed by the encoder 3105 and the decoder 3107 may be reversible processing. Accordingly, since the image signal does not deteriorate even after compression and extension processing is performed, memory capacity can be reduced without causing deterioration of quality of an image, which is finally displayed on a device. Alternatively, compression and extension processing which is performed by the encoder 3105 and the decoder 3107 may be non-reversible processing. Accordingly, since the size of data of the compressed image signal can be made extremely small, memory capacity can be significantly reduced.

As a method for reducing memory capacity, various methods can be used as well as the above-described method. For example, a method in which color information included in an image signal is reduced (e.g., tone reduction from 260 thousand colors to 65 thousand colors is performed) or the amount of data is reduced (resolution is reduced) without performing image compression by an encoder can be used.

Figure 46C:
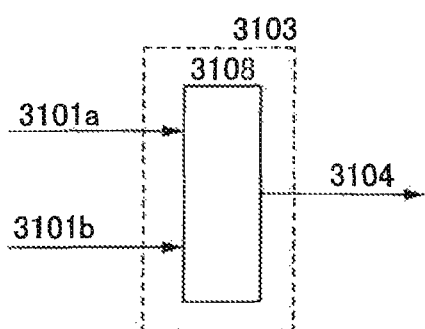

Next, specific examples of the correction circuit 3103 are described with reference to FIGS. 46C to 46E. The correction circuit 3103 corresponds to a circuit for outputting an output image signal of a certain value from two input image signals. Here, when a relation between the two input image signals and the output image signal is non-linear and it is difficult to calculate the relation by simple operation, a look up table (LUT) may be used as the correction circuit 3103. Since the relation between the two input image signals and the output image signal is calculated in advance by measurement in a LUT, the output image signal corresponding to the two input image signals can be calculated only by seeing the LUT (see FIG. 46C). By using a LUT 3108 as the correction circuit 3103, the correction circuit 3103 can be realized without complicated circuit design or the like.

Since the LUT is one of memories, it is preferable to reduce memory capacity as much as possible in order to reduce manufacturing cost. As an example of the correction circuit 3103 for realizing reduction in memory capacity, a circuit shown in FIG. 46D can be considered. The correction circuit 3103 shown in FIG. 46D includes a LUT 3109 and an adder 3110. Difference data between the input image signal 3101a and the output image signal 3104 to be output is stored in the LUT 3109. That is, corresponding difference data from the input image signal 3101a and the input image signal 3101b is extracted from the LUT 3109, and the extracted difference data and the input image signal 3101a are added by the adder 3110, so that the output image signal 3104 can be obtained. Note that when data stored in the LUT 3109 is difference data, memory capacity of the LUT can be reduced. This is because the size of difference data is smaller than that of the output image signal 3104 as it is, so that memory capacity necessary for the LUT 3109 can be reduced.

In addition, when the output image signal can be calculated by simple operation such as four arithmetic operations of the two input image signals, the correction circuit 3103 can be realized by combination of simple circuits such as an adder, a subtractor, and a multiplier. Accordingly, it is not necessary to use the LUT, and manufacturing cost can be significantly reduced. As such a circuit, a circuit shown in FIG. 46E can be considered. The correction circuit 3103 shown in FIG. 46E includes a subtractor 3111, a multiplier 3112, and an adder 3113. First, difference between the input image signal 3101a and the input image signal 3101b is calculated by the subtractor 3111. After that, a differential value is multiplied by an appropriate coefficient by using the multiplier 3112. Then, the differential value multiplied by the appropriate coefficient is added to the input image signal 3101a by the adder 3113; thus, the output image signal 3104 can be obtained. By using such a circuit, it is not necessary to use the LUT. Therefore, manufacturing cost can be significantly reduced.

Figure 46E:
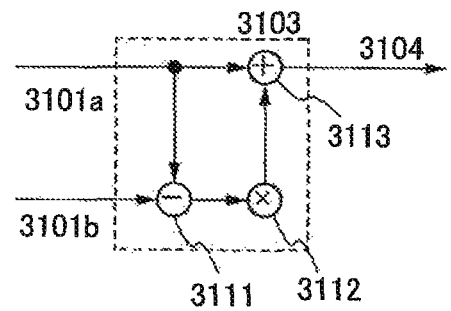
Figure 46D:
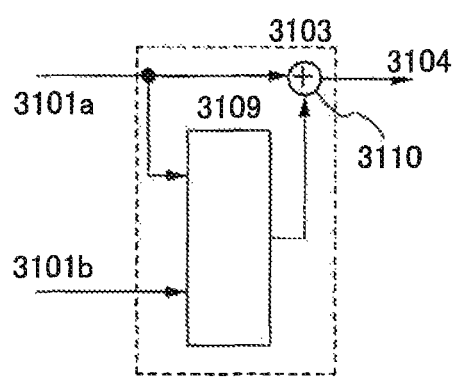

By using the correction circuit 3103 shown in FIG. 46E under a certain condition, inappropriate output of the output image signal 3104 can be prevented. The condition is that the output image signal 3104 applying the overdriving voltage and a differential value between the input image signals 3101a and 3101b have linearity. The slope of this linearity is a coefficient to be multiplied by the multiplier 3112. That is, it is preferable that the correction circuit 3103 in FIG. 46E be used for a liquid crystal element having such properties. As a liquid crystal element having such properties, an IPS mode liquid crystal element in which response time has little gray-scale dependency is considered. For example, when the correction circuit 3103 shown in FIG. 46E is used for an IPS mode liquid crystal element in this manner, manufacturing cost can be significantly reduced and an overdriving circuit which can prevent output of the inappropriate output image signal 3104 can be obtained.

Note that operations which are similar to those of the circuit shown in FIGS. 46A to 46E may be realized by software processing. As the memory used for the delay circuit, another memory included in the liquid crystal display device, a memory included in a device which transfers an image displayed on the liquid crystal display device (e.g., a video card or the like included in a personal computer or a device similar to the personal computer), or the like can be used. Accordingly, not only can manufacturing cost be reduced, intensity of overdriving, availability, or the like can be selected in accordance with user's preference.

Figure 47A:
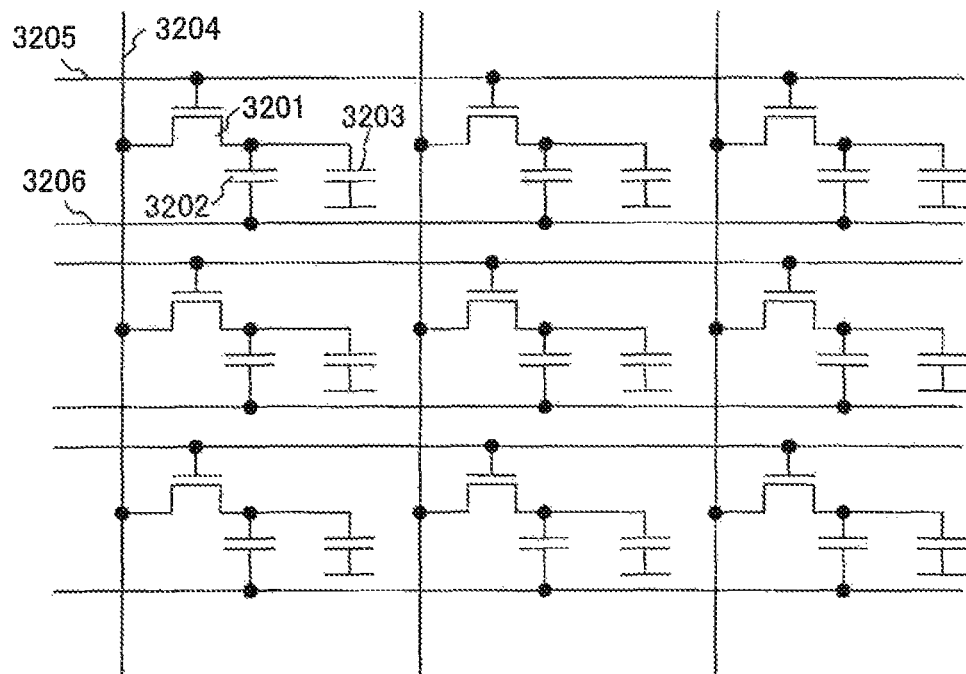
FIGS. 47A and 47B are diagrams showing exemplary driving methods of a display device of the present invention.

Next, driving which controls a potential of a common line is described with reference to FIGS. 47A and 47B. FIG. 47A shows a plurality of pixel circuits in which one common line is provided with respect to one scan line in a display device using a display element which has capacitive properties, such as a liquid crystal element. Each of the pixel circuits shown in FIG. 47A includes a transistor 3201, an auxiliary capacitor 3202, a display element 3203, a video signal line 3204, a scan line 3205, and a common line 3206.

A gate electrode of the transistor 3201 is electrically connected to the scan line 3205. One of a source electrode and a drain electrode of the transistor 3201 is electrically connected to the video signal line 3204. The other of the source electrode and the drain electrode of the transistor 3201 is electrically connected to one electrode of the auxiliary capacitor 3202 and one electrode of the display element 3203. The other electrode of the auxiliary capacitor 3202 is electrically connected to the common line 3206.

First, in each pixel selected by the scan line 3205, voltage corresponding to a video signal is applied to the display element 3203 and the auxiliary capacitor 3202 through the video signal line 3204 since the transistor 3201 is tuned on. At this time, when the video signal is a signal which makes all of pixels connected to the common line 3206 display a minimum gray scale or a maximum gray scale, it is not necessary that the video signal be written in each of the pixels through the video signal line 3204. Voltage applied to the display element 3203 can be changed by changing a potential of the common line 3206 instead of writing the video signal through the video signal line 3204.

Figure 47B:
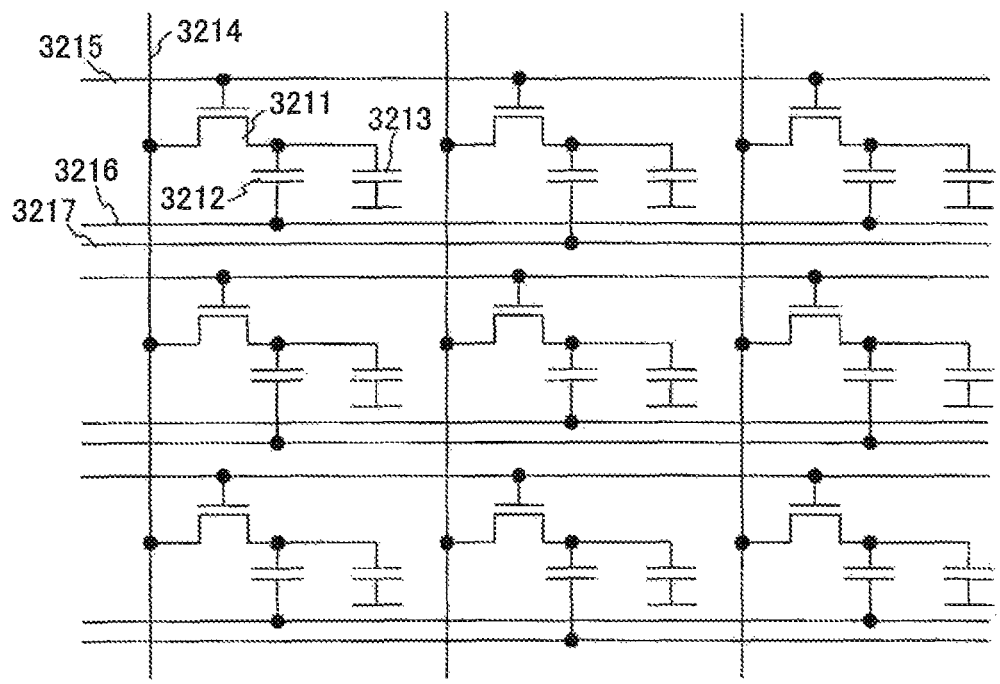

Next, FIG. 47B shows a plurality of pixel circuits in which two common lines are provided with respect to one scan line in a display device using a display element which has capacitive properties, such as a liquid crystal element. Each of the pixel circuits shown in FIG. 47B includes a transistor 3211, an auxiliary capacitor 3212, a display element 3213, a video signal line 3214, a scan line 3215, a first common line 3216, and a second common line 3217.

A gate electrode of the transistor 3211 is electrically connected to the scan line 3215. One of a source electrode and a drain electrode of the transistor 3211 is electrically connected to the video signal line 3214. The other of the source electrode and the drain electrode of the transistor 3211 is electrically connected to one electrode of the auxiliary capacitor 3212 and one electrode of the display element 3213. The other electrode of the auxiliary capacitor 3212 is electrically connected to the first common line 3216. Further, in a pixel which is adjacent to the pixel, the other electrode of the auxiliary capacitor 3212 is electrically connected to the second common line 3217.

In the pixel circuits shown in FIG. 47B, the number of pixels which are electrically connected to one common line is small. Accordingly, by changing a potential of the first common line 3216 or the second common line 3217 instead of writing a video signal through the video signal line 3214, frequency of changing voltage applied to the display element 3213 is significantly increased. In addition, source inversion driving or dot inversion driving can be performed. By performing source inversion driving or dot inversion driving, reliability of the element can be improved and a flicker can be suppressed.

Figure 66A:
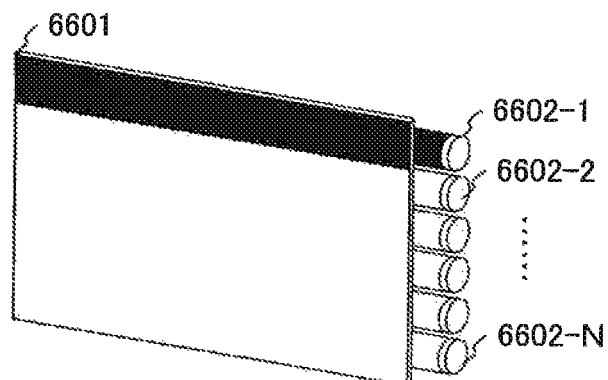
FIGS. 66A to 66C are diagrams showing an exemplary driving method of a display device of the present invention.
Figure 66B:
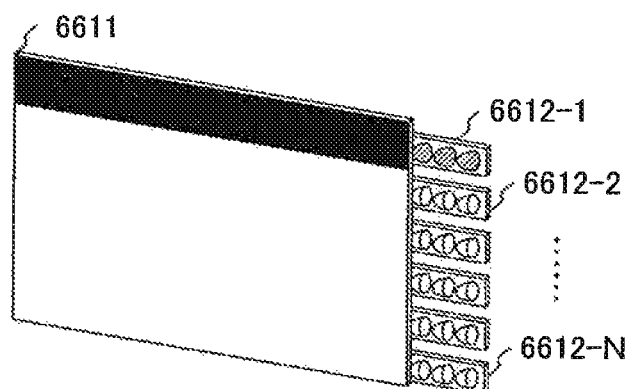

Next, a scanning backlight is described with reference to FIGS. 66A to 66C. FIG. 66A shows a scanning backlight in which cold cathode fluorescent lamps are arranged. The scanning backlight shown in FIG. 66A includes a diffusion plate 6601 and N pieces of cold cathode fluorescent lamps 6602-1 to 6602-N. The N pieces of the cold cathode fluorescent lamps 6602-1 to 6602-N are arranged on the back side of the diffusion plate 6601, so that the N pieces of the cold cathode fluorescent lamps 6602-1 to 6602-N can be scanned while luminance thereof is changed.

Change in luminance of each cold cathode fluorescent lamp in scanning is described with reference to FIG. 66C. First, luminance of the cold cathode fluorescent lamp 6602-1 is changed for a certain period. After that, luminance of the cold cathode fluorescent lamp 6602-2 which is provided adjacent to the cold cathode fluorescent lamp 6602-1 is changed for the same period. In this manner, luminance is changed sequentially from the cold cathode fluorescent lamps 6602-1 to 6602-N. Note that although luminance which is changed for a certain period is set to be lower than original luminance in FIG. 66C, it may be higher than original luminance. In addition, although scanning is performed from the cold cathode fluorescent lamps 6602-1 to 6602-N, scanning may be performed from the cold cathode fluorescent lamps 6602-N to 6602-1, which is in a reversed order.

Figure 66C:
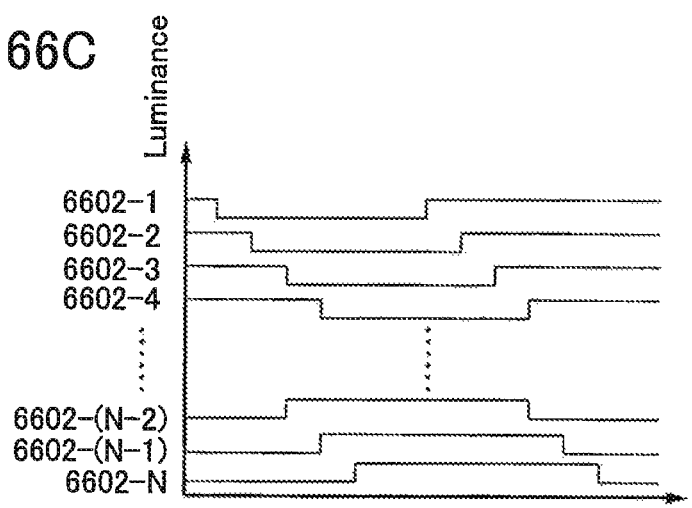

By performing driving as in FIG. 66C, average luminance of the backlight can be decreased. Therefore, power consumption of the backlight, which mainly takes up power consumption of the liquid crystal display device, can be reduced.

Note that an LED may be used as a light source of the scanning backlight. FIG. 66B shows the scanning backlight in that case. The scanning backlight in FIG. 66B includes a diffusion plate 6611 and light sources 6612-1 to 6612-N, in each of which LEDs are arranged. When the LED is used as the light source of the scanning backlight, it is advantageous in that the backlight can be thin and lightweight and that a color reproduction area can be widened. Further, since the LEDs which are arranged in each of the light sources 6612-1 to 6612-N can be similarly scanned, a dot scanning backlight can also be obtained. By using the dot scanning backlight, image quality of a moving image can be further improved.

When the LED is used as the light source of the backlight, driving can be performed by changing luminance as shown in FIG. 66C as well.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 10

In this embodiment mode, an operation of a display device is described.

Figure 67:
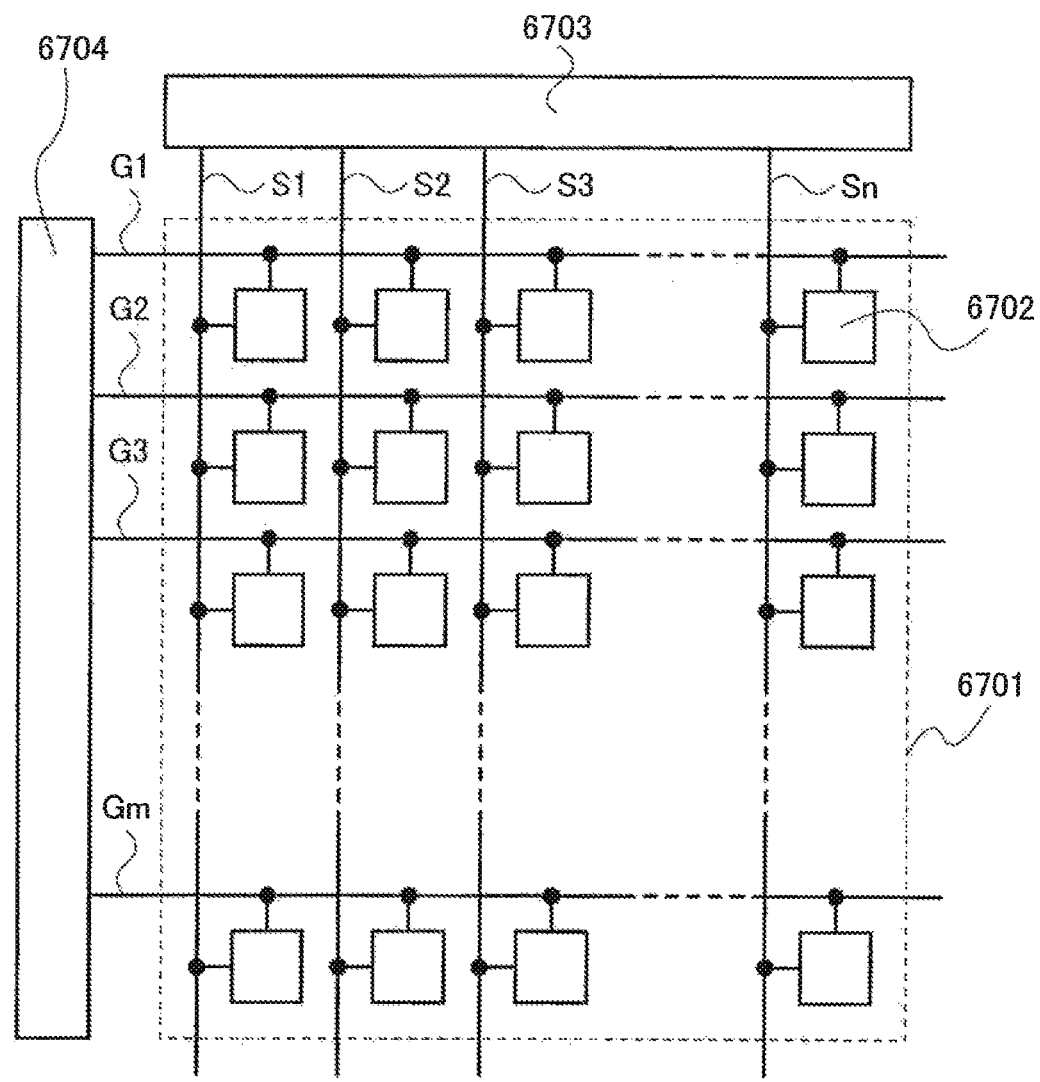
FIG. 67 is a diagram showing an exemplary driving method of a display device of the present invention.

FIG. 67 shows a structure example of a display device.

A display device includes a pixel portion 6701, a signal line driver circuit 6703, and a scan line driver circuit 6704. In the pixel portion 6701, a plurality of signal lines S1 to Sn extend from the signal line driver circuit 6703 in a column direction. In the pixel portion 6701, a plurality of scan lines G1 to Gm extend from the scan line driver circuit 6704 in a row direction. Pixels 6702 are arranged in matrix at each intersection of the plurality of signal lines S1 to Sn and the plurality of scan lines G1 to Gm.

The signal line driver circuit 6703 has a function of outputting a signal to each of the signal lines S1 to Sn. This signal may be referred to as a video signal. The scan line driver circuit 6704 has a function of outputting a signal to each of the scan lines G1 to Gm. This signal may be referred to as a scan signal.

The pixel 6702 includes at least a switching element connected to the signal line. On/off of the switching element is controlled by a potential of the scan line (a scan signal). When the switching element is turned on, the pixel 6702 is selected. On the other hand, when the switching element is turned off, the pixel 6702 is not selected.

When the pixel 6702 is selected (a selection state), a video signal is input to the pixel 6702 from the signal line. A state (e.g., luminance, transmittance, or voltage of a storage capacitor) of the pixel 6702 is changed in accordance with the video signal input thereto.

When the pixel 6702 is not selected (a non-selection state), the video signal is not input to the pixel 6702. Note that the pixel 6702 holds a potential corresponding to the video signal which is input when selected; thus, the pixel 6702 maintains the state (e.g., luminance, transmittance, or voltage of a storage capacitor) in accordance with the video signal.

Note that a structure of the display device is not limited to that shown in FIG. 67. For example, an additional wiring (such as a scan line, a signal line, a power supply line, a capacitor line, or a common line) may be added in accordance with the structure of the pixel 6702. As another example, a circuit having various functions may be added.

Figure 68:
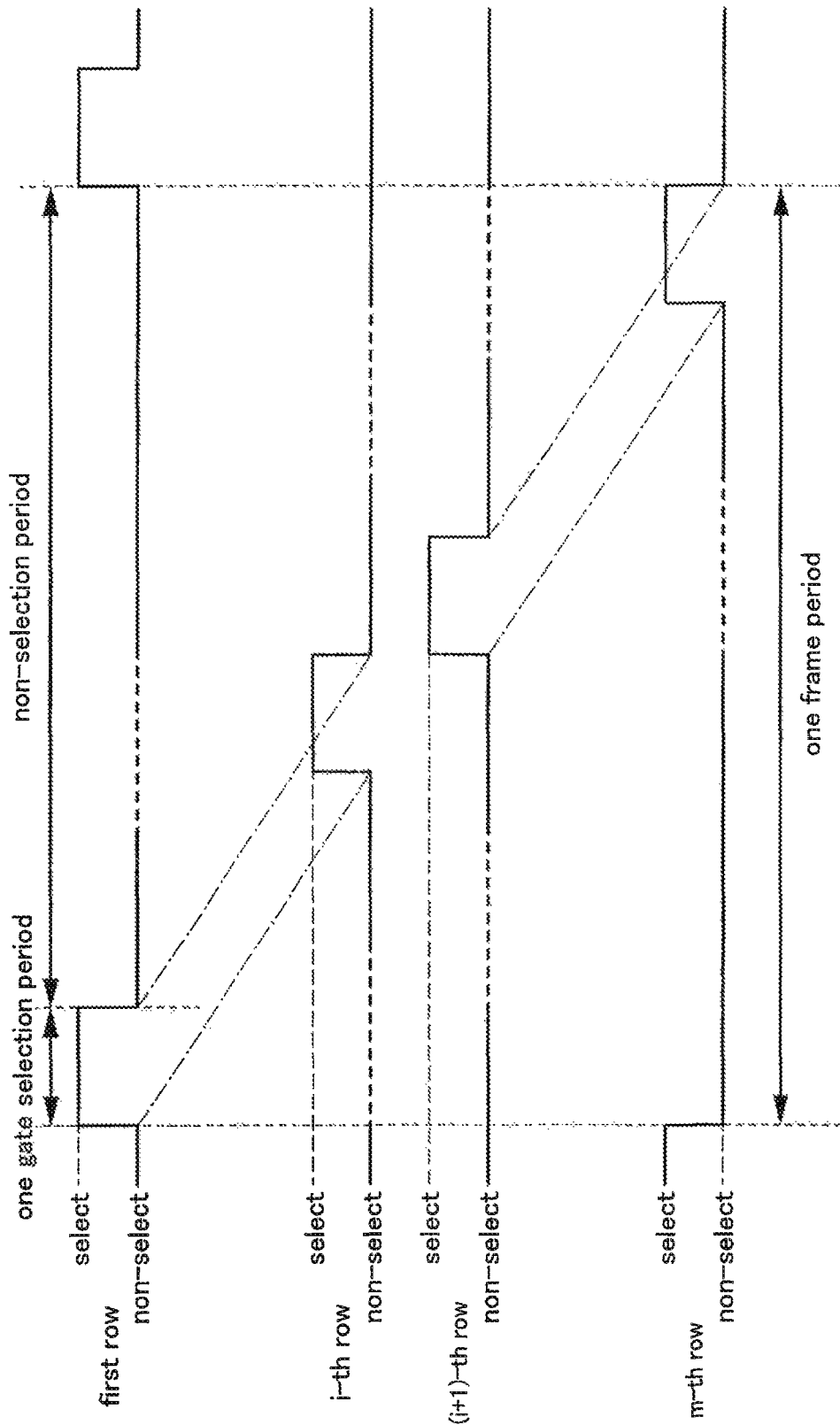
FIG. 68 is a diagram showing an exemplary driving method of a display device of the present invention.

FIG. 68 shows an example of a timing chart for describing an operation of a display device.

The timing chart of FIG. 68 shows one frame period corresponding to a period when an image of one screen is displayed. One frame period is not particularly limited, but is at least at least preferably 1/60 second or less so that a viewer does not perceive a flicker.

The timing chart of FIG. 68 shows timing of selecting the scan line G1 in the first row, the scan line G1 (one of the scan lines G1 to Gm) in the i-th row, the scan line G+1 in the (i+1)th row, and the scan line m in the m-th row.

At the same time as the scan line is selected, the pixel 6702 connected to the scan line is also selected. For example, when the scan line Gi in the i-th row is selected, the pixel 6702 connected to the scan line Gi in the 1-th row is also selected.

The scan lines G1 to Gm are sequentially selected (hereinafter also referred to as scanned) from the scan line G1 in the first row to the scan line Gm in the m-th row. For example, while the scan line Gi in the i-th row is selected, the scan lines (G1 to Gi−1 and Gi+1 to Gm) other than the scan line Gi in the i-th row are not selected. Then, during the next period, the scan line Gi+1 in the (i+1)th row is selected. Note that a period during which one scan line is selected is referred to as one gate selection period. In addition, the period is also referred to as a writing period in the row selected by the scan line.

Accordingly, when a scan line in a certain row is selected, video signals from the signal lines S1 to Sn are input to a plurality of pixels 6702 connected to the scan line, respectively. For example, while the scan line Gi in the i-th row is selected, given video signals are input from the signal lines S1 to Sn to the plurality of pixels 6702 connected to the scan line Gi in the i-th row, respectively. Thus, each of the plurality of pixels 6702 can be controlled individually by the scan signal and the video signal.

Figure 69:
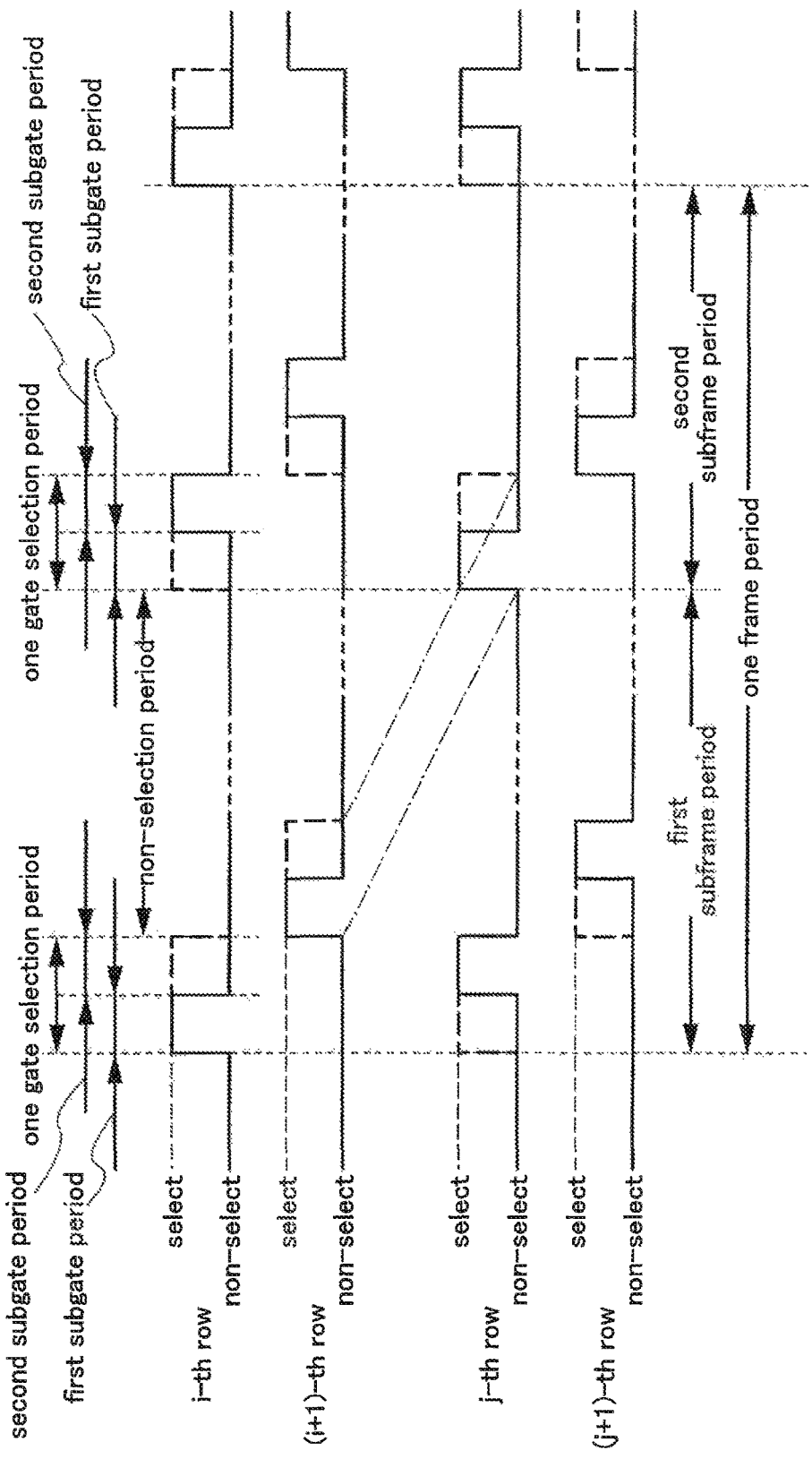
FIG. 69 is a diagram showing an exemplary driving method of a display device of the present invention.

Next, the case where one gate selection period is divided into a plurality of subgate selection periods is described. FIG. 69 is a timing chart in the case where one gate selection period is divided into two subgate selection periods (a first subgate selection period and a second subgate selection period).

Note that one gate selection period may be divided into three or more subgate selection periods.

The timing chart of FIG. 69 shows one frame period corresponding to a period when an image of one screen is displayed. One frame period is not particularly limited, but is at least at least preferably 1/60 second or less so that a viewer does not perceive a flicker.

Note that one frame is divided into two subframes (a first subframe and a second subframe).

The timing chart of FIG. 69 shows timing of selecting the scan line Gi in the i-th row, the scan line Gi+1 in the (i+1)th row, the scan line Gj (one of the scan lines Gi+1 to Gm) in the j-th row, and the scan line Gj+1 (one of the scan lines Gi+1 to Gm) in the (j+1)th row.

At the same time as the scan line is selected, the pixel 6702 connected to the scan line is also selected. For example, when the scan line Gi in the i-th row is selected, the pixel 6702 connected to the scan line Gi in the i-th row is also selected.

The scan lines G1 to Gm are sequentially scanned in each subgate selection period. For example, in one gate selection period, the scan line Gi in the i-th row is selected in the first subgate selection period, and the scan line Gj in the J-th row is selected in the second subgate selection period. Thus, in one gate selection period, an operation can be performed as if the scan signals of two rows are selected. At this time, different video signals are input to the signal lines S1 to Sn in the first subgate selection period and the second subgate selection period. Accordingly, different video signals can be input to a plurality of pixels 6702 connected to the i-th row and a plurality of pixels 6702 connected to the j-th row.

Next, a driving method of converting a frame rate of image data to be input (also referred to as input frame rate) and a frame rate of display (also referred to as a display frame rate) is described. Note that the frame rate is the number of frames per second, and its unit is Hz.

In this embodiment mode, the input frame rate does not necessarily correspond to the display frame rate. When the input frame rate and the display frame rate are different from each other, the frame rate can be converted by a circuit which converts a frame rate of image data (a frame rate conversion circuit). In such a manner, even when the input frame rate and the display frame rate are different from each other, display can be performed at a variety of display frame rates.

When the input frame rate is higher than the display frame rate, part of the image data to be input is discarded and the input frame rate is converted so that display is performed at a variety of display frame rates. In this case, the display frame rate can be reduced; thus, operating frequency of a driver circuit used for display can be reduced, and power consumption can be reduced. On the other hand, when the input frame rate is lower than the display frame rate, display can be performed at a variety of converted display frame rates by a method such as a method in which all or part of the image data to be input is displayed more than once, a method in which another image is generated from the image data to be input, or a method in which an image having no relation to the image data to be input is generated. In this case, quality of moving images can be improved by the display frame rate being increased.

In this embodiment mode, a frame rate conversion method in the case where the input frame rate is lower than the display frame rate is described in detail. Note that a frame rate conversion method in the case where the input frame rate is higher than the display frame rate can be realized by performance of the frame rate conversion method in the case where the input frame rate is lower than the display frame rate in reverse order.

In this embodiment mode, an image displayed at the same frame rate as the input frame rate is referred to as a basic image. An image which is displayed at a frame rate different from that of the basic image and displayed to ensure that the input frame rate and the display frame rate are consistent to each other is referred to as an interpolation image. As the basic image, the same image as that of the image data to be input can be used. As the interpolation image, the same image as the basic image can be used. Further, an image different from the basic image can be generated, and the generated image can be used as the interpolation image.

In order to generate the interpolation image, the following methods can be used, for example: a method in which temporal change (movement of images) of the image data to be input is detected and an image in an intermediate state between the images is employed as the interpolation image, a method in which an image obtained by multiplication of luminance of the basic image by a coefficient is employed as the interpolation image, and a method in which a plurality of different images are generated from the image data to be input and the plurality of images are continuously displayed (one of the plurality of images is employed as the basic image and the other images are employed as interpolation images) so as to allow a viewer to perceive an image corresponding to the image data to be input Examples of the method in which a plurality of different images are generated from the image data to be input include a method in which a gamma value of the image data to be input is converted and a method in which a gray scale value included in the image data to be input is divided up.

Note that an image in an intermediate state (an intermediate image) refers to an image obtained by detection of temporal change (movement of images) of the image data to be input and interpolation of the detected movement. Obtaining an intermediate image by such a method is referred to as motion compensation.

Next, a specific example of a frame rate conversion method is described. With this method, frame rate conversion multiplied by a given rational number (n/m) can be realized. Here, each of n and m is an integer equal to or more than 1. A frame rate conversion method in this embodiment mode can be treated as being divided into a first step and a second step. The first step is a step in which a frame rate is converted by being multiplied by the given rational number (n/m). As the interpolation image, the basic image or the intermediate image obtained by motion compensation may be used. The second step is a step in which a plurality of different images (sub-images) are generated from the image data to be input or from images each of which frame rate is converted in the first step and the plurality of sub-images are continuously displayed. By use of a method of the second step, human eyes can be made to perceive display such that the display appears to be an original image, despite the fact that a plurality of different images are displayed.

Note that in the frame rate conversion method in this embodiment mode, both the first and second steps can be used, the second step only can be used with the first step omitted, or the first step only can be used with the second step omitted.

Figure 70:
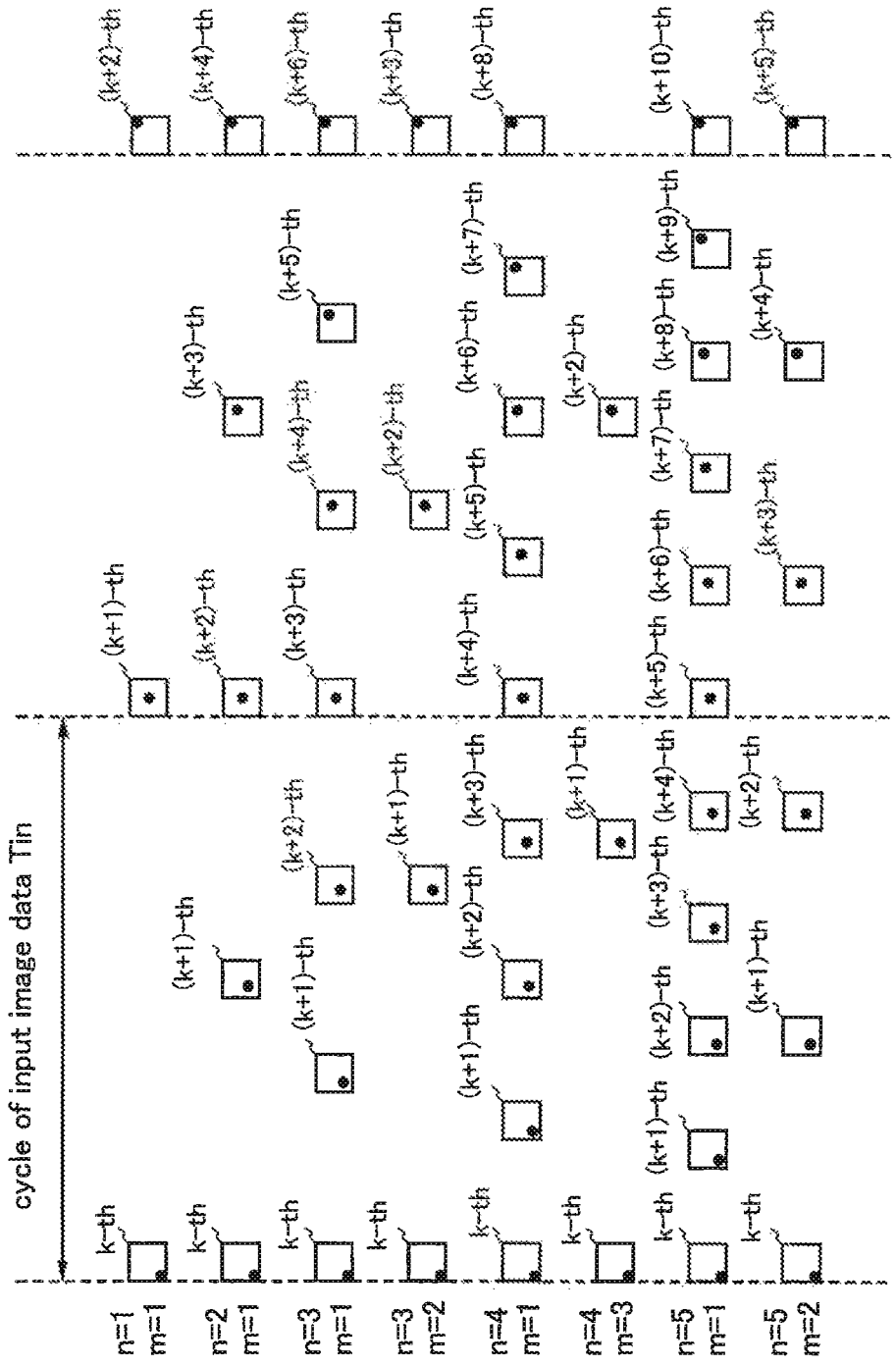
FIG. 70 is a diagram showing an exemplary driving method of a display device of the present invention.

First, as the first step, frame rate conversion multiplied by the given rational number (n/m) is described with reference to FIG. 70. In FIG. 70, the horizontal axis represents time, and the vertical axis represents cases for various combinations of n and m. Each pattern in FIG. 70 is a schematic diagram of an image to be displayed, and a horizontal position of the pattern represents timing of display. A dot in the pattern schematically represents movement of an image. Note that each of these images is an example for explanation, and an image to be displayed is not limited to one of these images. This method can be applied to a variety of images.

The period $T_{in}$ represents a cycle of input image data. The cycle of input image data corresponds to an input frame rate. For example, when the input frame rate is 60 Hz, the cycle of input image data is 1/60 seconds. Similarly, when the input frame rate is 50 Hz, the cycle of input image data is 1/50 seconds. Accordingly, the cycle (unit: second) of input image data is an inverse number of the input frame rate (unit: Hz). Note that a variety of input frame rates such as 24 Hz, 50 Hz, 60 Hz, 70 Hz, 48 Hz, 100 Hz, 120 Hz, and 140 Hz can be used. 24 Hz is a frame rate for movies on film, for example. 50 Hz is a frame rate for a video signal of the PAL standard, for example. 60 Hz is a frame rate for a video signal of the NTSC standard, for example. 70 Hz is a frame rate of a display input signal of a personal computer, for example. 48 Hz, 100 Hz, 120 Hz, and 140 Hz are twice as high as 24 Hz, 50 Hz, 60 Hz, and 70 Hz, respectively. Note that the frame rate can not only be doubled but also multiplied by a variety of numbers. As described above, with the method shown in this embodiment mode, a frame rate can be converted with respect to an input signal of various standards.

Procedures of frame rate conversion multiplied by the given rational number (n/m) times in the first step are as follows. As a procedure 1, display timing of a k-th interpolation image (k is an integer equal to or more than 1, where the initial value is 1) with respect to a first basic image is decided. The display timing of the k-th interpolation image is at the timing of passage of a period obtained by multiplication of the cycle of input image data by k(m/n) after the first basic image is displayed. As a procedure 2, whether the coefficient k(m/n) used for deciding the display timing of the k-th interpolation image is an integer or not is determined. When the coefficient k is an integer, a (k(m/n)+1)th basic image is displayed at the display timing of the k-th interpolation image, and the first step is finished. When the coefficient k is not an integer, the operation proceeds to a procedure 3. As the procedure 3, an image used as the k-th interpolation image is decided. Specifically, the coefficient k(m/n) used for deciding the display timing of the k-th interpolation image is converted into the form (x+(y/n)). Each of x and y is an integer, and y is smaller than n. When an intermediate image obtained by motion compensation is employed as the k-th interpolation image, an intermediate image which is an image corresponding to movement obtained by multiplication of the amount of movement from an (x+1)th basic image to an (x+2)th basic image by (y/n) is employed as the k-th interpolation image. When the k-th interpolation image is the same image as the basic image, the (x+1)th basic image can be used. Note that a method for obtaining an intermediate image as an image corresponding to movement obtained by multiplication of the amount of movement of the image by (y/n) will be described in detail later. As a procedure 4, a next interpolation image is set to be the objective interpolation image. Specifically, the value of k is increased by one, and the operation returns to the procedure 1.

Next, the procedures in the first step are described in detail using specific values of n and m.

Note that a mechanism for performing the procedures in the first step may be mounted on a device or decided in the design phase of the device in advance. When the mechanism for performing the procedures in the first step is mounted on the device, a driving method can be switched so that optimal operations depending on circumstances can be performed. Note that the circumstances here include contents of image data, environment inside and outside the device (e.g., temperature, humidity, barometric pressure, light, sound, electric field, the amount of radiation, altitude, acceleration, or movement speed), user settings, software version, and the like. On the other hand, when the mechanism for performing the procedures in the first step is decided in the design phase of the device in advance, driver circuits optimal for respective driving methods can be used. Moreover, since the mechanism is decided, reducing manufacturing cost can be expected due to efficiency of mass production.

When n=1 and m=1, that is, when a conversion ratio (n/m) is 1 (where n=1 and m=1 in FIG. 70), an operation in the first step is as follows. When k=1, in the procedure 1, display timing of a first interpolation image with respect to the first basic image is decided. The display timing of the first interpolation image is at the timing of passage of a period obtained by multiplication of the length of the cycle of input image data by k(m/n), that is, 1 after the first basic image is displayed.

Next, in the procedure 2, whether the coefficient k(m/n) used for deciding the display timing of the first interpolation image is an integer or not is determined. Here, the coefficient k(m/n) is 1, which is an integer. Consequently, the (k(m/n)+1)th basic image, that is, a second basic image is displayed at the display timing of the first interpolation image, and the first step is finished.

In other words, when the conversion ratio is 1, the k-th image is a basic image, the (k+1)th image is a basic image, and an image display cycle is equal to the cycle of input image data.

Specifically, in a driving method of a display device in which, when the conversion ratio is 1 (n/m=1), i-th image data (i is a positive integer) and (i+1)th image data are sequentially input as input image data in a certain cycle and the k-th image (k is a positive integer) and the (k+1)th image are sequentially displayed at an interval equal to the cycle of the input image data, the k-th image is displayed in accordance with the i-th image data, and the (k+1)th image is displayed in accordance with the (i+1)th image data.

Since the frame rate conversion circuit can be omitted when the conversion ratio is 1, manufacturing cost can be reduced. Further, when the conversion ratio is 1, quality of moving images can be improved compared with the case where the conversion ratio is less than 1. Moreover, when the conversion ratio is 1, power consumption and manufacturing cost can be reduced compared with the case where the conversion ratio is more than 1.

When n=2 and m=1, that is, when the conversion ratio (n/m) is 2 (where n=2 and m=1 in FIG. 70), an operation in the first step is as follows. When k=1, in the procedure 1, display timing of the first interpolation image with respect to the first basic image is decided. The display timing of the first interpolation image is at the timing of passage of a period obtained by multiplication of the length of the cycle of input image data by k(m/n), that is, ½ after the first basic image is displayed.

Next, in the procedure 2, whether the coefficient k(m/n) used for deciding the display timing of the first interpolation image is an integer or not is determined. Here, the coefficient k(m/n) is ½, which is not an integer. Consequently, the operation proceeds to the procedure 3.

In the procedure 3, an image used as the first interpolation image is decided. In order to decide the image, the coefficient ½ is converted into the form (x+(y/n)). In the case of the coefficient ½, x=0 and y=1. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (y/n), that is, ½ is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be decided. Next, in the procedure 4, the objective interpolation image is shifted from the first interpolation image to a second interpolation image. That is, k is changed from 1 to 2, and the operation returns to the procedure 1.

When k=2, in the procedure 1, display timing of the second interpolation image with respect to the first basic image is decided. The display timing of the second interpolation image is at the timing of passage of a period obtained by multiplication of the length of the cycle of input image data by k(m/n), that is, 1 after the first basic image is displayed.

Next, in the procedure 2, whether the coefficient k(m/n) used for deciding the display timing of the second interpolation image is an integer or not is determined. Here, the coefficient k(m/n) is 1, which is an integer. Consequently, the (k(m/n)+1)th basic image, that is, the second basic image is displayed at the display timing of the second interpolation image, and the first step is finished.

In other words, when the conversion ratio is 2 (n/m=2), the k-th image is a basic image, the (k+1)th image is an interpolation image, a (k+2)th image is a basic image, and an image display cycle is half the cycle of input image data.

Specifically, in a driving method of a display device in which, when the conversion ratio is 2 (n/m=2), the i-th image data (i is a positive integer) and the (i+1)th image data are sequentially input as input image data in a certain cycle and the k-th image (k is a positive integer), the (k+1)th image, and the (k+2)th image are sequentially displayed at an interval which is half the cycle of the input image data, the k-th image is displayed in accordance with the f-th image data, the (k+1)th image is displayed in accordance with image data corresponding to movement obtained by multiplication of the amount of movement from the i-th image data to the (i+1)th image data by ½, and the (k+2)th image is displayed in accordance with the (i+1)th image data.

Even specifically, in a driving method of a display device in which, when the conversion ratio is 2 (n/m=2), the i-th image data (i is a positive integer) and the (i+1)th image data are sequentially input as input image data in a certain cycle and the k-th image (k is a positive integer), the (k+1)th image, and the (k+2)th image are sequentially displayed at an interval which is half the cycle of the input image data, the k-th image is displayed in accordance with the i-th image data, the (k+1)th image is displayed in accordance with the i-th image data, and the (k+2)th image is displayed in accordance with the (i+1)th image data.

Specifically, when the conversion ratio is 2, driving is also referred to as double-frame rate driving or frame rate driving. For example, when the input frame rate is 60 Hz, the display frame rate is 120 Hz (120 Hz driving). Accordingly, two images are continuously displayed with respect to one input image. At this time, when an interpolation image is an intermediate image obtained by motion compensation, the movement of moving images can be made to be smooth; thus, quality of the moving image can be significantly improved. Further, quality of moving images can be significantly improved particularly when the display device is an active matrix liquid crystal display device. This is related to a problem of lack of writing voltage due to change in the electrostatic capacity of a liquid crystal element by applied voltage, so-called dynamic capacitance. That is, when the display frame rate is made higher than the input frame rate, the frequency of a writing operation of image data can be increased; thus, defects such as an afterimage and a phenomenon of a moving image in which traces are seen due to lack of writing voltage because of dynamic capacitance can be reduced. Moreover, a combination of 120 Hz driving and alternating-current driving of a liquid crystal display device is effective. That is, when driving frequency of the liquid crystal display device is 120 Hz and frequency of alternating-current driving is an integer multiple of 120 Hz or a unit fraction of 120 Hz (e.g., 30 Hz, 60 Hz, 120 Hz, or 240 Hz), flickers which appear in alternating-current driving can be reduced to a level that cannot be perceived by human eyes.

When n=3 and m=1, that is, when the conversion ratio (n/m) is 3 (where n=3 and m=1 in FIG. 70), an operation in the first step is as follows. First, when k=1, in the procedure 1, display timing of the first interpolation image with respect to the first basic image is decided. The display timing of the first interpolation image is at the timing of passage of a period obtained by multiplication of the length of the cycle of input image data by k(m/n), that is, ⅓ after the first basic image is displayed.

Next, in the procedure 2, whether the coefficient k(m/n) used for deciding the display timing of the first interpolation image is an integer or not is determined. Here, the coefficient k(m/n) is ⅓, which is not an integer. Consequently, the operation proceeds to the procedure 3.

In the procedure 3, an image used as the first interpolation image is decided. In order to decide the image, the coefficient ⅓ is converted into the form (x+(y/n)). In the case of the coefficient ⅓, x=0 and y=1. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (y/n), that is, ⅓ is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be decided. Next, in the procedure 4, the objective interpolation image is shifted from the first interpolation image to the second interpolation image. That is, k is changed from 1 to 2, and the operation returns to the procedure 1.

When k=2, in the procedure 1, display timing of the second interpolation image with respect to the first basic image is decided. The display timing of the second interpolation image is at the timing of passage of a period obtained by multiplication of the length of the cycle of input image data by k(m/n), that is, ⅔ after the first basic image is displayed.

Next, in the procedure 2, whether the coefficient k(m/n) used for deciding the display timing of the second interpolation image is an integer or not is determined. Here, the coefficient k(m/n) is ⅔, which is not an integer. Consequently, the operation proceeds to the procedure 3.

In the procedure 3, an image used as the second interpolation image is decided. In order to decide the image, the coefficient ⅔ is converted into the form (x+(y/n)). In the case of the coefficient ⅔, x=0 and y=2. When an intermediate image obtained by motion compensation is employed as the second interpolation image, an intermediate image corresponding to movement obtained by multiplication of the amount of movement from the (x+1)th basic image, that is, the first basic image to the (x+2)th basic image, that is, the second basic image by (y/n), that is, ⅔ is employed as the second interpolation image. When the second interpolation image is the same image as the basic image, the (x+1)th basic image, that is, the first basic image can be used.

According to the procedures performed up to this point, the display timing of the second interpolation image and the image displayed as the second interpolation image can be decided. Next, in the procedure 4, the objective interpolation image is shifted from the second interpolation image to a third interpolation image. That is, k is changed from 2 to 3, and the operation returns to the procedure 1.

When k=3, in the procedure 1, display timing of the third interpolation image with respect to the first basic image is decided. The display timing of the third interpolation image is at the timing of passage of a period obtained by multiplication of the length of the cycle of input image data by k(m/n), that is, 1 after the first basic image is displayed.

Next, in the procedure 2, whether the coefficient k(m/n) used for deciding the display timing of the third interpolation image is an integer or not is determined. Here, the coefficient k(m/n) is 1, which is an integer. Consequently, the (k(m/n)+1)th basic image, that is, the second basic image is displayed at the display timing of the third interpolation image, and the first step is finished.

In other words, when the conversion ratio is 3 (n/m=3), the k-th image is a basic image, the (k+1)th image is an interpolation image, the (k+2)th image is an interpolation image, a (k+3)th image is a basic image, and an image display cycle is ⅓ times the cycle of input image data.

Specifically, in a driving method of a display device in which, when the conversion ratio is 3 (n/m=3), the i-th image data (is a positive integer) and the (i+1)th image data are sequentially input as input image data in a certain cycle and the k-th image (k is a positive integer), the (k+1)th image, the (k+2)th image, and the (k+3)th image are sequentially displayed at an interval which is ⅓ times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by ⅓, the (k+2)th image is displayed in accordance with image data corresponding to movement obtained by multiplication of the amount of movement from the i-th image data to the (i+1)th image data by ⅔, and the (k+3)th image is displayed in accordance with the (i+1)th image data.

Even specifically, in a driving method of a display device in which, when the conversion ratio is 3 (n/m=3), the i-th image data (i is a positive integer) and the (i+1)th image data are sequentially input as input image data in a certain cycle and the k-th image (k is a positive integer), the (k+1)th image, the (k+2)th image, and the (k+3)th image are sequentially displayed at an interval which is ⅓ times the cycle of the input image data, the k-th image is displayed in accordance with the i-th image data, the (k+1)th image is displayed in accordance with the i-th image data, the (k+2)th image is displayed in accordance with the i-th image data, and the (k+3)th image is displayed in accordance with the (i+1)th image data.

When the conversion ratio is 3, quality of moving images can be improved competed with the case where the conversion ratio is less than 3. Moreover, when the conversion ratio is 3, power consumption and manufacturing cost can be reduced compared with the case where the conversion ratio is more than 3.

Specifically, when the conversion ratio is 3, driving is also referred to as triple-flame rate driving. For example, when the input frame rate is 60 Hz, the display frame rate is 180 Hz (180 Hz driving). Accordingly, three images are continuously displayed with respect to one input image. At this time, when an interpolation image is an intermediate image obtained by motion compensation, the movement of moving images can be made to be smooth; thus, quality of the moving image can be significantly improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 180 Hz driving and alternating-current driving of a liquid crystal display device is effective. That is, when driving frequency of the liquid crystal display device is 180 Hz and frequency of alternating-current driving is an integer multiple of 180 Hz or a unit fraction of 180 Hz (e.g., 45 Hz, 90 Hz, 180 Hz, or 360 Hz), flickers which appear in alternating-current driving can be reduced to a level that cannot be perceived by human eyes.

When n=3 and m=2, that is, when the conversion ratio (n/m) is 3/2 (where n=3 and m=2 in FIG. 70), an operation in the first step is as follows. When k=1, in the procedure 1, the display timing of the first interpolation image with respect to the first basic image is decided. The display timing of the first interpolation image is at the timing of passage of a period obtained by multiplication of the length of the cycle of input image data by k(m/n), that is, ⅔ after the first basic image is displayed.

Next, in the procedure 2, whether the coefficient k(m/n) used for deciding the display timing of the first interpolation image is an integer or not is determined. Here, the coefficient k(m/n) is ⅔, which is not an integer. Consequently, the operation proceeds to the procedure 3.

In the procedure 3, an image used as the first interpolation image is decided. In order to decide the image, the coefficient ⅔ is converted into the form (x+(y/n)). In the case of the coefficient ⅔, x=0 and y=2. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (y/n), that is, ⅔ is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be decided. Next, in the procedure 4, the objective interpolation image is shifted from the first interpolation image to the second interpolation image. That is, k is changed from 1 to 2, and the operation returns to the procedure 1.

When k=2, in the procedure 1, the display timing of the second interpolation image with respect to the first basic image is decided. The display timing of the second interpolation image is at the timing of passage of a period obtained by multiplication of the length of the cycle of input image data by k(m/n), that is, 4/3 after the first basic image is displayed.

Next, in the procedure 2, whether the coefficient k(m/n) used for deciding the display timing of the second interpolation image is an integer or not is determined. Here, the coefficient k(m/n) is 4/3, which is not an integer. Consequently, the operation proceeds to the procedure 3.

In the procedure 3, an image used as the second interpolation image is decided. In order to decide the image, the coefficient 4/3 is converted into the form (x+(y/n)). In the case of the coefficient 4/3, x=1 and y=1. When an intermediate image obtained by motion compensation is employed as the second interpolation image, an intermediate image corresponding to movement obtained by multiplication of the amount of movement from the (x+1)th basic image, that is, the second basic image to the (x+2)th basic image, that is, a third basic image by (y/n), that is, ⅓ is employed as the second interpolation image. When the second interpolation image is the same image as the basic image, the (x+1)th basic image, that is, the second basic image can be used.

According to the procedures performed up to this point, the display timing of the second interpolation image and the image displayed as the second interpolation image can be decided. Next, in the procedure 4, the objective interpolation image is shifted from the second interpolation image to the third interpolation image. That is, k is changed from 2 to 3, and the operation returns to the procedure 1.

When k=3, in the procedure 1, the display timing of the third interpolation image with respect to the first basic image is decided. The display timing of the third interpolation image is at the timing of passage of a period obtained by multiplication of the length of the cycle of input image data by k(m/n), that is, 2 after the first basic image is displayed.

Next, in the procedure 2, whether the coefficient k(m/n) used for deciding the display timing of the third interpolation image is an integer or not is determined. Here, the coefficient k(m/n) is 2, which is an integer. Consequently, the ((m/n)+1)th basic image, that is, the third basic image is displayed at the display timing of the third interpolation image and the first step is finished.

In other words, when the conversion ratio is 3/2 (n/m=3/2), the k-th image is a basic image, the (k+1)th image is an interpolation image, the (k+2)th image is an interpolation image, the (k+3)th image is a basic image, and an image display cycle is ⅔ times the cycle of input image data.

Specifically, in a driving method of a display device in which, when the conversion ratio is 3/2 (n/m=3/2), the i-th image data (i is a positive integer), the (i+1)th image data, and (i+2)th image data are sequentially input as input image data in a certain cycle and the k-th image (k is a positive integer), the (k+1)th image, the (k+2)th image, and the (k+3)th image are sequentially displayed at an interval which is ⅔ times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by ⅔, the (k+2)th image is displayed in accordance with image data corresponding to movement obtained by multiplication of the amount of movement from the (+1)th image data to the (i+2)th image data by ⅓, and the (k+3)th image is displayed in accordance with the (i+2)th image data.

Even specifically, in a driving method of a display device in which, when the conversion ratio is 3/2 (n/m=3/2), the i-th image data (i is a positive integer), the (i+1)th image data, and the (i+2)th image data are sequentially input as input image data in a certain cycle and the k-th image (k is a positive integer), the (k+1)th image, the (k+2)th image, and the (k+3)th image are sequentially displayed at an interval which is ⅔ times the cycle of the input image data, the k-th image is displayed in accordance with the i-th image data, the (k+1)th image is displayed in accordance with the i-th image data, the (k+2)th image is displayed in accordance with the (i+1)th image data, and the (k+3)th image is displayed in accordance with the (i+2)th image data.

When the conversion ratio is 3/2, quality of moving images can be improved compared with the case where the conversion ratio is less than 3/2. Moreover, when the conversion ratio is 3/2, power consumption and manufacturing cost can be reduced compared with the case where the conversion ratio is more than 3/2.

Specifically, when the conversion ratio is 3/2, driving is also referred to as 3/2-fold frame rate driving or 1.5-fold frame rate driving. For example, when the input frame rate is 60 Hz, the display frame rate is 90 Hz (90 Hz driving). Accordingly, three images are continuously displayed with respect to two input images. At this time, when an interpolation image is an intermediate image obtained by motion compensation, the movement of moving images can be made to be smooth; thus, quality of the moving image can be significantly improved. Moreover, operating frequency of a circuit used for obtaining an intermediate image by motion compensation can be reduced, in particular, compared with a driving method with high driving frequency, such as 120 Hz driving (double-frame rate driving) or 180 Hz driving (triple-frame rate driving); thus, an inexpensive circuit can be used, and manufacturing cost and power consumption can be reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 90 Hz driving and alternating-current driving of a liquid crystal display device is effective. That is, when driving frequency of the liquid crystal display device is 90 Hz and frequency of alternating-current driving is an integer multiple of 90 Hz or a unit fraction of 90 Hz (e.g., 30 Hz, 45 Hz, 90 Hz, or 180 Hz), flickers which appear in alternating-current driving can be reduced to a level that cannot be perceived by human eyes.

Detailed description of procedures for positive integers n and m other than those described above is omitted. A conversion ratio can be set as a given rational number (n/m) in accordance with the procedures of frame rate conversion in the first step. Note that among combinations of the positive integers n and m, a combination in which a conversion ratio (n/m) can be reduced to its lowest term can be treated the same as a conversion ratio that is already reduced to its lowest term.

For example, when n=4 and m=1, that is, when the conversion ratio (n/m) is 4 (where n=4 and m=1 in FIG. 70), the k-th image is a basic image, the (k+1)th image is an interpolation image, the (k+2)th image is an interpolation image, the (k+3)th image is an interpolation image, a (k+4)th image is a basic image, and an image display cycle is ¼ times the cycle of input image data.

Specifically, in a driving method of a display device in which, when the conversion ratio is 4 (n/m=4), the i-th image data (i is a positive integer) and the (i+1)th image data are sequentially input as input image data in a certain cycle and the k-th image (k is a positive integer), the (k+1)th image, the (k+2)th image, the (k+3)th image, and the (k+4)th image are sequentially displayed at an interval which is ¼ times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by ¼, the (k+2)th image is displayed in accordance with image data corresponding to movement obtained by multiplication of the amount of movement from the i-th image data to the (i+1)th image data by ½, the (k+3)th image is displayed in accordance with image data corresponding to movement obtained by multiplication of the amount of movement from the i-th image data to the (i+1)th image data by ¾, and the (k+4)th image is displayed in accordance with the (i+1)th image data.

Even specifically, in a driving method of a display device in which, when the conversion ratio is 4 (n/m=4), the i-th image data (i is a positive integer) and the (i+1)th image data are sequentially input as input image data in a certain cycle and the k-th image (k is a positive integer), the (k+1)th image, the (k+2)th image, the (k+3)th image, and the (k+4)th image are sequentially displayed at an interval which is ¼ times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the i-th image data, and the (k+4)th image is displayed in accordance with the (i+1)th image data.

When the conversion ratio is 4, quality of moving images can be improved compared with the case where the conversion ratio is less than 4. Moreover, when the conversion ratio is 4, power consumption and manufacturing cost can be reduced compared with the case where the conversion ratio is more than 4.

Specifically, when the conversion ratio is 4, driving is also referred to as quadruple-frame rate driving. For example, when the input frame rate is 60 Hz, the display frame rate is 240 Hz (240 Hz driving). Accordingly, four images are continuously displayed with respect to one input image. At this time, when an interpolation image is an intermediate image obtained by motion compensation, the movement of moving images can be made to be smooth thus, quality of the moving image can be significantly improved. Moreover, an interpolation image obtained by more accurate motion compensation can be used, in particular, compared with a driving method with low driving frequency, such as 120 Hz driving (double-frame rate driving) or 180 Hz driving (triple-frame rate driving); thus, the movement of moving images can be made smoother, and quality of the moving image can be significantly improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 240 Hz driving and alternating-current driving of a liquid crystal display device is effective. That is, when driving frequency of the liquid crystal display device is 240 Hz and frequency of alternating-current driving is an integer multiple of 240 Hz or a unit fraction of 240 Hz (e.g., 30 Hz, 40 Hz, 60 Hz, or 120 Hz), flickers which appear in alternating-current driving can be reduced to a level that cannot be perceived by human eyes.

Moreover, when n=4 and m=3, that is, when the conversion ratio (n/m) is 4/3 (where n=4 and m=3 in FIG. 70), the k-th image is a basic image, the (k+1)th image is an interpolation image, the (k+2)th image is an interpolation image, the (k+3)th image is an interpolation image, the (k+4)th image is a basic image, and the length of an image display cycle is ¾ times the cycle of input image data.

As a further specific description, in a driving method of a display device in which when the conversion ratio is 4/3 (n/m=4/3), the i-th image data (i is a positive integer), the (i+1)th image data, the (+2)th image data, and the (+3)th image data are sequentially input as input image data in a certain cycle and the k-th image (k is a positive integer), the (k+1)th image, the (k+2)th image, the (k+3)th image, and the (k+4)th image are sequentially displayed at an interval which is ¾ times the cycle of the input image data, the k-th image is displayed in accordance with the i-th image data, the (k+1)th image is displayed in accordance with image data corresponding to movement obtained by multiplying the amount of movement from the i-th image data to the (i+1)th image data by ¾, the (k+2)th image is displayed in accordance with image data corresponding to movement obtained by multiplying the amount of movement from the (i+1)th image data to the (i+2)th image data by ½, the (k+3)th image is displayed in accordance with image data corresponding to movement obtained by multiplying the amount of movement from the (i+2)th image data to the (i+3)th image data by ¼, and the (k+4)th image is displayed in accordance with the (i+3)th image data.

As a further specific description, in a driving method of a display device in which when the conversion ratio is 4/3 (n/m=4/3), the i-th image data (i is a positive integer), the (i+1)th image data, the (i+2)th image data, and the (i+3)th image data are sequentially input as input image data in a certain cycle and the k-th image (k is a positive integer), the (k+1)th image, the (k+2)th image, the (k+3)th image, and the (k+4)th image are sequentially displayed at an interval which is ¾ times the cycle of the input image data, the k-th image is displayed in accordance with the i-th image data, the (k+1)th image is displayed in accordance with the i-th image data, the (k+2)th image is displayed in accordance with the (i+1)th image data, the (k+3)th image is displayed in accordance with the (i+2)th image data, and the (k+4)th image is displayed in accordance with the (i+3)th image data.

When the conversion ratio is 4/3, quality of moving images can be improved compared with the case where the conversion ratio is less than 4/3. Moreover, when the conversion ratio is 4/3, power consumption and manufacturing cost can be reduced compared with the case where the conversion ratio is more than 4/3.

Specifically, when the conversion ratio is 4/3, driving is also referred to as 4/3-fold frame rate driving or 1.25-fold frame rate driving. For example, when the input frame rate is 60 Hz, the display frame rate is 80 Hz (80 Hz driving). Four images are successively displayed with respect to three input images. At this time, when an interpolation image is an intermediate image obtained by motion compensation, motion of moving images can be made smooth; thus, quality of the moving image can be significantly improved. Moreover, operating frequency of a circuit for obtaining an intermediate image by motion compensation can be reduced particularly as compared with a driving method with high driving frequency, such as 120 Hz driving (double-frame rate driving) or 180 Hz driving (triple-frame rate driving); thus, an inexpensive circuit can be used, and manufacturing cost and power consumption can be reduced. Further, when a display device is an active matrix liquid crystal display device, a problem of shortage of writing voltage due to dynamic capacitance can be avoided; thus, quality of moving images can be significantly improved particularly with respect to defects such as traces and afterimages of a moving image. Moreover, a combination of 80 Hz driving and alternating-current driving of a liquid crystal display device is effective. That is, when driving frequency of the liquid crystal display device is 80 Hz and frequency of alternating-current driving is an integer multiple of 80 Hz or a unit fraction of 80 Hz (e.g., 40 Hz, 80 Hz, 160 Hz, or 240 Hz), a flicker which appears by alternating-current driving can be reduced to the extent that the flicker is not perceived by human eyes.

Moreover, when n=5 and m=1, that is, when the conversion ratio (n/m) is 5 (where n=5 and m=1 in FIG. 70), the k-th image is a basic image, the (k+1)th image is an interpolation image, the (k+2)th image is an interpolation image, the (k+3)th image is an interpolation image, a (k+4)th image is an interpolation image, a (k+5)th image is a basic image, and the length of an image display cycle is ⅕ times the cycle of input image data.

As a further specific description, in a driving method of a display device in which when the conversion ratio is 5 (n/m=5), the i-th image data (i is a positive integer) and the (i+1)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval whose length is ⅕ times the cycle of the input image data, the k-th image is displayed in accordance with the i-th image data, the (k+1)th image is displayed in accordance with image data corresponding to movement obtained by multiplying the amount of movement from the i-th image data to the (i+1)th image data by ⅕, the (k+2)th image is displayed in accordance with image data corresponding to movement obtained by multiplying the amount of movement from the i-th image data to the (i+1)th image data by ⅖, the (k+3)th image is displayed in accordance with image data corresponding to movement obtained by multiplying the amount of movement from the i-th image data to the (i+1)th image data by ⅗, the (k+4)th image is displayed in accordance with image data corresponding to movement obtained by multiplying the amount of movement from the i-th image data to the (i+1)th image data by ⅘, and the (k+5)th image is displayed in accordance with the (i+1)th image data.

As a further specific description, in a driving method of a display device in which when the conversion ratio is 5 (n/m=5), the i-th image data (i is a positive integer) and the (i+1)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval whose length is ⅕ times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the i-th image data, the (k+4)th image is displayed in accordance with the i-th image data, and the (k+5)th image is displayed in accordance with the (i+1)th image data.

When the conversion ratio is 5, quality of moving images can be improved compared with the case where the conversion ratio is less than 5. Moreover, when the conversion ratio is 5, power consumption and manufacturing cost can be reduced compared with the case where the conversion ratio is more than 5.

Specifically, when the conversion ratio is 5, driving is also refined to as 5-fold frame rate driving. For example, when the input frame rate is 60 Hz, the display frame rate is 300 Hz (300 Hz driving). Five images are successively displayed with respect to one input image. At this time, when an interpolation image is an intermediate image obtained by motion compensation, motion of moving images can be made smooth; thus, quality of the moving image can be significantly improved. Moreover, an intermediate image obtained by more accurate motion compensation can be used as the interpolation image particularly as compared with a driving method with low driving frequency, such as 120 Hz driving (double-frame rate driving) or 180 Hz driving (triple-frame rate driving); thus, motion of moving images can be made smoother, and quality of the moving image can be significantly improved. Further when a display device is an active matrix liquid crystal display device, a problem of shortage of writing voltage due to dynamic capacitance can be avoided; thus, quality of moving images can be significantly improved particularly with respect to defects such as traces and afterimages of a moving image. Moreover, a combination of 300 Hz driving and alternating-current driving of a liquid crystal display device is effective. That is, when driving frequency of the liquid crystal display device is 300 Hz and frequency of alternating-current driving is an integer multiple of 300 Hz or a unit fraction of 300 Hz (e.g., 30 Hz, 50 Hz, 60 Hz, or 100 Hz), a flicker which appears by alternating-current driving can be reduced to the extent that the flicker is not perceived by human eyes.

Moreover, when n=5 and m=2, that is, when the conversion ratio (n/m) is 5/2 (where n=5 and m=2 in FIG. 70), the k-th image is a basic image, the (k+1)th image is an interpolation image, the (k+2)th image is an interpolation image, the (k+3)th image is an interpolation image, a (k+4)th image is an interpolation image, the (k+5)th image is a basic image, and the length of an image display cycle is ⅖ times the cycle of input image data.

As a further specific description, in a driving method of a display device in which when the conversion ratio is 5/2 (n/m=5/2), the i-th image data (i is a positive integer), the (i+1)th image data, and the (i+2)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval whose length is ⅖ times the cycle of the input image data, the k-th image is displayed in accordance with the i-th image data, the (k+1)th image is displayed in accordance with image data corresponding to movement obtained by multiplying the amount of movement from the i-th image data to the (i+1)th image data by ⅖, the (k+2)th image is displayed in accordance with image data corresponding to movement obtained by multiplying the amount of movement from the i-th image data to the (i+1)th image data by ⅘, the (k+3)th image is displayed in accordance with image data corresponding to movement obtained by multiplying the amount of movement from the (i+1)th image data to the (i+2)th image data by ⅕, the (k+4)th image is displayed in accordance with image data corresponding to movement obtained by multiplying the amount of movement from the (i+1)th image data to the (i+2)th image data by ⅗, and the (k+5)th image is displayed in accordance with the (i+2)th image data.

As a further specific description, in a driving method of a display device in which when the conversion ratio is 5/2 (n/m=5/2), the i-th image data (i is a positive integer), the (i+1)th image data, the (i+2)th image data, and the (i+3)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval whose length is ⅖ times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the (i+1)th image data, the (k+4)th image is displayed in accordance with the (i+1)th image data, and the (k+5)th image is displayed in accordance with the (i+2)th image data.

When the conversion ratio is 5/2, quality of moving images can be improved compared with the case where the conversion ratio is less than 5/2. Moreover, when the conversion ratio is 5/2, power consumption and manufacturing cost can be reduced compared with the case where the conversion ratio is more than 5/2.

Specifically, when the conversion ratio is 5/2, driving is also referred to as 5/2-fold frame rate driving or 2.5-fold frame rate driving. For example, when the input frame rate is 60 Hz, the display frame rate is 150 Hz (150 Hz driving).

Five images are successively displayed with respect to two input images. At this time, when an interpolation image is an intermediate image obtained by motion compensation, motion of moving images can be made smooth; thus, quality of the moving image can be significantly improved. Moreover, an intermediate image obtained by more accurate motion compensation can be used as the interpolation image particularly as compared with a driving method with low driving frequency, such as 120 Hz driving (double-frame rate driving); thus, motion of moving images can be made smoother, and quality of the moving image can be significantly improved. Further, operating frequency of a circuit for obtaining an intermediate image by motion compensation can be reduced particularly as compared with a driving method with high driving frequency, such as 180 Hz driving (triple-frame rate driving); thus, an inexpensive circuit can be used, and manufacturing cost and power consumption can be reduced. Furthermore, when a display device is an active matrix liquid crystal display device, a problem of shortage of writing voltage due to dynamic capacitance can be avoided; thus, quality of moving images can be significantly improved particularly with respect to defects such as traces and afterimages of a moving image. Moreover, a combination of 150 Hz driving and alternating-current driving of a liquid crystal display device is effective. That is, when driving frequency of the liquid crystal display device is 150 Hz and frequency of alternating-current driving is an integer multiple of 150 Hz or a unit fraction of 150 Hz (e.g., 30 Hz, 50 Hz, 75 Hz, or 150 Hz), a flicker which appears by alternating-current driving can be reduced to the extent that the flicker is not perceived by human eyes.

In this manner, by setting positive integers n and m to be various numbers, the conversion ratio can be set to be a given rational number (n/m). Although detailed description is omitted, when n is 10 or less, combinations listed below can be possible: n=1, m=1, that is, the conversion ratio is (n/m)=1 (one-fold frame rate driving, 60 Hz), n=2, m=1, that is, the conversion ratio is (n/m)=2 (double-frame rate driving, 120 Hz), n=3, m=1, that is, the conversion ratio is (n/m)=3 (triple-frame rate driving, 180 Hz), n=3, m=2, that is, the conversion ratio is (n/m)=3/2 (3/2-fold frame rate driving. 90 Hz), n=4, m=1, that is, the conversion ratio is (n/m)=4 (quadruple-frame rate driving, 240 Hz), n=4, m=3, that is, the conversion ratio is (n/m)=4/3 (4/3-fold frame rate driving, 80 Hz), n=5, m=1, that is, the conversion ratio is (n/m)=5/1 (5-fold frame rate driving, 300 Hz), n=5, m=2, that is, the conversion ratio is (n/m)=5/2 (5/2-fold frame rate driving, 150 Hz), n=5, m=3, that is, the conversion ratio is (n/m)=5/3 (5/3-fold frame rate driving, 100 Hz), n=5, m=4, that is, the conversion ratio is (n/m)=5/4 (5/4-fold frame rate driving, 75 Hz), n=6, m=1, that is, the conversion ratio is (n/m)=6 (6-fold frame rate driving, 360 Hz), n=6, m=5, that is, the conversion ratio is (n/m)=6/5 (6/5-fold frame rate driving, 72 Hz), n=7, m=1, that is, the conversion ratio is (n/m)=7 (7-fold frame rate driving, 420 Hz), n=7, m=2, that is, the conversion ratio is (n/m)=7/2 (7/2-fold frame rate driving, 210 Hz), n=7, m=3, that is, the conversion ratio is (n/m)=7/3 (7/3-fold frame rate driving, 140 Hz), n=7, m=4, that is, the conversion ratio is (n/m)=7/4 (7/4-fold frame rate driving, 105 Hz), n=7, m=5, that is, the conversion ratio is (n/m)=7/5 (7/5-fold frame rate driving, 84 Hz), n=7, m=6, that is, the conversion ratio is (n/m)=7/6 (7/6-fold frame rate driving, 70 Hz), n=8, m=1, that is, the conversion ratio is (n/m)=8 (8-fold frame rate driving, 480 Hz), n=8, m=3, that is, the conversion ratio is (n/m)=8/3 (8/3-fold frame rate driving, 160 Hz), n=8, m=5, that is, the conversion ratio is (n/m)=8/5 (8/5-fold frame rate driving, 96 Hz), n=8, m=7, that is, the conversion ratio is (n/m)=8/7 (8/7-fold frame rate driving, 68.6 Hz), n=9, m=1, that is, the conversion ratio is (n/m)=9 (9-fold frame rate driving, 540 Hz), n=9, m=2, that is, the conversion ratio is (n/m)=9/2 (9/2-fold frame rate driving, 270 Hz), n=9, m=4, that is, the conversion ratio is (n/m)=9/4 (9/4-fold frame rate driving, 135 Hz), n=9, m=5, that is, the conversion ratio is (n/m)=9/5 (9/5-fold frame rate driving, 108 Hz), n=9, m=7, that is, the conversion ratio is (n/m)=9/7 (9/7-fold frame rate driving, 77.1 Hz), n=9, m=8, that is, the conversion ratio is (n/m)=9/8 (9/8-fold frame rate driving, 67.5 Hz), n=10, m=1, that is, the conversion ratio is (n/m)=10 (10-fold frame rate driving, 600 Hz), n=10, m=3, that is, the conversion ratio is (n/m)=10/3 (10/3-fold frame rate driving, 200 Hz), n=10, m=7, that is, the conversion ratio is (n/m)=10/7 (10/7-fold frame rate driving, 85.7 Hz), and n=10, m=9, that is, the conversion ratio is (n/m)=10/9 (10/9-fold frame rate driving, 66.7 Hz). Note that these frequencies are examples in the case where the input frame rate is 60 Hz. With regard to other frame rates, a product obtained by multiplication of each conversion ratio and an input frame rate can be a driving frequency.

In the case where n is an integer more than 10, although specific numbers for n and m are not stated here, the procedure of frame rate conversion in the first step can be obviously applied to various n and m.

Depending on how many images which can be displayed without motion compensation to the input image data are included in the displayed images, the conversion ratio can be determined. Specifically, the smaller m becomes, the higher the proportion of images which can be displayed without motion compensation to the input image data becomes. When motion compensation is performed less frequently, power consumption can be reduced because a circuit which performs motion compensation operates less frequently. In addition, the likelihood of generation of an image (an intermediate image which does not correctly reflect motion of an image) including an error by motion compensation can be decreased, so that image quality can be improved. For example, as such a conversion ratio, in the case where n is 10 or less, 1, 2, 3, 3/2, 4, 5, 5/2, 6, 7, 7/2, 8, 9, 9/2, or 10 is possible. By employing such a conversion ratio, especially when an intermediate image obtained by motion compensation is used as an interpolation image, the image quality can be improved and power consumption can be reduced because the number (half the total number of images input) of images, which can be displayed without motion compensation to the input image data, is comparatively large and motion compensation is performed less frequently in the case where m is 2; and because the number (equal to the total number of images input) of images which can be displayed without motion compensation to the input image data is large and motion compensation cannot be performed in the case where m is 1. On the other hand, the larger m becomes, the smoother motion of images can be made because an intermediate image which is generated by motion compensation with high accuracy is used.

Note that, in the case where a display device is a liquid crystal display device, the conversion ratio can be determined in accordance with a response time of a liquid crystal element. Here, the response time of the liquid crystal element is the time from when a voltage applied to the liquid crystal element is changed until when the liquid crystal element responds. When the response time of the liquid crystal element differs depending on the amount of change of the voltage applied to the liquid crystal element, an average of the response times of plural typical voltage changes can be used. Alternatively, the response time of the liquid crystal element can be defined as MRPT (moving picture response time). Then, by frame rate conversion, the conversion ratio which enables the length of the image display cycle to be near the response time of the liquid crystal element can be determined. Specifically, the response time of the liquid crystal element is preferably the time from the value obtained by multiplication of the cycle of input image data and the inverse number of the conversion ratio, to approximately half that value. In this manner, the image display cycle can be made to correspond to the response time of the liquid crystal element, so that the image quality is improved. For example, when the response time of the liquid crystal element is more than or equal to 4 milliseconds and less than or equal to 8 milliseconds, double-frame rate driving (120 Hz driving) can be employed. This is because the image display cycle of 120 Hz driving is approximately 8 milliseconds and the half of the image display cycle of 120 Hz driving is approximately 4 milliseconds. Similarly, for example, when the response time of the liquid crystal element is more than or equal to 3 milliseconds and less than or equal to 6 milliseconds, triple-frame rate driving (180 Hz driving) can be employed; when the response time of the liquid crystal element is more than or equal to 5 milliseconds and less than or equal to 11 milliseconds, 1.5-fold frame rate driving (90 Hz driving) can be employed; when the response time of the liquid crystal element is more than or equal to 2 milliseconds and less than or equal to 4 milliseconds, quadruple-frame rate driving (240 Hz driving) can be employed; and when the response time of the liquid crystal element is more than or equal to 6 milliseconds and less than or equal to 12 milliseconds, 1.25-fold frame rate driving (80 Hz driving) can be employed. Note that this is similar to the case of other driving frequencies.

Note that the conversion ratio can also be determined by a tradeoff between the quality of the moving image, and power consumption and manufacturing cost. That is, the quality of the moving image can be improved by increasing the conversion ratio while power consumption and manufacturing cost can be reduced by decreasing the conversion ratio. Therefore, when n is 10 or less, each conversion ratio has an advantage described below.

When the conversion ratio is 1, the quality of the moving image can be improved compared to the case where the conversion ratio is less than 1, and power consumption and manufacturing cost can be more reduced compared to the case where the conversion ratio is more than 1. Moreover, since m is small, power consumption can be reduced while high image quality is obtained. Further, by applying the conversion ratio of 1 to a liquid crystal display device in which the response time of the liquid crystal elements is approximately 1 times the cycle of input image data, the image quality can be improved.

When the conversion ratio is 2, the quality of the moving image can be more improved compared to the case where the conversion ratio is less than 2, and power consumption and manufacturing cost can be more reduced compared to the case where the conversion ratio is more than 2. Moreover, since m is small, power consumption can be reduced while high image quality is obtained. Further, by applying the conversion ratio of 2 to a liquid crystal display device in which the response time of the liquid crystal elements is approximately ½ times the cycle of input image data, the image quality can be improved.

When the conversion ratio is 3, the quality of the moving image can be more improved compared to the case where the conversion ratio is less than 3, and power consumption and manufacturing cost can be more reduced compared to the case where the conversion ratio is more than 3. Moreover, since m is small, power consumption can be reduced while high image quality is obtained. Further, by applying the conversion ratio of 3 to a liquid crystal display device in which the response time of the liquid crystal elements is approximately ⅓ times the cycle of input image data, the image quality can be improved.

When the conversion ratio is 3/2, the quality of the moving image can be more improved compared to the case where the conversion ratio is less than 3/2, and power consumption and manufacturing cost can be more reduced compared to the case where the conversion ratio is more than 3/2. Moreover, since m is small, power consumption can be reduced while high image quality is obtained. Further, by applying the conversion ratio of 3/2 to a liquid crystal display device in which the response time of the liquid crystal elements is approximately ⅔ times the cycle of input image data, the image quality can be improved.

When the conversion ratio is 4, the quality of the moving image can be more improved compared to the case where the conversion ratio is less than 4, and power consumption and manufacturing cost can be more reduced compared to the case where the conversion ratio is more than 4. Moreover, since m is small, power consumption can be reduced while high image quality is obtained. Further, by applying the conversion ratio of 4 to a liquid crystal display device in which the response time of the liquid crystal elements is approximately ¼ times the cycle of input image data, the image quality can be improved.

When the conversion ratio is 4/3, the quality of the moving image can be more improved compared to the case where the conversion ratio is less than 4/3, and power consumption and manufacturing cost can be more reduced compared to the case where the conversion ratio is more than 4/3. Moreover, since m is large, motion of the image can be made smoother. Further, by applying the conversion ratio of 4/3 to a liquid crystal display device in which the response time of the liquid crystal elements is approximately ¾ times the cycle of input image data, the image quality can be improved.

When the conversion ratio is 5, the quality of the moving image can be more improved compared to the case where the conversion ratio is less than 5, and power consumption and manufacturing cost can be more reduced compared to the case where the conversion ratio is more than 5. Moreover, since m is small, power consumption can be reduced while high image quality is obtained. Further, by applying the conversion ratio of 5 to a liquid crystal display device in which the response time of the liquid crystal elements is approximately ⅕ times the cycle of input image data, the image quality can be improved.

When the conversion ratio is 5/2, the quality of the moving image can be more improved compared to the case where the conversion ratio is less than 5/2, and power consumption and manufacturing cost can be more reduced compared to the case where the conversion ratio is more than 5/2. Moreover, since m is small, power consumption can be reduced while high image quality is obtained. Further by applying the conversion ratio of 5/2 to a liquid crystal display device in which the response time of the liquid crystal elements is approximately ⅖ times the cycle of input image data, the image quality can be improved.

When the conversion ratio is 5/3, the quality of the moving image can be more improved compared to the case where the conversion ratio is less than 5/3, and power consumption and manufacturing cost can be more reduced compared to the case where the conversion ratio is more than 5/3. Moreover, since m is large, motion of the image can be made smoother. Further, by applying the conversion ratio of 5/3 to a liquid crystal display device in which the response time of the liquid crystal elements is 6 approximately 3/5 times the cycle of input image data, the image quality can be improved.

When the conversion ratio is 5/4, the quality of the moving image can be more improved compared to the case where the conversion ratio is less than 5/4, and power consumption and manufacturing cost can be more reduced compared to the case where the conversion ratio is more than 5/4. Moreover, since m is large, motion of the image can be made smoother. Further, by applying the conversion ratio of 5/4 to a liquid crystal display device in which the response time of the liquid crystal elements is approximately 4/5 times the cycle of input image data, the image quality can be improved.

When the conversion ratio is 6, the quality of the moving image can be more improved compared to the case where the conversion ratio is less than 6, and power consumption and manufacturing cost can be more reduced compared to the case where the conversion ratio is more than 6. Moreover, since m is small, power consumption can be reduced while high image quality is obtained. Further, by applying the conversion ratio of 6 to a liquid crystal display device in which the response time of the liquid crystal elements is approximately 1/6 times the cycle of input image data, the image quality can be improved.

When the conversion ratio is 6/5, the quality of the moving image can be more improved compared to the case where the conversion ratio is less than 6/5, and power consumption and manufacturing cost can be more reduced compared to the case where the conversion ratio is more than 6/5. Moreover, since m is large, motion of the image can be made smoother. Further, by applying the conversion ratio of 6/5 to a liquid crystal display device in which the response time of the liquid crystal elements is approximately 5/6 times the cycle of input image data, the image quality can be improved.

When the conversion ratio is 7, the quality of the moving image can be more improved compared to the case where the conversion ratio is less than 7, and power consumption and manufacturing cost can be more reduced compared to the case where the conversion ratio is more than 7. Moreover, since m is small, power consumption. 16 can be reduced while high image quality is obtained. Further, by applying the conversion ratio of 7 to a liquid crystal display device in which the response time of the liquid crystal elements is approximately 1/7 times the cycle of input image data, the image quality can be improved.

When the conversion ratio is 7/2, the quality of the moving image can be more improved compared to the case where the conversion ratio is less than 7/2, and power consumption and manufacturing cost can be more reduced compared to the case where the conversion ratio is more than 7/2. Moreover, since m is small, power consumption can be reduced while high image quality is obtained. Further, by applying the conversion ratio of 7/2 to a liquid crystal display device in which the response time of the liquid crystal elements is approximately 2/7 times the cycle of input image data, the image quality can be improved.

When the conversion ratio is 7/3, the quality of the moving image can be more improved compared to the case where the conversion ratio is less than 7/3, and power consumption and manufacturing cost can be more reduced compared to the case where the conversion ratio is more than 7/3. Moreover, since m is large, motion of the image can be made smoother. Further, by applying the conversion ratio of 7/3 to a liquid crystal display device in which the response time of the liquid crystal elements is approximately 3/7 times the cycle of input image data, the image quality can be improved.

When the conversion ratio is 7/4, the quality of the moving image can be more improved compared to the case where the conversion ratio is less than 7/4, and power consumption and manufacturing cost can be more reduced compared to the case where the conversion ratio is more than 7/4. Moreover, since m is large, motion of the image can be made smoother. Further, by applying the conversion ratio of 7/4 to a liquid crystal display device in which the response time of the liquid crystal elements is approximately 4/7 times the cycle of input image data, the image quality can be improved.

When the conversion ratio is 7/5, the quality of the moving image can be more improved compared to the case where the conversion ratio is less than 7/5, and power consumption and manufacturing cost can be more reduced compared to the case where the conversion ratio is more than 7/5. Moreover, since m is large, motion of the image can be made smoother. Further, by applying the conversion ratio of 7/5 to a liquid crystal display device in which the response time of the liquid crystal elements is approximately 5/7 times the cycle of input image data, the image quality can be improved.

When the conversion ratio is 7/6, the quality of the moving image can be more improved compared to the case where the conversion ratio is less than 7/6, and power consumption and manufacturing cost can be more reduced compared to the case where the conversion ratio is more than 7/6. Moreover, since m is large, motion of the image can be made smoother. Further, by applying the conversion ratio of 7/6 to a liquid crystal display device in which the response time of the liquid crystal elements is approximately 6/7 times the cycle of input image data, the image quality can be improved.

When the conversion ratio is 8, the quality of the moving image can be more improved compared to the case where the conversion ratio is less than 8, and power consumption and manufacturing cost can be more reduced compared to the case where the conversion ratio is more than 8. Moreover, since m is small, power consumption can be reduced while high image quality is obtained. Further, by applying the conversion ratio of 8 to a liquid crystal display device in which the response time of the liquid crystal elements is approximately 1/8 times the cycle of input image data, the image quality can be improved.

When the conversion ratio is 8/3, the quality of the moving image can be more improved compared to the case where the conversion ratio is less than 8/3, and power consumption and manufacturing cost can be more reduced compared to the case where the conversion ratio is more than 8/3. Moreover, since m is large, motion of the image can be made smoother. Further, by applying the conversion ratio of 8/3 to a liquid crystal display device in which the response time of the liquid crystal elements is approximately 3/8 times the cycle of input image data, the image quality can be improved.

When the conversion ratio is 8/5, the quality of the moving image can be more improved compared to the case where the conversion ratio is less than 8/5, and power consumption and manufacturing cost can be more reduced compared to the case where the conversion ratio is more than 8/5. Moreover, since m is large, motion of the image can be made smoother. Further, by applying the conversion ratio of 8/5 to a liquid crystal display device in which the response time of the liquid crystal elements is approximately 5/8 times the cycle of input image data, the image quality can be improved.

When the conversion ratio is 8/7, the quality of the moving image can be more improved compared to the case where the conversion ratio is less than 817, and power consumption and manufacturing cost can be more reduced compared to the case where the conversion ratio is more than 8/7. Moreover, since m is large, motion of the image can be made smoother. Further, by applying the conversion ratio of 8/7 to a liquid crystal display device in which the response time of the liquid crystal elements is approximately 7/8 times the cycle of input image data, the image quality can be improved.

When the conversion ratio is 9, the quality of the moving image can be more improved compared to the case where the conversion ratio is less than 9, and power consumption and manufacturing cost can be more reduced compared to the case where the conversion ratio is more than 9. Moreover, since m is small, power consumption can be reduced while high image quality is obtained. Further, by applying the conversion ratio of 9 to a liquid crystal display device in which the response time of the liquid crystal elements is approximately 1/9 times the cycle of input image data, the image quality can be improved.

When the conversion ratio is 9/2, the quality of the moving image can be more improved compared to the case where the conversion ratio is less than 9/2, and power consumption and manufacturing cost can be more reduced compared to the case where the conversion ratio is more than 9/2. Moreover, since m is small, power consumption can be reduced while high image quality is obtained. Further, by applying the conversion ratio of 9/2 to a liquid crystal display device in which the response time of the liquid crystal elements is approximately 2/9 times the cycle of input image data, the image quality can be improved.

When the conversion ratio is 9/4, the quality of the moving image can be more improved compared to the case where the conversion ratio is less than 9/4, and power consumption and manufacturing cost can be more reduced compared to the case where the conversion ratio is more than 9/4. Moreover, since m is large, motion of the image can be made smoother. Further, by applying the conversion ratio of 9/4 to a liquid crystal display device in which the response time of the liquid crystal elements is approximately 4/9 times the cycle of input image data, the image quality can be improved.

When the conversion ratio is 9/5, the quality of the moving image can be more improved compared to the case where the conversion ratio is less than 9/5, and power consumption and manufacturing cost can be more reduced compared to the case where the conversion ratio is more than 9/5. Moreover, since m is large, motion of the image can be made smoother. Further, by applying the conversion ratio of 9/5 to a liquid crystal display device in which the response time of the liquid crystal elements is approximately 5/9 times the cycle of input image data, the image quality can be improved.

When the conversion ratio is 9/7, the quality of the moving image can be more improved compared to the case where the conversion ratio is less than 9/7, and power consumption and manufacturing cost can be more reduced compared to the case where the conversion ratio is more than 9/7. Moreover, since m is large, motion of the image can be made smoother. Further, by applying the conversion ratio of 9/7 to a liquid crystal display device in which the response time of the liquid crystal elements is approximately 7/9 times the cycle of input image data, the image quality can be improved.

When the conversion ratio is 9/8, the quality of the moving image can be more improved compared to the case where the conversion ratio is less than 9/8, and power consumption and manufacturing cost can be more reduced compared to the case where the conversion ratio is more than 9/8. Moreover, since m is large, motion of the image can be made smoother. Further, by applying the conversion ratio of 9/8 to a liquid crystal display device in which the response time of the liquid crystal elements is approximately 8/9 times the cycle of input image data, the image quality can be improved.

When the conversion ratio is 10, the quality of the moving image can be more improved compared to the case where the conversion ratio is less than 10, and power consumption and manufacturing cost can be more reduced compared to the case where the conversion ratio is more than 10. Moreover, since m is small, power consumption can be reduced while high image quality is obtained. Further, by applying the conversion ratio of 10 to a liquid crystal display device in which the response time of the liquid crystal elements is approximately 1/10 times the cycle of input image data, the image quality can be improved.

When the conversion ratio is 10/3, the quality of the moving image can be more improved compared to the case where the conversion ratio is less than 10/3, and power consumption and manufacturing cost can be more reduced compared to the case where the conversion ratio is more than 10/3. Moreover, since m is large, motion of the image can be made smoother. Further, by applying the conversion ratio of 10/3 to a liquid crystal display device in which the response time of the liquid crystal elements is approximately 3/10 times the cycle of input image data, the image quality can be improved.

When the conversion ratio is 10/7, the quality of the moving image can be more improved compared to the case where the conversion ratio is less than 10/7, and power consumption and manufacturing cost can be more reduced compared to the case where the conversion ratio is more than 10/7. Moreover, since m is large, motion of the image can be made smoother. Further, by applying the conversion ratio of 10/7 to a liquid crystal display device in which the response time of the liquid crystal elements is approximately 7/10 times the cycle of input image data, the image quality can be improved.

When the conversion ratio is 10/9, the quality of the moving image can be more improved compared to the case where the conversion ratio is less than 10/9, and power consumption and manufacturing cost can be more reduced compared to the case where the conversion ratio is more than 10/9. Moreover, since m is large, motion of the image can be made smoother. Further, by applying the conversion ratio of 10/9 to a liquid crystal display device in which the response time of the liquid crystal elements is approximately 9/10 times the cycle of input image data, the image quality can be improved.

Note that it is obvious that each conversion ratio where n is more than 10 also has a similar advantage.

Next, as the second step, a method will be described in which a plurality of different images (sub-images) are generated from an image based on input image data or each image (hereinafter referred to as an original image) whose frame rate is converted by a given rational number (n/m) times in the first step, and the plurality of sub-images are displayed in temporal succession. In this manner, a method of the second step can make human eyes perceive as if one original image were displayed in appearance, despite the fact that a plurality of different images are displayed.

Here, among the sub-images generated from one original image, a sub-image which is displayed first is referred to as a first sub-image. The timing when the first sub-image is displayed is the same as the timing when the original image determined in the first step is displayed. On the other hand, a sub-image which is displayed after that is referred to as a second sub-image. The timing when the second sub-image is displayed can be determined at will regardless of the timing when the original image determined in the first step is displayed. Note that an image which is actually displayed is an image generated from the original image by a method in the second step. Various images can be used for the original image for generating sub-images. The number of sub-images is not limited to two and more than two sub-images are also possible. In the second step, the number of sub-images is represented as J (J is an integer of 2 or more). At that time, a sub-image which is displayed at the same timing as the timing when the original image determined in the first step is displayed is referred to as a first sub-image. Sub-images which are sequentially displayed are referred to as a second sub-image, a third sub image . . . and J-th sub-image in order from a sub-image which is displayed.

There are many methods for generating a plurality of sub-images from one original image. As main ones, the following methods can be given. The first one is a method in which the original image is used as it is as the sub-image. The second one is a method in which brightness of the original image is distributed to the plurality of sub-images. The third one is a method in which an intermediate image obtained by motion compensation is used as the sub-image.

Here, a method for distributing brightness of the original image to the plurality of sub-images can be further divided into some methods. As main ones, the following methods can be given. The first one is a method in which at least one sub-image is a black image (hereinafter referred to as black data insertion). The second one is a method in which the brightness of the original image is distributed to a plurality of ranges and just one sub-image among all the sub-images is used to control the brightness in the ranges (hereinafter referred to as time-division gray scale control). The third one is a method in which one sub-image is a bright image which is made by changing a gamma value of the original image, and the other sub-image is a dark image which is made by changing the gamma value of the original image (hereinafter referred to as gamma complement).

Some of the methods described above will be briefly described. In the method in which the original image is used as it is as the sub-image, the original image is used as it is as the first sub-image. Further, the original image is used as it is as the second sub-image. By using this method, a circuit which newly generates a sub-image does not need to operate, or the circuit itself is not necessary, so that power consumption and manufacturing cost can be reduced. Particularly in a liquid crystal display device, this method is preferably used after frame rate conversion using an intermediate image obtained by motion compensation in the first step as an interpolation image. This is because defects such as traces and afterimages of a moving image attributed to shortage of writing voltage due to dynamic capacitance of the liquid crystal elements can be reduced by using the intermediate image obtained by motion compensation as the interpolation image to make motion of the moving image smooth and displaying the same image repeatedly.

Next, in the method in which the brightness of the original image is distributed to the plurality of sub-images, a method for setting the brightness of the image and the length of a period when the sub-images are displayed will be specifically described. Note that J is the number of sub-images, and an integer of 2 or more. The lower case j and capital J are distinguished. The lower case j is an integer of more than or equal to 1 and less than or equal to J. The brightness of a pixel in normal hold driving is L, the cycle of original image data is T, the brightness of a pixel in a j-th sub-image is $L_j$, and the length of a period when the j-th sub-image is displayed is T. The total sum of products of $L_j$ and $T_j$ where j=1 to where j=J ($L_1T_1+L_2T_2+ \ldots +L_JT_J$) is preferably equal to a product of L and T (LT) (brightness is unchangeable). Further, the total sum of $T_j$ where j=1 to where j=J is preferably equal to T (a display cycle of the original image is maintained). Here, unchangeableness of brightness and maintenance of the display cycle of the original image is referred to as sub-image distribution condition.

In the methods for distributing brightness of the original image to a plurality of sub-images, black data insertion is a method in which at least one sub-image is made a black image. In this manner, a display method can be made close to pseudo impulse type display so that deterioration of quality of moving image due to hold-type display method can be prevented. In order to prevent a decrease in brightness due to black data insertion, sub-image distribution condition is preferably satisfied. However, in the situation that a decrease in brightness of the displayed image is acceptable (dark surrounding or the like) or in the case where a decrease in brightness of the displayed image is set to be acceptable by the user, sub-image distribution condition is not necessarily satisfied. For example, one sub-image may be the same as the original image and the other sub-image can be a black image. In this case, power consumption can be reduced compared to the case where sub-image distribution condition is satisfied. Further, in a liquid crystal display device, when one sub-image is made by increasing the whole brightness of the original image without limitation of the maximum brightness, sub-image distribution condition can be satisfied by increasing brightness of a backlight. In this case, since sub-image distribution condition can be satisfied without controlling the voltage value which is applied to a pixel, operation of an image processing circuit can be omitted, so that power consumption can be reduced.

Note that a feature of black data insertion is to make $L_j$ of all pixels 0 in any one of sub-images. In this manner, a display method can be made close to pseudo-impulse type display, so that deterioration of quality of a moving image due to a hold-type display method can be prevented.

In the methods for distributing the brightness of the original image to a plurality of sub-images, time-division gray scale control is a method in which brightness of the original image is divided into a plurality of ranges and brightness in that range is controlled by just one sub-image among all sub-images. In this manner, a display method can be made close to pseudo impulse type display without a decrease in brightness. Therefore, deterioration of quality of moving image due to a hold-type display method can be prevented.

As a method for dividing the brightness of the original image into a plurality of ranges, a method in which the maximum brightness ($L_{max}$) is divided into the number of sub-images can be given. This method will be described with a display device which can adjust brightness of 0 to $L_{max}$ by 256 grades (from the grade 0 to 255) in the case where two sub-images are provided. When the grade 0 to 127 is displayed, brightness of one sub-image is adjusted in a range of the grade 0 to 255 while brightness of the other sub-image is set to be the grade 0. When the grade 128 to 255 is displayed, the brightness of on sub-image is set to be 255 while brightness of the other sub-image is adjusted in a range of the grade 0 to 255. In this manner this method can make human eyes perceive as if an original image is displayed and make a display method close to pseudo-impulse type display, so that deterioration of quality of an moving image due to a hold-type display method can be prevented. Note that more than two sub-images can be provided. For example, if three sub-images are provided, the grade (grade 0 to 255) of brightness of an original image is divided into three. In some cases, the number of grades of brightness is not divisible by the number of sub-images, depending on the number of grades of brightness of the original image and the number of sub-images; however, the number of grades of brightness which is included in a range of each divided brightness can be distributed as appropriate even if the number of grades of brightness is not just the same as the number of sub-images.

In the case of time-division gray scale control, by satisfying sub-image distribution condition, the same image as the original image can be displayed without a decrease in brightness or the like, which is preferable.

In the methods for distributing brightness of the original image to a plurality of sub-images, gamma complement is a method in which one sub-image is made a bright image by changing the gamma characteristic of the original image while the other sub-image is made a dark image by changing the gamma characteristic of the original image. In this manner, a display method can be made close to pseudo impulse type display without a decrease in brightness. Therefore, deterioration of quality of moving image due to a hold-type display method can be prevented. Here, a gamma characteristic is a degree of brightness with respect to a grade (gray scale) of brightness. In general, a line of the gamma characteristic is adjusted so as to be close to a linear shape. This is because a smooth gray scale can be obtained if change in brightness is proportion to one gray scale in the grade of brightness. In gamma complement, the curve of the gamma characteristic of one sub-image is deviated from the linear shape so that the one sub-image is brighter than a sub-image in the linear shape in a region of intermediate brightness (halftone) (the image in halftone is brighter than as it usually is). Further, a line of the gamma characteristic of the other sub-image is also deviated from the linear shape so that the other sub-image is darker than the sub-image in the linear shape in a region of intermediate brightness (the image in halftone is darker than as it usually is). Here, the amount of change for brightening the one sub-image than that in the linear shape, and the amount of change for darkening the other sub-image than the sub-image in the linear shape, are preferably almost the same. This method can make human eyes perceive as if an original image is displayed and a decrease in quality of a moving image due to a hold-type display method can be prevented. Note that more than two sub-images can be provided. For example, if three sub-images are provided, each gamma characteristic of three sub-images are adjusted and the sum of the amounts of change for brightening sub-images, and the sum of the amounts of change for darkening sub-images are almost the same.

Note that also in the case of gamma complement, by satisfying sub-image distribution condition, the same image as the original image can be displayed without a decrease in brightness or the like, which is preferable. Further, in gamma complement, since change in brightness $L_j$ of each sub-image with respect to gray scale follows a gamma curve, the gray scale of each sub-image can be displayed smoothly by itself. Therefore, there is an advantage that image quality to be perceived by human eyes is improved.

A method in which an intermediate image obtained by motion compensation is used as a sub-image is a method in which one sub-image is an intermediate image obtained by motion compensation using previous and next images. In this manner, motion of images can be smooth and quality of a moving image can be improved.

The relation between the timing when a sub-image is displayed and a method of making a sub-image will be described. Although the timing when the first sub-image is displayed is the same as that when the original image determined in the first step is displayed, and the timing when the second sub-image is displayed can be decided at will regardless of the timing when the original image determined in the first step is displayed, the sub-image itself may be changed in accordance with the timing when the second sub-image is displayed. In this manner, even if the timing when the second sub-image is displayed is changed variously, human eyes can be made to perceive as if the original image is displayed. Specifically, if the timing when the second sub-image is displayed is earlier, the first sub-image can be brighter and the second sub-image can be darker. Further, if the timing when the second sub-image is displayed is later, the first sub-image may be darker and the second sub-image may be brighter. This is because brightness perceived by human eyes changes in accordance with the length of a period when an image is displayed. More specifically, the longer the length of the period when an image is displayed becomes, the higher brightness perceived by human eyes becomes while the shorter the length of the period when an image is displayed becomes, the lower brightness perceived by human eyes becomes. That is, by making the timing when the second sub-image is displayed earlier, the length of the period when the first sub-image is displayed becomes shorter and the length of period when the second sub-image is displayed becomes longer. This means human eyes perceive as if the first sub-image is dark and the second sub-image is bright. As a result, a different image from the original image is perceived by human eyes. In order to prevent this, the first sub-image can be made much brighter and the second sub-image can be made much darker. Similarly, by making the timing when the second sub-image is displayed later, the length of the period when the first sub-image is displayed becomes longer, and the length of the period when the second sub-image is displayed becomes shorter, in such a case, the first sub-image can be made much darker and the second sub-image can be made much brighter.

In accordance with the above description, procedures in the second step is shown below. As a procedure 1, a method for making a plurality of sub-images from one original image is decided. More specifically, a method for making a plurality of sub-images can be selected from a method in which an original image is used as it is as a sub-image, a method in which brightness of an original image is distributed to a plurality of sub-images, and a method in which an intermediate image obtained by motion compensation is used as a sub-image. As a procedure 2, the number J of sub-images is decided. Note that J is an integer of 2 or more. As a procedure 3, the brightness Lj of a pixel in i-th sub-image and the length of the period $T_j$ when the j-th sub-image is displayed are decided in accordance with the method shown in the procedure 1. Through the procedure 3, the length of a period when each sub-image is displayed and the brightness of each pixel included in each sub-image are specifically decided. As a procedure 4, the original image is processed in accordance with what decided in respective procedures 1 to 3 to actually perform display. As a procedure 5, the objective original image is shifted to the next original image and the operation returns to the procedure 1.

Note that a mechanism for performing the procedures in the second step may be mounted on a device or decided in the design phase of the device in advance. When the mechanism for performing the procedures in the second step is mounted on the device, a driving method can be switched so that an optimal operation depending on circumstances can be performed. Note that the circumstances here include contents of image data, environment inside and outside the device (e.g., temperature, humidity, barometric pressure, light, sound, an electromagnetic field, an electric field, radiation quantity, an altitude, acceleration, or movement speed), user setting, a software version, and the like. On the other hand, when the mechanism for performing the procedures in the second step is decided in the design phase of the device in advance, driver circuits optimal for respective driving methods can be used. Further, since the mechanism is decided, manufacturing cost can be reduced due to efficiency of mass production.

Next, various driving methods are employed depending on the procedures in the second step and are described in detail, specifically showing values of n and m in the first step.

In the procedure 1 in the second step, in the case where a method using an original image as it is as a sub-image is selected, the driving method is as follows.

One feature of a driving method of the display device is that i-th (i is a positive integer) image data and (i+1)th image data are sequentially prepared in a constant cycle T. The cycle T is divided into J (J is an integer equal to or more than 2) sub-image display periods. The i-th image data is data which can make each of a plurality of pixels have unique brightness L. The j-th (i is an integer equal to or more than 1, and equal to or less than J) sub-image is formed by arranging the plurality of pixels each having unique brightness $L_j$, and is an image displayed only during the j-th sub-image display period $T_j$. The aforementioned L, T, $L_j$, and $T_j$ satisfy the sub-image distribution condition. In all values of J, the brightness $L_j$ of each pixel which is included in the j-th sub-image is equal to L. Here, as image data which are prepared sequentially in a constant cycle T, the original image data which is formed in the first step can be used. That is, all display patterns given in the description of the first step can be combined with the above mentioned driving method.

Figure 71:
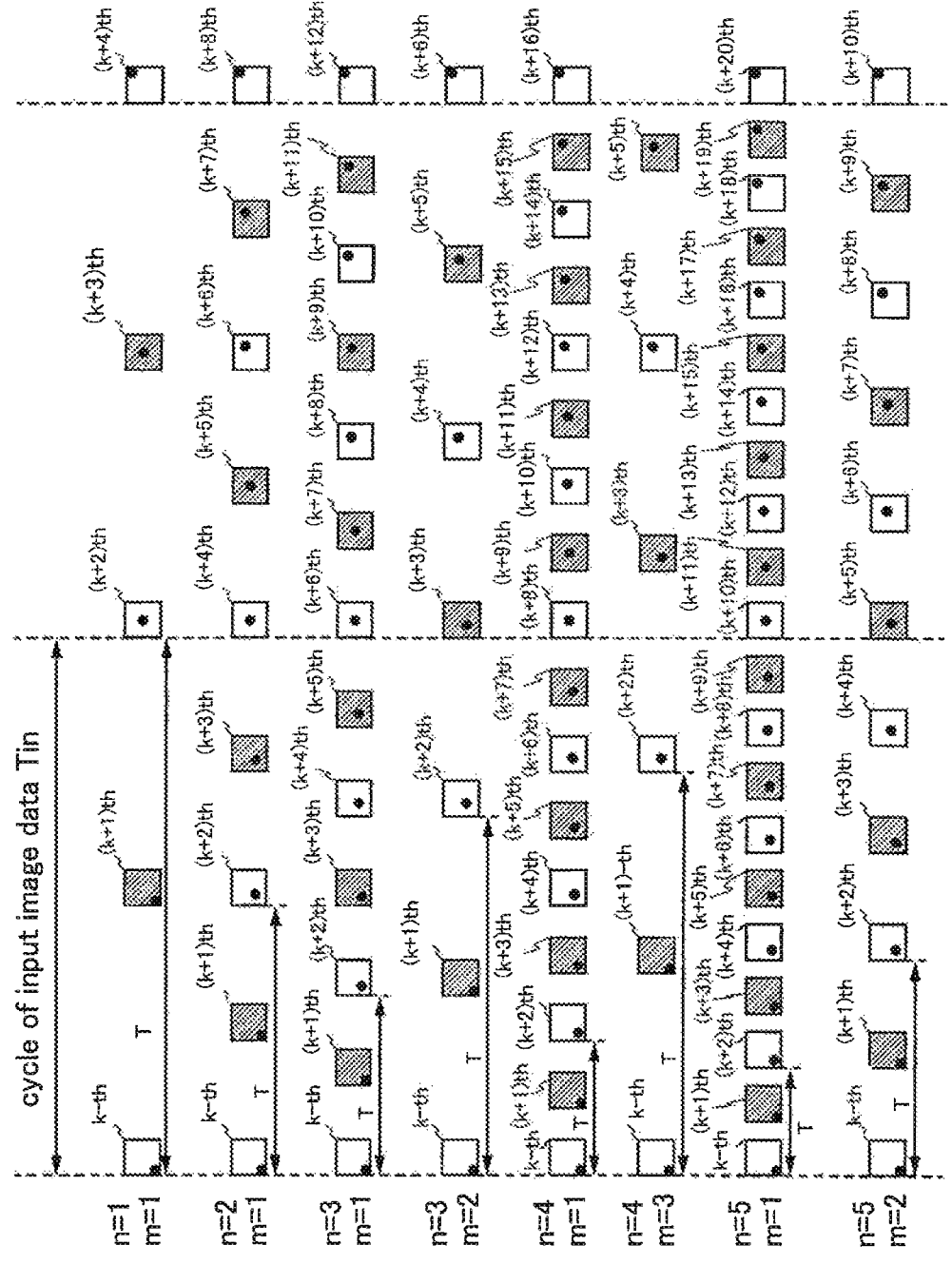
FIG. 71 is a diagram showing an exemplary driving method of a display device of the present invention.

Then, in the case where the number of sub-images J is determined to be 2 in the procedure 2 in the second step, and it is determined that $T_1=T_2=T/2$ in the procedure 3, the above-mentioned driving method is as shown in FIG. 71. In FIG. 71, the horizontal axis indicates time, and the vertical axis indicates cases which are classified with respect to various values of n and m used in the first step.

For example, in the first step, in the case of n=1 and m=1, in other words, when the conversion ratio (n/m) is 1, a driving method as shown in the case of n=1 and m=1 in FIG. 71 is employed. At this time, the display frame rate is twice (double-frame rate driving) as high as the frame rate of input image data. Specifically, for example, when the input frame rate is 60 Hz, the display frame rate is 120 Hz (120 Hz driving). Then, two images are continuously displayed with respect to one piece of input image data. Here, in the case of double-frame rate driving, quality of moving images can be improved than the case where the frame rate is lower than that of the double-frame rate driving, and power consumption and a production cost can be reduced than the case where the frame rate is higher than that of the double-frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 120 Hz driving and alternating-current driving of a liquid crystal display device is effective. That is, when the driving frequency of the liquid crystal display device is 120 Hz and the frequency of alternating-current driving is an integer multiple of 120 Hz or a unit fraction of 120 Hz (e.g., 30 Hz, 60 Hz, 120 Hz, or 240 Hz), flickers which appear by alternating-current driving can be reduced so as not to be perceived by human eyes. Moreover, image quality can be improved by applying the driving method to the liquid crystal display device in which the response time of the liquid crystal element is approximately half a cycle of input image data.

Further, for example, in the first step, in the case of a n=2 and m=1, in other words, when the conversion ratio (n/m) is 2, a driving method as shown in the case of n=2 and m=1 in FIG. 71 is employed. At this time, the display frame rate is 4-fold (quadruple-frame rate driving) as high as the frame rate of input image data. Specifically, for example, when the input frame rate is 60 Hz, the display frame rate is 240 Hz (240 Hz diving). Then, four images are continuously displayed with respect to one piece of input image data. At this time, when an interpolated image in the first step is an intermediate image obtained by motion compensation, motion of moving images can be smooth; thus, quality of moving images can be significantly improved. In the case of quadruple-frame rate driving, quality of moving images can be improved than the case where the frame rate is lower than that of the quadruple-frame rate driving, and power consumption and a production cost can be reduced than the case where the frame rate is higher than that of the quadruple-frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particularly, such as a phenomenon of a moving image in which traces are seen and an afterimage are reduced. Moreover, a combination of 240 Hz driving and alternating-current driving of a liquid crystal display device is effective. That is, when the driving frequency of the liquid crystal display device is 240 Hz and the frequency of alternating-current driving is an integer multiple of 240 Hz or a unit fraction of 240 Hz (e.g., 30 Hz, 60 Hz, 120 Hz, or 240 Hz), flickers which appear by alternating-current driving can be reduced so as not to be perceived by human eyes. Moreover, image quality can be improved by applying the driving method to the liquid crystal display device in which the response time of the liquid crystal element is approximately quarter of a cycle of input image data.

Further, for example, in the first step, in the case of n=3 and m=1, in other words, when the conversion ratio (n/m) is 3, a driving method as shown in the case of n=3 and m=1 in FIG. 71 is employed. At this time, the display frame rate is 6-fold (6-fold frame rate driving) as high as the frame rate of input image data. Specifically, for example, when the input frame rate is 60 Hz, the display frame rate is 360 Hz (360 Hz driving). Then, six images are continuously displayed with respect to one piece of input image data. At this time, when an interpolated image in the first step is an intermediate image obtained by motion compensation, motion of moving images can be smooth; thus, quality of moving images can be significantly improved. In the case of 6-fold frame rate driving, quality of moving images can be improved than the case where the frame rate is lower than that of the 6-fold frame rate driving, and power consumption and a production cost can be reduced than the case where the frame rate is higher than that of the 6-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an after-image are reduced. Moreover, a combination of 360 Hz driving and alternating-current driving of a liquid crystal display device is effective. That is, when the driving frequency of the liquid crystal display device is 360 Hz and the frequency of alternating-current driving is an integer multiple of 360 Hz or a unit fraction of 360 Hz (e.g., 30 Hz, 60 Hz, 120 Hz, or 180 Hz), flickers which appear by alternating-current driving can be reduced so as not to be perceived by human eyes. Moreover, image quality can be improved by applying the driving method to the liquid crystal display device in which the response time of the liquid crystal element is approximately $\frac{1}{6}$ of a cycle of input image data.

Further, for example, in the first step, in the case of n=3 and m=2, in other words, when the conversion ratio (n/m) is 3/2, a driving method as shown in the case of n=3 and m=2 in FIG. 71 is employed. At this time, the display frame rate is triple (triple flame rate driving) as high as the frame rate of input image data. Specifically, for example, when the input frame rate is 60 Hz, the display frame rate is 180 Hz (180 Hz driving). Then, three images are continuously displayed with respect to one piece of input image data. At this time, when an interpolated image in the first step is an intermediate image obtained by motion compensation, motion of moving images can be smooth; thus, quality of moving images can be significantly improved. In the case of triple frame rate driving, quality of moving images can be improved than the case where the frame rate is lower than that of the triple frame rate driving, and power consumption and a production cost can be reduced than the case where the frame rate is higher than that of the triple frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an after-image are reduced. Moreover, a combination of 180 Hz driving and alternating-current driving of a liquid crystal display device is effective. That is, when the driving frequency of the liquid crystal display device is 180 Hz and the frequency of alternating-current driving is an integer multiple of 180 Hz or a unit fraction of 180 Hz (e.g., 30 Hz, 60 Hz, 120 Hz, or 180 Hz), flickers which appear by alternating-current driving can be reduced so as not to be perceived by human eyes. Moreover, image quality can be improved by applying the driving method to the liquid crystal display device in which the response time of the liquid crystal element is approximately $\frac{1}{3}$ of a cycle of input image data.

Further, for example, in the first step, in the case of n=4 and m=1, in other words, when the conversion ratio (n/m) is 4, a driving method as shown in the case of n=4 and m=1 in FIG. 71 is employed. At this time, the display frame rate is 8-fold (8-fold frame rate driving) as high as the frame rate of input image data. Specifically, for example, when the input frame rate is 60 Hz, the display frame rate is 480 Hz (480 Hz driving). Then, eight images are continuously displayed with respect to one piece of input image data. At this time, when an interpolated image in the first step is an intermediate image obtained by motion compensation, motion of moving images can be smooth; thus, quality of moving images can be significantly improved. In the case of 8-fold frame rate driving, quality of moving images can be improved than the case where the frame rate is lower than that of the 8-fold frame rate driving, and power consumption and a production cost can be reduced than the case where the frame rate is higher than that of the 8-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an after-image are reduced. Moreover, a combination of 480 Hz driving and alternating-current driving of a liquid crystal display device is effective. That is, when the driving frequency of the liquid crystal display device is 480 Hz and the frequency of alternating-current driving is an integer multiple of 480 Hz or a unit fraction of 480 Hz (e.g., 30 Hz, 60 Hz, 120 Hz, or 240 Hz), flickers which appear by alternating-current driving can be reduced so as not to be perceived by human eyes. Moreover, image quality can be improved by applying the driving method to the liquid crystal display device in which the response time of the liquid crystal element is approximately $\frac{1}{8}$ of a cycle of input image data.

Further, for example, in the first step, in the case of n=4 and m=3, in other words, when the conversion ratio (n/m) is 4/3, a driving method as shown in the case of n=4 and m=3 in FIG. 71 is employed. At this time, the display frame rate is 8/3 times (8/3-fold frame rate driving) as high as the frame rate of input image data. Specifically, for example, when the input frame rate is 60 Hz, the display frame rate is 160 Hz (160 Hz driving). Then, eight images are continuously displayed with respect to three pieces of input image data. At this time, when an interpolated image in the first step is an intermediate image obtained by motion compensation, motion of moving images can be smooth; thus, quality of moving images can be significantly improved. In the case of 8/3-fold frame rate driving, quality of moving images can be improved than the case where the frame rate is lower than that of the 8/3-fold frame rate driving, and power consumption and a production cost can be reduced than the case where the frame rate is higher than that of the 8/3-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 160 Hz driving and alternating-current driving of a liquid crystal display device is effective. That is, when the driving frequency of the liquid crystal display device is 160 Hz and the frequency of alternating-current driving is an integer multiple of 160 Hz or a unit fraction of 160 Hz (e.g., 40 Hz, 80 Hz, 160 Hz, or 320 Hz), flickers which appear by alternating-current driving can be reduced so as not to be perceived by human eyes. Moreover, image quality can be improved by applying the driving method to the liquid crystal display device in which the response time of the liquid crystal element is approximately 3/8 of a cycle of input image data.

Further, for example, in the first step, in the case of n=5 and m=1, in other words, when the conversion ratio (n/m) is 5, a driving method as shown in the case of n=5 and m=1 in FIG. 71 is employed. At this time, the display frame rate is 10-fold (10-fold frame rate driving) as high as the frame rate of input image data. Specifically, for example, when the input frame rate is 60 Hz, the display frame rate is 600 Hz (600 Hz driving). Then, ten images are continuously displayed with respect to one piece of input image data. At this time, when an interpolated image in the first step is an intermediate image obtained by motion compensation, motion of moving images can be smooth; thus, quality of moving images can be significantly improved. In the case of 10-fold frame rate driving, quality of moving images can be improved than the case where the frame rate is lower than that of the 10-fold frame rate driving, and power consumption and a production cost can be reduced than the case where the frame rate is higher than that of the 10-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 600 Hz driving and alternating-current driving of a liquid crystal display device is effective. That is, when the driving frequency of the liquid crystal display device is 600 Hz and the frequency of alternating-current driving is an integer multiple of 600 Hz or a unit fraction of 600 Hz (e.g., 30 Hz, 60 Hz, 100 Hz, or 120 Hz), flickers which appear by alternating-current driving can be reduced so as not to be perceived by human eyes. Moreover, image quality can be improved by applying the driving method to the liquid crystal display device in which the response time of the liquid crystal element is approximately 1/10 of a cycle of input image data.

Further, for example, in the first step, in the case of n=5 and m=2, in other words, when the conversion ratio (n/m) is 5/2, a driving method as shown in the case of n=5 and m=2 in FIG. 71 is employed. At this time, the display frame rate is 5-fold (5-fold frame rate driving) as high as the frame rate of input image data. Specifically, for example, when the input frame rate is 60 Hz, the display frame rate is 300 Hz (300 Hz driving). Then, five images are continuously displayed with respect to one piece of input image data. At this time, when an interpolated image in the first step is an intermediate image obtained by motion compensation, motion of moving images can be smooth; thus, quality of moving images can be significantly improved. In the case of 5-fold frame rate driving, quality of moving images can be improved than the case where the frame rate is lower than that of the 5-fold frame rate driving, and power consumption and a production cost can be reduced than the case where the frame rate is higher than that of the 5-fold frame rate driving. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Moreover, a combination of 300 Hz driving and alternating-current driving of a liquid crystal display device is effective. That is, when the driving frequency of the liquid crystal display device is 300 Hz and the frequency of alternating-current driving is an integer multiple of 300 Hz or a unit fraction of 300 Hz (e.g., 30 Hz, 50 Hz, 60 Hz, or 100 Hz), flickers which appear by alternating-current driving can be reduced so as not to be perceived by human eyes. Moreover, image quality can be improved by applying the driving method to the liquid crystal display device in which the response time of the liquid crystal element is approximately 1/5 of a cycle of input image data.

As described above, when a method in which an original image is used as it is as a sub-image is selected the procedure 1 in the second step; the number of sub-images is determined to be 2 in the procedure 2 in the second step; when it is determined that $T_1=T_2=T/2$ in the procedure 3 in the second step, the display frame rate can be double of the display frame rate obtained by the frame rate conversion using a conversion ratio determined by the values of n and m in the first step; thus, quality of moving images can be further improved. Further, the quality of moving images can be improved than the case where a display frame rate is lower than the display frame rate, and power consumption and a production cost can be reduced than the case where a display frame rate is higher than the display frame rate. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Furthermore, when the driving frequency of the liquid crystal display device is made high and the frequency of alternating-current driving is an integer multiple or a unit fraction, flickers which appear by alternating-current driving can be reduced so as not to be perceived by human eyes. Moreover, image quality can be improved by applying the driving method to the liquid crystal display device in which the response time of the liquid crystal element is approximately (1/(double the conversion ratio)) of a cycle of input image data.

Note that it is obvious that there are similar advantages in the case of using a conversion ratio than those described above, though detailed description is omitted. For example when n is 10 or less, the following combinations are possible in addition to the above mentioned cases:

n=5, m=3, that is, the conversion ratio (n/m)=5/3 (10/3-fold frame rate driving, 200 Hz), n=5, m=4, that is, the conversion ratio (n/m)=5/4 (5/2-fold frame rate driving, 150 Hz), n=6, m=1, that is, the conversion ratio (n/m)=6 (12-fold frame rate driving, 720 Hz), n=6, m=5, that is, the conversion ratio (n/m)=6/5 (12/5-fold frame rate driving, 144 Hz), n=7, m=1, that is, the conversion ratio (n/m)=7 (14-fold frame rate driving, 840 Hz), n=7, m=2, that is, the conversion ratio (n/m)=7/2 (7-fold frame rate driving, 420 Hz), n=7, m=3, that is, the conversion ratio (n/m)=7/3 (14/3-fold frame rate driving, 280 Hz), n=7, m=4, that is, the conversion ratio (n/m)=7/4 (7/2-fold frame rate driving, 210 Hz), n=7, m=5, that is, the conversion ratio (n/m)=7/5 (14/5-fold frame rate driving, 168 Hz), n=7, m=6, that is, the conversion ratio (n/m)=7/6 (7/3-fold frame rate driving, 140 Hz), n=8, m=1, that is, the conversion ratio (n/m)=8 (16-fold frame rate driving, 960 Hz), n=8, m=3, that is, the conversion ratio (n/m)=8/3 (16/3-fold frame rate driving, 320 Hz), n=8, m=5, that is, the conversion ratio (n/m)=8/5 (16/5-fold frame rate driving, 192 Hz), n=8, m=7, that is, the conversion ratio (n/m)=8/7 (16/7-fold frame rate driving, 137 Hz), n=9, m=1, that is, the conversion ratio (n/m)=9 (18-fold frame rate driving, 1080 Hz), n=9, m=2, that is, the conversion ratio (n/m)=9/2 (9-fold frame rate driving, 540 Hz), n=9, m=4, that is, the conversion ratio (n/m)=9/4 (9/2-fold frame rate driving, 270 Hz), n=9, m=5, that is, the conversion ratio (n/m)=9/5 (18/5-fold frame rate driving, 216 Hz), n=9, m=7, that is, the conversion ratio (n/m)=9/7 (18/7-fold frame rate driving, 154 Hz), n=9, m=8, that is, the conversion ratio (n/m)=9/8 (9/4-fold frame rate driving, 135 Hz), n=10, m=1, that is, the conversion ratio (n/m)=10 (20-fold frame rate driving, 1200 Hz), n=10, m=3, that is, the conversion ratio (n/m)=10/3 (20/3-fold frame rate driving, 400 Hz), n=10, m=7, that is, the conversion ratio (n/m)=10/7 (20/7-fold frame rate driving, 171 Hz), and n=10, m=9, that is, the conversion ratio (n/m)=10/9 (20/9-fold frame rate driving, 133 Hz). Note that these frequencies are examples in the case where the input frame rate is 60 Hz. As for other frame rates, the product of an input frame rate multiplied by double of conversion ratio in each case is a driving frequency.

Although specific numbers for n and m in the case where n is an integer more than 10 are not stated here, the procedure in the second step can be obviously applied to various values of n and m.

Note that in the case of J=2, it is particularly effective that the conversion ratio in the first step is larger than 2. This is because when the number of sub-images is comparatively smaller like J=2 in the second step, the conversion ratio in the first step can be higher. Such a conversion ratio includes 3, 4, 5, 5/2, 6, 7, 7/2, 7/3, 8, 8/3, 9, 9/2, 9/4, 10, and 10/3, when n is equal to or less than 10. When display frame rate after the first step is such a value, by setting the value of J at 3 or more balance between an advantage (e.g., reduction of power consumption and a production cost) by the number of sub-images in the second step being small and an advantage (e.g., increase of moving image quality, reduction of flickers) by the final display frame rate being high can be achieved.

Note that although the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, a display method can be pseudo impulse driving, while the original image can be perceived by human eyes; therefore, quality of moving images can be improved. Note that when a method in which an original image is used as it is as a sub-image is selected in the procedure 1 as the case of the above-mentioned driving method, the sub-image can be directly displayed without changing the brightness of the sub-image. This is because an image which is used as a sub-image is the same in this case, and the original image can be displayed properly regardless of display timing of the sub-image.

Further, it is obvious that the number of sub-images J may be another value instead of 2 in the procedure 2. In this case, the display frame rate can be J times as high as the display frame rate obtained by the frame rate conversion using a conversion ratio determined by the values of n and m in the first step; thus, quality of moving images can be further improved. Further, the quality of moving images can be improved than the case where a display frame rate is lower than the display frame rate, and power consumption and a production cost can be reduced than the case where a display frame rate is higher than the display frame rate. Further, in the procedure 1 in the second step, when a method in which an original image is used as it is as a sub-image is selected, a circuit operation which produces an intermediate image by motion compensation can be stopped, or the circuit itself can be omitted from the device, whereby power consumption and a production cost of the device can be reduced. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Furthermore, when the driving frequency of the liquid crystal display device is made high and the frequency of alternating-current driving is an integer multiple or a unit fraction, flickers which appear by alternating-current driving can be reduced so as not to be perceived by human eyes. Moreover image quality can be improved by applying the driving method to the liquid crystal display device in which the response time of the liquid crystal element is approximately (1/(J times the conversion ratio)) of a cycle of input image data.

For example, in the case of J=3, particularly there is advantages that the quality of moving images can be improved compared to the case where the number of sub-images is smaller than 3, and that power consumption and a production cost can be reduced compared to the case where the number of sub-images is larger than 3. Moreover, image quality can be improved by applying the driving method to the liquid crystal display device in which the response time of the liquid crystal element is approximately (1/(three times the conversion ratio)) of a cycle of input image data.

For example, in the case of J=4, particularly there is advantages that the quality of moving images can be improved compared to the case where the number of sub-images is smaller than 4, and that power consumption and a production cost can be reduced compared to the case where the number of sub-images is larger than 4. Moreover, image quality can be improved by applying the driving method to the liquid crystal display device in which the response time of the liquid crystal element is approximately (1/(four times the conversion ratio)) of a cycle of input image data.

For example, in the case of J=5, particularly there is advantages that the quality of moving images can be improved compared to the case where the number of sub-images is smaller than 5, and that power consumption and a production cost can be reduced compared to the case where the number of sub-images is larger than 5. Moreover, image quality can be improved by applying the driving method to the liquid crystal display device in which the response time of the liquid crystal element is approximately (1/(five times the conversion ratio)) of a cycle of input image data.

Furthermore, there are similar advantages even in the case where the number of J is anything other than the above mentioned numbers.

Figure 72:
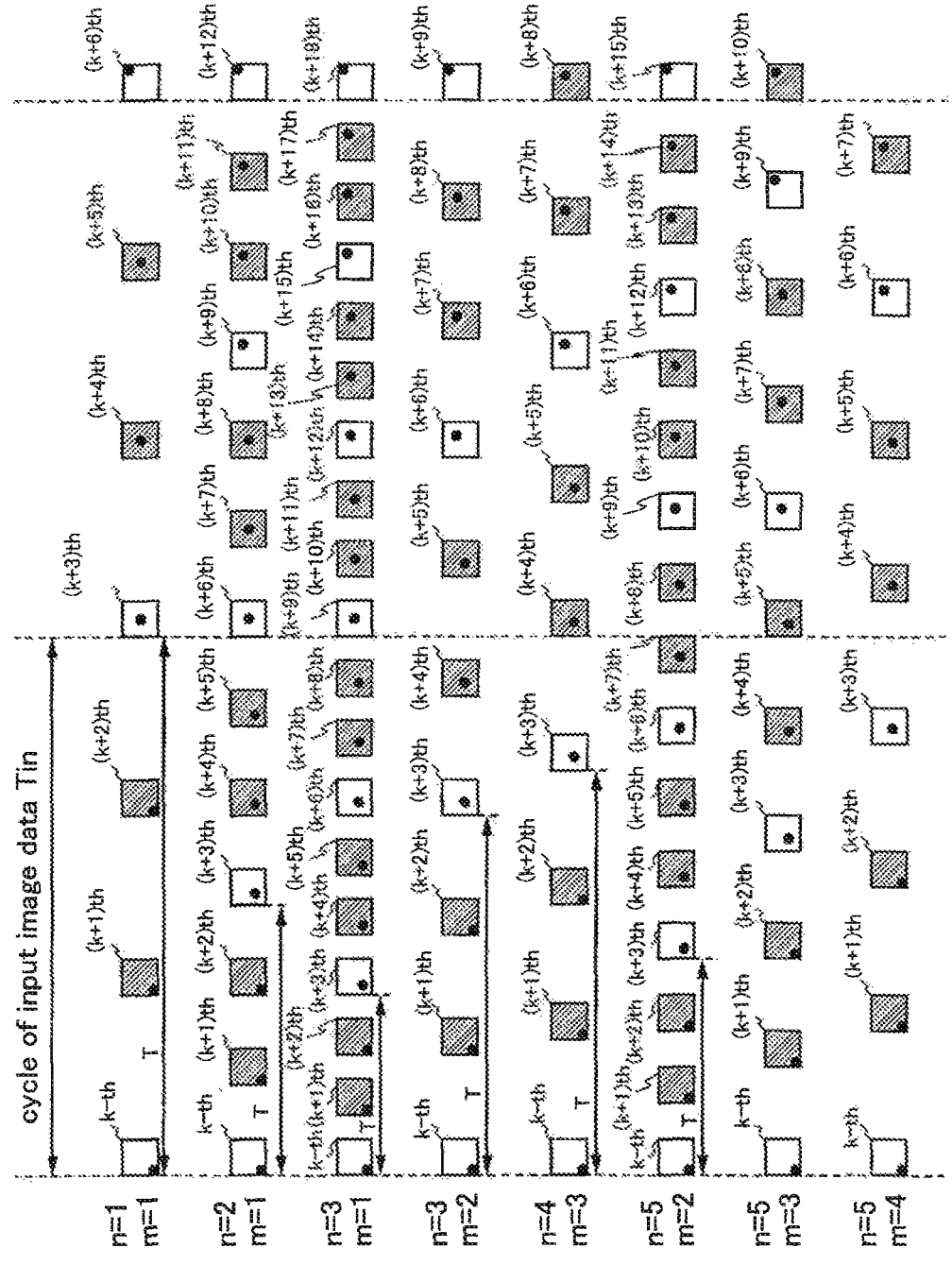
FIG. 72 is a diagram showing an exemplary driving method of a display device of the present invention.

Note that in the case of J=3 or more, the conversion ratio in the first step can be various values. J=3 or more is effective particularly when the conversion ratio in the first step is relatively small (equal to or less than 2). This is because when the display frame rate after the first step is relatively lower, J can be larger in the second step. Such a conversion ratio includes 1, 2, 3/2, 4/3, 5/3, 5/4, 6/5, 7/4, 7/5, 7/6, 8/7, 9/5, 9/7, 9/8, 10/7, and 10/9 when n is equal to or less than 10. FIG. 72 shows the case where the conversion ratio is 1, 2, 3/2, 4/3, 5/3, and 5/4 among the above-described conversion ratios. As described above, when the display frame rate after the first step is a relatively small value, by setting the value of J at 3 or more balance between an advantage (e.g., reduction of power consumption and a production cost) by the number of sub-images in the first step being small and an advantage (e.g., increase of moving image quality, reduction of flickers) by the final display frame rate being high can be achieved.

Next, another example of the driving method determined by the procedure in the second step will be described.

In the procedure 1 in the second step, when black data insertion is selected among methods in which brightness of the original image is distributed to a plurality of sub-images, the driving method is as follows.

One feature of a driving method of the display device is that i-th (I is a positive integer) image data and (i+1)th image data are sequentially prepared in a constant cycle T. The cycle T is divided into J (J is an integer equal to or more than 2) sub-image display periods. The i-th image data is data which can make each of a plurality of pixels have unique brightness L. The j-th (j is an integer equal to or more than 1, and equal to or less than J) sub-image is formed by arranging a plurality of pixels each having unique brightness $L_j$, and is an image which is displayed only during the J-th sub-image display period $T_j$. The aforementioned L, T, $L_j$, and $T_j$ satisfy the sub-image distribution condition. In at least one value of j, the brightness $L_j$ of all pixels which are included in the j-th sub-image is equal to 0. Here, as image data which are prepared sequentially in a constant cycle T, the original image data which is formed in the first step can be used. That is, all display patterns given in the description of the first step can be combined with the above mentioned driving method.

It is obvious that the driving method can be implemented by combining various values of n and m which are used in the first step.

Then, when the number of sub-images J is determined to be 2 in the procedure 2 in the second step, and it is determined that $T_1=T_2=T/2$ in the procedure 3, the driving method can be as shown in FIG. 71. Since features and advantages of the driving method (display timing using various values of n and m) shown in FIG. 71 have already been described, detailed description is omitted here. In the procedure 1 in the second step, even when black data insertion is selected among methods in which brightness of the original image is distributed to a plurality of sub-images, it is obvious that similar advantages can be gained. For example, when an interpolated image in the first step is an intermediate image obtained by motion compensation, motion of a moving image can be smooth; thus, quality of moving images can be significantly improved. The quality of moving images can be improved when the display frame rate is high, and power consumption and a production cost can be reduced when the display frame rate is low. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Flickers which appear by alternating-current driving can be reduced so as not to be perceived by human eyes.

In the procedure 1 in the second step, as a typical advantage of selecting black data insertion among methods in which brightness of the original image is distributed to a plurality of sub-images, a circuit operation which produces an intermediate image by motion compensation can be stopped, or the circuit itself can be omitted from the device, whereby power consumption and a production cost of the device can be reduced. Further, the display method can be pseudo impulse driving regardless of the gray scale value included in the image data; therefore, quality of a moving image can be improved.

Note that the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, the display method can be pseudo impulse driving, while the original image can be perceived by human eyes; therefore, quality of moving images can be improved. Note that as in the case of the above-mentioned driving method, when black data insertion is selected among methods in which brightness of the original image is distributed to a plurality of sub-images in the procedure 1, the sub-image may be directly displayed without changing the brightness of the sub-image. This is because when the brightness of the sub-image is not changed, the original image is merely displayed in such a manner that entire brightness of the original image is low. In other words, when this method is positively used for controlling the brightness of the display device, brightness can be controlled and the quality of moving images increases at the same time.

Further, it is obvious that the number of sub-images J may be another value instead of 2 in the procedure 2. Since advantages in that case have been already described, detailed description is omitted here. In the procedure 1 in the second step, even when black data insertion is selected among methods in which brightness of the original image is distributed to a plurality of sub-images, it is obvious that similar advantages can be gained. For example, image quality can be improved by applying the driving method to the liquid crystal display device in which the response time of the liquid crystal element is approximately ($1/(J$ times the conversion ratio)) of a cycle of input image data.

Next, another example of the driving method determined by the procedure in the second step will be described.

In the procedure 1 in the second step, when a time ratio gray scale controlling method is selected among methods in which brightness of the original image is distributed to a plurality of sub-images, the driving method is as follows.

One feature of a driving method of the display device is that i-th (i is a positive integer) image data and (i+1)th image data are sequentially prepared in a constant cycle T. The cycle T is divided into J (J is an integer equal to or more than 2) sub-image display periods. The i-th image data is data which can make each of a plurality of pixels have unique brightness L. The maximum value of the unique brightness L is $L_{max}$. The J-th (is an integer equal to or more than 1, and equal to or less than J) sub-image is formed by arranging a plurality of pixels each having unique brightness $L_j$ and is an image which is displayed only during the j-th sub-image display period $T_j$. The aforementioned L, T, $L_j$, and $T_j$ satisfy the sub-image distribution condition. When the unique brightness L is displayed, the brightness is adjusted in the range of from $(j-1) \times L_{max}/J$ to $J \times L_{max}/J$ by adjusting brightness in only one sub-image display period among the J sub-image display periods. Here, as image data which are prepared sequentially in a constant cycle T, the original image data which is formed in the first step can be used. That is, all display patterns given in the description of the first step can be combined with the above mentioned driving method.

It is obvious that the driving method can be implemented by combining various values of n and m which are used in the first step.

Then, when the number of sub-images J is determined to be 2 in the procedure 2 in the second step, and it is determined that $T_1=T_2=T/2$ in the procedure 3, the driving method can be as shown in FIG. 71. Since features and advantages of the driving method (display timing using various values of n and m) shown in FIG. 71 have already been described, detailed description is omitted here. In the procedure 1 in the second step, even when the time ratio gray scale controlling method is selected among methods in which brightness of the original image is distributed to a plurality of sub-images, it is obvious similar advantages can be gained. For example, when an interpolated image in the first step is an intermediate image obtained by motion compensation, motion of a moving image can be smooth; thus, quality of moving images can be significantly improved. The quality of moving images can be improved when the display frame rate is high, and power consumption and a production cost can be reduced when the display frame rate is low. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an after-image are reduced. Flickers which appear by alternating-current driving can be reduced so as not to be perceived by human eyes.

In the procedure 1 in the second step, as a typical advantage of selecting the time ratio gray scale controlling method among methods in which brightness of the original image is distributed to a plurality of sub-images, a circuit operation which produces an intermediate image by motion compensation can be stopped, or the circuit itself can be omitted from the device, whereby power consumption and a production cost of the device can be reduced. Further, since the display method can be pseudo impulse driving, quality of a moving image can be improved, and since brightness of the display device does not become lower, power consumption can be further reduced.

Note that although the case where the number of sub-images J is determined to be 2 in the procedure 2 and it is determined that $T_1=T_2T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, the display method can be pseudo impulse driving, while the original image can be perceived by human eyes; therefore, quality of moving image can be improved.

Further, it is obvious that the number of sub-images J may be another value instead of 2 in the procedure 2. Since advantages in that case have been already described, detailed description is omitted here. In the procedure 1 in the second step, even when the time ratio gray scale controlling method is selected among methods in which brightness of the original image is distributed to a plurality of sub-images, it is obvious similar advantages can be gained. For example, image quality can be improved by applying the driving method to the liquid crystal display device in which the response time of the liquid crystal element is approximately (1/(J times the conversion ratio)) of a cycle of input image data.

Next, another example of the driving method determined by the procedure in the second step will be described.

In the procedure 1 in the second step, when gamma complement is selected among methods in which brightness of the original image is distributed to a plurality of sub-images, the driving method is as follows.

One feature of a driving method of the display device is that i-th (i is a positive integer) image data and (i+1)th image data are sequentially prepared in a constant cycle T. The cycle T is divided into J (J is an integer equal to or more than 2) sub-image display periods. The i-th image data is data which can make each of a plurality of pixels have unique brightness L. The j-th (i is an integer equal to or more than 1, and equal to or less than J) sub-image is formed by arranging a plurality of pixels each 6 having unique brightness $L_j$, and is an image which is displayed only during the j-th sub-image display period $T_j$. The aforementioned L, T, $L_j$, and $T_j$ satisfy the sub-image distribution condition. In each sub-image, characteristics of a change of brightness with respect to the gray scale is changed from the linear shape, and total amount of brightness which is changed to a lighter area from the linear shape and the total amount of brightness which is changed to a darker area from the linear shape are almost the same in all gray scale. Here, as image data which are prepared sequentially in a constant cycle T, the original image data which is formed in the first step can be used. That is, all display patterns given in the description of the first step can be combined with the above-mentioned driving method.

It is obvious that the driving method can be implemented by combining various values of n and m which are used in the first step.

Then, when the number of sub-images J is determined to be 2 in the procedure 2 in the second step, and it is determined that $T_1T_2=T/2$ in the procedure 3, the driving method can be as shown in FIG. 71. Since features and advantages of the driving method (display timing using various values of n and m) shown in FIG. 71 have already been described, detailed description is omitted here. In the procedure 1 in the second step, even when gamma complement is selected among methods in which brightness of the original image is distributed to a plurality of sub-images, it is obvious similar advantages can be gained. For example, when an interpolated image in the first step is an intermediate image obtained by motion compensation, motion of moving images can be smooth; thus, quality of moving images can be significantly improved. The quality of moving images can be improved when the display frame rate is high, and power consumption and a production cost can be reduced when the display frame rate is low. Further, when a display device is an active matrix liquid crystal display device, a problem of shortage of writing voltage due to dynamic capacitance can be avoided; thus, quality of moving images can be significantly improved while defects, in particular, such as a phenomenon of a moving image in which traces are seen and an afterimage are reduced. Flickers which appear by alternating-current driving can be reduced so as not to be perceived by human eyes.

In the procedure 1 in the second step, as a typical advantage of selecting gamma complement among methods in which brightness of the original image is distributed to a plurality of sub-images, a circuit operation which produces an intermediate image by motion compensation can be stopped, or the circuit itself can be omitted from the device, whereby power consumption and a production cost of the device can be reduced. Further, since the display method can be pseudo impulse driving regardless of the gray scale value included in the image data, quality of a moving image can be improved. Moreover, image data may be directly subjected to gamma conversion to obtain a sub-image. In this case, there is an advantage in that the gamma value can be controlled variously by the amount of movement of a moving image. Further, without the image data being directly subjected to gamma conversion, a sub-image whose gamma value is changed may be obtained by change of the reference voltage of a digital-to-analog converter circuit (DAC). In this case, since the image data is not directly subjected to gamma conversion, a circuit operation for gamma conversion can be stopped, or the circuit itself can be omitted from the device, whereby power consumption and a production cost of the device can be reduced. Further, in gamma complement, since the change of the brightness $L_j$ of each sub-image with respect to gray scale follows a gamma curve, the gray scale of each sub-image can be displayed smoothly by itself; therefore, there is an advantage in that image quality to be perceived in the end by human eyes is improved.

Note that although the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, the display method can be pseudo impulse driving, while the original image can be perceived by human eyes; therefore, quality of moving images can be improved. In the procedure 1, when gamma complement is selected among methods in which brightness of the original image is distributed to a plurality of sub-images as in the case of the above-mentioned driving method, the gamma value may be changed in the case where brightness of the sub-image is changed. That is, the gamma value may be determined in accordance with display timing of the second sub-image. Accordingly, the operation of a circuit for changing brightness of the entire image can be stopped, or the circuit itself can be omitted from the device, whereby power consumption and a production cost of the device can be reduced.

Further, it is obvious that the number of sub-images J may be another value instead of 2 in the procedure 2. Since advantages in that case have been already described, detailed description is omitted here. In the procedure 1 in the second step, even when gamma complement is selected among methods in which brightness of the original image is distributed to a plurality of sub-images, it is obvious similar advantages can be gained. For example, image quality can be improved by applying the driving method to the liquid crystal display device in which the response time of the liquid crystal element is approximately (1/(J times the conversion ratio)) of a cycle of input image data.

Next, another example of the driving method determined by the procedure in the second step will be described in detail.

When a method in which an intermediate image obtained by motion compensation is used as a sub-image is selected in the procedure 1 in the second step; when the number of sub-images is determined to be 2 in the procedure 2 in the second step; and when it is determined that $T_1=T_2=T/2$ in the procedure 3 in the second step, the driving method determined by the procedures in the second step can be as follows.

One feature of a driving method of the display device is that i-th (i is a positive integer) image data and (f+1)th image data are sequentially prepared in a constant cycle T. A k-th (k is a positive integer) image, a (k+1)th image, and a (k+2)th image are sequentially displayed at half interval of the period of the original image data. The k-th image is displayed in accordance with the i-th image data. The (k+1)th image is displayed in accordance with the image data which corresponds to half amount of the movement of from the i-th image data to the (i+1)th image data. The (k+2)th image is displayed in accordance with the (i+1)th image data. Here, as the image data which are prepared sequentially in a constant cycle T, the original image data which is formed in the first step can be used. That is, all display patterns given in the description of the first step can be combined with the above-mentioned driving method.

It is obvious that the driving method can be implemented by combining various values of n and m which are used in the first step.

In the procedure 1 in the second step, a typical advantage of selecting a method in which an intermediate image obtained by motion compensation is used as a sub-image is that a method for obtaining an intermediate image employed in the first step can be similarly used in the second step when an intermediate image obtained by motion compensation is an interpolated image. In other words, a circuit for obtaining an intermediate image by motion compensation can be used not only in the first step, but also in the second step, whereby the circuit can be used efficiently and treatment efficiency can be increased. In addition, motion of moving images can be further smooth; thus, quality of moving images can be further improved.

Note that although the case where the number of sub-images J is determined to be 2 in the procedure 2 and it is determined that $T_1=T_2=T/2$ in the procedure 3 has been described here, the present invention is not limited to this obviously.

For example, in the case where it is determined that $T_1<T_2$ in the procedure 3 in the second step, the first sub-image can be brightened and the second sub-image can be darkened. Further, in the case where it is determined that $T_1>T_2$ in the procedure 3 in the second step, the first sub-image can be darkened and the second sub-image can be brightened. Thus, the display method can be pseudo impulse driving, while the original image can be perceived by human eyes; therefore, quality of moving images can be improved. Note that as in the case of the above-mentioned driving method, when a method in which an intermediate image obtained by motion compensation is used as a sub-image is selected in the procedure 2, it is not necessary that brightness of the sub-image is changed. This is because the image in an intermediate state is completed as an image in itself, and even when display timing of the second sub-image is changed, the image which is perceived by human eyes is not changed. In this case, the operation of a circuit for changing brightness of the entire image can be stopped, or the circuit itself can be omitted from the device, whereby power consumption and a production cost of the device can be reduced.

Further, it is obvious that the number of sub-images J may be another value instead of 2 in the procedure 2. Since advantages in that case have been already described, detailed description is omitted here. In the procedure 1 in the second step, even when a method in which an intermediate image obtained by motion compensation is used as a sub-image is selected, it is obvious similar advantages can be gained. For example, image quality can be improved by applying the driving method to the liquid crystal display device in which the response time of the liquid crystal element is approximately (1/(J times the conversion ratio)) of a cycle of input image data.

Next, specific examples of a method for converting the frame rate when the input frame rate and the display frame rate are different are described with reference to FIGS. 73A to 73C. In methods shown in FIGS. 73A to 73C, circular regions in images are changed from frame to frame, and triangle regions in the images are hardly changed from frame to frame. Note that the images are just examples for explanation, and the images to be displayed are not limited to these examples. The methods shown in FIGS. 73A to 73C can be applied to various images.

Figure 73A:
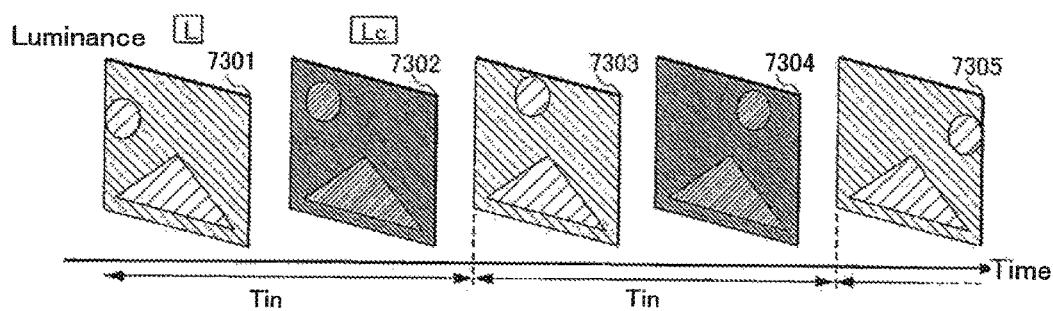
FIGS. 73A to 73C are diagrams showing exemplary driving methods of a display device of the present invention.

FIG. 73A shows the case where the display frame rate is twice as high as the input frame rate (the conversion ratio is 2). When the conversion ratio is 2, there is an advantage in that quality of moving images can be improved compared to the case where the conversion ratio is less than 2. Further, when the conversion ratio is 2, there is an advantage in that power consumption and manufacturing cost can be reduced compared to the case where the conversion ratio is more than 2. FIG. 73A schematically shows time change in images to be displayed with time represented by the horizontal axis. Here, a focused image is referred to as a p-th image (p is a positive integer). An image displayed after the focused image is referred to as a (p+1)th image, and an image displayed before the focused image is referred to as a (p−1)th image, for example. Thus, how far an image to be displayed is apart from the focused image is described for convenience. An image 7301 is the p-th image; an image 7302 is the (p+1)th image; an image 7303 is a (p+2)th image; an image 7304 is a (p+3)th image; and an image 7305 is a (p+4)th image. The period $T_{in}$ shows a cycle of input image data. Note that since FIG. 73A shows the case where the conversion ratio is 2, the period $T_{in}$ is twice as long as a period after the p-th image is displayed until the (p+1)th image is displayed.

Here, the (p+1)th image 7302 may be an image which is made to be in an intermediate state between the p-th image 7301 and the (p+2)th image 7303 by detecting the amount of change in the images from the p-th image 7301 to the (p+2)th image 7303. FIG. 73A shows an image in an intermediate state by a region whose position is changed from frame to frame (the circular region) and a region whose position is hardly changed from frame to frame (the triangle region). In other words, the position of the circular region in the (p+1)th image 7302 is an intermediate position between the positions of the circular regions in the p-th image 7301 and the (p+2)th image 7303. That is, as for the (p+1)th image 7302, image data is interpolated by motion compensation. When motion compensation is performed on a moving object on the image in this manner to interpolate the image data, smooth display can be performed.

Further, the (p+1)th image 7302 may be an image which is made to be in an intermediate state between the p-th image 7301 and the (p+2)th image 7303 and may be an image, luminance of which is controlled by a certain rule. As the certain rule, for example, $L>L_c$ may be satisfied when typical luminance of the p-th image 7301 is denoted by L and typical luminance of the (p+1)th image 7302 is denoted by $L_c$, as shown in FIG. 73A. Preferably, $0.1L<L_c<0.8L$ is satisfied, and more preferably $0.2L<L_c<0.5L$ is satisfied. Alternatively, $L<L_c$ may be satisfied, preferably $0.1L_c<L<0.8L_c$ is satisfied, and more preferably $0.2L_c<L<0.54L_c$ is satisfied. In this manner, display can be made pseudo impulse display, so that an afterimage perceived by human eyes can be suppressed.

Note that typical luminance of the images is described later in detail with reference to FIGS. 74A to 74E.

When two different causes of motion blur (non-smoothness in movement of images and an afterimage perceived by human eyes) are removed at the same time in this manner, motion blur can be considerably reduced.

Moreover, the (p+3)th image 7304 may also be formed from the (p+2)th image 7303 and the (p+4)th image 7305 by using a similar method. That is, the (p+3)th image 7304 may be an image which is made to be in an intermediate state between the (p+2)th image 7303 and the (p+4)th image 7305 by detecting the amount of change in the images from the (p+2)th image 7303 to the (p+4)th image 7305 and may be an image, luminance of which is controlled by a certain rule.

Figure 73B:
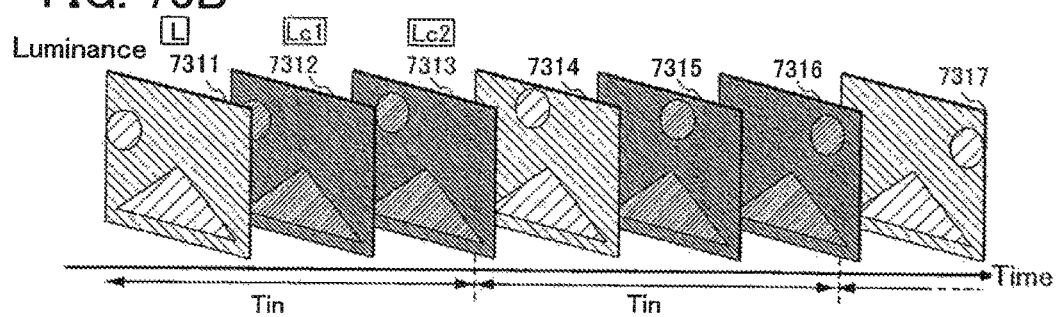

FIG. 73B shows the case where the display frame rate is three times as high as the input frame rate (the conversion ratio is 3). FIG. 73B schematically shows time change in images to be displayed with time represented by the horizontal axis. An image 7311 is the p-th image; an image 7312 is the (p+1)th image; an image 7313 is a (p+2)th image; an image 7314 is a (p+3)th image; an image 7315 is a (p+4)th image; an image 7316 is a (p+5)th image; and an image 7317 is a (p+6)th image. The period $T_{in}$ shows a cycle of input image data. Note that since FIG. 73B shows the case where the conversion ratio is 3, the period $T_{in}$ is three times as long as a period after the p-th image is displayed until the (p+1)th image is displayed.

Here, each of the (p+1)th image 7312 and the (p+2)th image 7313 may be an image which is made to be in an intermediate state between the p-th image 7311 and the (p+3)th image 7314 by detecting the amount of change in the images from the p-th image 7311 to the (p+3)th image 7314. FIG. 73B shows an image in an intermediate state by a region whose position is changed from frame to frame (the circular region) and a region whose position is hardly changed from frame to frame (the triangle region). That is, the position of the circular region in each of the (p+1)th image 7312 and the (p+2)th image 7313 is an intermediate position between the positions of the circular regions in the p-th image 7311 and the (p+3)th image 7314. Specifically, when the amount of movement of the circular regions detected from the p-th image 7311 and the (p+3)th image 7314 is denoted by X; the position of the circular region in the (p+1)th image 7312 may be displaced by approximately (⅓)X from the position of the circular region in the p-th image 7311. Further, the position of the circular region in the (p+2)th image 7313 may be displaced by approximately (⅔)X from the position of the circular region in the p-th image 7311. That is, as for each of the (p+1)th image 7312 and the (p+2)th image 7313, image data is interpolated by motion compensation. When motion compensation is performed on a moving object on the image in this manner to interpolate the image data, smooth display can be performed.

Further, each of the (p+1)th image 7312 and the (p+2)th image 7313 may be an image which is made to be in an intermediate state between the p-th image 7311 and the (p+3)th image 7314 and may be an image, luminance of which is controlled by a certain rule. As the certain rule, for example, $L>L_c1$, $L>L_c2$, or $L_c1=L_c2$ may be satisfied when typical luminance of the p-th image 7311 is denoted by L, typical luminance of the (p+1)th image 7312 is denoted by $L_c1$, and typical luminance of the (p+2)th image 7313 is denoted by $L_c2$, as shown in FIG. 73B. Preferably, $0.1L<L_c1=L_c2<0.8L$ is satisfied, and more preferably $0.2L<L_c1=L_c2<0.5L$ is satisfied. Alternatively, $L<L_c1$, $L<L_c2$, or $L_c1=L_c2$ may be satisfied, preferably $0.1L_c1=0.1L_c2<L<0.8L_c1=0.8L_c2$ is satisfied, and more preferably $0.2L_c1=0.2L_c2<L<0.5L_c1=0.5L_c2$ is satisfied. In this manner, display can be made pseudo impulse display, so that an afterimage perceived by human eyes can be suppressed. Alternatively, images, luminance of which is changed, may be made to appear alternately. In this manner, a cycle of luminance change can be shortened, so that flickers can be reduced.

When two different causes of motion blur (non-smoothness in movement of images and an afterimage perceived by human eyes) are removed at the same time in this manner, motion blur can be considerably reduced.

Moreover, each of the (p+4)th image 7315 and the (p+5)th image 7316 may also be formed from the (p+3)th image 7314 and the (p+6)th image 7317 by using a similar method. That is, each of the (p+4)th image 7315 and the (p+5)th image 7316 may be an image which is made to be in an intermediate state between the (p+3)th image 7314 and the (p+6)th image 7317 by detecting the amount of change in the images from the (p+3)th image 7314 to the (p+6)th image 7317 and may be an image, luminance of which is controlled by a certain rule.

Note that when the method shown in FIG. 73B is used, the display frame rate is so high that movement of the image can follow movement of human eyes, so that movement of the image can be displayed smoothly. Therefore, motion blur can be considerably reduced.

Figure 73C:
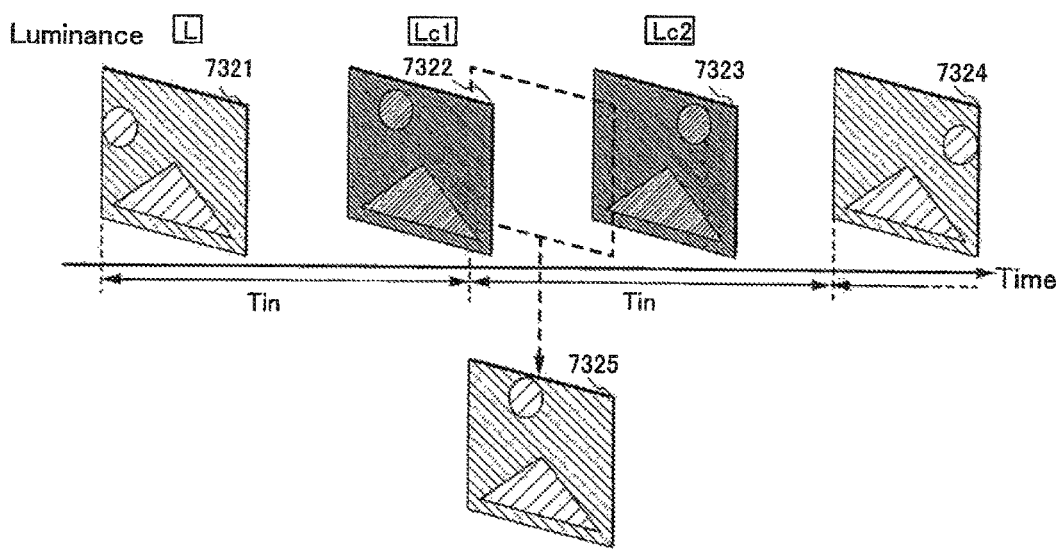

FIG. 73C shows the case where the display frame rate is 1.5 times as high as the input frame rate (the conversion ratio is 1.5). FIG. 73C schematically shows time change in images to be displayed with time represented by the horizontal axis. An image 7321 is the p-th image; an image 7322 is the (p+1)th image; an image 7323 is the (p+2)th image; and an image 7324 is the (p+3)th image. Note that although not necessarily displayed actually, an image 7325, which is input image data, may be used to form the (p+1)th image 7322 and the (p+2)th image 7323. The period $T_{in}$ shows a cycle of input image data. Note that since FIG. 73C shows the case where the conversion ratio is 1.5, the period $T_{in}$ is 1.5 times as long as a period after the p-th image is displayed until the (p+1)th image is displayed.

Here, each of the (p+1)th image 7322 and the (p+2)th image 7323 may be an image which is made to be in an intermediate state between the p-th image 7321 and the (p+3)th image 7324 by detecting the amount of change in the images from the p-th image 7321 to the (p+3)th image 7324 via the image 7325. FIG. 73C shows an image in an intermediate state by a region whose position is changed from frame to frame (the circular region) and a region whose position is hardly changed from frame to frame (the triangle region). That is, the position of the circular region in each of the (p+1)th image 7322 and the (p+2)th image 7323 is an intermediate position between the positions of the circular regions in the p-th image 7321 and the (p+3)th image 7324. That is, as for each of the (p+1)th image 7322 and the (p+2)th image 7323, image data is interpolated by motion compensation. When motion compensation is performed on a moving object on the image in this manner to interpolate the image data, smooth display can be performed.

Further each of the (p+1)th image 7322 and the (p+2)th image 7323 may be an image which is made to be in an intermediate state between the p-th image 7321 and the (p+3)th image 7324 and may be an image, luminance of which is controlled by a certain rule. As the certain rule, for example, $L>L_c1$, $L>L_c2$, or $L_c1=L_c2$ is satisfied when typical luminance of the p-th image 7321 is denoted by L, typical luminance of the (p+1)th image 7322 is denoted by $L_c1$, and typical luminance of the (p+2)th image 7323 is denoted by $L_c2$, as shown in FIG. 73C. Preferably, $0.1L<L_c1=L_c2<0.8L$ is satisfied, and more preferably $0.2L<L_c1=L_c2<0.5L$ is satisfied. Alternatively, $L<L_c1$, $L<L_c2$, or $L_c1=L_c2$ may be satisfied, preferably $0.1L_c1=0.1L_c2<L<0.8L_c1=0.8L_c2$ is satisfied, and more preferably $0.2L_c1=0.2L_c2<L<0.5L_c1=0.5L_c2$ is satisfied. In this manner, display can be made pseudo impulse display, so that an afterimage perceived by human eyes can be suppressed. Alternatively, images, luminance of which is changed, may be made to appear alternately. In this manner, a cycle of luminance change can be shortened, so that flickers can be reduced.

When two different causes of motion blur (non-smoothness in movement of images and an afterimage perceived by human eyes) are removed at the same time in this manner, motion blur can be considerably reduced.

Note that when the method shown in FIG. 73C is used, the display frame rate is so low that time for writing a signal to a display device can be increased. Therefore, clock frequency of the display device can be made lower, so that power consumption can be reduced. Further, processing speed of motion compensation can be decreased, so that power consumption can be reduced.

Next, typical luminance of images is described with reference to FIGS. 74A to 74E. FIGS. 74A to 74D each schematically show time change in images to be displayed with time represented by the horizontal axis. FIG. 74B shows an example of a method for measuring luminance of an image in a certain region.

An example of a method for measuring luminance of an image is a method for individually measuring luminance of each pixel which forms the image. With this method, luminance in every detail of the image can be strictly measured.

Note that since a method for individually measuring luminance of each pixel which forms the image needs much energy, another method may be used. An example of another method for measuring luminance of an image is a method for measuring average luminance of a region in an image, which is focused. With this method, luminance of an image can be easily measured. In this embodiment mode, luminance measured by a method for measuring average luminance of a region in an image is referred to as typical luminance of an image for convenience.

Then, which region in an image is focused in order to measure typical luminance of the image is described below.

Figure 74A:
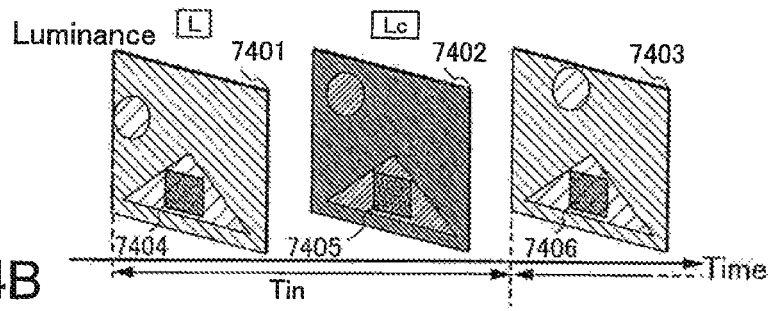
FIGS. 74A to 74E are diagrams showing exemplary driving methods of a display device of the present invention.
Figure 74B:
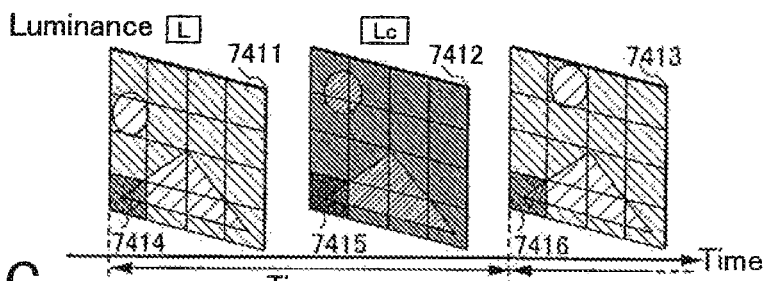

FIG. 74A shows an example of a measuring method in which luminance of a region whose position is hardly changed with respect to change in an image (the triangle region) is typical luminance of the image. The period $T_{in}$ shows a cycle of input image data; an image 7401 is the p-th image; an image 7402 is the (p+1)th image; an image 7403 is the (p+2)th image; a first region 7404 is a luminance measurement region in the p-th image 7401; a second region 7405 is a luminance measurement region in the (p+1)th image 7402; and a third region 7406 is a luminance measurement region in the (p+2)th image 7403. Here, the first to third regions may be provided in almost the same spatial positions in a device. That is, when typical luminance of the images is measured in the first to third regions, time change in typical luminance of the images can be calculated.

When the typical luminance of the images is measured, whether display is made pseudo impulse display or not can be judged. For example, if $L_c<L$ is satisfied when luminance measured in the first region 7404 is denoted by L and luminance measured in the second region 7405 is denoted by $L_c$, it can be said that display is made pseudo impulse display. At that time, it can be said that quality of a moving image is improved.

Note that when the amount of change in typical luminance of the images with respect to time change (relative luminance) in the luminance measurement regions is in the following range, image quality can be improved. As for relative luminance, for example, relative luminance between the first region 7404 and the second region 7405 can be the ratio of lower luminance to higher luminance; relative luminance between the second region 7405 and the third region 7406 can be the ratio of lower luminance to higher luminance; and relative luminance between the first region 7404 and the third region 7406 can be the ratio of lower luminance to higher luminance. That is, when the amount of change in typical luminance of the images with respect to time change (relative luminance) is 0, relative luminance is 100%. When the relative luminance is less than or equal to 80%, quality of a moving image can be improved. In particular, when the relative luminance is less than or equal to 50%, quality of a moving image can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of a moving image can be improved and power consumption and flickers can be reduced. Further, when the relative luminance is more than or equal to 20% and less than or equal to 50%, quality of a moving image can be significantly improved and power consumption and flickers can be significantly reduced.

FIG. 74B shows an example of a method in which luminance of regions which are divided into tiled shapes is measured and an average value thereof is typical luminance of an image. The period $T_{in}$ shows a cycle of input image data; an image 7411 is the p-th image; an image 7412 is the (p+1)th image; an image 7413 is the (p+2)th image; a first region 7414 is a luminance measurement region in the p-th image 7411; a second region 7415 is a luminance measurement region in the (p+1)th image 7412; and a third region 7416 is a luminance measurement region in the (p+2)th image 7413. Here, the first to third regions may be provided in almost the same spatial positions in a device. That is, when typical luminance of the images is measured in the first to third regions, time change in typical luminance of the images can be measured.

When the typical luminance of the images is measured, whether display is made pseudo impulse display or not can be judged. For example, if $L_c<L$ is satisfied when luminance measured in the first region 7414 is denoted by L and luminance measured in the second region 7415 is denoted by Lc, it can be said that display is made pseudo impulse display. At that time, it can be said that quality of a moving image is improved.

Note that when the amount of change in typical luminance of the images with respect to time change (relative luminance) in the luminance measurement regions is in the following range, image quality can be improved. As for relative luminance, for example, relative luminance between the first region 7414 and the second region 7415 can be the ratio of lower luminance to higher luminance; relative luminance between the second region 7415 and the third region 7416 can be the ratio of lower luminance to higher luminance; and relative luminance between the first region 7414 and the third region 7416 can be the ratio of lower luminance to higher luminance. That is, when the amount of change in typical luminance of the images with respect to time change (relative luminance) is 0, relative luminance is 100%. When the relative luminance is less than or equal to 80%, quality of a moving image can be improved. In particular, when the relative luminance is less than or equal to 50%, quality of a moving image can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of a moving image can be improved and power consumption and flickers can be reduced. Further, when the relative luminance is more than or equal to 20% and less than or equal to 50%, quality of a moving image can be significantly improved and power consumption and flickers can be significantly reduced.

Figure 74C:
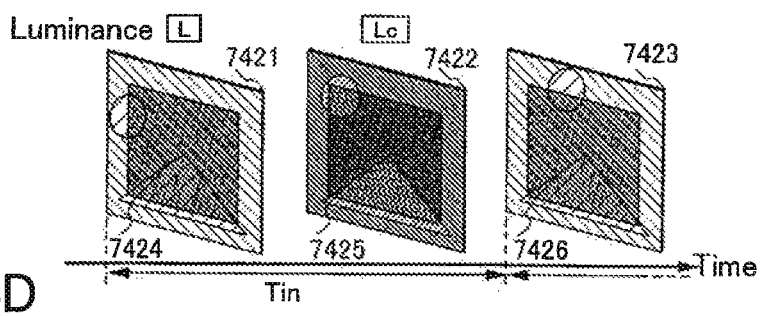

FIG. 74C shows an example of a method in which luminance of a center region in an image is measured and an average value thereof is typical luminance of the image. The period $T_{in}$ shows a cycle of input image data; an image 7421 is the p-th image; an image 7422 is the (p+1)th image; an image 7423 is the (p+2)th image; a first region 7424 is a luminance measurement region in the p-th image 7421; a second region 7425 is a luminance measurement region in the (p+1)th image 7422; and a third region 7426 is a luminance measurement region in the (p+2)th image 7423.

When the typical luminance of the images is measured, whether display is made pseudo impulse display or not can be judged. For example, if $L_c < L$ is satisfied when luminance measured in the first region 7424 is denoted by L and luminance measured in the second region 7425 is denoted by $L_c$, it can be said that display is made pseudo impulse display. At that time, it can be said that quality of a moving image is improved.

Note that when the amount of change in typical luminance of the images with respect to time change (relative luminance) in the luminance measurement regions is in the following range, image quality can be improved. As for relative luminance, for example, relative luminance between the first region 7424 and the second region 7425 can be the ratio of lower luminance to higher luminance; relative luminance between the second region 7425 and the third region 7426 can be the ratio of lower luminance to higher luminance; and relative luminance between the first region 7424 and the third region 7426 can be the ratio of lower luminance to higher luminance. That is, when the amount of change in typical luminance of the images with respect to time change (relative luminance) is 0, relative luminance is 100%. When the relative luminance is less than or equal to 80%, quality of a moving image can be improved. In particular, when the relative luminance is less than or equal to 50%, quality of a moving image can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of a moving image can be improved and power consumption and flickers can be reduced. Further, when the relative luminance is more than or equal to 20% and less than or equal to 50%, quality of a moving image can be significantly improved and power consumption and flickers can be significantly reduced.

Figure 74D:
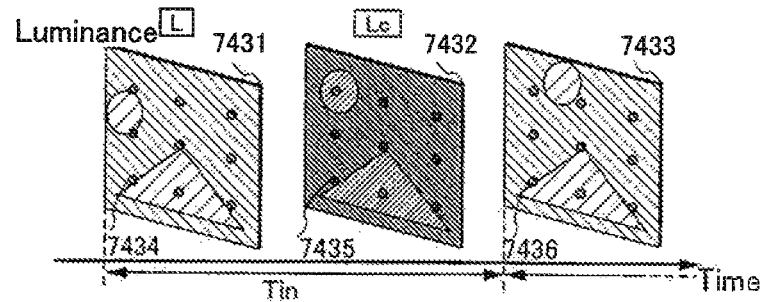

FIG. 74D shows an example of a method in which luminance of a plurality of points sampled from the entire image is measured and an average value thereof is typical luminance of the image. The period $T_{in}$ shows a cycle of input image data; an image 7431 is the p-th image; an image 7432 is the (p+1)th image; an image 7433 is the (p+2)th image; a first region 7434 is a luminance measurement region in the p-th image 7431; a second region 7435 is a luminance measurement region in the (p+1)th image 7432; and a third region 7436 is a luminance measurement region in the (p+2)th image 7433.

When the typical luminance of the images is measured, whether display is made pseudo impulse display or not can be judged. For example, if $L_c < L$ is satisfied when luminance measured in the first region 7434 is denoted by L and luminance measured in the second region 7435 is denoted by $L_c$, it can be said that display is made pseudo impulse display. At that time, it can be said that quality of a moving image is improved.

Note that when the amount of change in typical luminance of the images with respect to time change (relative luminance) in the luminance measurement regions is in the following range, image quality can be improved. As for relative luminance, for example, relative luminance between the first region 7434 and the second region 7435 can be the ratio of lower luminance to higher luminance; relative luminance between the second region 7435 and the third region 7436 can be the ratio of lower luminance to higher luminance; and relative luminance between the first region 7434 and the third region 7436 can be the ratio of lower luminance to higher luminance. That is, when the amount of change in typical luminance of the images with respect to time change (relative luminance) is 0, relative luminance is 100%. When the relative luminance is less than or equal to 80%, quality of a moving image can be improved. In particular, when the relative luminance is less than or equal to 50%, quality of a moving image can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of a moving image can be improved and power consumption and flickers can be reduced. Further, when the relative luminance is more than or equal to 20% and less than or equal to 50%, quality of a moving image can be significantly improved and power consumption and flickers can be significantly reduced.

Figure 74E:
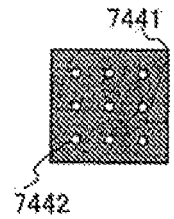

FIG. 74E shows a measurement method in the luminance measurement regions shown in FIGS. 74A to 74D. A region 7441 is a focused luminance measurement region, and a point 7442 is a luminance measurement point in the region 7441. In a luminance measurement apparatus having high time resolution, a measurement range thereof is small in some cases. Therefore, in the case where the region 7441 is large, unlike the case of measuring the whole region, a plurality of points in the region 7441 may be measured uniformly by dots and an average value thereof may be the luminance of the region 744, as shown in FIG. 74E.

Note that in the case where the image is formed using combination of three primary colors of R, G, and B, luminance to be measured may be luminance of R, G, and B, luminance of R and G, luminance of G and B, luminance of B and R, or each luminance of R, G, and B.

Next, a method for producing an image in an intermediate state by detecting movement of an image, which is included in input image data, and a method for controlling a driving method in accordance with movement of an image, which is included in input image data, or the like are described.

Figure 75A:
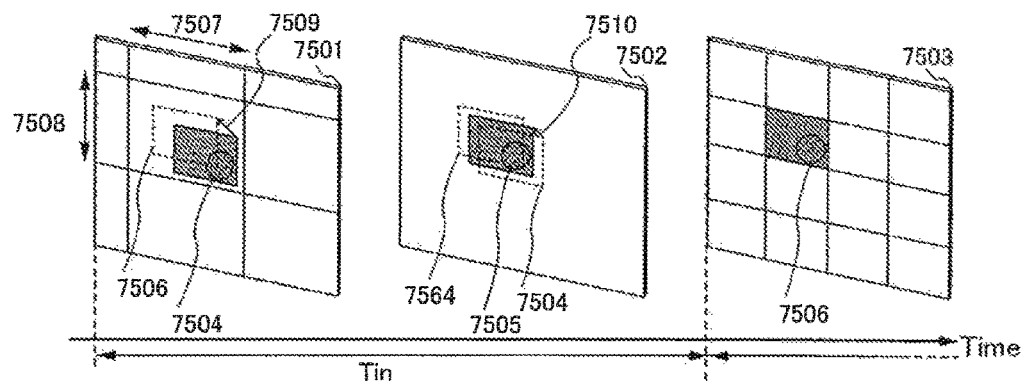
FIGS. 75A and 75B are diagrams showing exemplary driving methods of a display device of the present invention.

A method for producing an image in an intermediate state by detecting movement of an image, which is included in input image data, is described with reference to FIGS. 75A and 75B. FIG. 75A shows the case where the display frame rate is twice as high as the input frame rate (the conversion ratio is 2). FIG. 75A schematically shows a method for detecting movement of an image with time represented by the horizontal axis. The period $T_{in}$ shows a cycle of input image data; an image 7501 is the p-th image; an image 7502 is the (p+1)th image; and an image 7503 is the (p+2)th image. Further, as regions which are independent of time, a first region 7504, a second region 7505, and a third region 7506 are provided in images.

First, in the (p+2)th image 7503, the image is divided into a plurality of tiled regions, and image data in the third region 7506 which is one of the regions is focused.

Next, in the p-th image 7501, a region which uses the third region 7506 as the center and is larger than the third region 7506 is focused. Here, the region which uses the third region 7506 as the center and is larger than the third region 7506 corresponds to a data retrieval region. In the data retrieval region, a range in a horizontal direction (an X direction) is denoted by 7507 and a range in a perpendicular direction (a Y direction) is denoted by 7508. Note that the range in the horizontal direction 7507 and the range in the perpendicular direction 7508 may be ranges in which each of a range in a horizontal direction and a range in a perpendicular direction of the third region 7506 is enlarged by approximately 15 pixels.

Then, in the data retrieval region, a region having image data which is most similar to the image data in the third region 7506 is retrieved. As a retrieval method, a least-squares method or the like can be used. As a result of retrieval, it is assumed that the first region 7504 be derived as the region having the most similar image data.

Next, as an amount which shows positional difference between the derived first region 7504 and the third region 7506, a vector 7509 is derived. Note that the vector 7509 is referred to as a motion vector.

Then, in the (p+1)th image 7502, the second region 7505 is formed by a vector calculated from the motion vector 7509, the image data in the third region 7506 in the (p+2)th image 7503, and image data in the first region 7504 in the p-th image 7501.

Here, the vector calculated from the motion vector 7509 is referred to as a displacement vector 7510. The displacement vector 7510 has a function of determining a position in which the second region 7505 is formed. The second region 7505 is formed in a position which is apart from the third region 7506 by the displacement vector 7510. Note that the amount of the displacement vector 7510 may be an amount which is obtained by multiplying the motion vector 7509 by a coefficient (½).

Image data in the second region 7505 in the (p+1)th image 7502 may be determined by the image data in the third region 7506 in the (p+2)th image 7503 and the image data in the first region 7504 in the p-th image 7501. For example, the image data in the second region 7505 in the (p+1)th image 7502 may be an average value between the image data in the third region 7506 in the (p+2)th image 7503 and the image data in the first region 7504 in the p-th image 7501.

In this manner, the second region 7505 in the (p+1)th image 7502, which corresponds to the third region 7506 in the (p+2)th image 7503, can be formed. Note that when the above-described treatment is also performed on other regions in the (p+2)th image 7503, the (p+1)th image 7502 which is made to be in an intermediate state between the (p+2)th image 7503 and the p-th image 7501 can be formed.

Figure 75B:
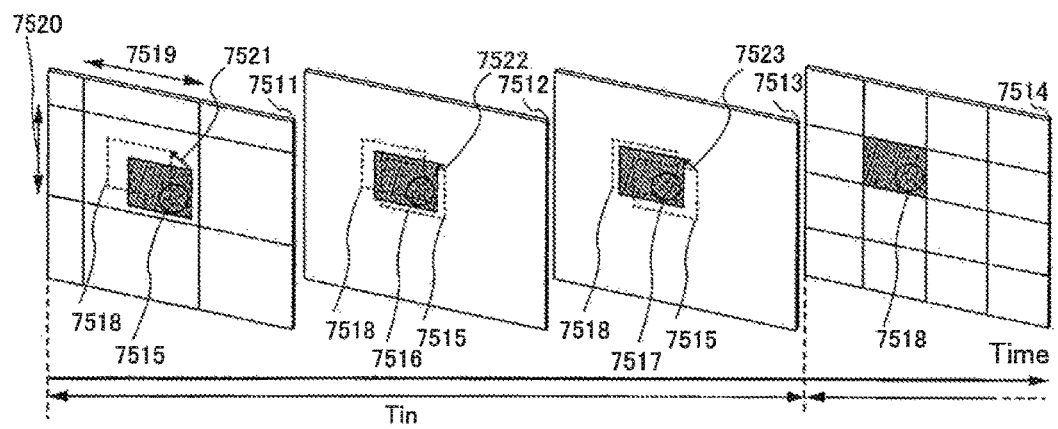

FIG. 75B shows the case where the display frame rate is three times as high as the input frame rate (the conversion ratio is 3). FIG. 75B schematically shows a method for detecting movement of an image with time represented by the horizontal axis. The period $T_{in}$ shows a cycle of input image data; an image 7511 is the p-th image; an image 7512 is the (p+1)th image; an image 7513 is the (p+2)th image; and an image 7514 is the (p+3)th image. Further, as regions which are independent of time, a first region 7515, a second region 7516, a third region 7517, and a fourth region 7518 are provided in images.

First, in the (p+3)th image 7514, the image is divided into a plurality of tiled regions, and image data in the fourth region 7518 which is one of the regions is focused.

Next, in the p-th image 7511, a region which uses the fourth region 7518 as the center and is larger than the fourth region 7518 is focused. Here, the region which uses the fourth region 7518 as the center and is larger than the fourth region 7518 corresponds to a data retrieval region. In the data retrieval region, a range in a horizontal direction (an X direction) is denoted by 7519 and a range in a perpendicular direction (a Y direction) is denoted by 7520. Note that the region in the horizontal direction 7519 and the range in the perpendicular direction 7520 may be ranges in which each of a range in a horizontal direction and a range in a perpendicular direction of the fourth region 7518 is enlarged by approximately 15 pixels.

Then, in the data retrieval region, a region having image data which is most similar to the image data in the fourth region 7518 is retrieved. As a retrieval method, a least-squares method or the like can be used. As a result of retrieval, it is assumed that the first region 7515 be derived as the region having the most similar image data.

Next, as an amount which shows positional difference between the derived first region 7515 and the fourth region 7518, a vector 7521 is derived. Note that the vector 7521 is referred to as a motion vector.

Then, in each of the (p+1)th image 7512 and the (p+2)th image 7513, the second region 7516 and the third region 7517 are formed by a vector 7522 and a vector 7523 calculated from the motion vector 7521, the image data in the fourth region 7518 in the (p+3)th image 7514, and image data in the first region 7515 in the p-th image 7511.

Here, the vector 7522 calculated from the motion vector 7521 is referred to as a first displacement vector 7522. In addition, the vector 7523 is referred to as a second displacement vector. The first displacement vector 7522 has a function of determining a position in which the second region 7516 is formed. The second region 7516 is formed in a position which is apart from the fourth region 7518 by the first displacement vector 7522. Note that the first displacement vector 7522 may be an amount which is obtained by multiplying the motion vector 7521 by a coefficient (⅓). Further, the second displacement vector 7523 has a function of determining a position in which the third region 7517 is formed. The third region 7517 is formed in a position which is apart from the fourth region 7518 by the second displacement vector 7523. Note that the second displacement vector 7523 may be an amount which is obtained by multiplying the motion vector 7521 by a coefficient (⅔).

Image data in the second region 7516 in the (p+1)th image 7512 may be determined by the image data in the fourth region 7518 in the (p+3)th image 7514 and the image data in the first region 7515 in the p-th image 7511. For example, the image data in the second region 7516 in the (p+1)th image 7512 may be an average value between the image data in the fourth region 7518 in the (p+3)th image 7514 and the image data in the first region 7515 in the p-th image 7511.

Image data in the third region 7517 in the (p+2)th image 7513 may be determined by the image data in the fourth region 7518 in the (p+3)th image 7514 and the image data in the first region 7515 in the p-th image 7511. For example, the image data in the third region 7517 in the (p+2)th image 7513 may be an average value between the image data in the fourth region 7518 in the (p+3)th image 7514 and the image data in the first region 7515 in the p-th image 7511.

In this manner, the second region 7516 in the (p+1)th image 7512 and the third region 7517 in the (p+2)th image 7513 which correspond to the fourth region 7518 in the (p+3)th image 7514 can be formed. Note that when the above-described treatment is also performed on other regions in the (p+3)th image 7514, the (p+1)th image 7512 and the (p+2)th image 7513 which are made to be in an intermediate state between the (p+3)th image 7514 and the p-th image 7511 can be formed.

Figure 76A:
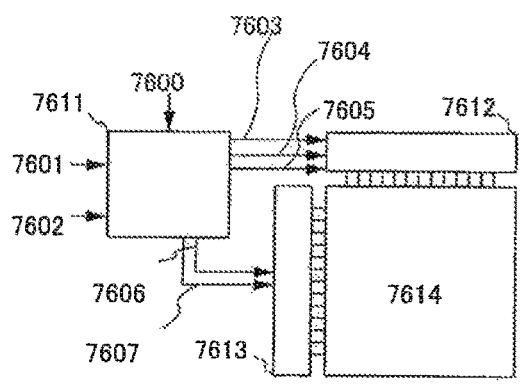
FIGS. 76A to 76D are diagrams showing an exemplary driving method of a display device of the present invention.
Figure 76B:
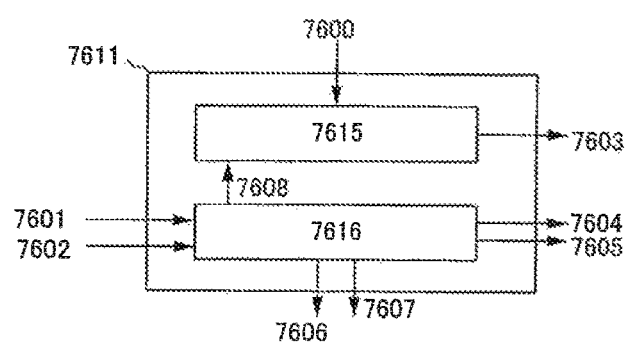
Figure 76C:
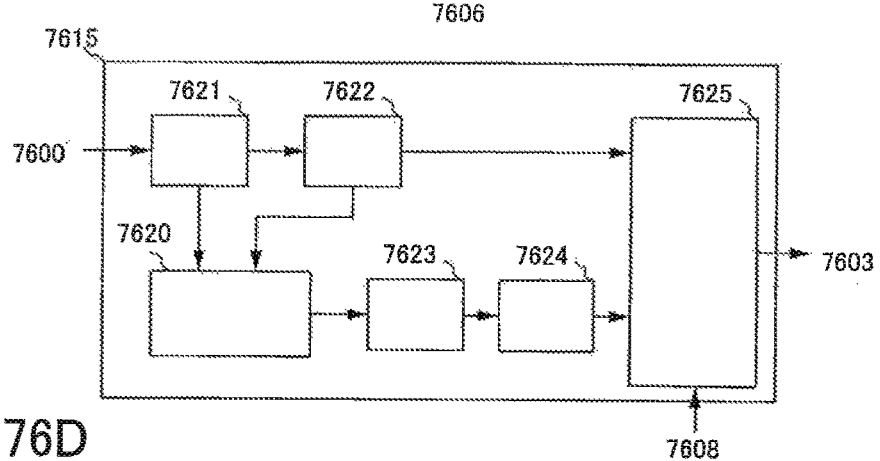
Figure 76D:
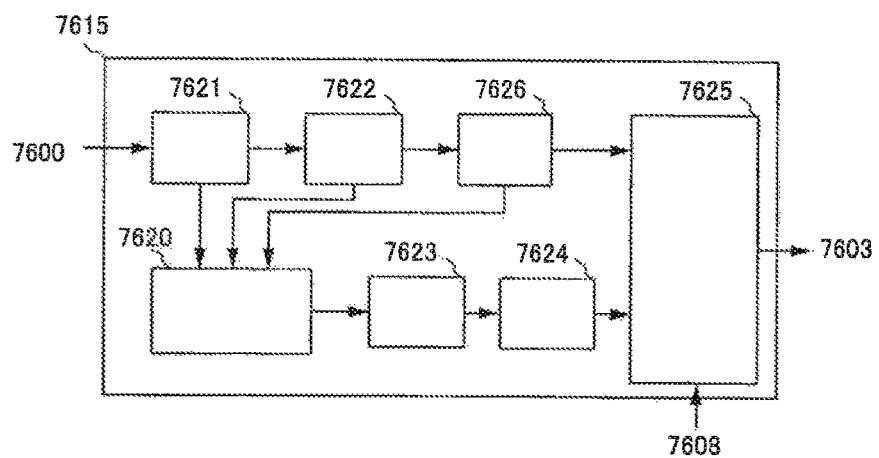

Next, an example of a circuit which produces an image in an intermediate state by detecting movement of an image, which is included in input image data, is described with reference to FIGS. 76A to 76D. FIG. 76A shows a connection relation between a peripheral driver circuit including a source driver and a gate driver for displaying an image on a display region, and a control circuit for controlling the peripheral driver circuit. FIG. 76B shows an example of a specific circuit structure of the control circuit. FIG. 76C shows an example of a specific circuit structure of an image processing circuit included in the control circuit. FIG. 76D shows another example of the specific circuit structure of the image processing circuit included in the control circuit.

As shown in FIG. 76A, a device in this embodiment mode may include a control circuit 7611, a source driver 7612, a gate driver 7613, and a display region 7614.

Note that the control circuit 7611, the source driver 7612, and the gate driver 7613 may be formed over the same substrate as the display region 7614.

Note that part of the control circuit 7611, the source driver 7612, and the gate driver 7613 may be formed over the same substrate as the display region 7614, and other circuits may be formed over a different substrate from that of the display region 7614. For example, the source driver 7612 and the gate driver 7613 may be formed over the same substrate as the display region 7614, and the control circuit 7611 may be formed over a different substrate as an external IC. Similarly, the gate driver 7613 may be formed over the same substrate as the display region 7614, and other circuits may be formed over a different substrate as an external IC. Similarly, part of the source driver 7612, the gate driver 7613, and the control circuit 7611 may be formed over the same substrate as the display region 7614, and other circuits may be formed over a different substrate as an external IC.

The control circuit 7611 may have a structure to which an external image signal 7600, a horizontal synchronization signal 7601, and a vertical synchronization signal 7602 are input and an image signal 7603, a source start pulse 7604, a source clock 7605, a gate start pulse 7606, and a gate clock 7607 are output.

The source driver 7612 may have a structure in which the image signal 7603, the source start pulse 7604, and the source clock 7605 are input and voltage or current in accordance with the image signal 7603 is output to the display region 7614.

The gate driver 7613 may have a structure to which the gate start pulse 7606 and the gate clock 7607 are input and a signal which specifies timing for writing a signal output from the source driver 7612 to the display region 7614 is output.

In the case where frequency of the external image signal 7600 is different from frequency of the image signal 7603, a signal for controlling timing for driving the source driver 7612 and the gate driver 7613 is also different from frequency of the horizontal synchronization signal 7601 and the vertical synchronization signal 7602 which are input. Therefore, in addition to processing of the image signal 7603, it is necessary to process the signal for controlling timing for driving the source driver 7612 and the gate driver 7613. The control circuit 7611 may have a function of processing the signal for controlling timing for driving the source driver 7612 and the gate driver 7613. For example, in the case where the frequency of the image signal 7603 is twice as high as the frequency of the external image signal 7600, the control circuit 7611 generates the image signal 7603 having twice frequency by interpolating an image signal included in the external image signal 7600 and controls the signal for controlling timing so that the signal also has twice frequency.

Further, as shown in FIG. 76B, the control circuit 7611 may include an image processing circuit 7615 and a timing generation circuit 7616.

The image processing circuit 7615 may have a structure to which the external image signal 7600 and a frequency control signal 7608 are input and the image signal 7603 is output.

The timing generation circuit 7616 may have a structure to which the horizontal synchronization signal 7601 and the vertical synchronization signal 7602 are input, and the source start pulse 7604, the source clock 7605, the gate start pulse 7606, the gate clock 7607, and the frequency control signal 7608 are output. Note that the timing generation circuit 7616 may have a memory, a register, or the like for holding data for specifying the state of the frequency control signal 7608. Alternatively, the timing generation circuit 7616 may have a structure to which a signal for specifying the state of the frequency control signal 7608 is input from outside.

As shown in FIG. 76C, the image processing circuit 7615 may include a motion detection circuit 7620, a first memory 7621, a second memory 7622, a third memory 7623, a luminance control circuit 7624, and a high-speed processing circuit 7625.

The motion detection circuit 7620 may have a structure in which a plurality of pieces of image data are input, movement of an image is detected, and image data which is in an intermediate state of the plurality of pieces of image data is output.

The first memory 7621 may have a structure in which the external image signal 7600 is input, the external image signal 7600 is held for a certain period, and the external image signal 7600 is output to the motion detection circuit 7620 and the second memory 7622.

The second memory 7622 may have a structure in which image data output 16 from the first memory 7621 is input, the image data is held for a certain period, and the image data is output to the motion detection circuit 7620 and the high-speed processing circuit 7625.

The third memory 7623 may have a structure in which image data output from the motion detection circuit 7620 is input, the image data is held for a certain period, and the image data is output to the luminance control circuit 7624.

The high-speed processing circuit 7625 may have a structure in which image data output from the second memory 7622, image data output from the luminance control circuit 7624, and a frequency control signal 7608 are input and the image data is output as the image signal 7603.

In the case where the frequency of the external image signal 7600 is different from the frequency of the image signal 7603, the image signal 7603 may be generated by interpolating the image signal included in the external image signal 7600 by the image processing circuit 7615. The input external image signal 7600 is once held in the first memory 7621. At that time, image data which is input in the previous frame is held in the second memory 7622. The motion detection circuit 7620 may read the image data held in the first memory 7621 and the second memory 7622 as appropriate to detect a motion vector by difference between the both pieces of image data and to generate image data in an intermediate state. The generated image data in an intermediate state is held in the third memory 7623.

When the motion detection circuit 7620 generates the image data in an intermediate state, the high-speed processing circuit 7625 outputs the image data held in the second memory 7622 as the image signal 7603. After that, the image data held in the third memory 7623 is output through the luminance control circuit 7624 as the image signal 7603. At this time, frequency which is updated by the second memory 7622 and the third memory 7623 is the same as the external image signal 7600; however, the frequency of the image signal 7603 which is output through the high-speed processing circuit 7625 may be different from the frequency of the external image signal 7600. Specifically, for example, the frequency of the image signal 7603 is 1.5 times, twice, or three times as high as the frequency of the external image signal 7600. However, the present invention is not limited to this, and a variety of frequency can be used. Note that the frequency of the image signal 7603 may be specified by the frequency control signal 7608.

The structure of the image processing circuit 7615 shown in FIG. 76D is obtained by adding a fourth memory 7626 to the structure of the image processing circuit 7615 shown in FIG. 76C. When image data output from the fourth memory 7626 is also output to the motion detection circuit 7620 in addition to the image data output from the first memory 7621 and the image data output from the second memory 7622 in this manner, movement of an image can be detected adequately.

Note that in the case where image data to be input has already included a motion vector for data compression or the like, for example, the image data to be input is image data which is based on an MPEG (moving picture expert group) standard, an image in an intermediate state may be generated as an interpolated image by using this image data. At this time, a portion which generates a motion vector included in the motion detection circuit 7620 is not necessary. Further, since encoding and decoding processing of the image signal 7603 is simplified, power consumption can be reduced.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof; an example of partial modification thereof; an example of improvement thereof, an example of detailed description thereof, an application example thereof, an example of related part thereof or the like. Therefore, the contents described in other embodiment modes can be freely applied to, combined 16 with, or replaced with this embodiment mode.

Embodiment Mode 11

In this embodiment mode, a structure and a manufacturing method of a transistor are described.

Figure 48A:
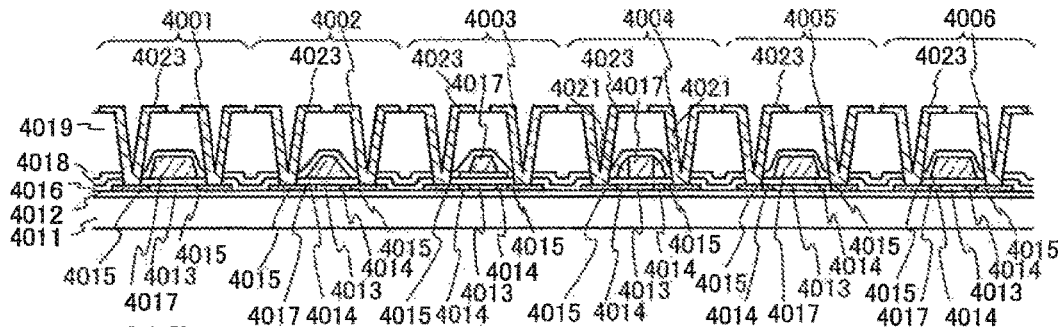
FIGS. 48A to 48G are diagrams illustrating an exemplary structure of transistors included in a display device of the present invention.

FIGS. 48A to 48G show examples of structures and manufacturing methods of transistors included in a display device of the present invention. FIG. 48A shows structure examples of transistors included in the display device of the present invention. FIGS. 48B to 48G show examples of manufacturing methods of the transistors included in the display device of the present invention.

Note that the structure and the manufacturing method of the transistors included in the display device of the present invention are not limited to those shown in FIGS. 48A to 48G and various structures and manufacturing methods can be employed.

First, structure examples of transistors included in the display device of the present invention are described with reference to FIG. 48A. FIG. 48A is a cross-sectional view of a plurality of transistors each having a different structure. Here, in FIG. 48A, the plurality of transistors each having a different structure are juxtaposed, which is for describing structures of the transistors. Thus, the transistors are not needed to be actually juxtaposed as shown in FIG. 48A and can be separately formed as needed.

Next, characteristics of each layer forming the transistor included in the display device of the present invention are described.

A substrate 4011 can be a glass substrate using barium borosilicate glass, aluminoborosilicate glass, or the like, a quartz substrate, a ceramic substrate, a metal substrate containing stainless steel, or the like. Further, a substrate formed of plastics typified by polyethylene terephthalate (PET), polyethylene naphthalate (PEN), or polyethersulfone (PES), or a substrate formed of a flexible synthetic resin such as acrylic can also be used. By using a flexible substrate, a display device capable of being bent can be formed. A flexible substrate has no strict limitations on the area or the shape of the substrate.

An insulating film 4012 functions as a base film and is provided to prevent alkali metal such as Na or alkaline earth metal from the substrate 4011 from adversely affecting characteristics of a semiconductor element. The insulating film 4012 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y). For example, when the insulating film 4012 is provided to have a two-layer structure, it is preferable that a silicon nitride oxide film be used as a first insulating film and a silicon oxynitride film be used as a second insulating film. Further, when the insulating film 4012 is provided to have a three-layer structure, it is preferable that a silicon oxynitride film be used as a first insulating film, a silicon nitride oxide film be used as a second insulating film, and a silicon oxynitride film be used as a third insulating film.

Semiconductor layers 4013, 4014, and 4015 can be formed using an amorphous semiconductor or a semi-amorphous semiconductor (SAS). Alternatively, a polycrystalline semiconductor layer may be used. SAS is a semiconductor having an intermediate structure between amorphous and crystalline (including single crystal and polycrystalline) structures and having a third state which is stable in free energy. Moreover, SAS includes a crystalline region with a short-range order and lattice distortion. A crystalline region of 0.5 to 20 nm can be observed at least in part of a film. When silicon is contained as a main component, Raman spectrum shifts to a wave number side lower than 520 $cm^{-1}$. The diffraction peaks of (111) and (220) which are thought to be contributed to a silicon crystalline lattice are observed by X-ray diffraction. SAS contains hydrogen or halogen of at least 1 atomic percent or more to compensate dangling bonds. SAS is formed by glow discharge decomposition (plasma CVD) of a material gas. As the material gas, $Si_2H_6$, $SiH_2Cl_2$, $SiHCl_3$, $SiCl_4$, $SiF_4$, or the like as well as $SiH_4$ can be used. Alternatively, $GeF_4$ may be mixed. The material gas may be diluted with $H_2$, or $H_2$ and one or more kinds of rare gas elements selected from He, Ar, Kr, and Ne. A dilution ratio is in the range of 2 to 1000 times. Pressure is in the range of approximately 0.1 to 133 Pa, and a power supply frequency is 1 to 120 MHz, preferably 13 to 60 MHz. A substrate heating temperature may be 300° C. or lower. A concentration of impurities in atmospheric components such as oxygen, nitrogen, and carbon is preferably $1\times10^2$ $cm^{-1}$ or less as impurity elements in the film. In particular, an oxygen concentration is $5\times10^{19}/cm^3$ or less, preferably $1\times10^{19}/cm^3$ or less. Here, an amorphous semiconductor layer is formed using a material containing silicon (Si) as its main component (e.g., $Si_xGe_{1-x}$) by a known method (such as a sputtering method, an LPCVD method, or a plasma CVD method). Then, the amorphous semiconductor layer is crystallized by a known crystallization method such as a laser crystallization method, a thermal crystallization method using RTA or an annealing furnace, or a thermal crystallization method using a metal element which promotes crystallization.

An insulating film 4016 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y).

A gate electrode 4017 can have a single-layer structure of a conductive film or a stacked-layer structure of two or three conductive films. As a material for the gate electrode 4017, a known conductive film can be used. For example, a single film of an element such as tantalum (Ta), titanium (Ti), molybdenum (Mo), tungsten (W), chromium (Cr), or silicon (Si); a nitride film containing the aforementioned element (typically, a tantalum nitride film, a tungsten nitride film, or a titanium nitride film); an alloy film in which the aforementioned elements are combined (typically, a Mo—W alloy or a Mo—Ta alloy); a silicide film containing the aforementioned element (typically, a tungsten silicide film or a titanium silicide film); and the like can be used. Note that the aforementioned single film, nitride film, alloy film, silicide film, and the like can have a single-layer structure or a stacked-layer structure.

An insulating film 4018 can have a single-layer structure or a stacked-layer structure of an insulating film containing oxygen or nitrogen, such as silicon oxide ($SiO_x$), silicon nitride (SiN), silicon oxynitride ($SiO_xN_y$) (x>y), or silicon nitride oxide ($SiN_xO_y$) (x>y); or a film containing carbon, such as a DLC (diamond-like carbon), by a known method (such as a sputtering method or a plasma CVD method).

An insulating film 4019 can have a single-layer structure or a stacked-layer structure of a siloxane resin; an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon, such as a DLC (diamond-like carbon); or an organic material such as epoxy, polyimide, polyamide, polyvinyl phenol, benzocyclobutene, or acrylic. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aryl group) is used. Alternatively, a fluoro group, or a fluoro group and an organic group containing at least hydrogen can be used as a substituent. Note that in a display device applicable to the present invention, the insulating film 4019 can be directly provided so as to cover the gate electrode 4017 without provision of the insulating film 4018.

As a conductive film 4023, a single film of an element such as Al, Ni, W, Mo, Ti, Pt, Cu, Ta, Au, or Mn, a nitride film containing the aforementioned element, an alloy film in which the aforementioned elements are combined, a silicide film containing the aforementioned element, or the like can be used. For example, as an alloy containing a plurality of the aforementioned elements, an Al alloy containing C and Ti, an Al alloy containing Ni, an Al alloy containing C and Ni, an Al alloy containing C and Mn, or the like can be used. Further, when the conductive film has a stacked-layer structure, Al can be interposed between Mo, Ti, or the like; thus, resistance of Al to heat and chemical reaction can be improved.

Next, with reference to the cross-sectional view of the plurality of transistors each having a different structure shown in FIG. 48A, characteristics of each structure are described.

A transistor 4001 is a single drain transistor. Since the single drain transistor can be formed by a simple method, it is advantageous in low manufacturing cost and high yield. Here, the semiconductor layers 4013 and 4015 have different concentrations of impurities, and the semiconductor layer 4013 is used as a channel formation region and the semiconductor layers 4015 serve as a source region and a drain region. By controlling the concentration of impurities in this manner, resistivity of the semiconductor layer can be controlled. Further, an electrical connection state of the semiconductor layer and the conductive film 4023 can be closer to ohmic contact. Note that as a method of separately forming the semiconductor layers each having different amount of impurities, a method can be used in which impurities are doped in a semiconductor layer using the gate electrode 4017 as a mask.

A transistor 4002 is a transistor in which the gate electrode 4017 is tapered at an angle of at least certain degrees. Since the transistor can be formed by a simple method, it is advantageous in low manufacturing cost and high yield. The semiconductor layers 4013, 4014, and 4015 have different concentrations of impurities. The semiconductor layer 4013 is used as a channel formation region, the semiconductor layers 4014 as lightly doped drain (LDD) regions, and the semiconductor layers 4015 as a source region and a drain region. By controlling the amount of impurities in this manner, resistivity of the semiconductor layer can be controlled. Further an electrical connection state of the semiconductor layer and the conductive film 4023 can be closer to ohmic contact. Moreover, since the transistor includes the LDD regions, a high electric field is hardly applied inside the transistor, so that deterioration of the element due to hot carriers can be suppressed. Note that as a method of separately forming the semiconductor layers having different amount of impurities, a method can be used in which impurities are doped in a semiconductor layer using the gate electrode 4017 as a mask. In the transistor 4002, since the gate electrode 4017 is tapered at an angle of at least certain degrees, gradient of the concentration of impurities doped in the semiconductor layer through the gate electrode 4017 can be provided, and the LDD region can be easily formed.

A transistor 4003 is a transistor in which the gate electrode 4017 is formed of at least two layers, and a lower gate electrode 4017*a* is longer than an upper gate electrode 4017*b*. In this specification, a shape of the lower and upper gate electrodes is called a hat shape. When the gate electrode has a hat shape, an LDD region can be formed without addition of a photomask. Note that a structure where the LDD region overlaps with the gate electrode, like the transistor 4003, is particularly called a GOLD (gate overlapped LDD) structure. As a method of forming the gate electrode with a hat shape, the following method may be used.

First, when the gate electrode is patterned, the lower and upper gate electrodes are etched by dry etching so that side surfaces thereof are inclined (tapered). Then, the inclination of the upper gate electrode is processed to be almost perpendicular by anisotropic etching. Thus, the gate electrode a cross section of which is a hat shape is formed. After that, impurity elements are doped twice, so that the semiconductor layer 4013 used as the channel region, the semiconductor layers 4014 used as the LDD regions, and the semiconductor layers 4015 used as a source electrode and a drain electrode are formed.

Note that here, part of the LDD region, which overlaps with the gate electrode, is referred to as an Lov region, and part of the LDD region, which does not overlap with the gate electrode, is referred to as an Loff region. The Loff region is highly effective in suppressing an off-current value, whereas it is not very effective in preventing deterioration in an on-current value due to hot carriers by relieving an electric field in the vicinity of the drain. On the other hand, the Lov region is effective in preventing deterioration in the on-current value by relieving the electric field in the vicinity of the drain, whereas it is not very effective in suppressing the off-current value. Thus, it is preferable to form a transistor having a structure appropriate for characteristics of each of the various circuits. For example, when a display device to which the present invention can be applied is used, a transistor having an Loff region is preferably used as a pixel transistor in order to suppress the off-current value. On the other hand, as a transistor in a peripheral circuit, a transistor having an Lov region is preferably used in order to prevent deterioration in the on-current value by relieving the electric field in the vicinity of the drain.

A transistor 4004 is a transistor including a sidewall 4021 in contact with the side surface of the gate electrode 4017. When the transistor includes the sidewall 4021, a region overlapping with the sidewall 4021 can be made to be an LDD region.

A transistor 4005 is a transistor in which an LDD (Loff) region is formed by performing doping of the semiconductor layer with the use of a mask. Thus, the LDD region can surely be formed, and an off-current value of the transistor can be reduced.

A transistor 4006 is a transistor in which an LDD (Lov) region is formed by performing doping of the semiconductor layer with the use of a mask. Thus, the LDD region can surely be formed, and deterioration in an on-current value can be prevented by relieving the electric field in the vicinity of the drain of the transistor.

Next, an example of a method for manufacturing a transistor included in the display device to which the present invention can be applied is described with reference to FIGS. 48B to 48G.

Note that a structure and a manufacturing method of a transistor included in the display device of the present invention is not limited to those in FIGS. 48A to 48Q and various structures and manufacturing methods can be used.

In this embodiment mode, surfaces of the substrate 4011, the insulating film 4012, the semiconductor layer 4013, the semiconductor layer 4014, the semiconductor layer 4015, the insulating film 4016, the insulating film 4018, or the insulating film 4019 are oxidized or nitrided by using plasma treatment, so that these surfaces can be oxidized or nitrided. By oxidizing or nitriding the semiconductor layer or the insulating film by plasma treatment in such a manner, the surface of the semiconductor layer or the insulating film is modified, and the insulating film can be formed to be denser than an insulating film formed by a CVD method or a sputtering method. Thus, a defect such as a pinhole can be suppressed, and characteristics and the like of the display device can be improved.

First, the surface of the substrate 4011 is washed using hydrofluoric acid (HF), alkaline, or pure water. The substrate 4011 can be a glass substrate using barium borosilicate glass, aluminoborosilicate glass, or the like, a quartz substrate, a ceramic substrate, a metal substrate containing stainless steel, or the like. Further, a substrate formed of plastics typified by polyethylene terephthalate (PET), polyethylene naphthalate (PEN), or polyethersulfone (PES), or a substrate formed of a flexible synthetic resin such as acrylic can also be used. Here, the case where a glass substrate is used as the substrate 4011 is shown.

Figure 48B:
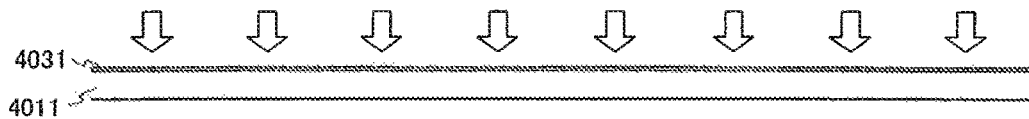

Here, an oxide film or a nitride film may be formed on the surface of the substrate 4011 by oxidizing or nitriding the surface of the substrate 4011 by plasma treatment (FIG. 48B). Hereinafter, an insulating film such as an oxide film or a nitride film formed by performing plasma treatment on the surface is also referred to as a plasma-treated insulating film. Note that in FIG. 48B, an insulating film 4031 is a plasma-treated insulating film. In general, when a semiconductor element such as a thin film transistor is provided over a substrate formed of glass, plastic, or the like, an impurity element such as alkali metal (e.g., Na) or alkaline earth metal included in glass, plastic, or the like might be mixed into the semiconductor element; thus, characteristics of the semiconductor element may be adversely affected in some cases. Nitridation of a surface of the substrate formed of glass, plastic, or the like can prevent an impurity element such as alkali metal (e.g., Na) or alkaline earth metal included in the substrate from being mixed into the semiconductor element.

When the surface is oxidized by plasma treatment, the plasma treatment is performed in an oxygen atmosphere (e.g., in an atmosphere of oxygen ($O_2$) and a rare gas (containing at least one of He, Ne, Ar, Kr, and Xe), in an atmosphere of oxygen, hydrogen ($H_2$), and a rare gas, or in an atmosphere of dinitrogen monoxide and a rare gas). On the other hand, when the semiconductor layer is nitrided by plasma treatment, the plasma treatment is performed in a nitrogen atmosphere (e.g., in an atmosphere of nitrogen ($N_2$) and a rare gas (containing at least one of He, Ne, Ar, Kr, and Xe), in an atmosphere of nitrogen, hydrogen, and a rare gas, or in an atmosphere of $NH_3$ and a rare gas). As a rare gas, for example, Ar or a gas in which Ar and Kr are mixed may be used. Accordingly, the plasma-treated insulating film contains a rare gas (containing at least one of He, Ne, Ar, Kr, and Xe) used for the plasma treatment. For example, the plasma-treated insulating film contains Ar when Ar is used.

In addition, it is preferable to process plasma treatment in the atmosphere containing the aforementioned gas, with conditions of an electron density in the range of $1 \times 10^{11}$ to $1 \times 10^{13}$ cm$^{-3}$ and a plasma electron temperature in the range of 0.5 to 1.5 eV. Since the plasma electron density is high and the electron temperature in the vicinity of an object to be treated is low, damage by plasma to the object to be treated can be prevented. Further, since the plasma electron density is as high as $1 \times 10^{11}$ cm$^{-3}$ or more, an oxide film or a nitride film formed by oxidizing or nitriding the object to be treated by plasma treatment is superior in its uniformity of thickness and the like as well as being dense, as compared with a film formed by a CVD method, a sputtering method, or the like. Alternatively, since the plasma electron temperature is as low as 1 eV or less, oxidation or nitridation can be performed at a lower temperature as compared with a conventional plasma treatment or thermal oxidation. For example, oxidation or nitridation can be performed sufficiently even when plasma treatment is performed at a temperature lower than a strain point of a glass substrate by 100 degrees or more. Note that as frequency for generating plasma, high frequency waves such as microwaves (2.45 GHz) can be used. Note that hereinafter, plasma treatment is performed using the aforementioned conditions unless otherwise specified.

Note that although FIG. 48B shows the case where the plasma-treated insulating film is formed by plasma treatment on the surface of the substrate 4011, this embodiment mode includes the case where a plasma-treated insulating film is not formed on the surface of the substrate 4011.

Figure 48C:
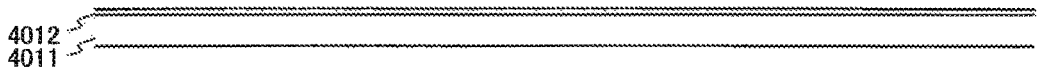

Note that although a plasma-treated insulating film formed by plasma treatment on the surface of the object to be treated is not shown in FIGS. 48C to 48Q this embodiment mode includes the case where a plasma-treated insulating film formed by plasma treatment exists on the surface of the substrate 4011, the insulating film 4012, the semiconductor layer 4013, the semiconductor layer 4014, the semiconductor layer 4015, the insulating film 4016, the insulating film 4018, or the insulating film 4019.

Next, the insulating film 4012 is formed over the substrate 4011 by a known method (such as a sputtering method, an LPCVD method, or a plasma CVD method) (FIG. 48C). For the insulating film 4012, silicon oxide (SiO) or silicon oxynitride ($SiO_xN_y$) (x>y) can be used.

Here, a plasma-treated insulating film may be formed on the surface of the insulating film 4012 by oxidizing or nitriding the surface of the insulating film 4012 by plasma treatment. By oxidizing the surface of the insulating film 4012, the surface of the insulating film 4012 is modified, and a dense film with fewer defects such as a pinhole can be obtained. Further, by oxidizing the surface of the insulating film 4012, the plasma-treated insulating film containing a little amount of N atoms can be formed; thus, interface characteristics of the plasma-treated insulating film and a semiconductor layer are improved when the semiconductor layer is provided over the plasma-treated insulating film. The plasma-treated insulating film contains a rare gas (containing at least one of He, No, Ar, Kr, and Xe) used for the plasma treatment. Note that the plasma treatment can be similarly performed under the aforementioned conditions.

Figure 48D:

Next, the island-shaped semiconductor layers 4013 and 4014 are formed over the insulating film 4012 (FIG. 48D). The island-shaped semiconductor layers 4013 and 4014 can be formed in such a manner that an amorphous semiconductor layer is formed over the insulating film 4012 by using a material containing silicon (Si) as its main component (e.g., $Si_xGe_{1-x}$) or the like by a known method (such as a sputtering method, an LPCVD method, or a plasma CVD method), the amorphous semiconductor layer is crystallized, and the semiconductor layer is selectively etched. Note that crystallization of the amorphous semiconductor layer can be performed by a known crystallization method such as a laser crystallization method, a thermal crystallization method using RTA or an annealing furnace, a thermal crystallization method using a metal element which promotes crystallization, or a method in which these methods are combined. Here, end portions of the island-shaped semiconductor layers are provided with an angle of about 90° ($\theta$=85 to 100°). Alternatively, the semiconductor layer 4014 to be a low concentration drain region may be formed by doping impurities with the use of a mask.

Here, a plasma-treated insulating film may be formed on the surfaces of the semiconductor layers 4013 and 4014 by oxidizing or nitriding the surfaces of the semiconductor layers 4013 and 4014 by plasma treatment. For example, when Si is used for the semiconductor layers 4013 and 4014, silicon oxide ($SiO_x$) or silicon nitride ($SiN_x$) is formed as the plasma-treated insulating film. Alternatively, after being oxidized by plasma treatment, the semiconductor layers 4013 and 4014 may be nitrided by performing plasma treatment again. In this case, silicon oxide ($SiO_x$) is formed in contact with the semiconductor layers 4013 and 4014, and silicon nitride oxide ($SiN_xO_y$) (x>y) is formed on the surface of the silicon oxide. Note that when the semiconductor 16 layer is oxidized by plasma treatment, the plasma treatment is performed in an oxygen atmosphere (e.g., in an atmosphere of oxygen ($O_2$) and a rare gas (containing at least one of He, Ne, Ar, Kr, and Xe), in an atmosphere of oxygen, hydrogen ($H_2$), and a rare gas, or in an atmosphere of dinitrogen monoxide and a rare gas). On the other hand, when the semiconductor layer is nitrided by plasma treatment, the plasma treatment is performed in a nitrogen atmosphere (e.g., in an atmosphere of nitrogen ($N_2$) and a rare gas (containing at least one of He, Ne, Ar, Kr, and Xe), in an atmosphere of nitrogen, hydrogen, and a rare gas, or in an atmosphere of $NH_3$ and a rare gas). As a rare gas, Ar can be used, for example. Alternatively, a gas in which Ar and Kr are mixed may be used. Accordingly, the plasma-treated insulating film contains a rare gas (containing at least one of He, Ne, Ar, Kr, and Xe) used for the plasma treatment. For example, the plasma-treated insulating film contains Ar when Ar is used.

Figure 48E:

Next, the insulating film 4016 is formed (FIG. 48E). The insulating film 4016 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y), by a known method (such as a sputtering method, an LPCVD method, or a plasma CVD method). Note that when the plasma-treated insulating film is formed on the surfaces of the semiconductor layers 4013 and 4014 by performing plasma treatment on the surfaces of the semiconductor layers 4013 and 4014, the plasma-treated insulating film can be used as the insulating film 4016.

Here, the surface of the insulating film 4016 may be oxidized or nitrided by plasma treatment, so that a plasma-treated insulating film is formed on the surface of the insulating film 4016. Note that the plasma-treated insulating film contains a rare gas (containing at least one of He, Ne, Ar, Kr, and Xe) used for the plasma treatment. The plasma treatment can be similarly performed under the aforementioned conditions.

Alternatively, after the insulating film 4016 is oxidized by performing plasma treatment once in an oxygen atmosphere, the insulating film 4016 may be nitrided by performing plasma treatment again in a nitrogen atmosphere. By oxidizing or nitriding the surface of the insulating film 4016 by plasma treatment in such a manner, the surface of the insulating film 4016 is modified, and a dense film can be formed. An insulating film obtained by plasma treatment is denser and has fewer defects such as a pinhole, as compared with an insulating film formed by a CVD method, a sputtering method, or the like. Thus, characteristics of a thin film transistor can be improved.

Figure 48F:
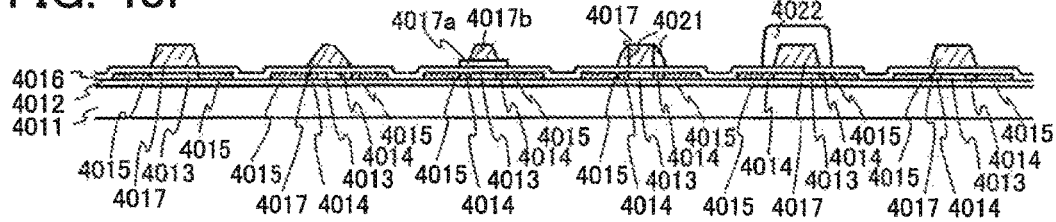

Next, the gate electrode 4017 is formed (FIG. 48F). The gate electrode 4017 can be formed by a known method (such as a sputtering method, an LPCVD method, or a plasma CVD method).

In the transistor 4001, the semiconductor layers 4015 used as the source region and the drain region can be formed by doping impurities after the gate electrode 4017 is formed.

In the transistor 4002, the semiconductor layers 4014 used as the LDD regions, the semiconductor layer 4013, and the semiconductor layers 4015 used as the source region and the drain region can be formed by doping impurities after the gate electrode 4017 is formed.

In the transistor 4003, the semiconductor layers 4014 used as the LDD regions, the semiconductor layer 4013, and the semiconductor layers 4015 used as the source region and the drain region can be formed by doping impurities after the gate electrode 4017a and 4017b is formed.

In the transistor 4004, the semiconductor layers 4014 used as the LDD regions, the semiconductor layer 4013, and the semiconductor layers 4015 used as the source region and the drain region can be formed by doping impurities after the sidewall 4021 is formed on the side surface of the gate electrode 4017.

Note that silicon oxide ($SiO_x$) or silicon nitride ($SiN_x$) can be used for the sidewall 4021. As a method of forming the sidewall 4021 on the side surface of the gate electrode 4017, a method can be used, for example, in which a silicon oxide ($SiO_x$) film or a silicon nitride ($SiN_x$) film is formed by a known method after the gate electrode 4017 is formed, and then, the silicon oxide ($SiO_x$) film or the silicon nitride ($SiN_x$) film is etched by anisotropic etching. Thus, the silicon oxide ($SiO_x$) film or the silicon nitride ($SiN_N$) film remains only on the side surface of the gate electrode 4017, so that the sidewall 4021 can be formed on the side surface of the gate electrode 4017.

In the transistor 4005, the semiconductor layers 4014 used as the LDD (Loff) regions, the semiconductor layers 4013, and the semiconductor layer 4015 used as the source region and the drain region can be formed by doping impurities after a mask 4022 is formed to cover the gate electrode 4017.

In the transistor 4006, the semiconductor layers 4014 used as the LDD (Lov) regions, the semiconductor layers 4013, and the semiconductor layers 4015 used as the source region and the drain region can be formed by doping impurities after the gate electrode 4017 is formed.

Figure 48G:
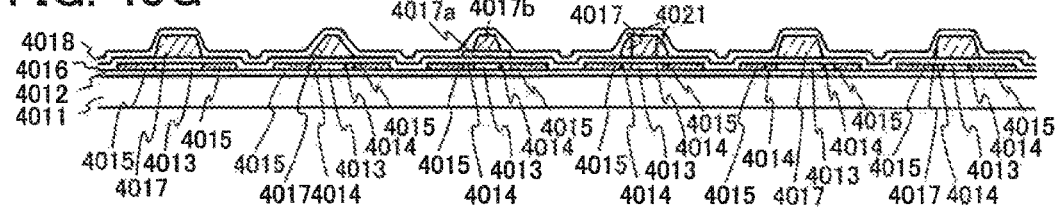

Next, the insulating film 4018 is formed (FIG. 48G). The insulating film 4018 can have a single-layer structure or a stacked-layer structure of an insulating film containing oxygen or nitrogen, such as silicon oxide ($SiO_x$), silicon nitride ($SiN_x$), silicon oxynitride ($SiO_xN_x$) (x>y), or silicon nitride oxide ($SiN_xO_y$) (x>y); or a film containing carbon, such as a DLC (diamond-like carbon), by a known method (such as a sputtering method or a plasma CVD method).

Here, the surface of the insulating film 4018 may be oxidized or nitrided by plasma treatment, so that a plasma-treated insulating film is formed on the surface of the insulating film 4018. Note that the plasma-treated insulating film contains a rare gas (containing at least one of He, Ne, Ar, Kr, and Xe) used for the plasma treatment. The plasma treatment can be similarly performed under the aforementioned conditions.

Next, the insulating film 4019 is formed (FIG. 48A). The insulating film 4019 can have a single-layer structure or a stacked-layer structure of an organic material such as epoxy, polyimide, polyamide, polyvinyl phenol, benzocyclobutene, or acrylic; or a siloxane resin, in addition to an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); or a film containing carbon, such as a DLC (diamond-like carbon), by known method (such as a sputtering method or a plasma CVD method). Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aryl group) is used. Alternatively, a fluoro group, or a fluoro group and an organic group containing at least hydrogen can be used as a substituent. In addition, the plasma-treated insulating film contains a rare gas (containing at least one of He, Ne, Ar, Kr, and Xe) used for the plasma treatment. For example, the plasma-treated insulating film contains Ar when Ar is used.

When an organic material such as polyimide, polyamide, polyvinyl phenol, benzocyclobutene, or acrylic, or a siloxane resin is used for the insulating film 4019, the surface of the insulating film 4019 can be modified by oxidizing or nitriding the surface of the insulating film by plasma treatment. Modification of the surface improves strength of the insulating film 4019, and physical damage such as a crack generated when an opening is formed, for example, or film reduction in etching can be reduced. Further, when the conductive film 4023 is formed over the insulating film 4019, modification of the surface of the insulating film 4019 improves adhesion to the conductive film. For example, when a siloxane resin is used for the insulating film 4019 and nitrided by plasma treatment, a plasma-treated insulating film containing nitrogen or a rare gas is formed by nitriding a surface of the siloxane resin, and physical strength is improved.

Next, a contact hole is formed in the insulating films 4019, 4018, and 4016 in order to form the conductive film 4023 which is electrically connected to the semiconductor layer 4015. Note that the contact hole may have a tapered shape; thus, coverage with the conductive film 4023 can be improved.

Figure 49:
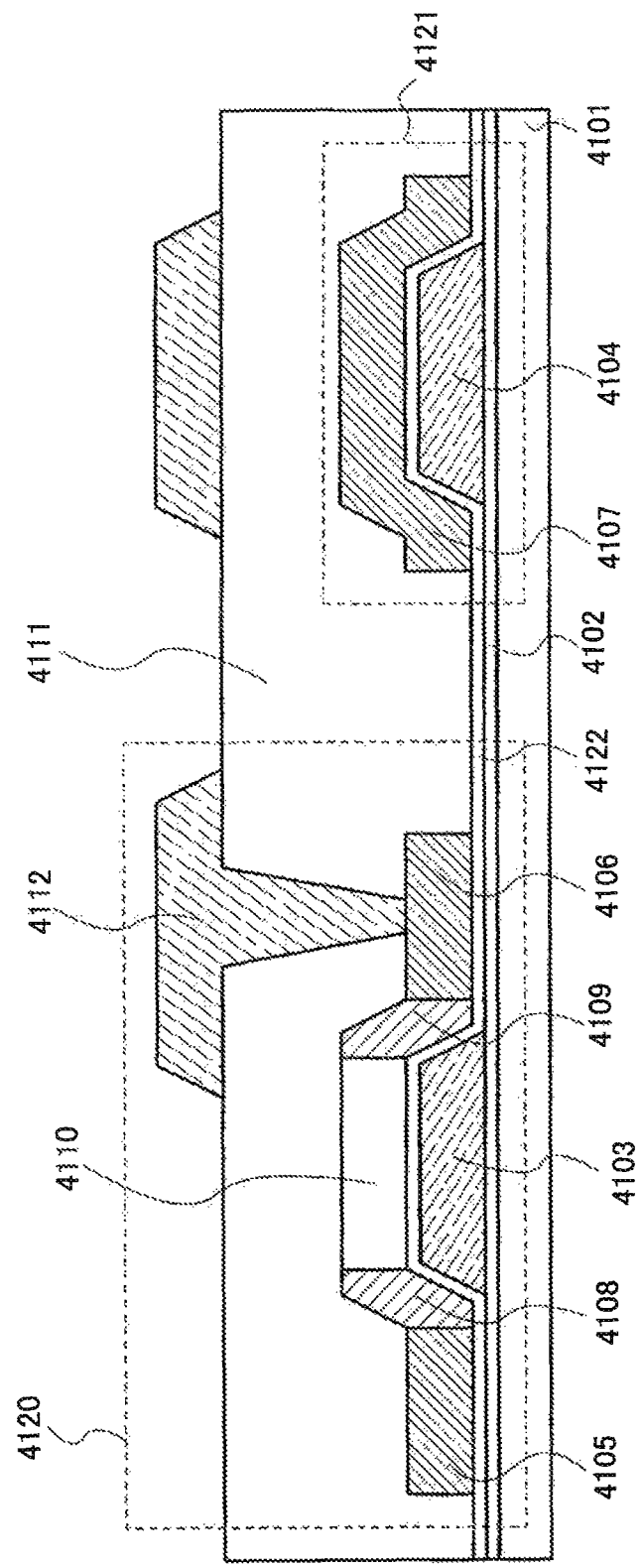
FIG. 49 is a diagram illustrating an exemplary structure of a transistor included in a display device of the present invention.

FIG. 49 shows cross-sectional structures of a bottom-gate transistor and a capacitor.

A first insulating film (an insulating film 4102) is formed over an entire surface of a substrate 4101. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

A first conductive layer (conductive layers 4103 and 4104) is formed over the first insulating film. The conductive layer 4103 includes a portion functioning as a gate electrode of a transistor 4120. The conductive layer 4104 includes a portion functioning as a first electrode of a capacitor 4121. As the first conductive layer, an element such as Ti, Mo, Ta, Cr, W, Al, Nd, Cu, Ag, Au, Pt, Si, Zn, Fe, Ba, or Ge, or an alloy of these elements can be used. Alternatively, a stacked layer of these elements (including the alloy thereof) can be used.

A second insulating film (an insulating film 4122) is formed to cover at least the first conductive layer. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A semiconductor layer is formed in part of a portion over the second insulating film, which overlaps with the first conductive layer, by a photolithography method, an inkjet method, a printing method, or the like. Part of the semiconductor layer extends to a portion over the second insulating film, which does not overlap with the first conductive layer. The semiconductor layer includes a channel formation region (a channel formation region 4110), an LDD region (LDD regions 4108 and 4109), and an impurity region (impurity regions 4105, 4106, and 4107). The channel formation region 4110 functions as a channel formation region of the transistor 4120. The LDD regions 4108 and 4109 function as LDD regions of the transistor 4120. Note that the LDD regions 4108 and 4109 are not necessarily formed. The impurity region 4105 includes a portion functioning as one of a source region and a drain region of the transistor 4120. The impurity region 4106 includes a portion functioning as the other of the source region and the drain region of the transistor 4120. The impurity region 4107 includes a portion functioning as a second electrode of the capacitor 4121.

A third insulating film (an insulating film 4111) is entirely formed. A contact hole is selectively formed in part of the third insulating film. The insulating film 4111 functions as an interlayer film. As the third insulating film, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material containing siloxane may be used. Note that siloxane is a material in which a skeleton structure is formed by a bond of silicon (Si) and oxygen (O). As a substitute, an organic group containing at least hydrogen (such as an alkyl group or aryl group) is used. Alternatively, a fluoro group, or a fluoro group and an organic group containing at least hydrogen may be used as a substituent.

A second conductive layer (conductive layers 4112 and 4113) is formed over the third insulating film. The conductive layer 4112 is connected to the other of the source electrode and the drain electrode of the transistor 4120 through the contact hole formed in the third insulating film. Thus, the conductive layer 4112 includes a portion functioning as the other of the source region and the drain region of the transistor 4120. As the second conductive layer, an element such as Ti, Mo, Ta, Cr, W, Al, Nd, Cu, Ag, Au, Pt, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Next, structures of a transistor and a capacitor are described in the case where an amorphous silicon (a-Si:H) film is used as a semiconductor layer of the transistor.

Figure 50:
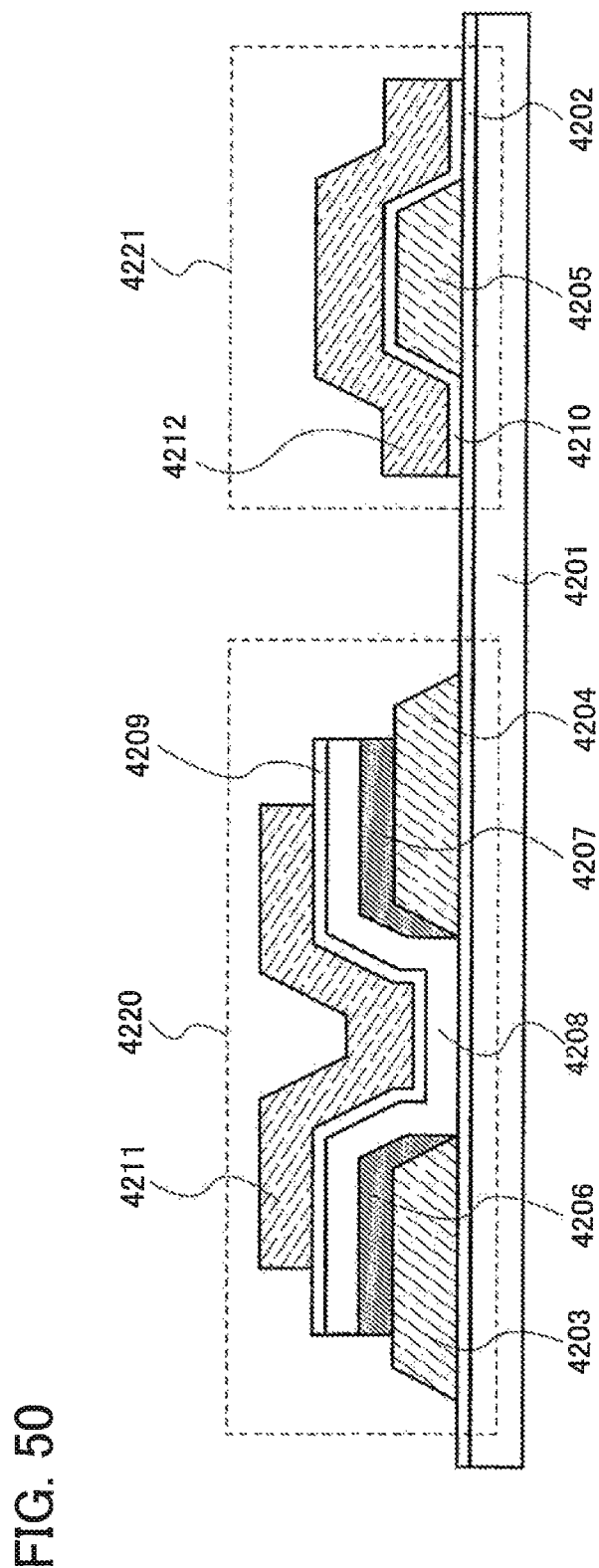
FIG. 50 is a diagram illustrating an exemplary structure of a transistor included in a display device of the present invention.

FIG. 50 shows cross-sectional structures of a top-gate transistor and a capacitor.

A first insulating film (an insulating film 4202) is formed over an entire surface of a substrate 4201. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further, since the structure can be simplified, the yield can be improved.

A first conductive layer (conductive layers 4203, 4204, and 4205) is formed over the first insulating film. The conductive layer 4203 includes a portion functioning as one of a source electrode and a drain electrode of a transistor 4220. The conductive layer 4204 includes a portion functioning as the other of the source electrode and the drain electrode of the transistor 4220. The conductive layer 4205 includes a portion functioning as a first electrode of a capacitor 4221. As the first conductive layer, an element such as Ti, Mo, Ta, Cr, W, Al, Nd, Cu, Ag, Au, Pt, Si, Zn, Fe, Ba, or Ge, or an alloy of these elements can be used. Alternatively, a stacked layer of these elements (including the alloy thereof) can be used.

A first semiconductor layer (semiconductor layers 4206 and 4207) is formed above the conductive layers 4203 and 4204. The semiconductor layer 4206 includes a portion functioning as one of the source region the drain region. The semiconductor layer 4207 includes a portion functioning as the other of the source electrode and the drain electrode. As the first semiconductor layer, silicon containing phosphorus or the like can be used, for example.

A second semiconductor layer (a semiconductor layer 4208) is formed over the first insulating film and between the conductive layer 4203 and the conductive layer 4204. Part of the semiconductor layer 4208 extends over the conductive layers 4203 and 4204. The semiconductor layer 4208 includes a portion functioning as a channel region of the transistor 4220. As the second semiconductor layer, a semiconductor layer having no crystallinity such as an amorphous silicon (a-Si:H) layer, a semiconductor layer such as a microcrystalline semiconductor (μ-Si:H) layer, or the like can be used.

A second insulating film (insulating films 4209 and 4210) is formed to cover at least the semiconductor layer 4208 and the conductive layer 4205. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the second semiconductor layer, a silicon oxide film is preferably used. This is because the trap level at the interface between the second semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A second conductive layer (conductive layers 4211 and 4212) is formed over the second insulating film. The conductive layer 4211 includes a portion functioning as a gate electrode of the transistor 4220. The conductive layer 4212 functions as a second electrode of the capacitor 4221 or a wiring. As the second conductive layer, an element such as Ti, Mo, Ta, Cr, W, Al, Nd, Cu, Ag, Au, Pt, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Figure 51:
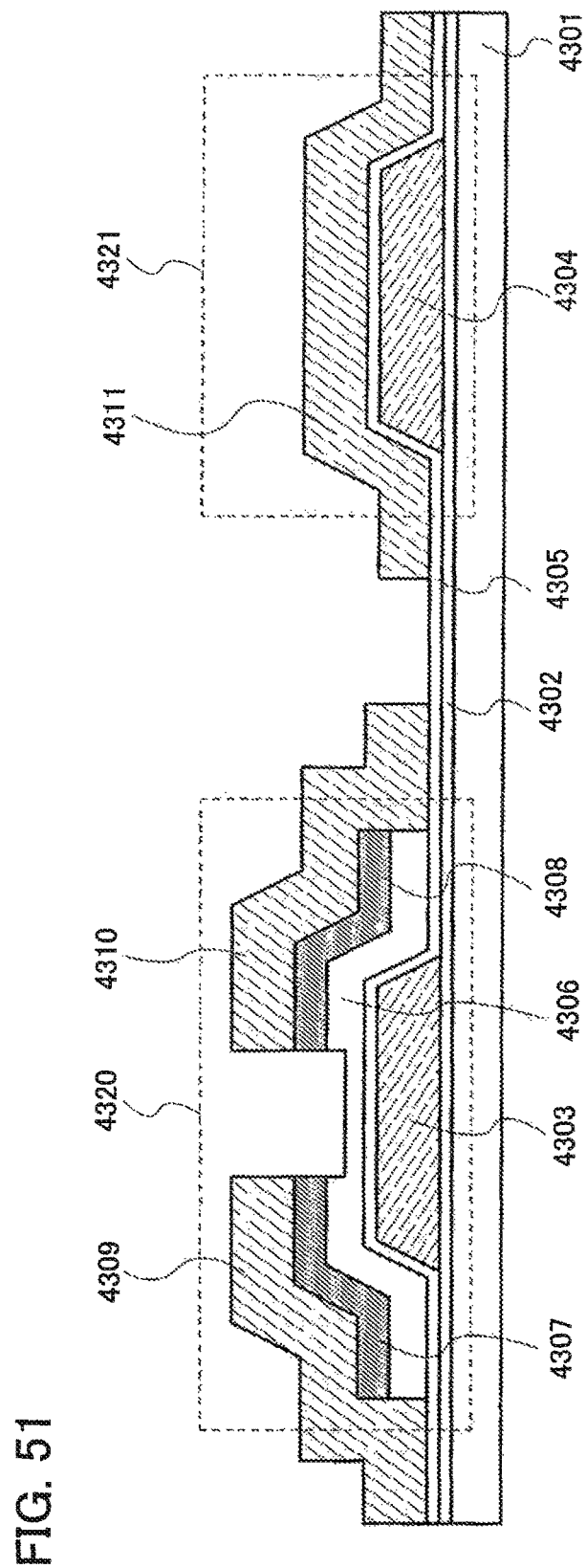
FIG. 51 is a diagram illustrating an exemplary structure of a transistor included in a display device of the present invention.

FIG. 51 shows cross-sectional structures of an inversely staggered (bottom gate) transistor and a capacitor. In particular, the transistor shown in FIG. 51 has a channel-etched structure.

A first insulating film (an insulating film 4302) is formed over an entire surface of a substrate 4301. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further, since the structure can be simplified, the yield can be improved.

A first conductive layer (conductive layers 4303 and 4304) is formed over the first insulating film. The conductive layer 4303 includes a portion functioning as a gate electrode of a transistor 4320. The conductive layer 4304 includes a portion functioning as a first electrode of a capacitor 4321. As the first conductive layer, an element such as Ti, Mo, Ta, Cr, W, Al, Nd, Cu, Ag, Au, Pt, Si, Zn, Fe, Ba, or Ge, or an alloy of these elements can be used. Alternatively, a stacked layer of these elements (including the alloy thereof) can be used.

A second insulating film (an insulating film 4305) is formed to cover at least the first conductive layer. The second insulating film functions as a gate insulating film. As the second insulating film, a single layer or a stacked layer of a silicon oxide film, a silicon nitride film, a silicon oxynitride film ($SiO_xN_x$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A first semiconductor layer (a semiconductor layer 4306) is formed in part of a portion over the second insulating film, which overlaps with the first conductive layer, by a photolithography method, an inkjet method, a printing method, or the like. Part of the semiconductor layer 4306 extends to a portion over the second insulating film, which does not overlap with the first conductive layer. The semiconductor layer 4306 includes a portion functioning as a channel region of the transistor 4320. As the semiconductor layer 4306, a semiconductor layer having no crystallinity such as an amorphous silicon (a-Si:H) layer, a semiconductor layer such as a microcrystalline semiconductor (μ-Si:H) layer, or the like can be used.

A second semiconductor layer (semiconductor layers 4307 and 4308) is formed over part of the first semiconductor layer. The semiconductor layer 4307 includes a portion functioning as one of a source region and a drain region. The semiconductor layer 4308 includes a portion functioning as the other of the source electrode and the drain electrode. As the second semiconductor layer, silicon containing phosphorus or the like can be used, for example.

A second conductive layer (conductive layers 4309, 4310, and 4311) is formed over the second semiconductor layer and the second insulating film. The conductive layer 4309 includes a portion functioning as one of the source electrode and the drain electrode of the transistor 4320. The conductive layer 4310 includes a portion functioning as the other of the source electrode and the drain electrode of the transistor 4320. The conductive layer 4311 includes a portion functioning as a second electrode of the capacitor 4321. As the second conductive layer, an element such as Ti, Mo, Ta, Cr, W, Al, Nd, Cu, Ag, Au, Pt, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Here, an example of a step which is characteristic of the channel-etched type transistor is described. The first semiconductor layer and the second semiconductor layer can be formed using the same mask. Specifically, the first semiconductor layer and the second semiconductor layer are continuously formed. Further, the first semiconductor layer and the second semiconductor layer are formed using the same mask.

Another example of a step which is characteristic of the channel-etched type transistor is described. The channel region of the transistor can be formed without using an additional mask. Specifically, after the second conductive layer is formed, part of the second semiconductor layer is removed using the second conductive layer as a mask. Alternatively, part of the second semiconductor layer is removed by using the same mask as the second conductive layer. The first semiconductor layer below the removed second semiconductor layer serves as the channel region of the transistor.

Figure 52:
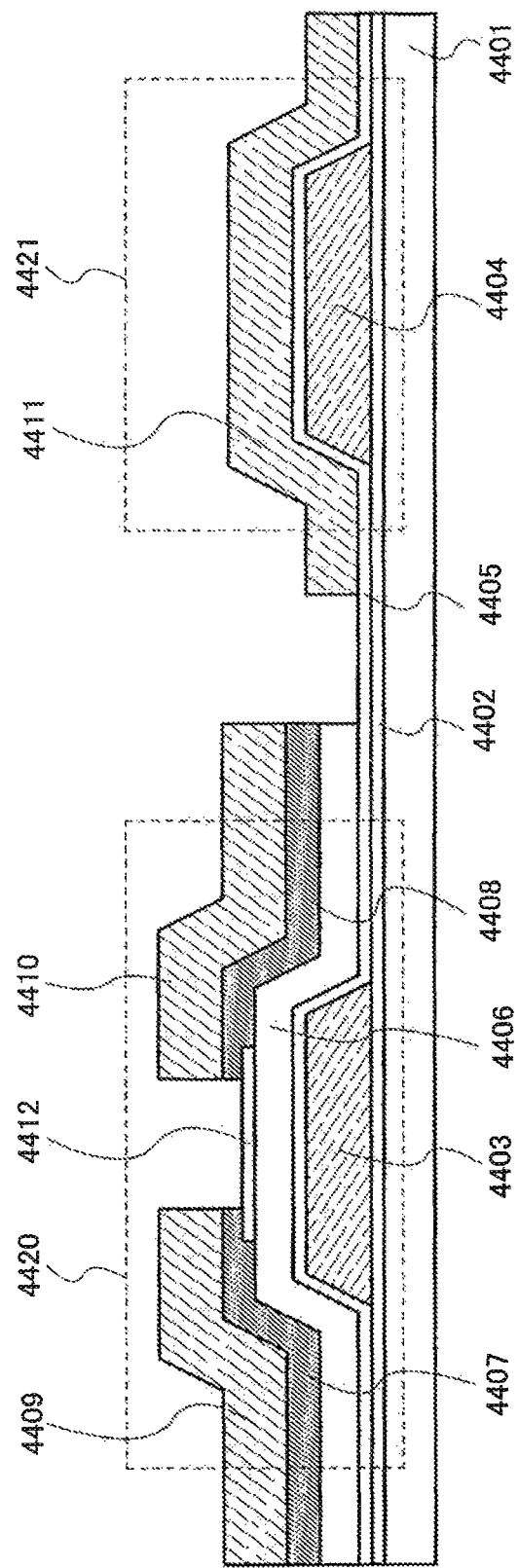
FIG. 52 is a diagram illustrating an exemplary structure of a transistor included in a display device of the present invention.

FIG. 52 shows cross-sectional structures of an inversely staggered (bottom gate) transistor and a capacitor. In particular, the transistor shown in FIG. 52 has a channel protection (channel stop) structure.

A first insulating film (an insulating film 4402) is formed over an entire surface of a substrate 4401. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further since the structure can be simplified, the yield can be improved.

A first conductive layer (conductive layers 4403 and 4404) is formed over the first insulating film. The conductive layer 4403 includes a portion functioning as a gate electrode of a transistor 4420. The conductive layer 4404 includes a portion functioning as a first electrode of a capacitor 4421. As the first conductive layer, an element such as Ti, Mo, Ta, Cr, W, Al, Nd, Cu, Ag, Au, Pt, Si, Zn, Fe, Ba, or Oe, or an alloy of these elements can be used. Alternately, a stacked layer of these elements (including the alloy thereof) can be used.

A second insulating film (an insulating film 4405) is formed to cover at least the first conductive layer. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A first semiconductor layer (a semiconductor layer 4406) is formed in part of a portion over the second insulating film, which overlaps with the first conductive layer, by a photolithography method, an inkjet method, a printing method, or the like. Part of the semiconductor layer 4406 extends to a portion over the second insulating film, which does not overlap with the first conductive layer. The semiconductor layer 4406 includes a portion functioning as a channel region of the transistor 4420. As the semiconductor layer 4406, a semiconductor layer having no crystallinity such as an amorphous silicon (a-Si:H) layer, a semiconductor layer such as a microcrystalline semiconductor (μ-Si:H) layer, or the like can be used.

A third insulating film (an insulating film 4412) is formed over part of the first semiconductor layer. The insulating film 4412 prevents the channel region of the transistor 4420 from being removed by etching. That is, the insulating film 4412 functions as a channel protection film (a channel stop film). As the third insulating film, a single layer or a stacked layer of a silicon oxide film, a silicon nitride film, a silicon oxynitride film ($SiO_xN_y$), or the like can be used.

A second semiconductor layer (semiconductor layers 4407 and 4408) is formed over part of the first semiconductor layer and pert of the third insulating film. The semiconductor layer 4407 includes a portion functioning as one of a source region and a drain region. The semiconductor layer 4408 includes a portion functioning as the other of the source region and the drain region. As the second semiconductor layer, silicon containing phosphorus or the like can be used, for example.

A second conductive layer (conductive layers 4409, 4410, and 4411) is formed over the second semiconductor layer. The conductive layer 4409 includes a portion functioning as one of the source electrode and the drain electrode of the transistor 4420. The conductive layer 4410 includes a portion functioning as the other of the source electrode and the drain electrode of the transistor 4420. The conductive layer 4411 includes a portion functioning as a second electrode of the capacitor 4421. As the second conductive layer, an element such as Ti, Mo, Ta, Cr, W, Al, Nd, Cu, Ag, Au, Pt, Si, Zn, Fe, Ba, or Ge, or an alloy of these elements can be used. Alternately, a stacked layer of these elements (including the alloy thereof) can be used.

Note that in steps after forming the second conductive layer, various insulating films or various conductive films may be formed.

Here, an example of a step which is characteristic of the channel protection type transistor is described. The first semiconductor layer, the second semiconductor layer, and the second conductive layer can be formed using the same mask. At the same time, the channel region can be formed. Specifically, the first semiconductor layer is formed, and then, the third insulating film (i.e., the channel protection film or the channel stop film) is patterned using a mask. Next, the second semiconductor layer and the second conductive layer are continuously formed. Then, after the second conductive layer is formed, the first semiconductor layer, the second semiconductor layer, and the second conductive film are patterned using the same mask. Note that part of the first semiconductor layer below the third insulating film is protected by the third insulating film, and thus is not removed by etching. This part (a part of the first semiconductor layer over which the third insulating film is formed) serves as the channel region.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode or embodiment. Further, much more drawings can be formed by combining each part in each drawing in this embodiment mode with part of another embodiment mode or embodiment.

Note that this embodiment mode shows examples of embodying, slightly transforming, partially modifying, improving, describing in detail, or applying the contents (or part of the contents) described in other embodiment modes and embodiments, an example of related part thereof, or the like. Therefore, the contents described in other embodiment modes and embodiments can be freely applied to, combined with, or replaced with this embodiment mode.

Embodiment Mode 12

In this embodiment mode, examples of electronic devices according to the present invention are described.

Figure 53:
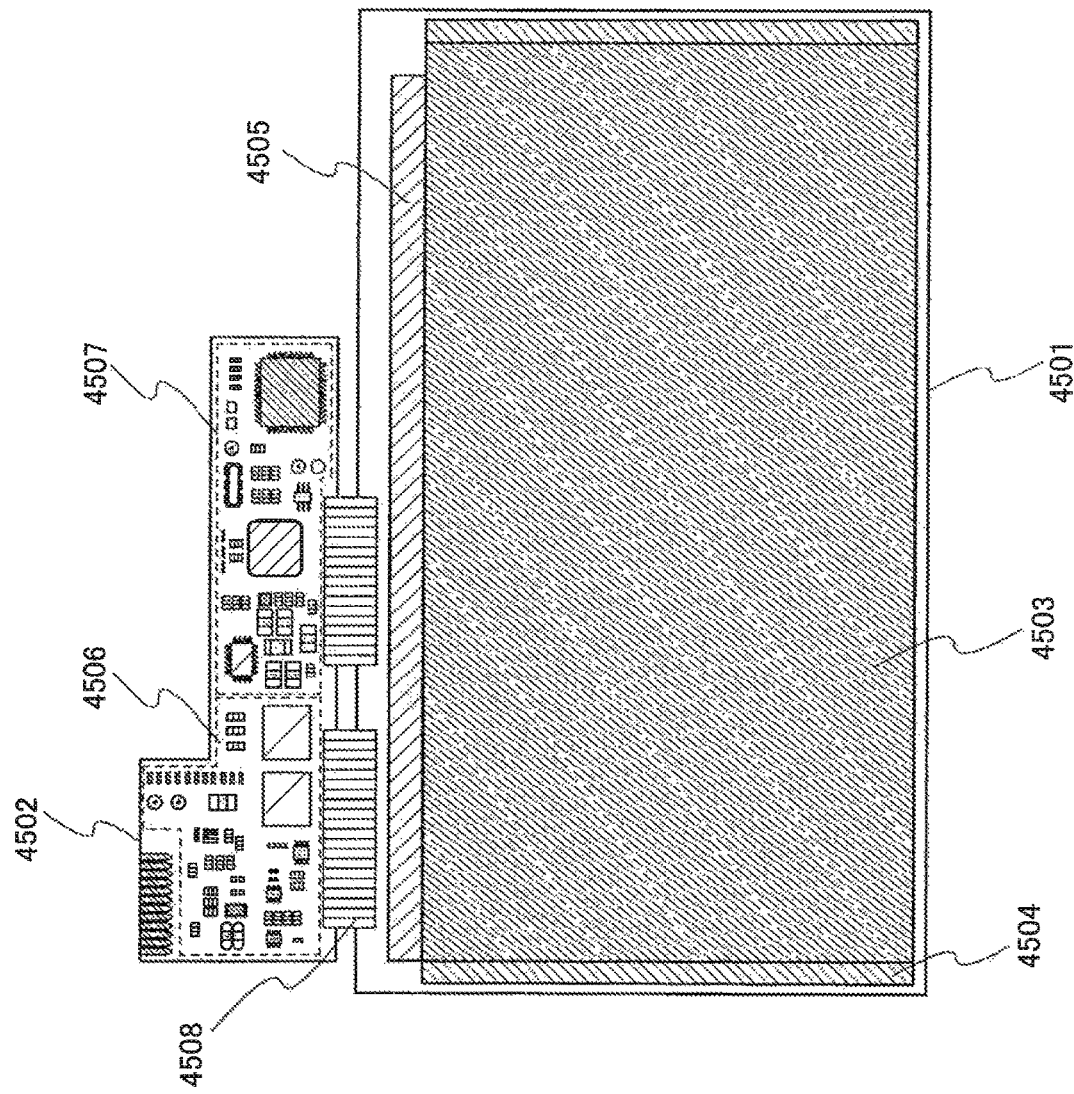
FIG. 53 is a diagram showing an exemplary structure of a display device of the present invention.

FIG. 53 shows one mode of a display panel module in which a display panel 4501 and a circuit board 4502 are combined.

As shown in FIG. 53, the display panel 4501 includes a pixel portion 4503, a scan line driver circuit 4504, and a signal line driver circuit 4505. The circuit board 4502 is provided with a control circuit 4506, a signal dividing circuit 4507, and the like, for example. Note that the display panel 4501 and the circuit board 4502 are connected by a connection wiring 4508. As the connection wiring 4508, an FPC or the like can be used.

In the display panel 4501, the pixel portion and part of peripheral driver circuits (a driver circuit having a low operation frequency among a plurality of driver circuits) may be formed using transistors over a substrate, and another peripheral driver circuit (a driver circuit having a high operation frequency among the plurality of driver circuits) may be formed on an IC chip. The IC chip may be mounted on the display panel 4501 by COG (chip on glass). The IC chip may alternatively be connected to a glass substrate by using TAB (tape automated bonding) or a printed circuit board. Further, all of the peripheral driver circuits may be formed on an IC chip and the IC chip may be mounted on the display panel by COG or the like.

Note that the pixels described in any of the above-described embodiment modes are used for the pixel portion. According to the present invention, viewing angle characteristics can be enhanced. Further, cost reduction can be achieved by using transistors with the same conductivity type as transistors included in the pixel portion or using an amorphous semiconductor for semiconductor layers of the transistors.

Figure 54:
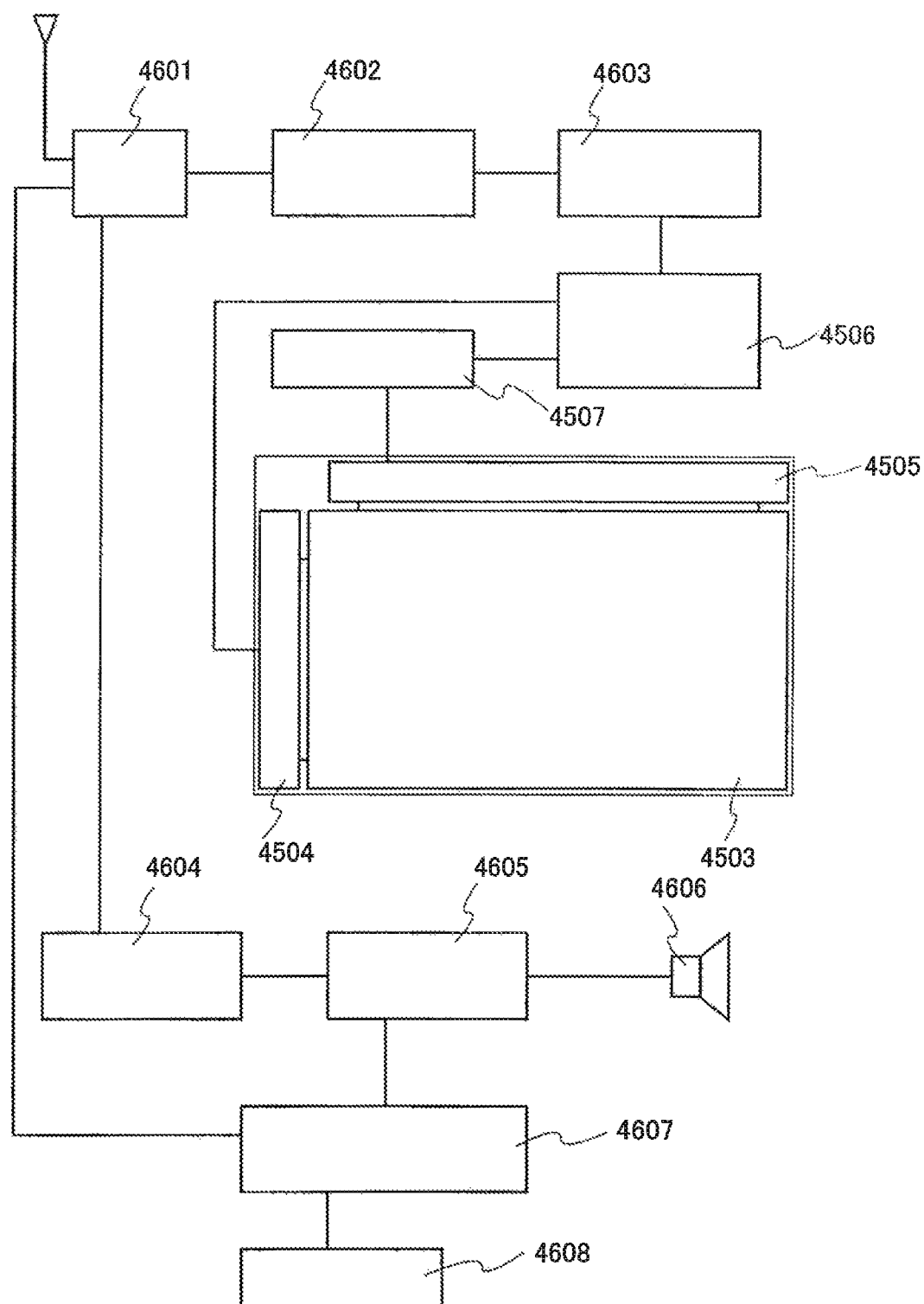
FIG. 54 is a diagram showing an exemplary structure of a display device of the present invention.

A TV receiver can be completed with such a display module. FIG. 54 is a block diagram showing a main structure of a TV receiver. A tuner 4601 receives a video signal and an audio signal. The video signal is processed by a video signal amplifier circuit 4602, a video signal processing circuit 4603 for converting a signal output from the video signal amplifier circuit 4602 into a color signal corresponding to each color of red, green, and blue, and a control circuit 4506 for converting the video signal into a signal which meets input specifications of a driver circuit. The control circuit 4506 outputs signals to a scan line side and a signal line side. In the case of performing a digital drive, a structure can be used in which the signal dividing circuit 4507 is provided on the signal line side to supply an input digital signal divided into m (m is a positive integer) pieces.

The audio signal among the signals received by the tuner 4601 is transmitted to an audio signal amplifier circuit 4604, and an output of the audio signal amplifier circuit 4604 is supplied to a speaker 4606 through an audio signal processing circuit 4605. A control circuit 4607 receives control information of a receiving station (reception frequency) or sound volume from an input portion 4608, and transmits signals to the tuner 4601 and the audio signal processing circuit 4605.

Figure 55A:
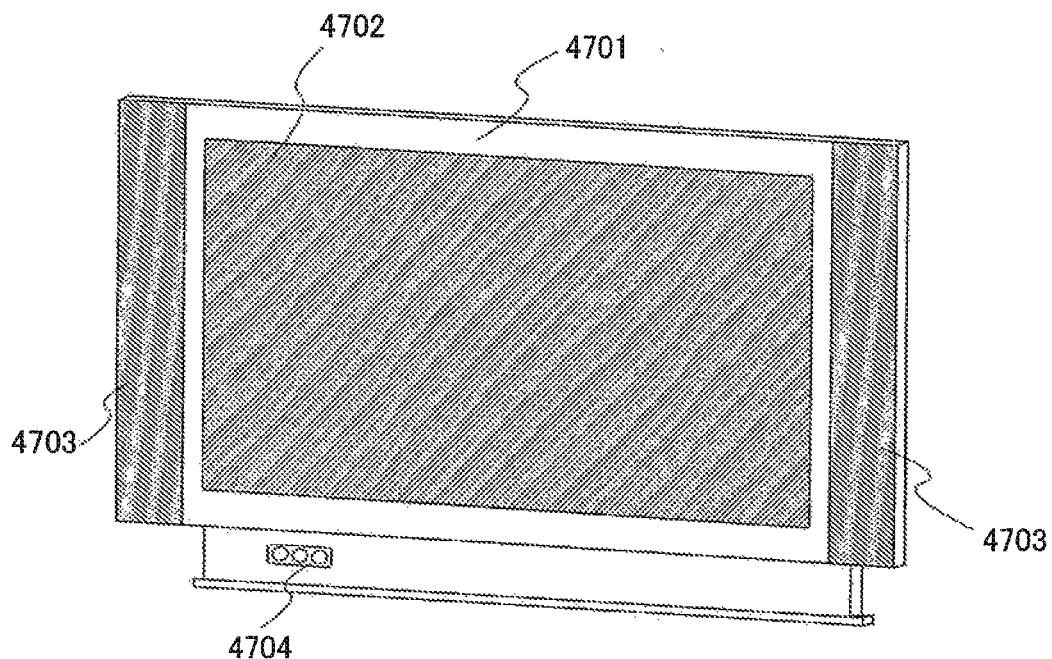
FIGS. 55A and 55B are diagrams showing exemplary structures of a display device of the present invention.

FIG. 55A shows a TV receiver incorporated with a display panel module which is different from that of FIG. 54. In FIG. 55A, a display screen 4702 stored in a housing 4701 is formed by using the display panel module. Note that speakers 4703, operation switches 4704, or the like may be provided as appropriate.

Figure 55B:
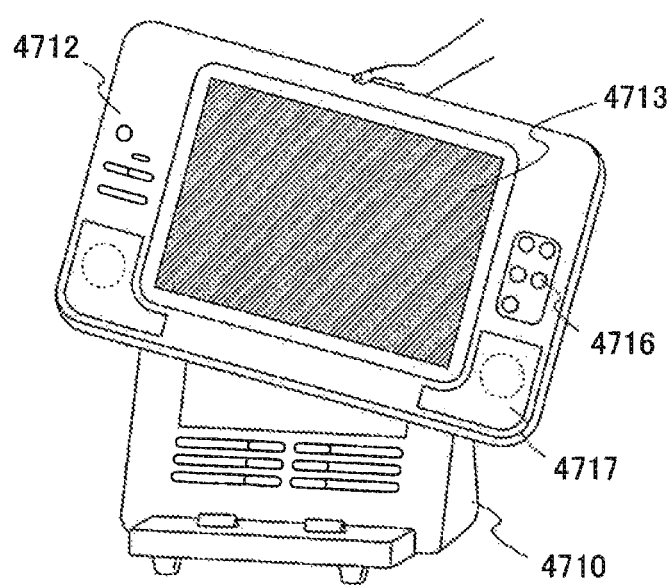

FIG. 55B shows a TV receiver, only a display of which can be carried wirelessly. A battery and a signal receiver are incorporated in a housing 4712. The battery drives a display portion 4713 and speaker portions 4717. The battery can be repeatedly charged with a charger 4710. The charger 4710 can transmit and receive a video signal and can transmit the video signal to the signal receiver of the display. The housing 4712 is controlled by operation keys 4716. Alternatively, the device shown in FIG. 55B may be an image audio two-way communication device which can transmit a signal to the charger 4710 from the housing 4712 by operating the operation keys 4716. Still alternatively, the device shown in FIG. 55B may be a general-purpose remote control device which can transmit a signal to the charger 4710 from the housing 4712 by operating the operation keys 4716, and can control communication of another electronic device when the electronic device is made to receive a signal which can be transmitted from the charger 4710. The present invention can be applied to the display portion 4713.

Figure 56A:
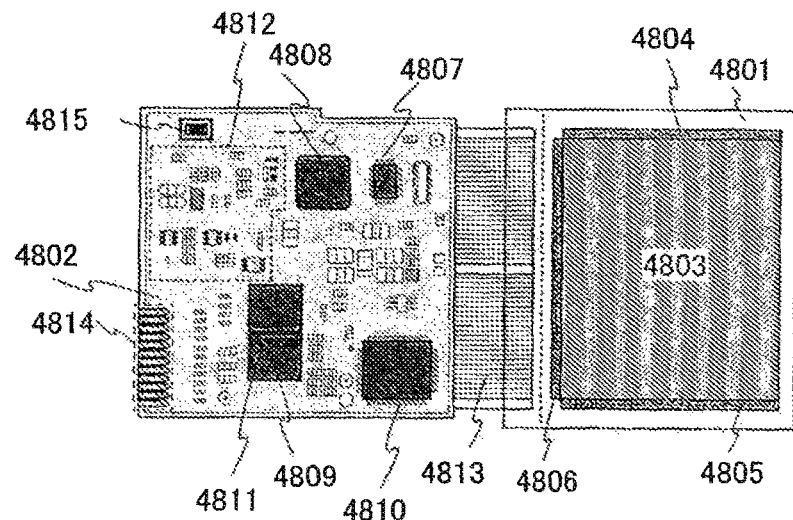
FIGS. 56A and 56B are diagrams showing an exemplary structure of a display device of the present invention.

FIG. 56A shows a module in which a display panel 4801 and a printed wiring board 4802 are combined. The display panel 4801 is provided with a pixel portion 4803 including a plurality of pixels, a first scan line driver circuit 4804, a second scan line driver circuit 4805, and a signal line driver circuit 4806 which supplies a video signal to a selected pixel.

The printed wiring board 4802 is provided with a controller 4807, a central processing unit (CPU) 4808, a memory 4809, a power supply circuit 4810, an audio processing circuit 4811, a transmitting/receiving circuit 4812, and the like. The printed wiring board 4802 and the display panel 4801 are connected by a flexible printed circuit (FPC) 4813. The flexible printed circuit (FPC) 4813 may be provided with a storage capacitor, a buffer circuit, or the like to prevent noise on power supply voltage or a signal, and increase in rise time of a signal. Note that the controller 4807, the audio processing circuit 4811, the memory 4809, the central processing unit (CPU) 4808, the power supply circuit 4810, and the like can be mounted on the display panel 4801 by using a COG (chip on glass) method. When a COG method is used, the size of the printed wiring board 4802 can be reduced.

Various control signals are input and output through an interface (I/F) portion 4814 provided for the printed wiring board 4802. In addition, an antenna port 4815 for transmitting and receiving a signal to/from an antenna is provided for the printed wiring board 4802.

Figure 56B:
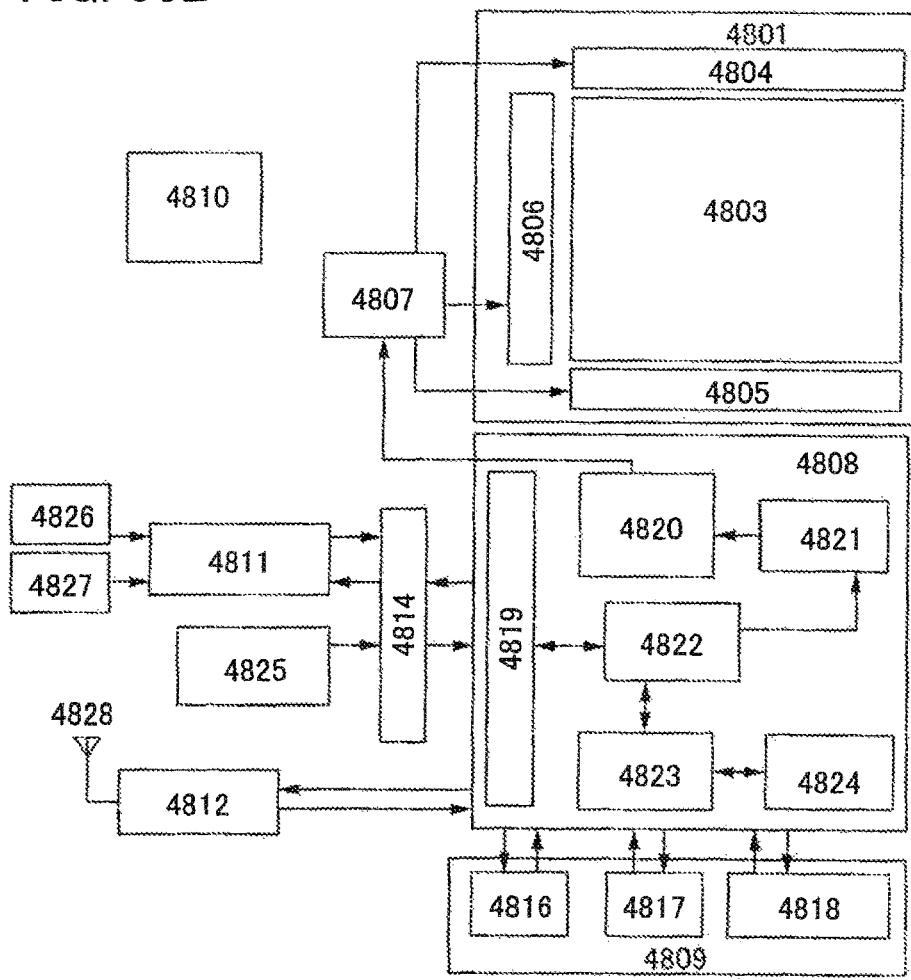

FIG. 56B is a block diagram of the module shown in FIG. 56A. The module includes a VRAM 4816, a DRAM 4817, a flash memory 4818, and the like as the memory 4809. The VRAM 4816 stores data on an image displayed on the panel. The DRAM 4817 stores video data or audio data. The flash memory 4818 stores various programs.

The power supply circuit 4810 supplies electric power for operating the display panel 4801, the controller 4807, the central processing unit (CPU) 4808, the audio processing circuit 4811, the memory 4809, and the transmitting/receiving circuit 4812. Note that depending on panel specifications, the power supply circuit 4810 is provided with a current source in some cases.

The central processing unit (CPU) 4808 includes a control signal generation circuit 4820, a decoder 4821, a register 4822, an arithmetic circuit 4823, a RAM 4824, an interface (I/F) portion 4819 for the central processing unit (CPU)

4808, and the like. Various signals which are input to the central processing unit (CPU) 4808 through the interface (I/F) portion 4819 are once stored in the register 4822, and then input to the arithmetic circuit 4823, the decoder 4821, and the like. The arithmetic circuit 4823 performs operation based on the input signal to designate a location to which various instructions are sent. On the other hand, the signal input to the decoder 4821 is decoded and input to the control signal generation circuit 4820. The control signal generation circuit 4820 generates a signal including various instructions based on the input signal, and transmits the signal to locations designated by the arithmetic circuit 4823, specifically, the memory 4809, the transmitting/receiving circuit 4812, the audio processing circuit 4811, the controller 4807, and the like.

The memory 4809, the transmitting/receiving circuit 4812, the audio processing circuit 4811, and the controller 4807 operate in accordance with respective instructions. Operations thereof are briefly described below.

A signal input from an input means 4825 is transmitted to the central processing unit (CPU) 4808 mounted on the printed wiring board 4802 through the interface (I/F) portion 4814. The control signal generation circuit 4820 converts image data stored in the VRAM 4816 into a predetermined format based on the signal transmitted from the input means 4825 such as a pointing device or a keyboard, and transmits the converted data to the controller 4807.

The controller 4807 performs data processing of the signal including the image data transmitted from the central processing unit (CPU) 4808 in accordance with the panel specifications, and supplies the signal to the display panel 4801. The controller 4807 generates an Hsync signal, a Vsync signal, a clock signal CLK, alternating voltage (AC Cont), and a switching signal L/R based on power supply voltage input from the power supply circuit 4810 or various signals input from the central processing unit (CPU) 4808, and supplies the signals to the display panel 4801.

The transmitting/receiving circuit 4812 processes a signal which is transmitted and received as a radio wave by an antenna 4828. Specifically, the transmitting/receiving circuit 4812 may include a high-frequency circuit such as an isolator, a band pass filter, a VCO (voltage controlled oscillator), an LPF (low pass filter), a coupler, or a balun. Among signals transmitted and received by the transmitting/receiving circuit 4812, a signal including audio information is transmitted to the audio processing circuit 4811 in accordance with an instruction from the central processing unit (CPU) 4808.

The signal including the audio information, which is transmitted in accordance with the instruction from the central processing unit (CPU) 4808, is demodulated into an audio signal by the audio processing circuit 4811 and is transmitted to a speaker 4827. An audio signal transmitted from a microphone 4826 is modulated by the audio processing circuit 4811 and is transmitted to the transmitting/receiving circuit 4812 in accordance with an instruction from the central processing unit (CPU) 4808.

The controller 4807, the central processing unit (CPU) 4808, the power supply circuit 4810, the audio processing circuit 4811, and the memory 4809 can be mounted as a package of this embodiment mode.

Needless to say, the present invention is not limited to the TV receiver, and can be applied to various uses particularly as a large display medium such as an information display board at a train station, an airport, or the like, or an advertisement display board on the street, as well as a monitor of a personal computer.

Next, a structural example of a mobile phone according to the present invention is described with reference to FIG. 57.

A display panel 4901 is incorporated in a housing 4930 so as to be detachable. The shape and the size of the housing 4930 can be changed as appropriate in accordance with the size of the display panel 4901. The housing 4930 to which the display panel 4901 is fixed is fitted into a printed circuit board 4931 and is assembled as a module.

The display panel 4901 is connected to the printed circuit board 4931 through an FPC 4913. The printed circuit board 4931 is provided with a speaker 4932, a microphone 4933, a transmitting/receiving circuit 4934, and a signal processing circuit 4935 including a CPU, a controller, and the like. Such a module, an input means 4936, and a battery 4937 are combined and stored in a housing 4939. A pixel portion of the display panel 4901 is provided so as to be seen from an opening window formed in the housing 4939.

In the display panel 4901, the pixel portion and part of peripheral driver circuits (a driver circuit having a low operation frequency among a plurality of driver circuits) may be formed over a substrate by using transistors, and another part of the peripheral driver circuits (a driver circuit having a high operation frequency among the plurality of driver circuits) may be formed over an IC chip. Then, the IC chip may be mounted on the display panel 4901 by COO (chip on glass). Alternatively, the IC chip may be connected to a glass substrate by using TAB (tape automated bonding) or a printed circuit board. With such a structure, power consumption of the mobile phone (the display panel is also possible) can be reduced, and operation time of the mobile phone per charge can be extended. Further, reduction in cost of the mobile phone can be realized.

Figure 57:
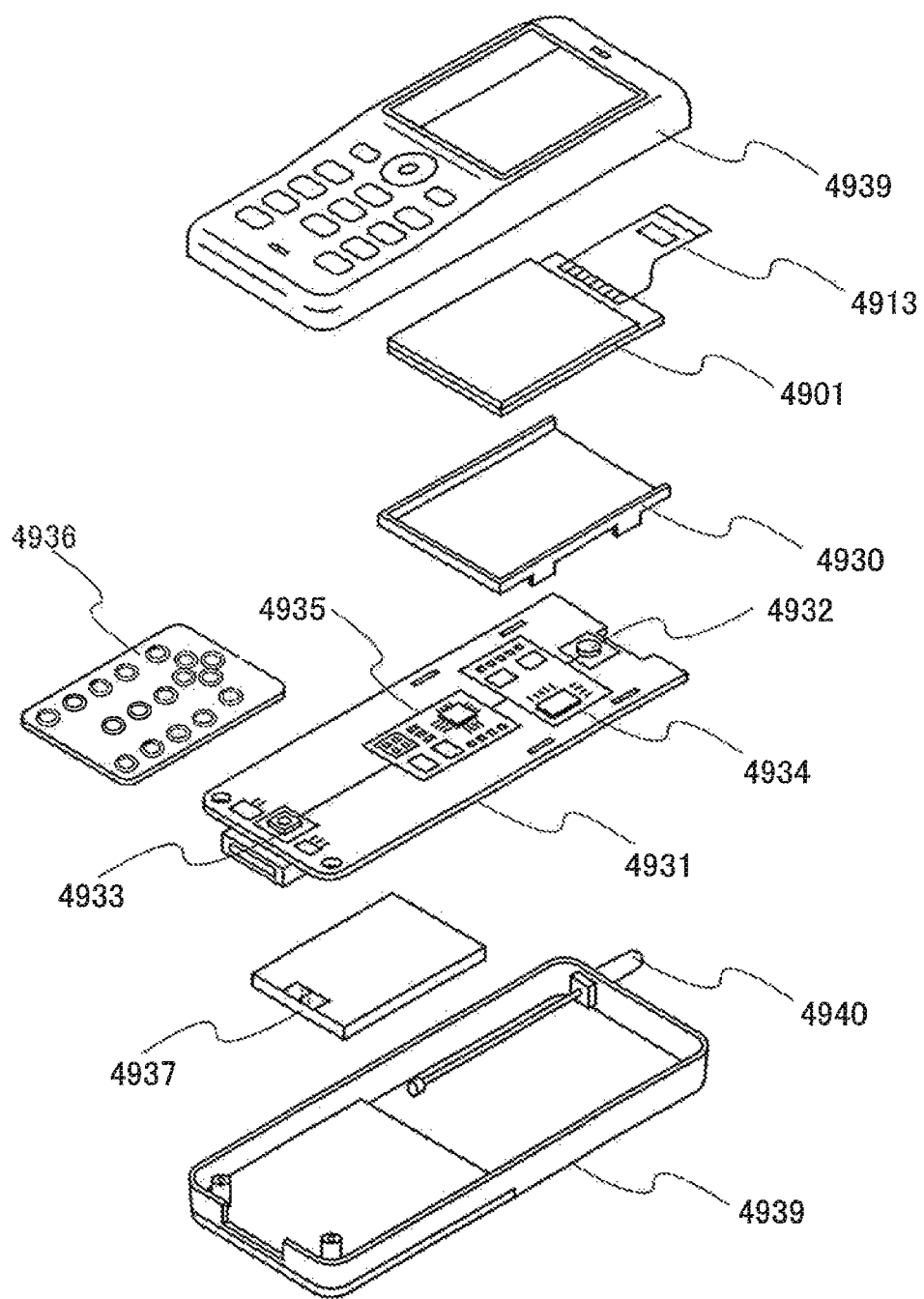
FIG. 57 is a diagram showing an electronic device in which a display device of the present invention is used.

The mobile phone shown in FIG. 57 has various functions such as a function of displaying a variety of information (e.g., a still image, a moving image, and a text image); a function of displaying a calendar, a date, time, or the like on a display portion; a function of operating or editing the information displayed on the display portion; a function of controlling processing by a variety of software (programs); a wireless communication function; a function of communicating with another mobile phone, a fixed phone, or an audio communication device by using the wireless communication function; a function of connecting with a variety of computer networks by using the wireless communication function; a function of transmitting or receiving a variety of data by using the wireless communication function; a function of operating a vibrator in accordance with incoming call, reception of data, or an alarm; and a function of generating a sound in accordance with incoming call, reception of data, or an alarm. Note that functions of the mobile phone shown in FIG. 57 are not limited to them, and the mobile phone can have various functions.

Figure 58:
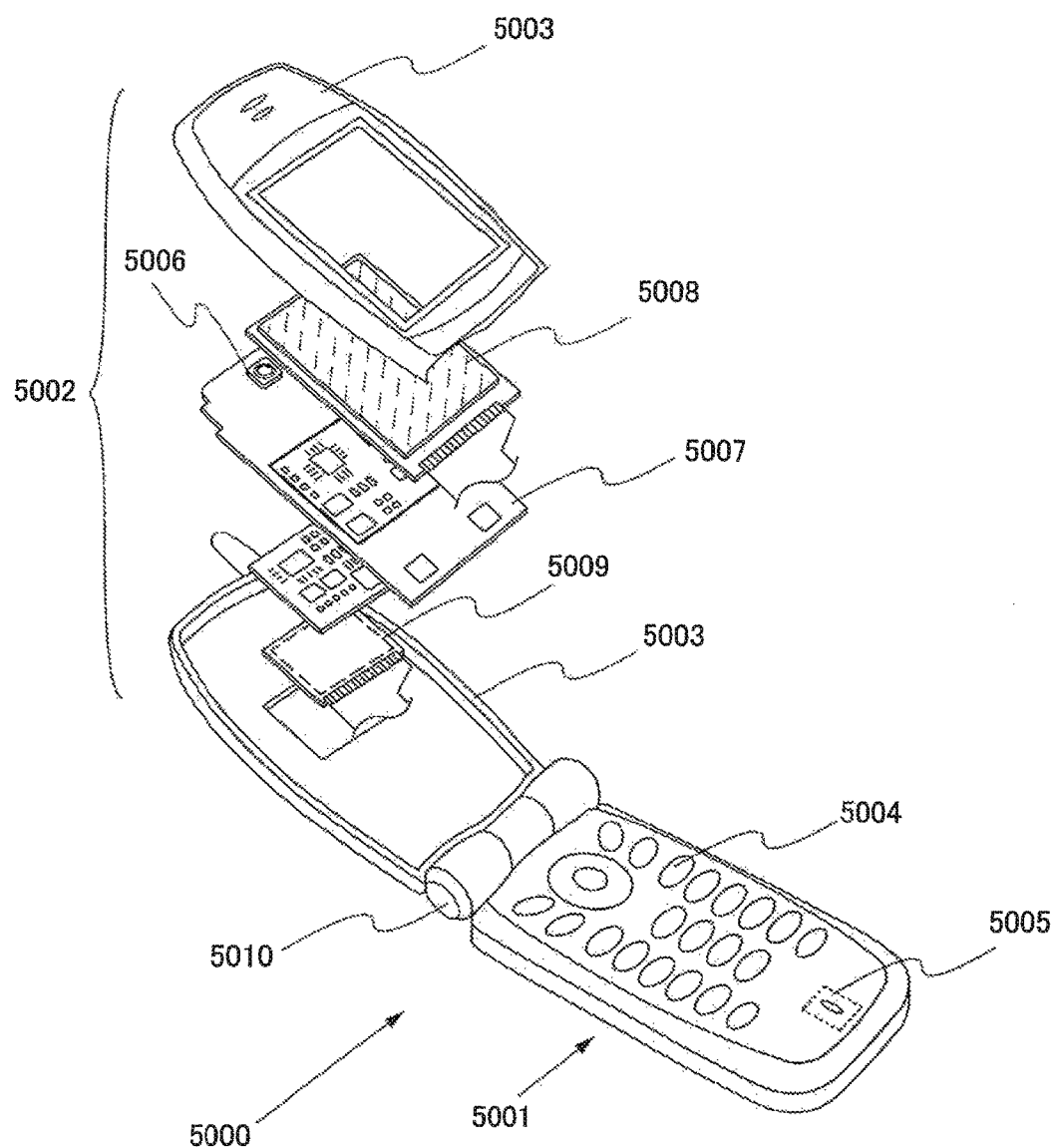
FIG. 58 is a diagram showing an electronic device in which a display device of the present invention is used.

In a mobile phone shown in FIG. 58, a main body (A) 5001 which is provided with operation switches 5004, a microphone 5005, and the like is connected to a main body (B) 5002 which is provided with a display panel (A) 5008, a display panel (B) 5009, a speaker 5006, and the like by using a hinge 5010 so that the mobile phone can be opened and closed. The display panel (A) 5008 and the display panel (B) 5009 are stored in a housing 5003 of the main body (B) 5002 together with a circuit board 5007. Each of pixel portions of the display panel (A) 5008 and the display panel (B) 5009 is provided so as to be seen from an opening window formed in the housing 5003.

Specifications of the display panel (A) 5008 and the display panel (B) 5009, such as the number of pixels, can be set as appropriate in accordance with functions of a mobile phone 5000. For example, the display panel (A) 5008 can be used as a main screen and the display panel (B) 5009 can be used as a sub-screen.

Each of the mobile phones of this embodiment mode can be changed in various modes depending on functions or applications thereof. For example, it may be a camera-equipped mobile phone by incorporating an imaging element in a portion of the hinge 5010. When the operation switches 5004, the display panel (A) 5008, and the display panel (B) 5009 are stored in one housing, the above-described advantageous effects can be obtained. Further, similar advantageous effects can be obtained when the structure of this embodiment mode is applied to an information display terminal provided with a plurality of display portions.

The mobile phone shown in FIG. 58 has various functions such as a function of displaying a variety of information (e.g., a still image, a moving image, and a text image); a function of displaying a calendar, a date, time, or the like on a display portion; a function of operating or editing the information displayed on the display portion; a function of controlling processing by a variety of software (programs); a wireless communication function; a function of communicating with another mobile phone, a fixed phone, or an audio communication device by using the wireless communication function; a function of connecting with a variety of computer networks by using the wireless communication function; a function of transmitting or receiving a variety of data by using the wireless communication function; a function of operating a vibrator in accordance with incoming call, reception of data, or an alarm; and a function of generating a sound in accordance with incoming call, reception of data, or an alarm. Note that functions of the mobile phone shown in FIG. 58 are not limited to them, and the mobile phone can have various functions.

The present invention can be applied to various electronic devices. Specifically, the present invention can be applied to display portions of electronic devices. Examples of such electronic devices are cameras such as a video camera and a digital camera, a goggle-type display, a navigation system, an audio reproducing device (e.g., a car audio component or an audio component), a computer, a game machine, a portable information terminal (e.g., a mobile computer, a mobile phone, a mobile game machine, or an electronic book), an image reproducing device provided with a recording medium (specifically, a device which reproduces a recording medium such as a digital versatile disc (DVD) and has a display for displaying a reproduced image), and the like.

Figure 59A:
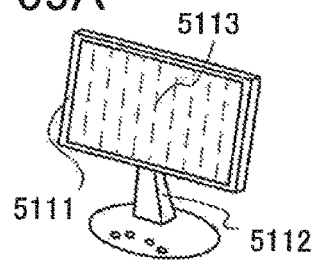
FIGS. 59A to 59H are diagrams showing electronic devices in which display devices of the present invention are used.

FIG. 59A shows a display, which includes a housing 5111, a support base 5112, a display portion 5113, and the like. The display shown in FIG. 59A has a function of displaying a variety of information (e.g., a still image, a moving image, and a text image) on the display portion. Note that the function of the display shown in FIG. 59A is not limited to this function, and the display can have various functions.

Figure 59B:
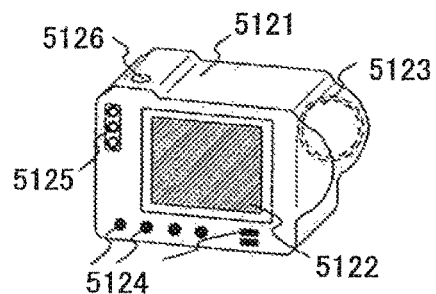

FIG. 59B shows a camera, which includes a main body 5121, a display portion 5122, an image receiving portion 5123, operation keys 5124, an external connection port 5125, a shutter button 5126, and the like. The camera shown in FIG. 59B has a function of photographing a still image and a moving image; a function of automatically correcting the photographed image (the still image or the moving image); a function of storing the photographed image in a recording medium (provided outside or incorporated in the camera); and a function of displaying the photographed image on the display portion. Note that the functions of the camera shown in FIG. 59B are not limited to these functions, and the camera can have various functions.

Figure 59C:
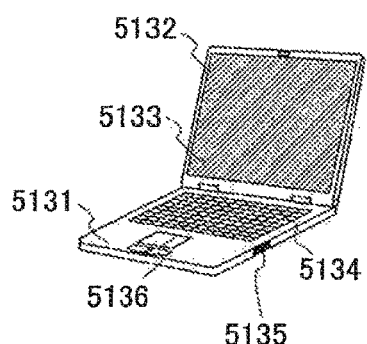

FIG. 59C shows a computer, which includes a main body 5131, a housing 5132, a display portion 5133, a keyboard 5134, an external connection port 5135, a pointing device 5136, and the like. The computer shown in FIG. 59C has a function of displaying a variety of information (e.g., a still image, a moving image, and a text image) on the display portion; a function of controlling processing by a variety of software (programs); a communication function such as wireless communication or wire communication; a function of connecting to various computer networks by using the communication function; and a function of transmitting or receiving a variety of data by using the communication function. Note that the functions of the computer shown in FIG. 59C are not limited to these functions, and the computer can have various functions.

Figure 59D:
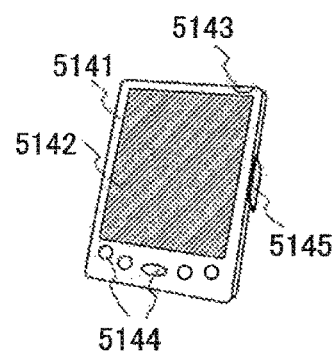

FIG. 59D shows a mobile computer, which includes a main body 5141, a display portion 5142, a switch 5143, operation keys, 5144, an infrared port 5145, and the like. The mobile computer shown in FIG. 59D has a function of displaying a variety of information (e.g., a still image, a moving image, and a text image) on the display portion; a touch panel function on the display portion; a function of displaying a calendar, a date, time, and the like on the display portion; a function of controlling processing by a variety of software (programs); a wireless communication function; a function of connecting to various computer networks by using the wireless communication function; and a function of transmitting or receiving a variety of data by using the wireless communication function. Note that the functions of the mobile computer shown in FIG. 59D are not limited to these functions, and the mobile computer can have various functions.

Figure 59E:
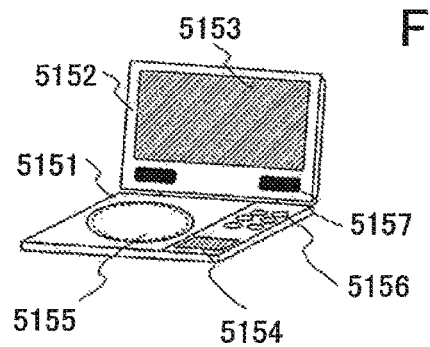

FIG. 59E shows a portable image reproducing device provided with a recording medium (e.g., a DVD reproducing device), which includes a main body 5151, a housing 5152, a display portion A 5153, a display portion B 5154, a recording medium (e.g., DVD) reading portion 5155, operation keys 5156, a speaker portion 5157, and the like. The display portion A 5153 can mainly display image information, and the display portion B 5154 can mainly display text information.

Figure 59F:
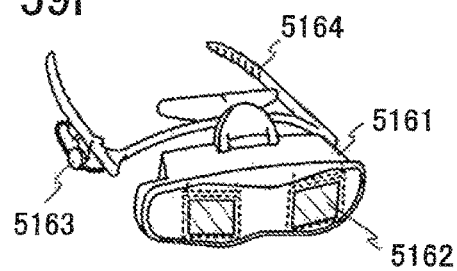

FIG. 59F shows a goggle-type display, which includes a main body 5161, a display portion 5162, an earphone 5163, a support portion 5164, and the like. The goggle-type display shown in FIG. 59F has a function of displaying an image (e.g., a still image, a moving image, or a text image) which is externally obtained on the display portion. Note that the functions of the goggle-type display shown in FIG. 59F are not limited to these functions, and the goggle-type display can have various functions.

Figure 59G:
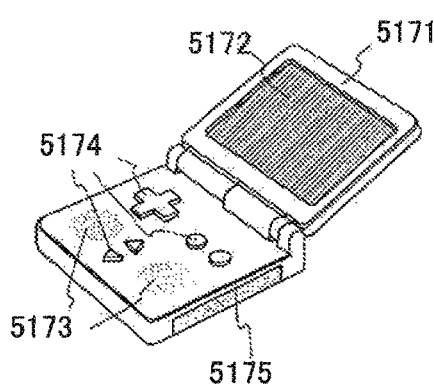

FIG. 59G shows a portable game machine, which includes a housing 5171, a display portion 5172, speaker portions 5173, operation keys 5174, a recording medium insert portion 5175, and the like. A portable game machine, in which the display device of the present invention is used for the display portion 5172, can display vivid colors. The portable game machine shown in FIG. 59G has a function of reading a program or data stored in the recording medium to display it on the display portion, and a function of sharing information with another portable game machine by wireless communication. Note that the functions of the portable game machine shown in FIG. 59O are not limited to these functions, and the portable game machine can have various functions.

Figure 59H:
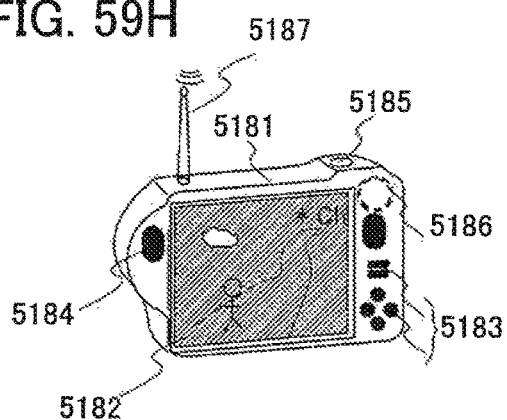

FIG. 59H shows a digital camera having a television reception function, which includes a main body 5181, a display portion 5182, operation keys 5183, a speaker 5184, a shutter button 5185, an image receiving portion 5186, an antenna 5187, and the like. The digital camera having the television reception function, which is shown in FIG. 59H, has a function of photographing a still image and a moving image; a function of automatically correcting the photographed image; a function of obtaining a variety of information from the antenna; a function of storing the photographed image or the information obtained from the antenna; and a function of displaying the photographed image or the information obtained from the antenna on the display portion. Note that the functions of the digital camera having the television reception function, which is shown in FIG. 59H, are not limited to these functions, and the digital camera having the television reception function can have various functions.

As shown in FIGS. 59A to 59E, the electronic appliances in accordance with the present invention have display portions for displaying some information. The electronic appliance of the present invention has low power consumption and can drive with a battery for a long time, because in the case where pieces of data overlap with each other, the overlapping data is stored in a memory and thus the frequency of circuit operations can be reduced. Next, application examples of the display devices of the present invention will be described.

Figure 60:
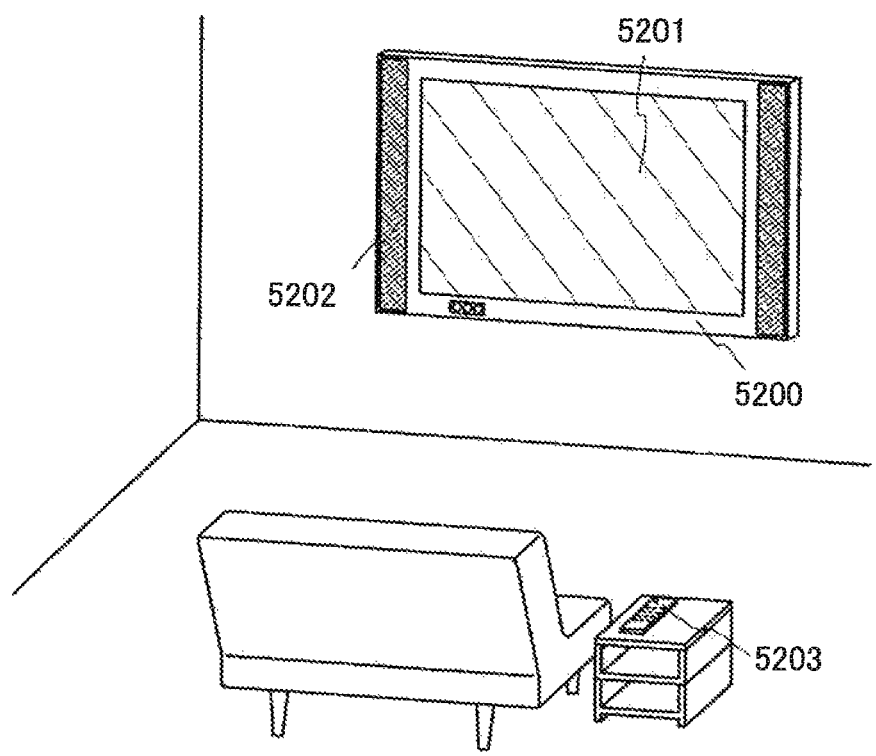
FIG. 60 is a diagram showing an electronic device in which a display device of the present invention is used.

FIG. 60 shows an example in which the display device in accordance with the present invention is incorporated in a structure. FIG. 60 shows the structure which includes a housing 5200, a display panel 5201, a speaker portion 5202, and the like. Note that a reference numeral 5203 denotes a remote controller for operating the display panel 5201.

The pixel described in any of the above embodiment modes is used for the display panel 5201. By using the present invention, a high-definition display panel which is viewable at wider angles can be obtained. Note that further, cost reduction can be achieved by using transistors with the same conductivity type as transistors included in the pixel portion or using an amorphous semiconductor for semiconductor layers of the transistors.

Since the display device shown in FIG. 60 is incorporated in the structure, the display device shown in FIG. 60 can be provided without requiring a wide space.

Figure 61:
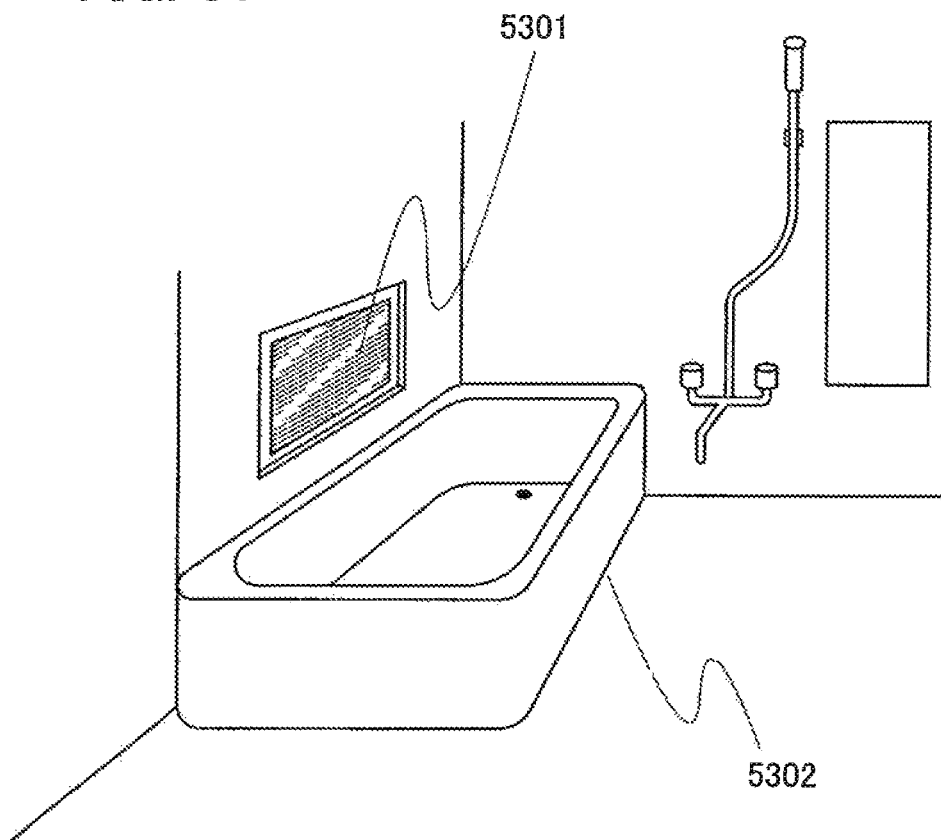
FIG. 61 is a diagram showing an electronic device in which a display device of the present invention is used.

FIG. 61 shows another example in which the display device in accordance with the present invention is incorporated in a structure. A display panel 5301 is incorporated in a prefabricated bath unit 5302, so that a bather can view the display panel 5301 while taking a bath. Information can be displayed on the display panel 5301 by an operation of the bather. Therefore, the display panel 5301 can be used for advertisement or an amusement means.

The pixel described in any of the above embodiment modes is used for the display panel 5301. By using the present invention, a high-definition display panel which is viewable at wider angles can be obtained. Note that further, cost reduction can be achieved by using transistors with the same conductivity type as transistors included in the pixel portion or using an amorphous semiconductor for semiconductor layers of the transistors.

The position for providing the display device in accordance with the present invention is not limited to a sidewall of the prefabricated bath unit 5302 shown in FIG. 61, and the display device in accordance with the present invention can be incorporated in various places. For example, the display device in accordance with the present invention can be incorporated in part of a mirror or the bathtub itself. In addition, the shape of the display device may be a shape in accordance with the mirror or the bathtub.

Figure 62:
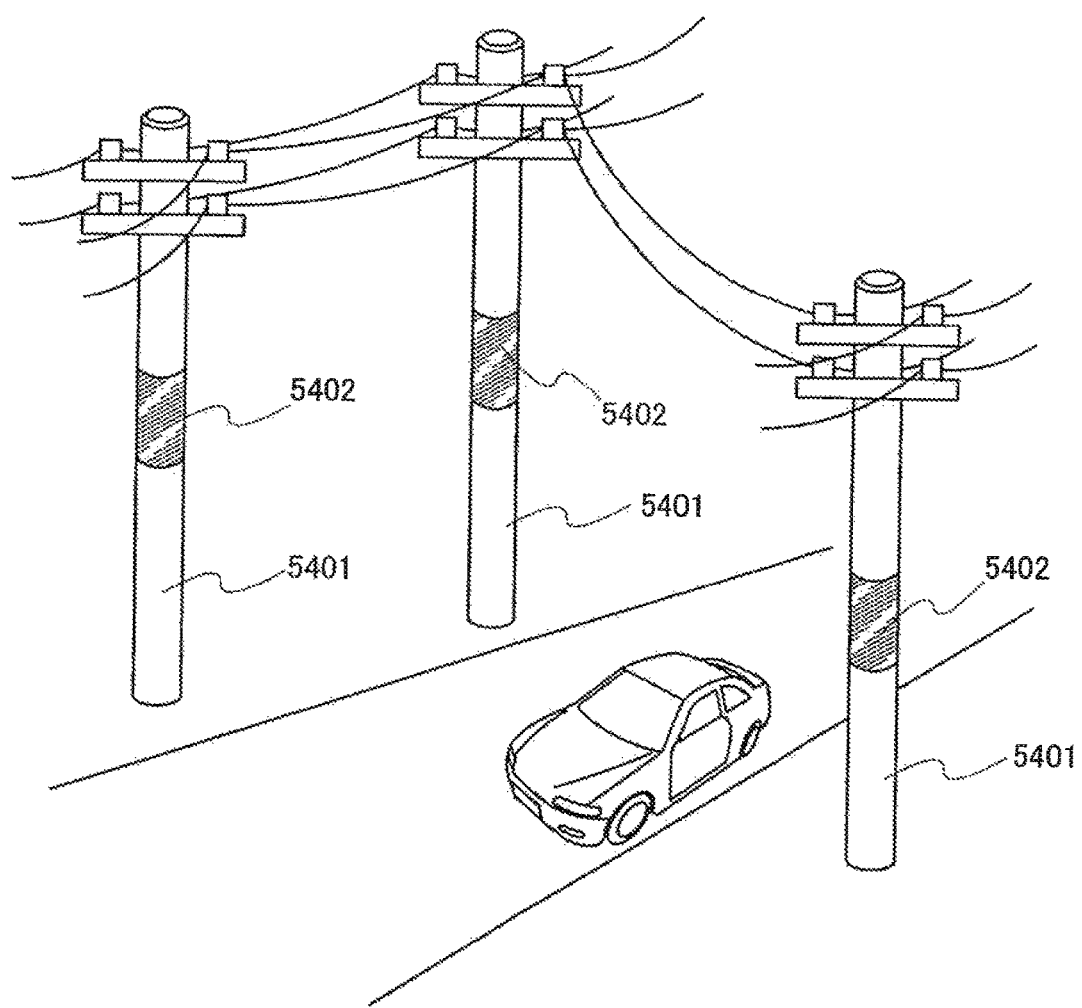
FIG. 62 is a diagram showing an electronic device in which a display device of the present invention is used.

FIG. 62 shows another example in which the display device in accordance with the present invention is incorporated in a structure. In FIG. 62, display panels 5402 are curved in accordance with curved surfaces of columnar objects 5401. Here, the columnar objects 5401 are described as telephone poles.

The display panels 5402 shown in FIG. 62 are provided at a position higher than a human eye level. When the display panels 5402 are provided for structures standing outside together in large numbers such as telephone poles, it is possible to provide information to the unspecified number of viewers through the display panels 5402. Therefore, the display panels are suitable for advertisement. Since the display panels 5402 can easily display the same images by control from outside and can easily switch images instantly, extremely effective information display and advertising effects can be expected. In addition, by providing self-luminous display elements in the display panels 5402, the display panels 5402 can be effectively used as highly visible display media even at night. Further, by providing the display panels 5402 for the telephone poles, power supply means of the display panels 5402 can be easily secured. In an emergency such as a disaster, the display panels 5402 can be means for quickly transmitting precise information to victims.

The pixel described in any of the above embodiment modes is used for each of the display panels 5402. By using the present invention, a high-definition display panel which is viewable at wider angles can be obtained. Note that further, cost reduction can be achieved by using transistors with the same conductivity type as transistors included in the pixel portion or using an amorphous semiconductor for semiconductor layers of the transistors. Alternatively, an organic transistor provided over a film substrate may be used.

Note that although this embodiment describes the wall, the prefabricated bath unit, and the columnar object as examples of the structure in which the display device in accordance with the present invention is incorporated, the display device in accordance with the present invention can be provided for various structures.

Next, an example is described in which the display device in accordance with the present invention is incorporated in a moving object.

Figure 63:
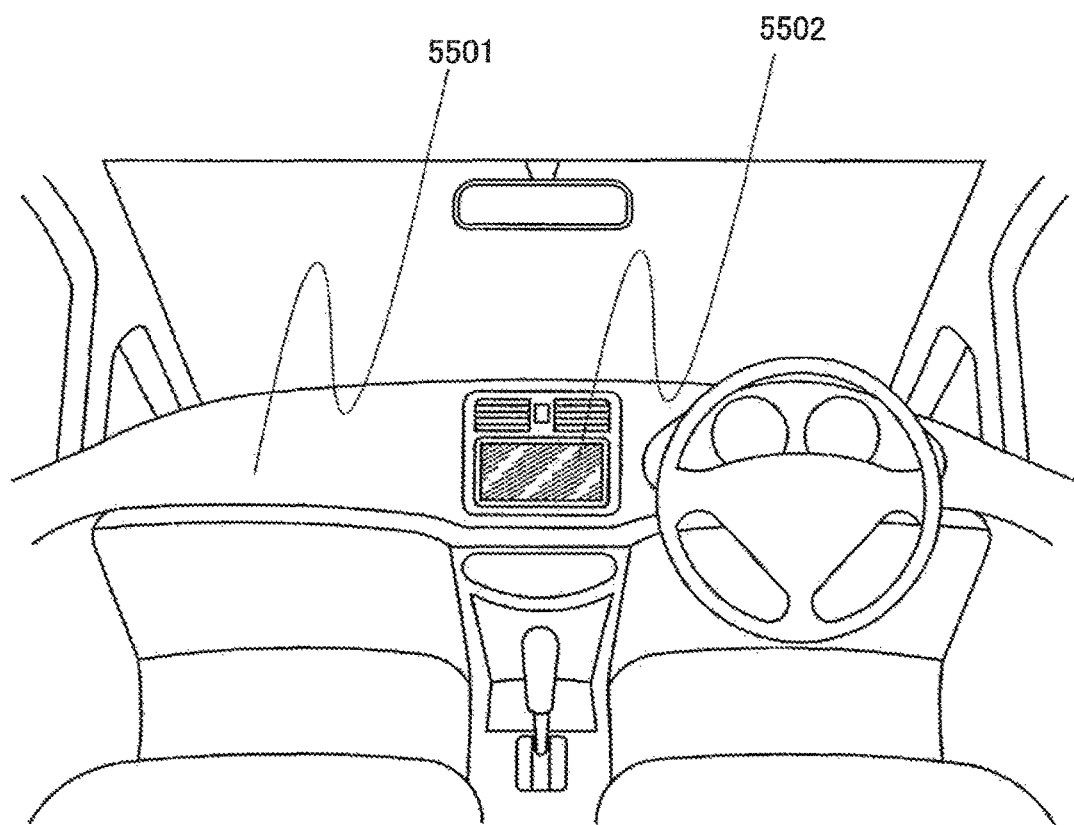
FIG. 63 is a diagram showing an electronic device in which a display device of the present invention is used.

FIG. 63 shows an example in which the display device in accordance with the present invention is incorporated in a car. A display panel 5502 is incorporated in a car body 5501 of the car and can display information on an operation of the car or information input from inside or outside of the car on an on-demand basis. Further the display panel 5502 may have a navigation function.

The pixel described in any of the above embodiment modes is used for the display panel 5502. By using the present invention, a high-definition display panel which is viewable at wider angles can be obtained. Note that further, cost reduction can be achieved by using transistors with the same conductivity type as transistors included in the pixel portion or using an amorphous semiconductor for semiconductor layers of the transistors.

Note that the display device in accordance with the present invention can be provided in not only the car body 5501 shown in FIG. 63 but also in various positions. For example, the display device in accordance with the present invention may be incorporated in a glass window, a door, a steering wheel, a shift lever, a seat, a room mirror, or the like. At this time, the shape of the display panel 5502 may be a shape in accordance with the shape of an object in which the display panel 5502 is provided.

Figure 64A:
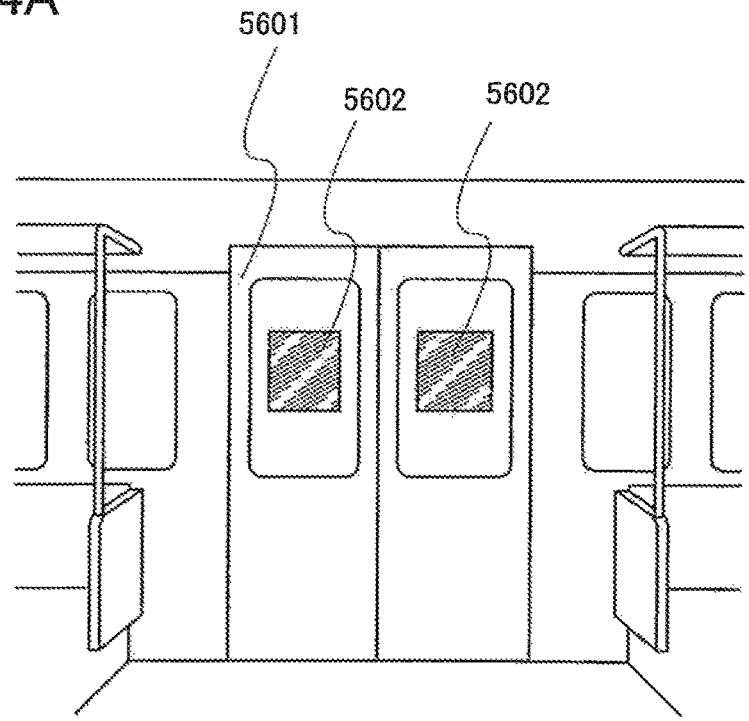
FIGS. 64A and 64B are diagrams showing electronic devices in which display devices of the present invention are used.
Figure 64B:
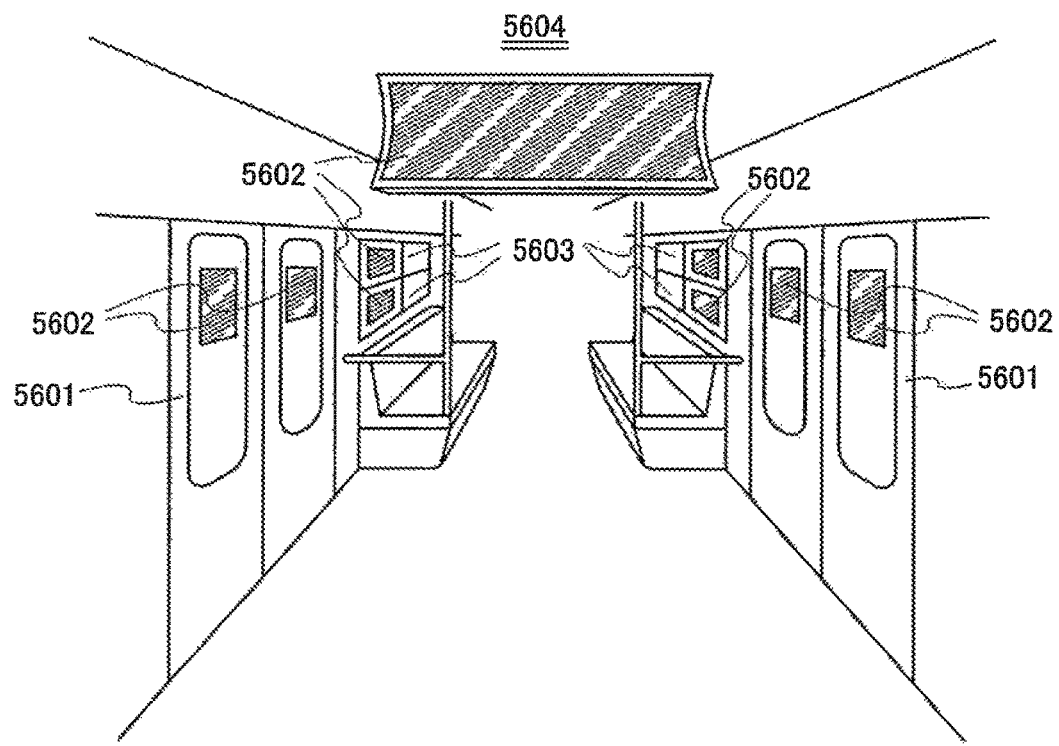

FIGS. 64A and 64B each show an example in which the display device in accordance with the present invention is incorporated in a train car.

FIG. 64A shows an example in which display panels 5602 are provided for glasses of a door 5601 of the train car. The display panels 5602 have an advantage over conventional paper-based advertisement that labor cost which is necessary for switching advertisement is not needed. In addition, since the display panels 5602 can instantly switch images displayed on a display portion by external signals, images on the display panel can be switched as the type of train passengers changes in accordance with different time periods. By changing images instantly in this manner, a more effective advertising effect can be expected.

FIG. 64B shows an example in which display panels 5602 are provided for glass windows 5603 and a ceiling 5604 as well as the glasses of the doors 5601 of the train car. Since the display device in accordance with the present invention can be easily provided in a position in which the display device is conventionally difficult to be provided, an effective advertisement effect can be obtained. In addition, since the display device in accordance with the present invention can instantly switch images displayed on the display portion by external signals, cost and time generated in advertisement switching can be reduced and more flexible advertisement operation and information transmission can be performed.

The pixel described in any of the above embodiment modes is used for each of the display panels 5602 shown in FIGS. 64A and 64B. By using the present invention, a high-definition display panel which is viewable at wider angles can be obtained. Note that further, cost reduction can be achieved by using transistors with the same conductivity type as transistors included in the pixel portion or using an amorphous semiconductor for semiconductor layers of the transistors.

Note that the position of the display device in accordance with the present invention is not limited to the above-described position and the display device can be provided in various positions. For example, the display device in accordance with the present invention may be incorporated in a hand strap, a seat, a handrail, a floor, or the like. At this time, the shape of the display panel 5602 may be a shape in accordance with the shape of an object in which the display panel 5602 is provided.

Figure 65A:
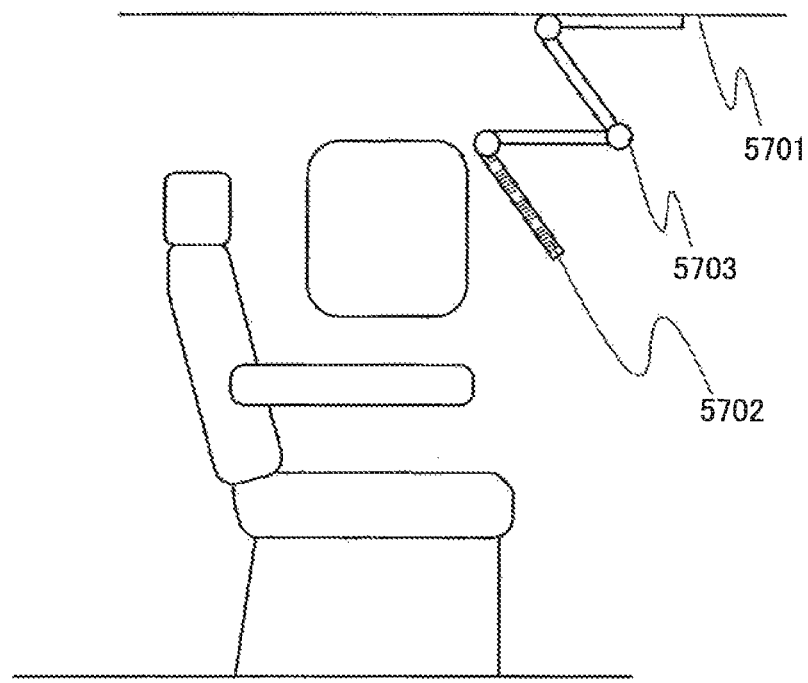
FIGS. 65A and 65B are diagrams showing electronic devices in which display devices of the present invention are used.
Figure 65B:
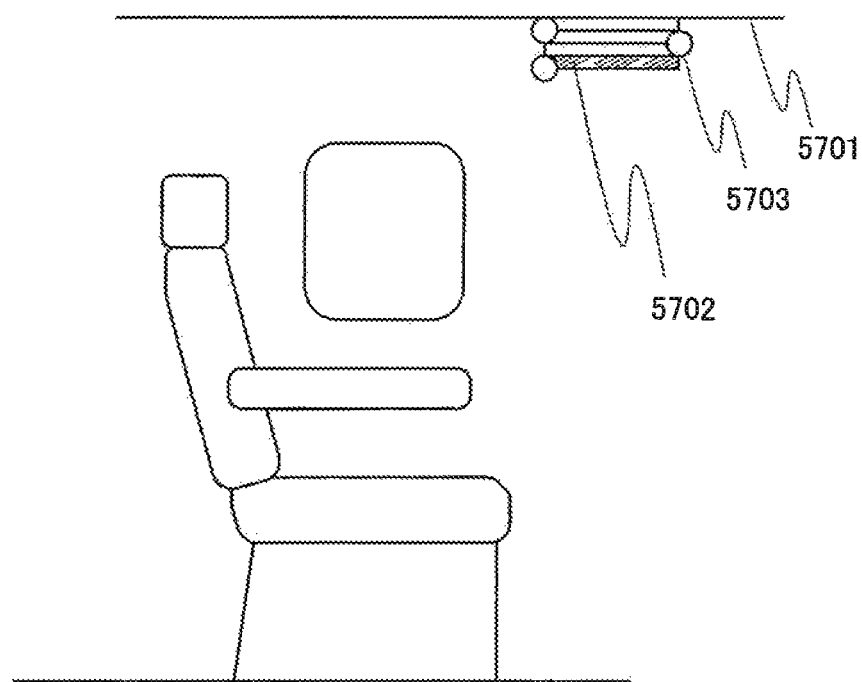

FIGS. 65A and 65B each show an example in which the display device in accordance with the present invention is incorporated in a passenger airplane.

FIG. 65A shows a shape in use when a display panel 5702 is provided to a ceiling 5701 above a seat of the passenger airplane. The display panel 5702 is incorporated in the ceiling 5701 through a hinge portion 5703, and a passenger can view the display panel 5702 at a desired position by a telescopic motion of the hinge portion 5703. Information can be displayed on the display panel 5702 by an operation of the passenger. Therefore, the display panel 5702 can be used for advertisement or an amusement means. In addition, by storing the display panel 5702 on the ceiling 5701 by folding the hinge portion 5703 as shown in FIG. 65B, safety during takeoff and landing can be secured. Note that the display panel 5702 can also be utilized as a medium and a guide light by lighting display elements of the display panel 5702 in an emergency.

Note that the pixel described in any of the above embodiment modes is used for each of the display panel 5702 shown in FIGS. 65A and 65B. By using the present invention, a high-definition display panel which is viewable at wider angles can be obtained. Note that further, cost reduction can be achieved by using transistors with the same conductivity type as transistors included in the pixel portion or using an amorphous semiconductor for semiconductor layers of the transistors.

Note that the display device in accordance with the present invention can be incorporated in not only the ceiling 5701 shown in FIGS. 65A and 65B but also in various positions. For example, the display device in accordance with the present invention may be incorporated in a seat, a table, an armrest, a window, or the like. In addition, a large display panel which can be viewed simultaneously by a large number of people may be provided in a wall of an airframe. At this time, the shape of the display panel 5702 may be a shape in accordance with the shape of an object in which the display panel 5702 is provided.

Although this embodiment mode describes the train car body, the car body, and the airplane body as examples of moving objects, the present invention is not limited to them, and can be applied to a motorbike, a four-wheeled vehicle (including a car, a bus, and the like), a train (including a monorail, a rail, and the like), a vessel, and the like. In addition, since display on display panels in a moving object can be switched instantly by external signals, the display device in accordance with the present invention can be used for an advertisement display board for an unspecified number of customers, or an information display board in an emergency by providing the display device in accordance with the present invention in the moving object.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode. This application is based on Japanese Patent Application serial no. 2007-132172 filed in Japan Patent Office on May 17, 2007, the entire contents of which are hereby incorporated by reference.

What is claimed is:
1. A liquid crystal display device comprising:
a first transistor, a second transistor, a third transistor, a fourth transistor, a first capacitor, a second capacitor, a first liquid crystal element, and a second liquid crystal element, wherein a gate electrode of the first transistor, a gate electrode of the second transistor, and a gate electrode of the third transistor are electrically connected to a first scan line, wherein one of a source and a drain of the first transistor is electrically connected to a signal line, wherein the other of the source and the drain of the first transistor is electrically connected to one of a source and a drain of the second transistor, a first electrode of the first capacitor, and a pixel electrode of the first liquid crystal element, wherein the other of the source and the drain of the second transistor is electrically connected to one of a source and a drain of the third transistor, a first electrode of the second capacitor, and a pixel electrode of the second liquid crystal element, wherein the other of the source and the drain of the third transistor is electrically connected to one of a source and a drain of the fourth transistor, wherein the other of the source and the drain of the fourth transistor, a second electrode of the first capacitor, and a second electrode of the second capacitor are electrically connected to a capacitor line, wherein a common electrode of the first liquid crystal element is electrically connected to a common electrode of the second liquid crystal element, wherein the fourth transistor comprises a first gate electrode, a second gate electrode, a first channel formation region overlapping with the first gate electrode, and a second channel formation region overlapping with the second gate electrode, and wherein the first gate electrode and the second gate electrode of the fourth transistor are electrically connected to a second scan line.

2. The liquid crystal display device according to claim 1, wherein a channel formation region of each of the first transistor, the second transistor, and the third transistor comprises an oxide semiconductor.

3. The liquid crystal display device according to claim 1, wherein each of the first channel formation region and the second channel formation region of the fourth transistor comprises an oxide semiconductor.

4. An electronic device comprising the liquid crystal display device according to claim 1.

5. A liquid crystal display device comprising:
a first transistor, a second transistor, a third transistor, a fourth transistor, a first capacitor, a second capacitor, a first liquid crystal element, and a second liquid crystal element, wherein a gate electrode of the first transistor and a gate electrode of the second transistor are electrically connected to a first scan line, wherein one of a source and a drain of the first transistor is electrically connected to a signal line, wherein the other of the source and the drain of the first transistor is electrically connected to one of a source and a drain of the second transistor, a first electrode of the first capacitor, and a pixel electrode of the first liquid crystal element, wherein the other of the source and the drain of the second transistor is electrically connected to one of a source and a drain of the third transistor, a first electrode of the second capacitor, and a pixel electrode of the second liquid crystal element, wherein the other of the source and the drain of the third transistor is electrically connected to one of a source and a drain of the fourth transistor, wherein the other of the source and the drain of the fourth transistor, a second electrode of the first capacitor, and a second electrode of the second capacitor are electrically connected to a capacitor line, wherein a common electrode of the first liquid crystal element is electrically connected to a common electrode of the second liquid crystal element, wherein the third transistor comprises a first gate electrode, a second gate electrode, a first channel formation region overlapping with the first gate electrode, and a second channel formation region overlapping with the second gate electrode, wherein the first gate electrode and the second gate electrode of the third transistor are electrically connected to the first scan line, and wherein a gate electrode of the fourth transistor is electrically connected to a second scan line.

6. The liquid crystal display device according to claim 5, wherein a channel formation region of each of the first transistor, the second transistor, and the fourth transistor comprises an oxide semiconductor.

7. The liquid crystal display device according to claim 5, wherein each of the first channel formation region and the second channel formation region of the third transistor comprises an oxide semiconductor.

8. An electronic device comprising the liquid crystal display device according to claim 5.

* * * * *